US012126320B2

(12) United States Patent
Burak et al.

(10) Patent No.: US 12,126,320 B2
(45) Date of Patent: *Oct. 22, 2024

(54) ACOUSTIC DEVICES STRUCTURES, FILTERS AND SYSTEMS

(71) Applicant: QXONIX INC., Irvine, CA (US)

(72) Inventors: Dariusz Burak, Fort Colins, CO (US); Kevin J. Grannen, Thornton, CO (US); Jack Lenell, Fort Collins, CO (US)

(73) Assignee: QXONIX, INC., Irvine, CA (US)

( * ) Notice: Subject to any disclaimer, the term of this patent is extended or adjusted under 35 U.S.C. 154(b) by 369 days.

This patent is subject to a terminal disclaimer.

(21) Appl. No.: 17/564,813

(22) Filed: Dec. 29, 2021

(65) Prior Publication Data

US 2022/0123729 A1    Apr. 21, 2022

Related U.S. Application Data

(63) Continuation of application No. PCT/US2020/043755, filed on Jul. 27, 2020.
(Continued)

(51) Int. Cl.
*H03H 9/02* (2006.01)
*H03H 3/02* (2006.01)
(Continued)

(52) U.S. Cl.
CPC .......... *H03H 9/02259* (2013.01); *H03H 3/02* (2013.01); *H03H 9/02015* (2013.01);
(Continued)

(58) Field of Classification Search
CPC .............. H03H 9/175; H03H 9/02118; H03H 9/02259; H03H 3/04; H03H 9/02078;
(Continued)

(56) References Cited

U.S. PATENT DOCUMENTS

| 5,883,575 A * | 3/1999 | Ruby ............... H03H 9/585 |
| | | 333/187 |
| 5,929,555 A | 7/1999 | Sugimoto et al. |

(Continued)

FOREIGN PATENT DOCUMENTS

| JP | 2007036915 A1 | 8/2007 |
| WO | WO2018022757 | 2/2018 |

(Continued)

OTHER PUBLICATIONS

International Search Report and Written Opinion for PCT/US2020/043716 mailed Oct. 20, 2020.

(Continued)

*Primary Examiner* — Quan Tra

(57) ABSTRACT

Techniques for improving acoustic wave device structures are disclosed, including filters and systems that may include such devices. An apparatus may comprise a first electrical filter including an acoustic wave device. The first electrical may having a first filter band in a Super High Frequency (SHF) band or an Extremely High Frequency (EHF) band to facilitate compliance with a regulatory requirement or a standards setting organization specification. For example, the first electrical filter may comprise a notch filter having a notch band overlapping at least a portion of an Earth Exploration Satellite Service (EESS) band to facilitate compliance with a regulatory requirement or the standards setting organization specification for the Earth Exploration Satellite Service (EESS) band.

30 Claims, 34 Drawing Sheets

Related U.S. Application Data

(60) Provisional application No. 62/881,061, filed on Jul. 31, 2019, provisional application No. 62/881,074, filed on Jul. 31, 2019, provisional application No. 62/881,077, filed on Jul. 31, 2019, provisional application No. 62/881,085, filed on Jul. 31, 2019, provisional application No. 62/881,087, filed on Jul. 31, 2019, provisional application No. 62/881,091, filed on Jul. 31, 2019, provisional application No. 62/881,094, filed on Jul. 31, 2019.

(51) Int. Cl.
    *H03H 9/13*         (2006.01)
    *H03H 9/17*         (2006.01)
    *H03H 9/205*       (2006.01)
    *H03H 9/54*         (2006.01)
    *H03H 9/56*         (2006.01)

(52) U.S. Cl.
CPC ...... *H03H 9/0207* (2013.01); *H03H 9/02102* (2013.01); *H03H 9/0211* (2013.01); *H03H 9/02157* (2013.01); *H03H 9/13* (2013.01); *H03H 9/131* (2013.01); *H03H 9/17* (2013.01); *H03H 9/173* (2013.01); *H03H 9/175* (2013.01); *H03H 9/205* (2013.01); *H03H 9/54* (2013.01); *H03H 9/568* (2013.01); *H03H 2003/021* (2013.01); *H03H 2009/02165* (2013.01)

(58) Field of Classification Search
CPC .......... H03H 9/568; H03H 9/605; H03H 3/02; H03H 9/02102; H03H 9/13; H03H 9/205; H03H 9/173; H03H 9/0207; H03H 9/174; H03H 9/54; H03H 9/02015; H03H 9/589; H03H 9/17; H03H 9/02157; H03H 9/131; H03H 2003/0428; H03H 2009/02165; H03H 2003/021

See application file for complete search history.

(56) References Cited

U.S. PATENT DOCUMENTS

| | | | |
|---|---|---|---|
| 5,945,770 A | 8/1999 | Hanafy | |
| 6,483,404 B1 * | 11/2002 | Ammar | H01P 1/20372 333/204 |
| 6,927,651 B2 | 8/2005 | Larson, III et al. | |
| 6,975,183 B2 | 12/2005 | Aigner et al. | |
| 7,385,334 B1 | 6/2008 | Olsson et al. | |
| 7,964,144 B1 | 6/2011 | Nordin et al. | |
| 8,346,482 B2 | 1/2013 | Fernandez | |
| 8,673,121 B2 | 3/2014 | Larson, III et al. | |
| 8,796,904 B2 | 8/2014 | Burak et al. | |
| 9,065,421 B2 | 6/2015 | Feng et al. | |
| 9,243,316 B2 | 1/2016 | Larson, III et al. | |
| 9,401,692 B2 | 7/2016 | Burak et al. | |
| 9,679,765 B2 | 6/2017 | Larson, III et al. | |
| 10,727,809 B2 * | 7/2020 | Sadhu | H03H 9/175 |
| 2002/0093398 A1 | 7/2002 | Ella et al. | |
| 2002/0121945 A1 | 9/2002 | Ruby et al. | |
| 2003/0030170 A1 * | 2/2003 | Abe | A61L 27/12 264/113 |
| 2004/0140869 A1 | 7/2004 | Marksteiner et al. | |
| 2004/0195937 A1 | 10/2004 | Matsubara et al. | |
| 2004/0233019 A1 | 11/2004 | Inoue et al. | |
| 2004/0183400 A1 | 12/2004 | Aigner et al. | |
| 2005/0012568 A1 * | 1/2005 | Aigner | H03H 9/174 333/187 |
| 2005/0070232 A1 | 3/2005 | Mages | |
| 2005/0148065 A1 | 7/2005 | Zhang et al. | |
| 2006/0094374 A1 | 5/2006 | Olip | |
| 2006/0119230 A1 | 6/2006 | Umead et al. | |
| 2006/0197411 A1 | 9/2006 | Hoen et al. | |
| 2006/0287195 A1 | 12/2006 | Jerome et al. | |
| 2007/0120625 A1 | 5/2007 | Larson et al. | |
| 2007/0191055 A1 | 8/2007 | Kovacs et al. | |
| 2007/0210349 A1 | 9/2007 | Iimura et al. | |
| 2007/0222336 A1 | 9/2007 | Grannen et al. | |
| 2007/0296513 A1 | 12/2007 | Ruile et al. | |
| 2009/0017326 A1 * | 1/2009 | Barber | H03H 9/175 427/404 |
| 2009/0045704 A1 | 2/2009 | Barber et al. | |
| 2009/0096550 A1 | 4/2009 | Handtmann et al. | |
| 2009/0256740 A1 | 10/2009 | Teshirogi et al. | |
| 2010/0073106 A1 | 3/2010 | Stuebing et al. | |
| 2010/0167416 A1 | 7/2010 | Kaliban et al. | |
| 2010/0327701 A1 | 12/2010 | Grannen et al. | |
| 2011/0043081 A1 | 2/2011 | Safari et al. | |
| 2011/0121689 A1 | 5/2011 | Grannen et al. | |
| 2011/0121916 A1 | 5/2011 | Barbet et al. | |
| 2011/0309899 A1 | 12/2011 | Leiba et al. | |
| 2012/0051976 A1 | 3/2012 | Lu et al. | |
| 2012/0293278 A1 | 3/2012 | Ueda et al. | |
| 2012/0096697 A1 | 4/2012 | Grannen et al. | |
| 2012/0154074 A1 | 4/2012 | Ruby et al. | |
| 2012/0319530 A1 | 5/2012 | Grazzi et al. | |
| 2012/0161902 A1 | 6/2012 | Feng et al. | |
| 2012/0201174 A1 | 8/2012 | Jian et al. | |
| 2012/0218057 A1 | 8/2012 | Burak et al. | |
| 2012/0218058 A1 | 8/2012 | Burak et al. | |
| 2012/0218059 A1 | 8/2012 | Burak et al. | |
| 2012/0218060 A1 | 8/2012 | Burak et al. | |
| 2012/0248941 A1 | 10/2012 | Saito et al. | |
| 2012/0280767 A1 | 11/2012 | Burak et al. | |
| 2012/0319534 A1 | 12/2012 | Shiwakawa et al. | |
| 2013/0038408 A1 | 2/2013 | Burak et al. | |
| 2013/0063226 A1 | 3/2013 | Burak et al. | |
| 2013/0063227 A1 | 3/2013 | Burak et al. | |
| 2013/0092547 A1 | 4/2013 | Li et al. | |
| 2013/0106248 A1 | 5/2013 | Burak et al. | |
| 2013/0106534 A1 | 5/2013 | Burak et al. | |
| 2013/0193808 A1 | 8/2013 | Feng et al. | |
| 2013/0314177 A1 | 11/2013 | Burak et al. | |
| 2014/0111288 A1 | 4/2014 | Nikkel et al. | |
| 2014/0118087 A1 | 5/2014 | Burak et al. | |
| 2014/0118088 A1 | 5/2014 | Burak et al. | |
| 2014/0118089 A1 | 5/2014 | Bradley et al. | |
| 2014/0118090 A1 | 5/2014 | Grannen et al. | |
| 2014/0118091 A1 | 5/2014 | Burak et al. | |
| 2014/0118092 A1 | 5/2014 | Burak et al. | |
| 2014/0125202 A1 | 5/2014 | Choy et al. | |
| 2014/0125203 A1 | 5/2014 | Choy et al. | |
| 2014/0132117 A1 | 5/2014 | Ella et al. | |
| 2014/0137815 A1 | 5/2014 | Bi et al. | |
| 2014/0152152 A1 | 6/2014 | Burak et al. | |
| 2014/0154697 A1 | 6/2014 | Johal et al. | |
| 2014/0159548 A1 | 6/2014 | Burak et al. | |
| 2014/0174908 A1 | 6/2014 | Feng et al. | |
| 2014/0175950 A1 | 6/2014 | Zou et al. | |
| 2014/0176261 A1 | 6/2014 | Burak et al. | |
| 2014/0193830 A1 | 7/2014 | Schimidt et al. | |
| 2014/0225682 A1 | 8/2014 | Burak et al. | |
| 2014/0225683 A1 | 8/2014 | Burak et al. | |
| 2014/0232486 A1 | 8/2014 | Burak | |
| 2014/0246305 A1 | 9/2014 | Larson, III | |
| 2014/0340172 A1 | 11/2014 | Bradley et al. | |
| 2014/0354109 A1 | 12/2014 | Grannen et al. | |
| 2014/0354115 A1 | 12/2014 | Burak et al. | |
| 2015/0133339 A1 | 5/2015 | Prindle | |
| 2015/0240349 A1 | 8/2015 | Grannen | |
| 2015/0244346 A1 | 8/2015 | Feng et al. | |
| 2015/0244347 A1 | 8/2015 | Lv et al. | |
| 2015/0270826 A1 | 9/2015 | Burak | |
| 2015/0280100 A1 | 10/2015 | Burak et al. | |
| 2015/0280687 A1 | 10/2015 | Burak et al. | |
| 2015/0308996 A1 | 10/2015 | Kim et al. | |
| 2015/0311046 A1 | 10/2015 | Yeh et al. | |
| 2015/0318461 A1 | 11/2015 | Jacobsen et al. | |
| 2015/0318837 A1 | 11/2015 | Zou et al. | |
| 2015/0326200 A1 | 11/2015 | Grannen et al. | |
| 2015/0341015 A1 | 11/2015 | Grannen et al. | |

(56) References Cited

U.S. PATENT DOCUMENTS

| | | |
|---|---|---|
| 2015/0349743 A1 | 12/2015 | Burak et al. |
| 2015/0349747 A1 | 12/2015 | Burak et al. |
| 2015/0377834 A1 | 12/2015 | Salvati et al. |
| 2016/0007893 A1 | 1/2016 | Roberts |
| 2016/0079958 A1 | 3/2016 | Burak |
| 2016/0087187 A1 | 3/2016 | Burak |
| 2016/0118957 A1 | 4/2016 | Burak et al. |
| 2016/0118958 A1 | 4/2016 | Burak |
| 2016/0126930 A1 | 5/2016 | Giovannini |
| 2016/0182011 A1 | 6/2016 | Burak et al. |
| 2016/0087186 A1 | 7/2016 | Sam |
| 2016/0301437 A1 | 10/2016 | Pehlke |
| 2016/0308509 A1 | 10/2016 | Burak et al. |
| 2016/0349088 A1 | 12/2016 | Patels |
| 2017/0026029 A1* | 1/2017 | Bahai ............... H03H 9/205 |
| 2017/0047907 A1 | 2/2017 | Burak et al. |
| 2017/0063339 A1 | 3/2017 | Burak et al. |
| 2017/0117871 A1 | 4/2017 | Rivas et al. |
| 2017/0120242 A1 | 5/2017 | Rivas |
| 2017/0122911 A1 | 5/2017 | McCarran et al. |
| 2017/0122936 A1 | 5/2017 | Rivas et al. |
| 2017/0134001 A1 | 5/2017 | Belsick et al. |
| 2017/0134002 A1 | 5/2017 | Rivas et al. |
| 2017/0168017 A1 | 6/2017 | Rivas et al. |
| 2017/0168018 A1 | 6/2017 | Morton et al. |
| 2017/0214387 A1 | 7/2017 | Burak et al. |
| 2017/0227497 A1 | 8/2017 | Rivas et al. |
| 2017/0261503 A1 | 9/2017 | Murdock et al. |
| 2017/0276670 A1 | 9/2017 | Salvati et al. |
| 2017/0288121 A1 | 10/2017 | Burak et al. |
| 2017/0288628 A1 | 10/2017 | Grannen et al. |
| 2017/0292950 A1 | 10/2017 | Grinsven |
| 2017/0301992 A1* | 10/2017 | Khlat ............... H04B 11/00 |
| 2017/0310304 A1 | 10/2017 | Burak et al. |
| 2017/0347925 A1 | 10/2017 | Burak et al. |
| 2018/0034438 A1 | 2/2018 | Ryder et al. |
| 2018/0085787 A1 | 3/2018 | Burak et al. |
| 2018/0097499 A1 | 4/2018 | Rinaldi et al. |
| 2018/0138892 A1 | 5/2018 | Caron |
| 2018/0138893 A1 | 5/2018 | Caron |
| 2018/0204996 A1 | 7/2018 | Zou et al. |
| 2018/0309425 A1 | 10/2018 | Shealy et al. |
| 2019/0081192 A1 | 3/2019 | Horng et al. |
| 2019/0103853 A1 | 4/2019 | Burak et al. |
| 2019/0152995 A1 | 6/2019 | Ram et al. |
| 2019/0187105 A1 | 6/2019 | Ram et al. |
| 2019/0234907 A1 | 8/2019 | Edwards et al. |
| 2019/0250198 A1 | 8/2019 | Kenumba et al. |
| 2019/0256806 A1 | 8/2019 | Nietfeld |
| 2020/0028484 A1* | 1/2020 | Lan ............... H03H 9/176 |
| 2020/0099359 A1* | 3/2020 | Shin ............... H03H 9/173 |
| 2020/0124625 A1 | 4/2020 | Dunlop et al. |

FOREIGN PATENT DOCUMENTS

| | | |
|---|---|---|
| WO | 2018111532 A1 | 6/2018 |
| WO | WO 2021/021719 | 2/2021 |
| WO | WO 2021/021723 | 2/2021 |
| WO | WO 2021/021730 | 2/2021 |
| WO | WO 2021/021732 | 2/2021 |
| WO | WO 2021/021736 | 2/2021 |
| WO | WO 2021/021739 | 2/2021 |
| WO | WO 2021/021743 | 2/2021 |
| WO | WO 2021/021745 | 2/2021 |
| WO | WO 2021/021747 | 2/2021 |
| WO | WO 2021/021748 | 2/2021 |

OTHER PUBLICATIONS

International Search Report and Written Opinion for PCT/US2020/043720 mailed Oct. 20, 2020.
International Search Report and Written Opinion for PCT/US2020/043740 mailed Oct. 28, 2020.
International Search Report and Written Opinion for PCT/US2020/043746 mailed Oct. 28, 2020.
International Search Report and Written Opinion for PCT/US2020/043752 mailed Oct. 27, 2020.
International Search Report and Written Opinion for PCT/US2020/043762 mailed Oct. 21, 2020.
International Search Report and Written Opinion for PCT/US2020/043760 mailed Dec. 17, 2020.
International Search Report and Written Opinion for PCT/US2020/043733 mailed Dec. 17, 2020.
International Search Report and Written Opinion for PCT/US2020/043755 mailed Dec. 18, 2020.
International Search Report and Written Opinion for PCT/US2020/043730 mailed Feb. 1, 2021.
Moyer, "The Search for 5G MmWave Filters", https://semiengineering.com/the-search-for-5g-mmwave-filters, Aug. 12, 2021.
Enlund et al., "Solidly mounted thin film electro-acoustic resonator utilizing a conductive Bragg reflector", Department Solid State Electronics, Angstrom Lab, Uppsala University, Sep. 14, 2007.
European Search Report for EP Patent Application No. 20846873.6, dated Aug. 12, 2023.
Guiducci et al., "How to evolve regulation with technologies for the effective spectrum management", 2018 IEEE 29th Annual International Symposium on Personal, Indoor, and Mobile Radio Communications, pp. 795-799.
Mediatek, "5GNR A new era for enhanced mobile broadband—white paper", www.mediatek.com/page/MediaTek-5G-NR-White-Paper-PDF5GNRWP.PDF, retrieved on Jun. 6, 2018.
European Search Report for EP Patent Application No. 20847975.8, dated Jul. 28, 2023.
European Search Report for EP Patent Application No. 20848167.1, mailed Jul. 28, 2023.
European Search Report for EP Patent Application No. 20847470.0, mailed Aug. 2, 2023.
Bi F Z et al: "Bulk acoustic wave RF technology", IEEE Microwave Magazine, vol. 9, No. 5, 1 Oct. 1, 2008.

* cited by examiner

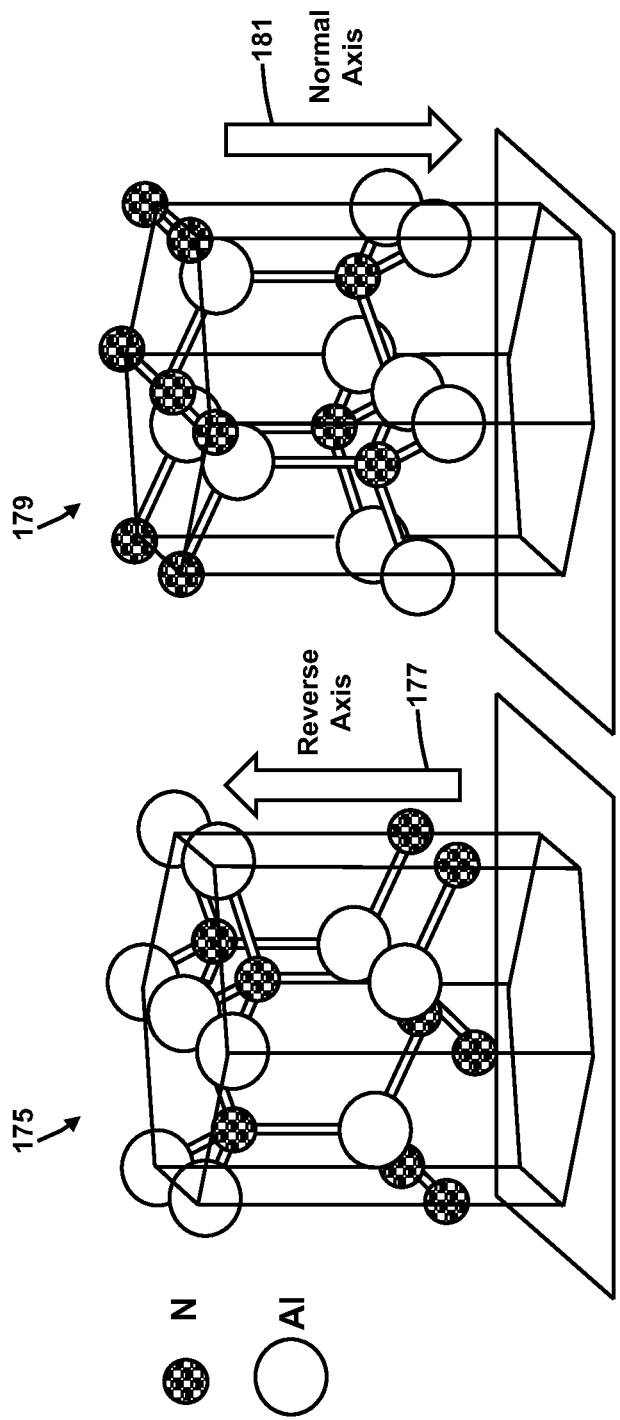

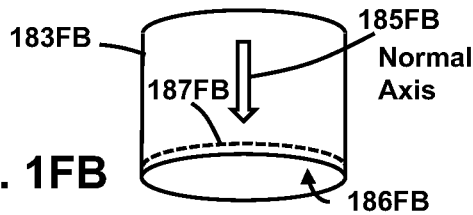
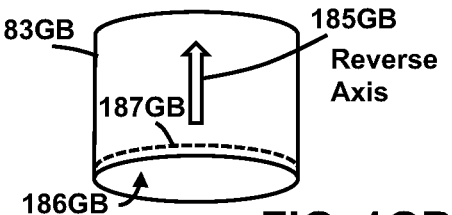
FIG. 1FB FIG. 1GB
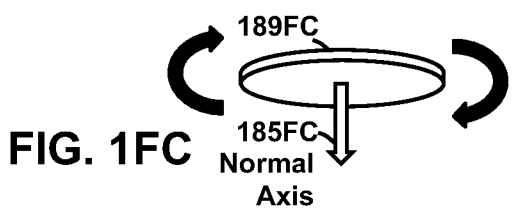
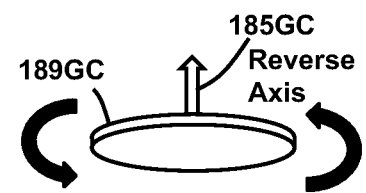
FIG. 1FC FIG. 1GC
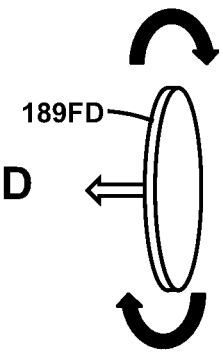
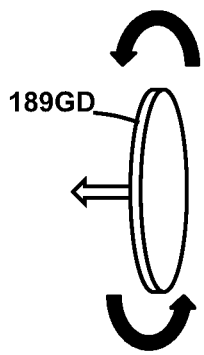
FIG. 1FD FIG. 1GD
FIG. 1FE FIG. 1GE
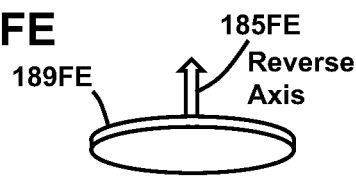
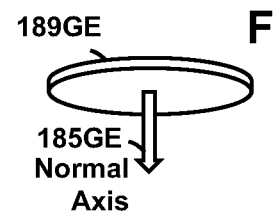
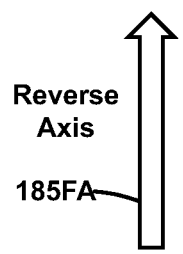
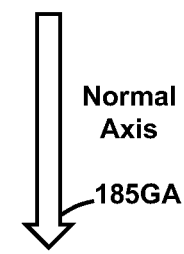
FIG. 1FA FIG. 1GA

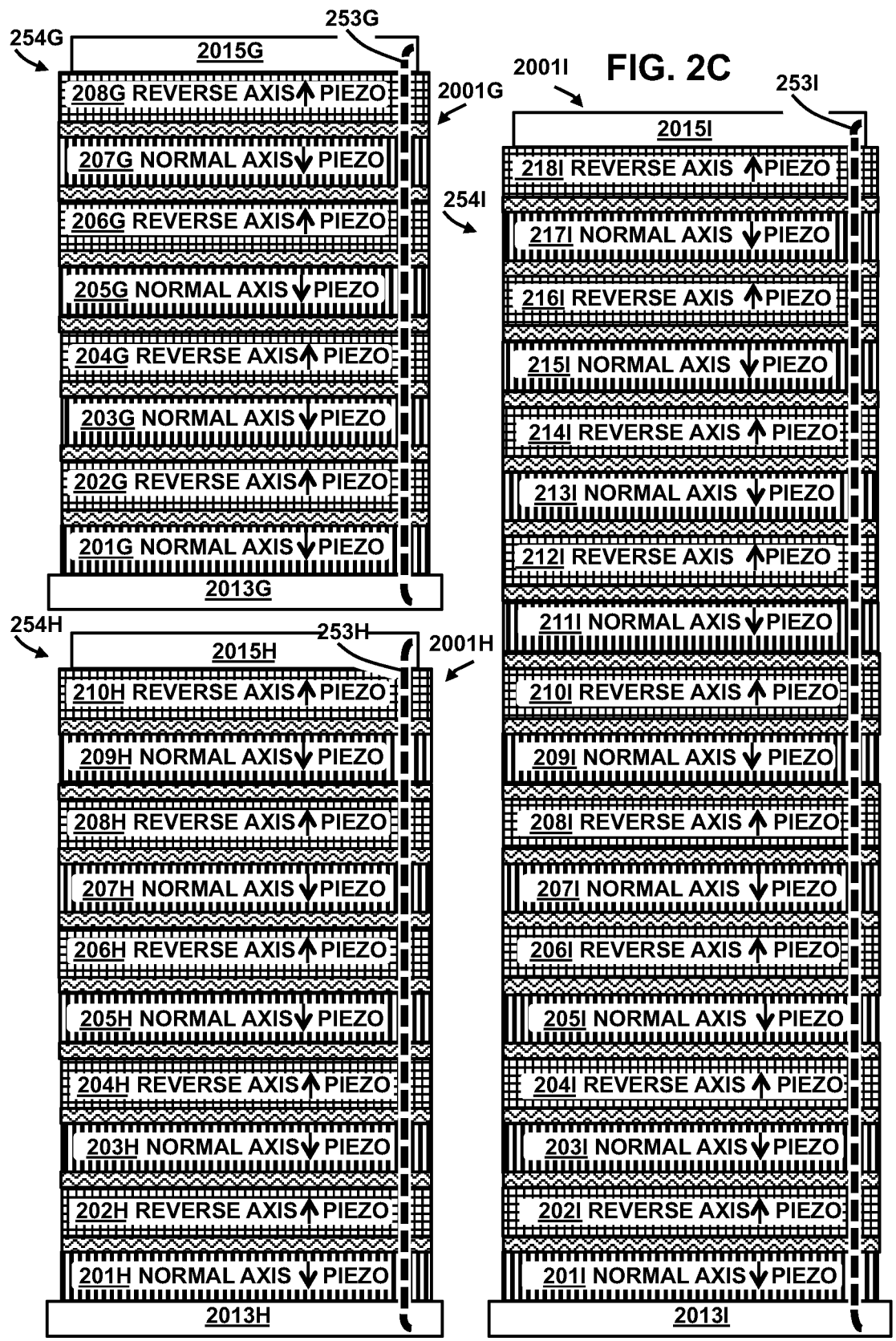

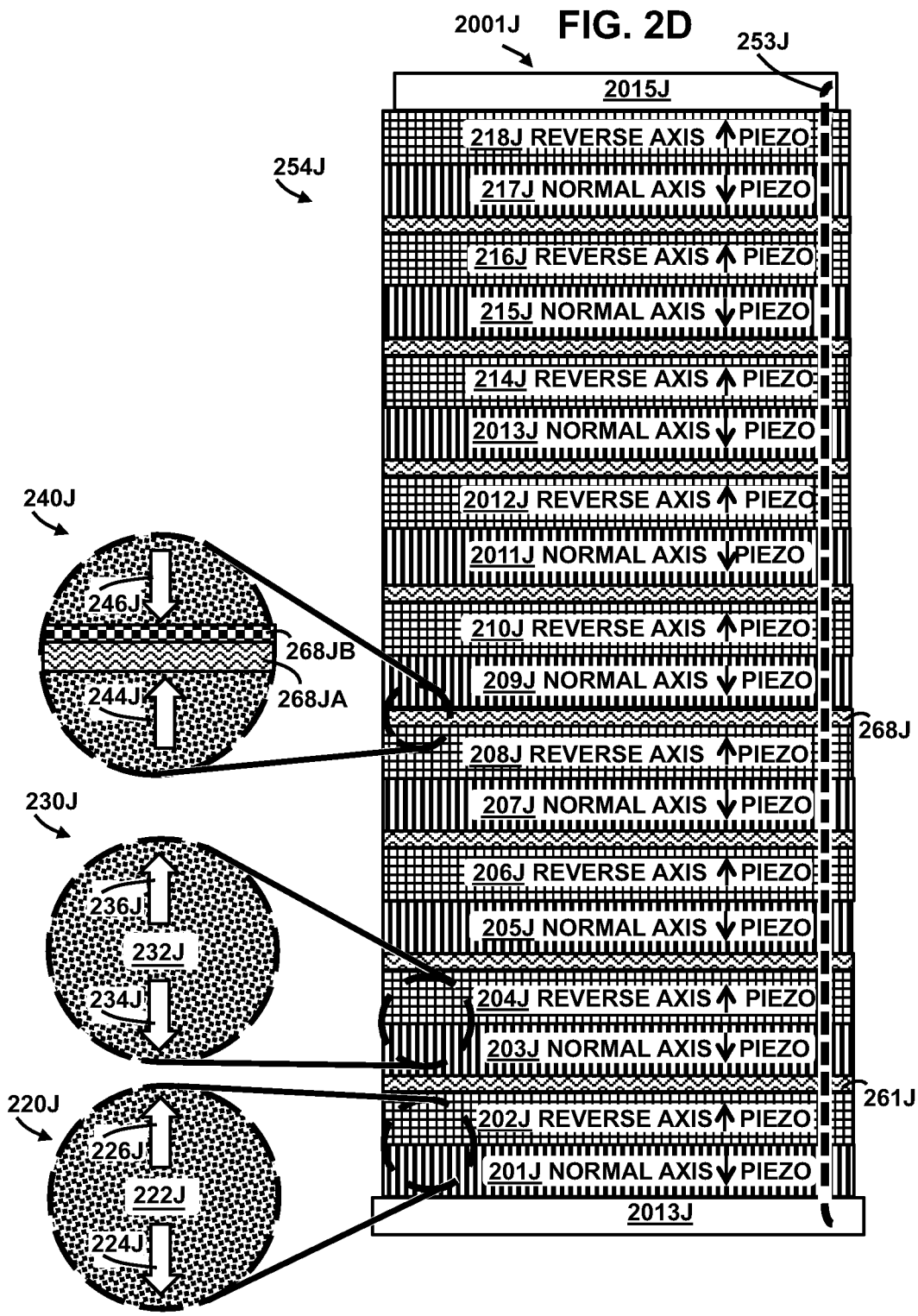

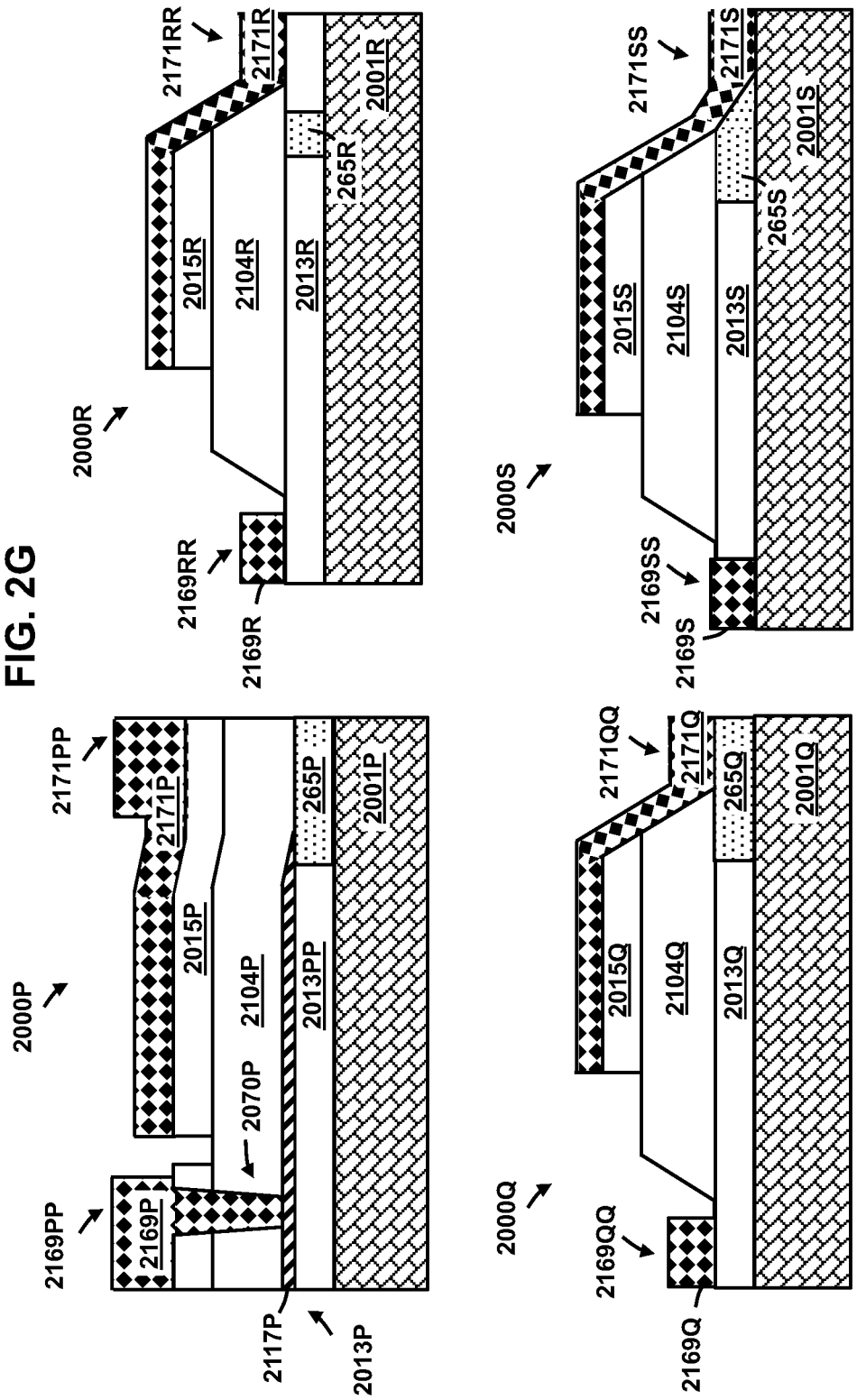

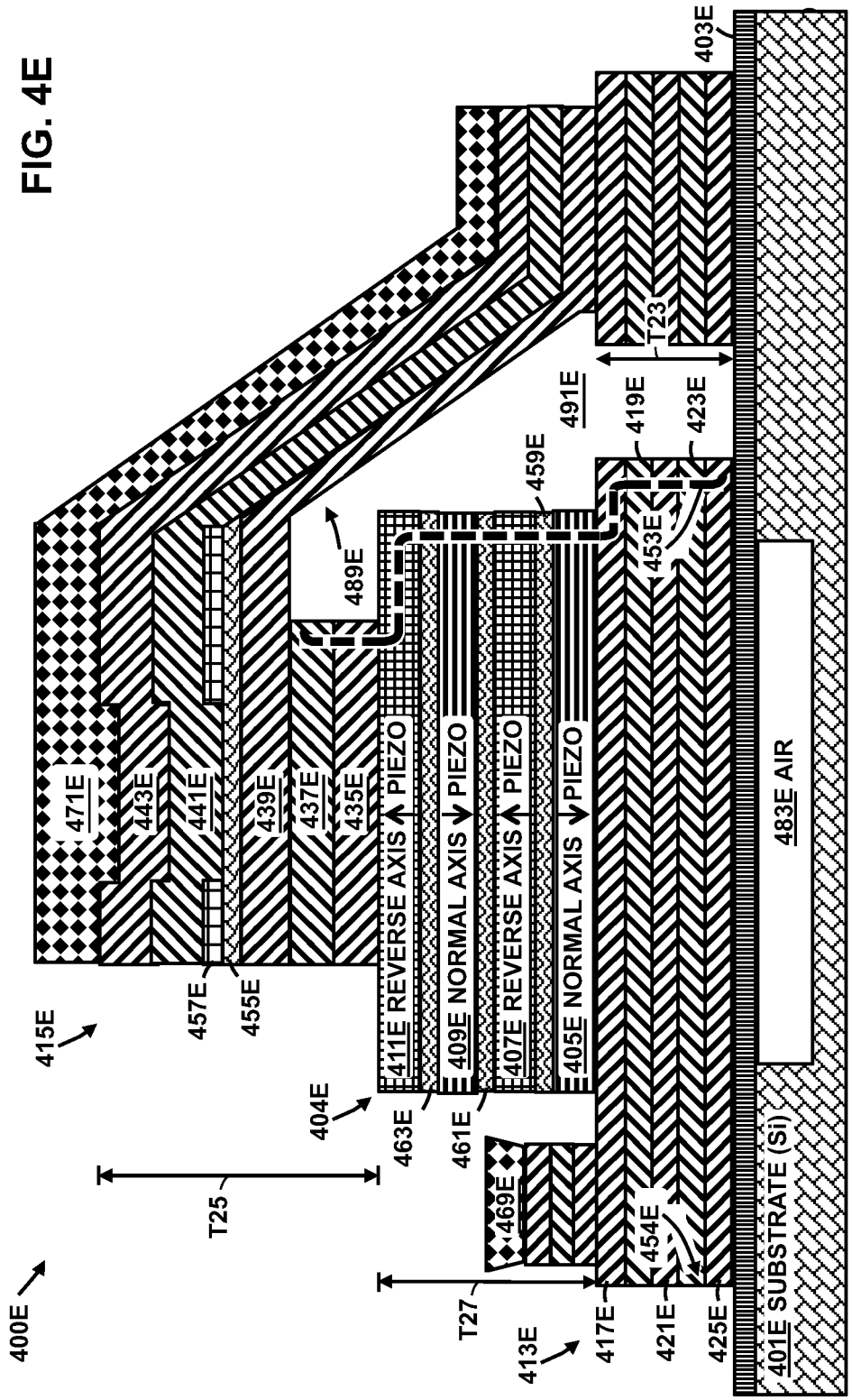

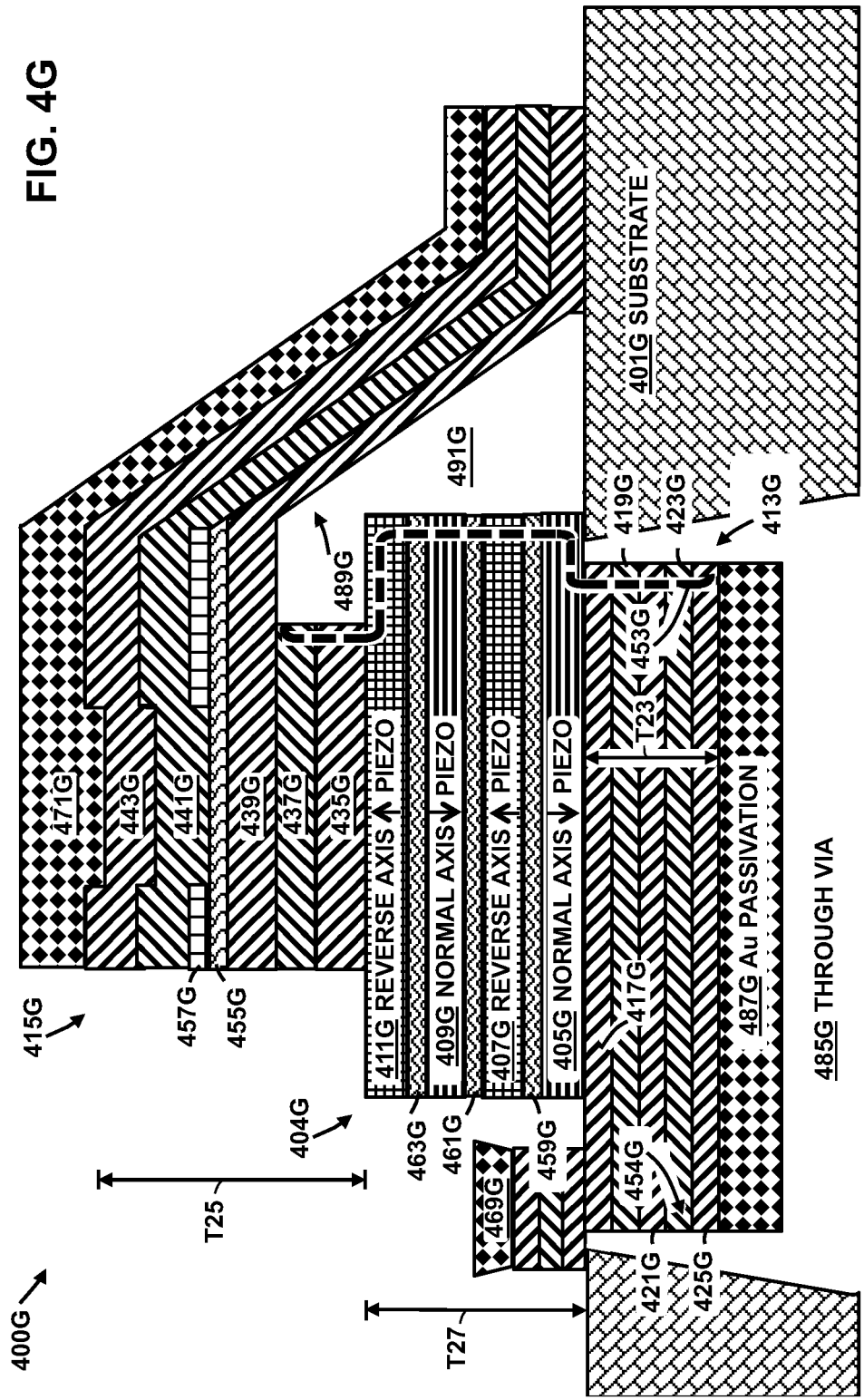

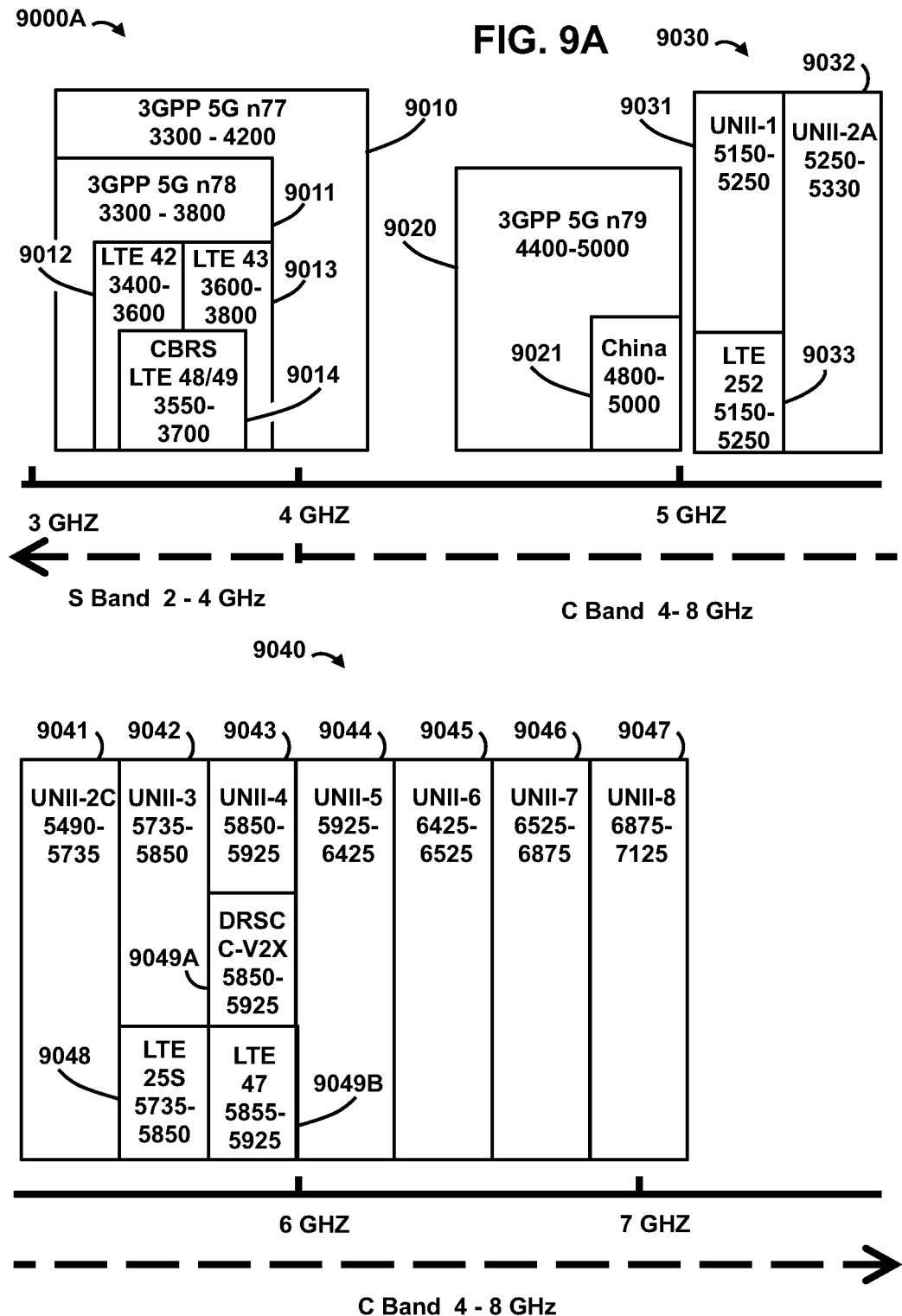

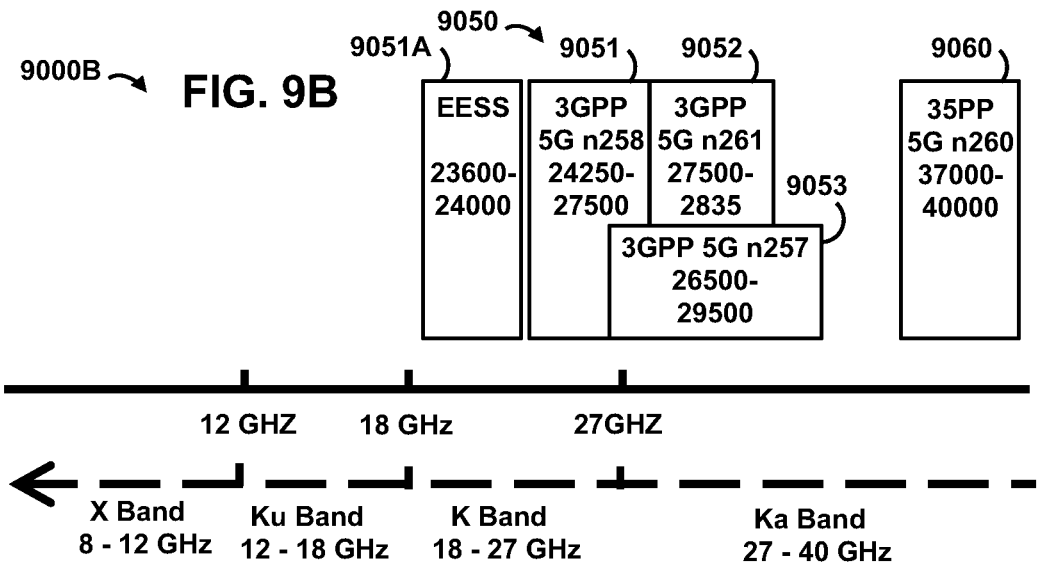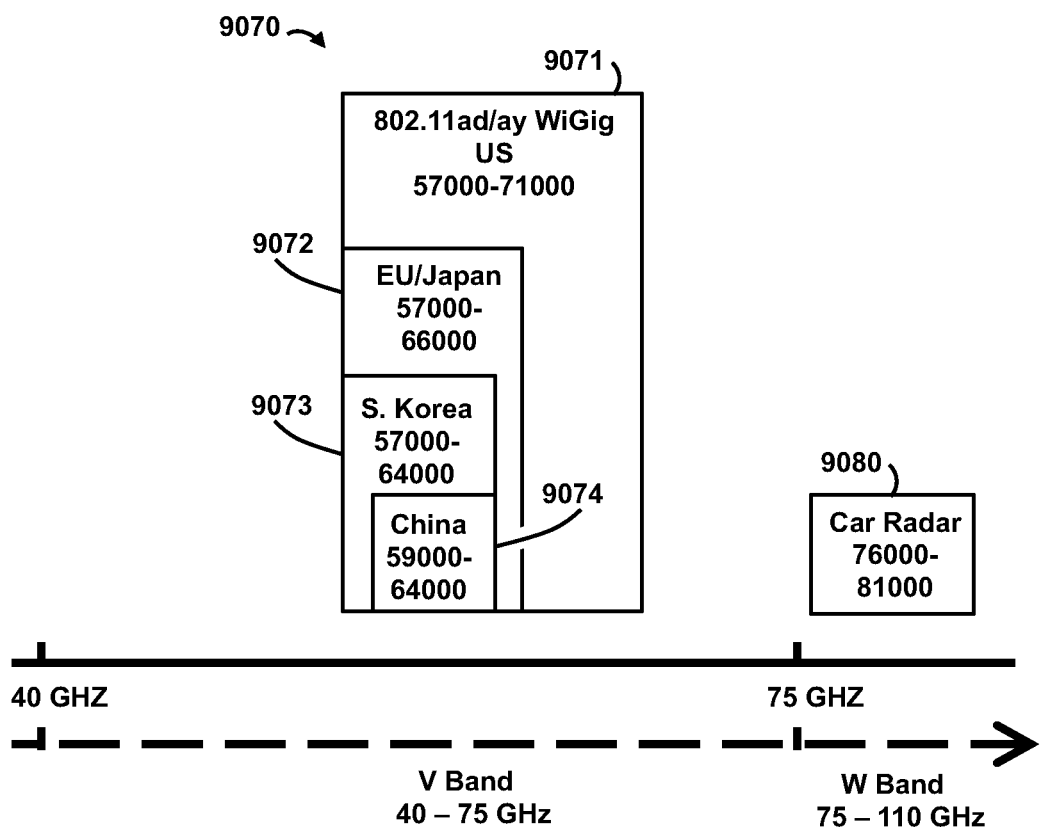

ACOUSTIC DEVICES STRUCTURES, FILTERS AND SYSTEMS

PRIORITY CLAIM

This application is a continuation of PCT Application No. PCTUS2020043755 filed Jul. 27, 2020, titled "ACOUSTIC DEVICE STRUCTURES, FILTERS AND SYSTEMS", which claims priority to the following provisional patent applications:

U.S. Provisional Patent Application Ser. No. 62/881,061, entitled "BULK ACOUSTIC WAVE (BAW) RESONATOR STRUCTURES, DEVICES AND SYSTEMS" and filed on Jul. 31, 2019;

U.S. Provisional Patent Application Ser. No. 62/881,074, entitled "ACOUSTIC DEVICE STRUCTURES, DEVICES AND SYSTEMS" and filed on Jul. 31, 2019;

U.S. Provisional Patent Application Ser. No. 62/881,077, entitled "DOPED BULK ACOUSTIC WAVE (BAW) RESONATOR STRUCTURES, DEVICES AND SYSTEMS" and filed on Jul. 31, 2019;

U.S. Provisional Patent Application Ser. No. 62/881,085, entitled "BULK ACOUSTIC WAVE (BAW) RESONATOR WITH PATTERNED LAYER STRUCTURES, DEVICES AND SYSTEMS" and filed on Jul. 31, 2019;

U.S. Provisional Patent Application Ser. No. 62/881,087, entitled "BULK ACOUSTIC WAVE (BAW) REFLECTOR AND RESONATOR STRUCTURES, DEVICES AND SYSTEMS" and filed on Jul. 31, 2019;

U.S. Provisional Patent Application Ser. No. 62/881,091, entitled "MASS LOADED BULK ACOUSTIC WAVE (BAW) RESONATOR STRUCTURES, DEVICES AND SYSTEMS" and filed on Jul. 31, 2019; and U.S. Provisional Patent Application Ser. No. 62/881,094, entitled "TEMPERATURE COMPENSATING BULK ACOUSTIC WAVE (BAW) RESONATOR STRUCTURES, DEVICES AND SYSTEMS" and filed on Jul. 31, 2019.

Each of the applications identified above are hereby incorporated by reference in their entirety.

TECHNICAL FIELD

The present disclosure relates to acoustic resonators and to devices and to systems comprising acoustic resonators.

BACKGROUND

Acoustic devices have enjoyed commercial success in filter applications. For example, 4G cellular phones that operate on fourth generation broadband cellular networks typically include a large number of Bulk Acoustic Wave (BAW) filters for various different frequency bands of the 4G network. In addition to BAW resonators and filters, also included in 4G phones are filters using Surface Acoustic Wave (SAW) resonators, typically for lower frequency band filters. SAW based resonators and filters are generally easier to fabricate than BAW based filters and resonators. However, performance of SAW based resonators and filters may decline if attempts are made to use them for higher 4G frequency bands. Accordingly, even though BAW based filters and resonators are relatively more difficult to fabricate than SAW based filters and resonators, they may be included in 4G cellular phones to provide better performance in higher 4G frequency bands what is provided by SAW based filters and resonators.

5G cellular phones may operate on newer, fifth generation broadband cellular networks. 5G frequencies include some frequencies that are much higher frequency than 4G frequencies. Such relatively higher 5G frequencies may transport data at relatively faster speeds than what may be provided over relatively lower 4G frequencies. However, previously known SAW and BAW based resonators and filters have encountered performance problems when attempts were made to use them at relatively higher 5G frequencies. Many learned engineering scholars have studied these problems, but have not found solutions. For example, performance problems cited for previously known SAW and BAW based resonators and filters include scaling issues and significant increases in acoustic losses at high frequencies.

From the above, it is seen that techniques for improving acoustic device structures are highly desirable, for example for operation over frequencies higher than 4G frequencies, in particular for filters and systems that may include such devices.

BRIEF DESCRIPTION OF THE DRAWINGS

FIG. 1D is a perspective view of an illustrative model of a crystal structure of MN having reverse axis orientation of negative polarization, for use in some example embodiments of the piezoelectric material layers of FIG. 1A.

FIG. 1E is a perspective view of an illustrative model of a crystal structure of MN having normal axis orientation of positive polarization, for use in some example embodiments of the piezoelectric material layers of FIG. 1A.

FIG. 1FA is an illustrative diagram of trigonal Lithium Niobate or Lithium Tantalate having reverse axis orientation of negative polarization, for use in some alternative example embodiments of the piezoelectric material layers of FIG. 1A.

FIGS. 1FB through 1FE are a series of illustrative diagrams showing splitting a normal axis donor wafer to produce a trigonal Lithium Niobate or Lithium Tantalate layer having the normal axis orientation of positive polarization, and showing layer rotation to produce a trigonal Lithium Niobate or Lithium Tantalate layer having reverse axis orientation of negative polarization relative to the normal axis donor wafer.

FIG. 1GA is an illustrative diagram of trigonal Lithium Niobate or Lithium Tantalate having normal axis orientation of positive polarization, for use in some alternative example embodiments of the piezoelectric material layers of FIG. 1A.

FIGS. 1GB through 1GE is a series of illustrative diagrams showing splitting a reverse axis donor wafer to produce a trigonal Lithium Niobate or Lithium Tantalate layer having the reverse axis orientation of negative polarization, and showing layer rotation to produce a trigonal Lithium Niobate or Lithium Tantalate layer having normal axis orientation of positive polarization relative to the reverse axis donor wafer.

FIG. 2C shows additional alternative bulk acoustic wave resonator structures with additional numbers of alternating axis piezoelectric layers.

FIGS. 2D and 2E show more additional alternative bulk acoustic wave resonator structures.

FIGS. 2F and 2G show additional Bulk Acoustic Wave (BAW) resonator examples including passivation, planarization and even-level electrical interconnect areas.

FIGS. 4A through 4G show alternative example bulk acoustic wave resonators to the example bulk acoustic wave resonator structures shown in FIG. 1A.

FIGS. 9A and 9B are simplified diagrams of a frequency spectrum illustrating application frequencies and application frequency bands of the example bulk acoustic wave resonators shown in FIG. 1A and FIGS. 4A through 4G, and the example filters shown in FIGS. 5 through 7.

DETAILED DESCRIPTION

Figure 1A:
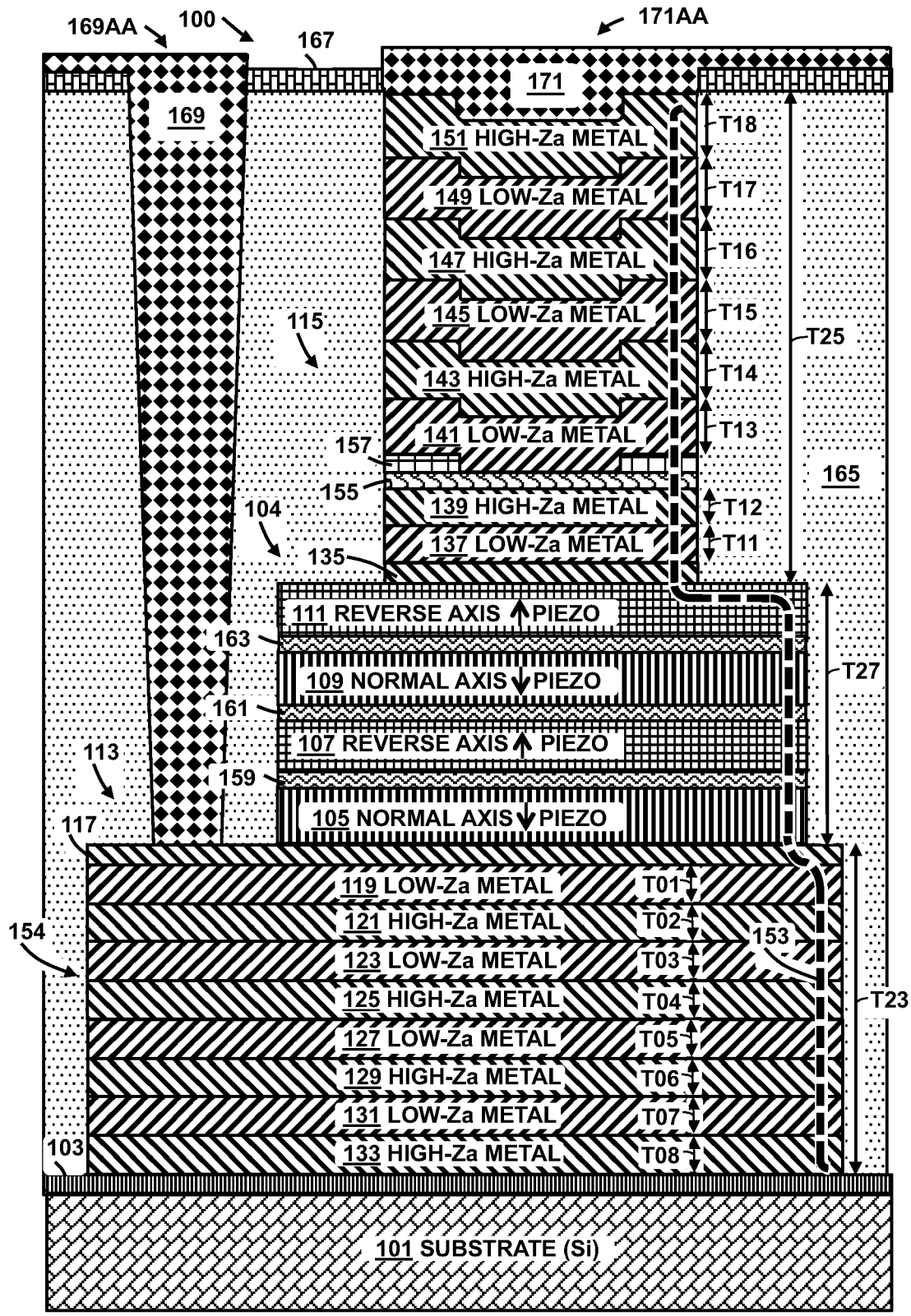
FIG. 1A is a diagram that illustrates an example bulk acoustic wave resonator structure.

Non-limiting embodiments will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment shown where illustration is not necessary to allow understanding by those of ordinary skill in the art. In the specification, as well as in the claims, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element. The term "compensating" is to be understood as including "substantially compensating". The terms "oppose", "opposes" and "opposing" are to be understood as including "substantially oppose", "substantially opposes" and "substantially opposing" respectively. Further, as used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As used in the specification and the appended claims and in addition to its ordinary meaning, the term "approximately" or "about" means to within an acceptable limit or amount to one of ordinary skill in the art. For example, "approximately the same" means that one of ordinary skill in the art would consider the items being compared to be the same. As used in the specification and appended claims, the terms "a", "an"

and "the" include both singular and plural referents, unless the context clearly dictates otherwise. Thus, for example, "a device" includes one device and plural devices. As used herein, the International Telecommunication Union (ITU) defines Super High Frequency (SHF) as extending between three Gigahertz (3 GHz) and thirty Gigahertz (30 GHz). The ITU defines Extremely High Frequency (EHF) as extending between thirty Gigahertz (30 GHz) and three hundred Gigahertz (300 GHz).

FIG. 1A is a diagram that illustrates an example bulk acoustic wave resonator structure 100. FIGS. 4A through 4G show alternative example bulk acoustic wave resonators, 400A through 400G, to the example bulk acoustic wave resonator structure 100 shown in FIG. 1A. The foregoing are shown in simplified cross sectional views. The resonator structures are formed over a substrate 101, 401A through 401G (e.g., silicon substrate 101, 401A, 401B, 401D through 401F, e.g., silicon carbide substrate 401C. In some examples, the substrate may further comprise a seed layer 103, 403A, 403B, 403D through 403F, formed of, for example, aluminum nitride (AlN), or another suitable material (e.g., silicon dioxide ($SiO_2$), aluminum oxide ($Al_2O_3$), silicon nitride ($Si_3N_4$), amorphous silicon (a-Si), silicon carbide (SiC)), having an example thickness in a range from approximately 100 A to approximately 1 um on the silicon substrate. In some other examples, the seed layer 103, 403A, 403B, 403D through 403F, may also be at least partially formed of electrical conductivity enhancing material such as Aluminum (Al) or Gold (Au).

The example resonators 100, 400A through 400G, include a respective stack 104, 404A through 404G, of an example four layers of piezoelectric material, for example, four layers of Aluminum Nitride (AlN) having a wurtzite structure, or for example, four layers of Lithium Niobate (LN) or Lithium Tantalate, e.g., having a trigonal structure. For example, FIG. 1A and FIGS. 4A through 4G show a bottom piezoelectric layer 105, 405A through 405G, a first middle piezoelectric layer 107, 407A through 407G, a second middle piezoelectric layer 109, 409A through 409G, and a top piezoelectric layer 111, 411A through 411G. A mesa structure 104, 404A through 404G (e.g., first mesa structure 104, 404A through 404G) may comprise the respective stack 104, 404A through 404G, of the example four layers of piezoelectric material. The mesa structure 104, 404A through 404G (e.g., first mesa structure 104, 404A through 404G) may comprise bottom piezoelectric layer 105, 405A through 405G. The mesa structure 104, 404A through 404G (e.g., first mesa structure 104, 404A through 404G) may comprise first middle piezoelectric layer 107, 407A through 407G. The mesa structure 104, 404A through 404G (e.g., first mesa structure 104, 404A through 404G) may comprise second middle piezoelectric layer 109, 409A through 409G. The mesa structure 104, 404A through 404G (e.g., first mesa structure 104, 404A through 404G) may comprise top piezoelectric layer 111, 411A through 411G.

The four layers of piezoelectric material in the respective stack 104, 404A through 404G of FIG. 1A and FIGS. 4A through 4G may have an alternating axis arrangement in the respective stack 104, 404A through 404G. For example the bottom piezoelectric layer 105, 405A through 405G may have a normal axis orientation, which is depicted in the figures using a downward directed arrow. Next in the alternating axis arrangement of the respective stack 104, 404A through 404G, the first middle piezoelectric layer 107, 407A through 407G may have a reverse axis orientation, which is depicted in the figures using an upward directed arrow. Next in the alternating axis arrangement of the respective stack 104, 404A through 404G, the second middle piezoelectric layer 109, 409A through 409G may have the normal axis orientation, which is depicted in the figures using the downward directed arrow. Next in the alternating axis arrangement of the respective stack 104, 404A through 404G, the top piezoelectric layer 111, 411A through 411G may have the reverse axis orientation, which is depicted in the figures using the upward directed arrow.

For example, polycrystalline thin film MN may be grown in a crystallographic c-axis negative polarization, or normal axis orientation perpendicular relative to the substrate surface using reactive magnetron sputtering of an Aluminum target in a nitrogen atmosphere. However, as will be discussed in greater detail subsequently herein, changing sputtering conditions, for example by adding oxygen, may reverse the axis to a crystallographic c-axis positive polarization, or reverse axis, orientation perpendicular relative to the substrate surface.

In the example resonators 100, 400A through 400G, of FIG. 1A and FIGS. 4A through 4G, the bottom piezoelectric layer 105, 405A through 405G, may have a piezoelectrically excitable resonance mode (e.g., main resonance mode) at a resonant frequency (e.g., main resonant frequency) of the example resonators. Similarly, the first middle piezoelectric layer 107, 407A through 407G, may have its piezoelectrically excitable resonance mode (e.g., main resonance mode) at the resonant frequency (e.g., main resonant frequency) of the example resonators. Similarly, the second middle piezoelectric layer 109, 409A through 409G, may have its piezoelectrically excitable resonance mode (e.g., main resonance mode) at the resonant frequency (e.g., main resonant frequency) of the example resonators. Similarly, the top piezoelectric layer 111, 411A through 411G, may have its piezoelectrically excitable main resonance mode (e.g., main resonance mode) at the resonant frequency (e.g., main resonant frequency) of the example resonators. Accordingly, the top piezoelectric layer 111, 411A through 411G, may have its piezoelectrically excitable main resonance mode (e.g., main resonance mode) at the resonant frequency (e.g., main resonant frequency) with the bottom piezoelectric layer 105, 405A through 405G, the first middle piezoelectric layer 107, 407A through 407G, and the second middle piezoelectric layer 109, 409A through 409G.

The bottom piezoelectric layer 105, 405A through 405G, may be acoustically coupled with the first middle piezoelectric layer 107, 407A through 407G, in the piezoelectrically excitable resonance mode (e.g., main resonance mode) at the resonant frequency (e.g., main resonant frequency) of the example resonators 100, 400A through 400G. The normal axis of bottom piezoelectric layer 105, 405A through 405G, in opposing the reverse axis of the first middle piezoelectric layer 107, 407A through 407G, may cooperate for the piezoelectrically excitable resonance mode (e.g., main resonance mode) at the resonant frequency (e.g., main resonant frequency) of the example resonators. The first middle piezoelectric layer 107, 407A through 407G, may be sandwiched between the bottom piezoelectric layer 105, 405A through 405G, and the second middle piezoelectric layer 109, 409A through 409G, for example, in the alternating axis arrangement in the respective stack 104, 404A through 404G. For example, the reverse axis of the first middle piezoelectric layer 107, 407A through 407G, may oppose the normal axis of the bottom piezoelectric layer 105, 405A through 405G, and the normal axis of the second middle piezoelectric layer 109, 409A-409G. In opposing the normal axis of the bottom piezoelectric layer 105, 405A through 405G, and the normal axis of the second middle piezoelectric layer 109, 409A through 409G, the reverse axis of the first middle piezoelectric layer 107, 407A through 407G, may cooperate for the piezoelectrically excitable resonance mode (e.g., main resonance mode) at the resonant frequency (e.g., main resonant frequency) of the example resonators.

The second middle piezoelectric layer 109, 409A through 409G, may be sandwiched between the first middle piezoelectric layer 107, 407A through 407G, and the top piezoelectric layer 111, 411A through 411G, for example, in the alternating axis arrangement in the respective stack 104, 404A through 404G. For example, the normal axis of the second middle piezoelectric layer 109, 409A through 409G, may oppose the reverse axis of the first middle piezoelectric layer 107, 407A through 407G, and the reverse axis of the top piezoelectric layer 111, 411A through 411G. In opposing the reverse axis of the first middle piezoelectric layer 107, 407A through 407G, and the reverse axis of the top piezoelectric layer 111, 411A through 411G, the normal axis of the second middle piezoelectric layer 109, 409A through 409G, may cooperate for the piezoelectrically excitable resonance mode (e.g., main resonance mode) at the resonant frequency (e.g., main resonant frequency) of the example resonators. Similarly, the alternating axis arrangement of the bottom piezoelectric layer 105, 405A through 405G, and the first middle piezoelectric layer 107, 407A through 407G, and the second middle piezoelectric layer 109, 409A through 409G, and the top piezoelectric layer 111, 411A-411G, in the respective stack 104, 404A through 404G may cooperate for the piezoelectrically excitable resonance mode (e.g., main resonance mode) at the resonant frequency (e.g., main resonant frequency) of the example resonators. Despite differing in their alternating axis arrangement in the respective stack 104, 404A through 404G, the bottom piezoelectric layer 105, 405A through 405G and the first middle piezoelectric layer 107, 407A through 407G, and the second middle piezoelectric layer 109, 409A through 409G, and the top piezoelectric layer 111, 411A through 411G, may all be made of the same piezoelectric material, e.g., Aluminum Nitride (AlN), e.g., Lithium Niobate (LN), e.g., Lithium Tantalate (LT).

Respective layers of piezoelectric material in the stack 104, 404A through 404G, of FIG. 1A and FIGS. 4A through 4G may have respective layer thicknesses of about one half wavelength (e.g., one half acoustic wavelength) of the main resonant frequency of the example resonators. For example, respective layers of piezoelectric material in the stack 104, 404A through 404G, of FIG. 1A and FIGS. 4A through 4G may have respective layer thicknesses selected so that the respective bulk acoustic wave resonators 100, 400A through 400G may have respective resonant frequencies that are in a Super High Frequency (SHF) band or an Extremely High Frequency (EHF) band. For example, for a five gigahertz (e.g., 5 GHz) main resonant frequency of the example resonators, the bottom piezoelectric layer 105, 405A through 405G, may have a layer thickness corresponding to about one half of a wavelength (e.g., one half of an acoustic wavelength) of the main resonant frequency, and may be about ten thousand Angstroms (10,000 A). Piezoelectric layer thickness may be scaled up or down to determine main resonant frequency. For example, for a twenty-four gigahertz (e.g., 24 GHz) main resonant frequency of the example resonators, the bottom piezoelectric layer 105, 405A through 405G, may have a layer thickness corresponding to about one half of a wavelength (e.g., about one half of an acoustic wavelength) of the main resonant frequency, and may be about two thousand Angstroms (2000 A). Similarly, the first middle piezoelectric layer 107, 407A through 407G, may have a layer thickness corresponding the one half of the wavelength (e.g., one half of the acoustic wavelength) of the main resonant frequency; the second middle piezoelectric layer 109, 409A through 409G, may have a layer thickness corresponding the one half of the wavelength (e.g., one half of the acoustic wavelength) of the main resonant frequency; and the top piezoelectric layer 111, 411A through 411G, may have a layer thickness corresponding the one half of the wavelength (e.g., one half of the acoustic wavelength) of the main resonant frequency.

The example resonators 100, 400A through 400G, of FIG. 1A and FIGS. 4A through 4G may comprise: a bottom acoustic reflector 113, 413A through 413G, including an acoustically reflective bottom electrode stack of a plurality of bottom metal electrode layers; and a top acoustic reflector 115, 415A through 415G, including an acoustically reflective bottom electrode stack of a plurality of top metal electrode layers. Accordingly, the bottom acoustic reflector 113, 413A through 413G, may be a bottom multilayer acoustic reflector, and the top acoustic reflector 115, 415A through 415G, may be a top multilayer acoustic reflector. The piezoelectric layer stack 104, 404A through 404G, may be sandwiched between the plurality of bottom metal electrode layers of the bottom acoustic reflector 113, 413A through 413G, and the plurality of top metal electrode layers of the top acoustic reflector 115, 415A through 415G. The piezoelectric layer stack 104, 404A through 404G, may be electrically and acoustically coupled with the plurality of bottom metal electrode layers of the bottom acoustic reflector 113, 413A through 413G and the plurality of top metal electrode layers of the top acoustic reflector 115, 415A through 415G, to excite the piezoelectrically excitable resonance mode (e.g., main resonance mode) at the resonant frequency (e.g., main resonant frequency). For example, such excitation may be done by using the plurality of bottom metal electrode layers of the bottom acoustic reflector 113, 413A through 413G and the plurality of top metal electrode layers of the top acoustic reflector 115, 415A through 415G to apply an oscillating electric field having a frequency corresponding to the resonant frequency (e.g., main resonant frequency) of the piezoelectric layer stack 104, 404A through 404G, and of the example resonators 100, 400A through 400G. For example, the piezoelectric layer stack 104, 404A through 404G, may be electrically and acoustically coupled with the plurality of bottom metal electrode layers of the bottom acoustic reflector 113, 413A through 413G and the plurality of top metal electrode layers of the top acoustic reflector 115, 415A through 415G, to excite the piezoelectrically excitable resonance mode (e.g., main resonance mode) at the resonant frequency (e.g., main resonant frequency.

For example, the bottom piezoelectric layer 105, 405A through 405G, may be electrically and acoustically coupled with the plurality of bottom metal electrode layers of the bottom acoustic reflector 113, 413A through 413G and the plurality of top metal electrode layers of the top acoustic reflector 115, 415A through 415G, to excite the piezoelectrically excitable resonance mode (e.g., main resonance mode) at the resonant frequency (e.g., main resonant frequency) of the bottom piezoelectric layer 105, 405A through 405G. Further, the bottom piezoelectric layer 105, 405A through 405G and the first middle piezoelectric layer 107, 407A through 407G, may be electrically and acoustically coupled with the plurality of bottom metal electrode layers of the bottom acoustic reflector 113, 413A through 413G, and the plurality of top metal electrode layers of the top acoustic reflector 115, 415A through 415G, to excite the piezoelectrically excitable resonance mode (e.g., main resonance mode) at the resonant frequency (e.g., main resonant frequency) of the bottom piezoelectric layer 105, 405A through 405G, acoustically coupled with the first middle piezoelectric layer 107, 407A through 407G. Additionally, the first middle piezoelectric layer 107, 407A-407G, may be sandwiched between the bottom piezoelectric layer 105, 405A through 405G and the second middle piezoelectric layer 109, 409A through 409G, and may be electrically and acoustically coupled with the plurality of bottom metal electrode layers of the bottom acoustic reflector 113, 413A through 413G, and the plurality of top metal electrode layers of the top acoustic reflector 115, 415A through 415G, to excite the piezoelectrically excitable resonance mode (e.g., main resonance mode) at the resonant frequency (e.g., main resonant frequency) of the first middle piezoelectric layer 107, 407A through 407G, sandwiched between the bottom piezoelectric layer 105, 405A through 405G, and the second middle piezoelectric layer 109, 409A through 409G.

The acoustically reflective bottom electrode stack of the plurality of bottom metal electrode layers of the bottom acoustic reflector 113, 413A through 413G, may have an alternating arrangement of low acoustic impedance metal layer and high acoustic impedance metal layer. For example, an initial bottom metal electrode layer 117, 417A through 417G, may comprise a relatively high acoustic impedance metal, for example, Tungsten having an acoustic impedance of about 100 MegaRayls, or for example, Molybdenum having an acoustic impedance of about 65 MegaRayls. The acoustically reflective bottom electrode stack of the plurality of bottom metal electrode layers of the bottom acoustic reflector 113, 413A through 413G may approximate a metal distributed Bragg acoustic reflector. The plurality of bottom metal electrode layers of the bottom acoustic reflector may be electrically coupled (e.g., electrically interconnected) with one another. The acoustically reflective bottom electrode stack of the plurality of bottom metal electrode layers may operate together as a multilayer (e.g., bilayer, e.g., multiple layer) bottom electrode for the bottom acoustic reflector 113, 413A through 413G.

Next in the alternating arrangement of low acoustic impedance metal layer and high acoustic impedance metal layer of the acoustically reflective bottom electrode stack, may be a first pair of bottom metal electrode layers 119, 419A through 419G and 121, 421A through 421G. A first member 119, 419A through 419G, of the first pair of bottom metal electrode layers may comprise a relatively low acoustic impedance metal, for example, Titanium having an acoustic impedance of about 27 MegaRayls, or for example, Aluminum having an acoustic impedance of about 18 MegaRayls. A second member 121, 421A through 421G, of the first pair of bottom metal electrode layers may comprise the relatively high acoustic impedance metal, for example, Tungsten or Molybdenum. Accordingly, the first pair of bottom metal electrode layers 119, 419A through 419G, and 121, 421A through 421G, of the bottom acoustic reflector 113, 413A through 413G, may be different metals, and may have respective acoustic impedances that are different from one another so as to provide a reflective acoustic impedance mismatch at the resonant frequency (e.g., main resonant frequency). Similarly, the initial bottom metal electrode layer 117, 417A through 417G, and the first member of the first pair of bottom metal electrode layers 119, 419A through 419G, of the bottom acoustic reflector 113, 413A through 413G, may be different metals, and may have respective acoustic impedances that are different from one another so as to provide a reflective acoustic impedance mismatch at the resonant frequency (e.g., main resonant frequency).

Next in the alternating arrangement of low acoustic impedance metal layer and high acoustic impedance metal layer of the acoustically reflective bottom electrode stack, a second pair of bottom metal electrode layers 123, 423A through 423G, and 125, 425A through 425G, may respectively comprise the relatively low acoustic impedance metal and the relatively high acoustic impedance metal. Accordingly, the initial bottom metal electrode layer 117, 417A through 417G, and members of the first and second pairs of bottom metal electrode layers 119, 419A through 419G, 121, 421A through 421G, 123, 423A through 423G, 125, 425A through 425G, may have respective acoustic impedances in the alternating arrangement to provide a corresponding plurality of reflective acoustic impedance mismatches.

Next in the alternating arrangement of low acoustic impedance metal layer and high acoustic impedance metal layer of the acoustically reflective bottom electrode stack, a third pair of bottom metal electrode layers 127, 427D, 129, 429D may respectively comprise the relatively low acoustic impedance metal and the relatively high acoustic impedance metal. Next in the alternating arrangement of low acoustic impedance metal layer and high acoustic impedance metal layer of the acoustically reflective bottom electrode stack, a fourth pair of bottom metal electrode layers 131, 431D and 133, 433D may respectively comprise the relatively low acoustic impedance metal and the relatively high acoustic impedance metal.

Respective thicknesses of the bottom metal electrode layers may be related to wavelength (e.g., acoustic wavelength) for the main resonant frequency of the example bulk acoustic wave resonators, 100, 400A through 400G. Further, various embodiments for resonators having relatively higher resonant frequency (higher main resonant frequency) may have relatively thinner bottom metal electrode thicknesses, e.g., scaled thinner with relatively higher resonant frequency (e.g., higher main resonant frequency). Similarly, various alternative embodiments for resonators having relatively lower resonant frequency (e.g., lower main resonant frequency) may have relatively thicker bottom metal electrode layer thicknesses, e.g., scaled thicker with relatively lower resonant frequency (e.g., lower main resonant frequency). For example, a layer thickness of the initial bottom metal electrode layer 117, 417A through 417G, may be about one eighth of a wavelength (e.g., one eighth of an acoustic wavelength) at the main resonant frequency of the example resonator. For example, if molybdenum is used as the high acoustic impedance metal and the main resonant frequency of the resonator is five Gigahertz (e.g., 5 GHz), then using the one eighth of the wavelength (e.g., one eighth of the acoustic wavelength) provides the layer thickness of the initial bottom metal electrode layer 117, 417A through 417G, as about one thousand six hundred Angstroms (1,600 A). For example, if molybdenum is used as the high acoustic impedance metal and the main resonant frequency of the resonator is twenty-four gigahertz (e.g., 24 GHz), then using the one eighth of the wavelength (e.g., one eighth of the acoustic wavelength) provides the layer thickness of the initial bottom metal electrode layer 117, 417A through 417G, as about three hundred and thirty Angstroms (330 A). In the foregoing examples, the one eighth of the wavelength (e.g., the one eighth of the acoustic wavelength) at the main resonant frequency was used for determining the layer thickness of the initial bottom metal electrode layer 117, 417A-417G, but it should be understood that this layer thickness may be varied to be thicker or thinner in various other alternative example embodiments.

Respective layer thicknesses, T01 through T08, shown in FIG. 1A for members of the pairs of bottom metal electrode layers may be about an odd multiple (e.g., 1×, 3×, etc.) of a quarter of a wavelength (e.g., one quarter of the acoustic wavelength) at the main resonant frequency of the example resonator. However, the foregoing may be varied. For example, members of the pairs of bottom metal electrode layers of the bottom acoustic reflector may have respective layer thickness that correspond to a range from about one eighth to about one half wavelength at the resonant frequency, or an odd multiple (e.g., 1×, 3×, etc.) thereof.

In an example, if Tungsten is used as the high acoustic impedance metal, and the main resonant frequency of the resonator is five gigahertz (e.g., 5 GHz), then using the one quarter of the wavelength (e.g., one quarter of the acoustic wavelength) provides the layer thickness of the high impedance metal electrode layer members of the pairs as about two thousand six hundred Angstroms (2,600 A). For example, if Titanium is used as the low acoustic impedance metal, and the main resonant frequency of the resonator is five gigahertz (e.g., 5 GHz), then using the one quarter of the wavelength (e.g., one quarter of the acoustic wavelength) provides the layer thickness of the low impedance metal electrode layer members of the pairs as about three thousand Angstroms (3,000 A). In another example, if Tungsten is used as the high acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the high impedance metal electrode layer members of the pairs as about five hundred and forty Angstroms (540 A). In yet another example, if Titanium is used as the low acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the low impedance metal electrode layer members of the pairs as about six hundred and thirty Angstroms (630 A). Similarly, respective layer thicknesses for members of the pairs of bottom metal electrode layers shown in FIGS. 4A through 4G may likewise be about one quarter of the wavelength (e.g., one quarter of the acoustic wavelength) of the main resonant frequency of the example resonator, and these respective layer thicknesses may likewise be determined for members of the pairs of bottom metal electrode layers for the high and low acoustic impedance metals employed.

For example, the bottom piezoelectric layer 105, 405A through 405G, may be electrically and acoustically coupled with the initial bottom metal electrode layer 117, 417A through 417G, and pair(s) of bottom metal electrode layers (e.g., first pair of bottom metal electrode layers 119, 419A through 419G, 121, 421A through 421G, e.g., second pair of bottom metal electrode layers 123, 423A through 423G, 125, 425A through 425G, e.g., third pair of bottom metal electrode layers 127, 427D, 129, 429D, fourth pair of bottom metal electrode layers 131, 431D, 133, 433D), to excite the piezoelectrically excitable resonance mode (e.g., main resonance mode) at the resonant frequency (e.g., main resonant frequency) of the bottom piezoelectric layer 105, 405A through 405G. Further, the bottom piezoelectric layer 105, 405A through 405G and the first middle piezoelectric layer 107, 407A through 407G may be electrically and acoustically coupled with the initial bottom metal electrode layer 117, 417A through 417G and pair(s) of bottom metal electrode layers (e.g., first pair of bottom metal electrode layers 119, 419A through 419G, 121, 421A through 421G, e.g., second pair of bottom metal electrode layers 123, 423A through 423G, 125, 425A through 425G, e.g., third pair of bottom metal electrode layers 127, 427D, 129, 429D), to excite the piezoelectrically excitable resonance mode (e.g., main resonance mode) at the resonant frequency (e.g., main resonant frequency) of the bottom piezoelectric layer 105, 405A through 405G acoustically coupled with the first middle piezoelectric layer 107, 407A through 407G. Additionally, the first middle piezoelectric layer 107, 407A through 407G, may be sandwiched between the bottom piezoelectric layer 105, 405A through 405G, and the second middle piezoelectric layer 109, 409A through 409G, and may be electrically and acoustically coupled with initial bottom metal electrode layer 117, 417A through 417G, and pair(s) of bottom metal electrode layers (e.g., first pair of bottom metal electrode layers 119, 419A through 419G, 121, 421A through 421G, e.g., second pair of bottom metal electrode layers 123, 423A through 423G, 125, 425A through 425G, e.g., third pair of bottom metal electrode layers 127, 427D, 129, 429D), to excite the piezoelectrically excitable resonance mode (e.g., main resonance mode) at the resonant frequency (e.g., main resonant frequency) of the first middle piezoelectric layer 107, 407A through 407G, sandwiched between the bottom piezoelectric layer 105, 405A through 405G, and the second middle piezoelectric layer 109, 409A through 409G.

Another mesa structure 113, 413A through 413G, (e.g., second mesa structure 113, 413A through 413G), may comprise the bottom acoustic reflector 113, 413A through 413G. The another mesa structure 113, 413A through 413G, (e.g., second mesa structure 113, 413A through 413G), may comprise initial bottom metal electrode layer 117, 417A through 417G. The another mesa structure 113, 413A through 413G, (e.g., second mesa structure 113, 413A through 413G), may comprise one or more pair(s) of bottom metal electrode layers (e.g., first pair of bottom metal electrode layers 119, 419A through 419G, 121, 421A through 421G, e.g., second pair of bottom metal electrode layers 123, 423A through 423G, 125, 425A through 425G, e.g., third pair of bottom metal electrode layers 127, 427A, 427D, 129, 429D, e.g., fourth pair of bottom metal electrode layers 131, 431D, 133, 433D).

Similar to what has been discussed for the bottom electrode stack, likewise the top electrode stack of the plurality of top metal electrode layers of the top acoustic reflector 115, 415A through 415G, may have the alternating arrangement of low acoustic impedance metal layer and high acoustic impedance metal layer. For example, an initial top metal electrode layer 135, 435A through 435G, may comprise the relatively high acoustic impedance metal, for example, Tungsten or Molybdenum. The top electrode stack of the plurality of top metal electrode layers of the top acoustic reflector 115, 415A through 415G, may approximate a metal distributed Bragg acoustic reflector. The plurality of top metal electrode layers of the top acoustic reflector may be electrically coupled (e.g., electrically interconnected) with one another. The acoustically reflective top electrode stack of the plurality of top metal electrode layers may operate together as a multilayer (e.g., bilayer, e.g., multiple layer) top electrode for the top acoustic reflector 115, 415A through 415G. Next in the alternating arrangement of low acoustic impedance metal layer and high acoustic impedance metal layer of the acoustically reflective top electrode stack, may be a first pair of top metal electrode layers 137, 437A through 437G, and 139, 439A through 439G. A first member 137, 437A through 437G, of the first pair of top metal electrode layers may comprise the relatively low acoustic impedance metal, for example, Titanium or Aluminum. A second member 139, 439A through 439G, of the first pair of top metal electrode layers may comprise the relatively high acoustic impedance metal, for example, Tungsten or Molybdenum. Accordingly, the first pair of top metal electrode layers 137, 437A through 437G, 139, 439A through 439G, of the top acoustic reflector 115, 415A through 415G, may be different metals, and may have respective acoustic impedances that are different from one another so as to provide a reflective acoustic impedance mismatch at the resonant frequency (e.g., main resonant frequency). Similarly, the initial top metal electrode layer 135, 435A through 435G, and the first member of the first pair of top metal electrode layers 137, 437A through 437G, of the top acoustic reflector 115, 415A through 415G, may be different metals, and may have respective acoustic impedances that are different from one another so as to provide a reflective acoustic impedance mismatch at the resonant frequency (e.g., main resonant frequency).

Next in the alternating arrangement of low acoustic impedance metal layer and high acoustic impedance metal layer of the acoustically reflective top electrode stack, a second pair of top metal electrode layers 141, 441A through 441G, and 143, 443A through 443G, may respectively comprise the relatively low acoustic impedance metal and the relatively high acoustic impedance metal. Accordingly, the initial top metal electrode layer 135, 435A through 435G, and members of the first and second pairs of top metal electrode layers 137, 437A through 437G, 139, 439A through 439G, 141, 441A through 441G, 143, 443A through 443G, may have respective acoustic impedances in the alternating arrangement to provide a corresponding plurality of reflective acoustic impedance mismatches.

Next in the alternating arrangement of low acoustic impedance metal layer and high acoustic impedance metal layer of the acoustically reflective top electrode stack, a third pair of top metal electrode layers 145, 445A through 445C, and 147, 447A through 447C, may respectively comprise the relatively low acoustic impedance metal and the relatively high acoustic impedance metal. Next in the alternating arrangement of low acoustic impedance metal layer and high acoustic impedance metal layer of the acoustically reflective top electrode stack, a fourth pair of top metal electrode layers 149, 449A through 449C, 151, 451A through 451C, may respectively comprise the relatively low acoustic impedance metal and the relatively high acoustic impedance metal.

For example, the bottom piezoelectric layer 105, 405A through 405G, may be electrically and acoustically coupled with the initial top metal electrode layer 135, 435A through 435G, and the pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C), to excite the piezoelectrically excitable resonance mode (e.g., main resonance mode) at the resonant frequency (e.g., main resonant frequency) of the bottom piezoelectric layer 105, 405A through 405G. Further, the bottom piezoelectric layer 105, 405A through 405G and the first middle piezoelectric layer 107, 407A through 407G may be electrically and acoustically coupled with the initial top metal electrode layer 135, 435A through 435G and pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C), to excite the piezoelectrically excitable resonance mode (e.g., main resonance mode) at the resonant frequency (e.g., main resonant frequency) of the bottom piezoelectric layer 105, 405A through 405G acoustically coupled with the first middle piezoelectric layer 107, 407A through 407G. Additionally, the first middle piezoelectric layer 107, 407A through 407G, may be sandwiched between the bottom piezoelectric layer 105, 405A through 405G, and the second middle piezoelectric layer 109, 409A through 409G, and may be electrically and acoustically coupled with the initial top metal electrode layer 135, 435A through 435G, and the pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C), to excite the piezoelectrically excitable resonance mode (e.g., main resonance mode) at the resonant frequency (e.g., main resonant frequency) of the first middle piezoelectric layer 107, 407A through 407G, sandwiched between the bottom piezoelectric layer 105, 405A through 405G, and the second middle piezoelectric layer 109, 409A through 409G.

Yet another mesa structure 115, 415A through 415G, (e.g., third mesa structure 115, 415A through 415G), may comprise the top acoustic reflector 115, 415A through 415G, or a portion of the top acoustic reflector 115, 415A through 415G. The yet another mesa structure 115, 415A through 415G, (e.g., third mesa structure 115, 415A through 415G), may comprise initial top metal electrode layer 135, 435A through 435G. The yet another mesa structure 115, 415A through 415C, (e.g., third mesa structure 115, 415A through 415C), may comprise one or more pair(s) of top metal electrode layers (e.g., first pair of top metal electrode layers 137, 437A through 437C, 139, 439A through 439C, e.g., second pair of top metal electrode layers 141, 441A through 441C, 143, 443A through 443C, e.g., third pair of top metal electrode layers 145, 445A through 445C, 147, 447A through 447C, e.g., fourth pair of top metal electrode layers 149, 449A through 449C, 151, 451A through 451C).

Like the respective layer thicknesses of the bottom metal electrode layers, respective thicknesses of the top metal electrode layers may likewise be related to wavelength (e.g., acoustic wavelength) for the main resonant frequency of the example bulk acoustic wave resonators, 100, 400A through 400G. Further, various embodiments for resonators having relatively higher main resonant frequency may have relatively thinner top metal electrode thicknesses, e.g., scaled thinner with relatively higher main resonant frequency. Similarly, various alternative embodiments for resonators having relatively lower main resonant frequency may have relatively thicker top metal electrode layer thicknesses, e.g., scaled thicker with relatively lower main resonant frequency. Like the layer thickness of the initial bottom metal, a layer thickness of the initial top metal electrode layer 135, 435A through 435G, may likewise be about one eighth of the wavelength (e.g., one eighth of the acoustic wavelength) of the main resonant frequency of the example resonator. For example, if molybdenum is used as the high acoustic impedance metal and the main resonant frequency of the resonator is five Gigahertz (e.g., 5 GHz), then using the one eighth of the wavelength (e.g., one eighth of the acoustic wavelength) provides the layer thickness of the initial top metal electrode layer 135, 435A through 435G, as about one thousand six hundred Angstroms (1,600 A). For example, if molybdenum is used as the high acoustic impedance metal and the main resonant frequency of the resonator is twenty-four gigahertz (e.g., 24 GHz), then using the one eighth of the wavelength (e.g., one eighth of the acoustic wavelength) provides the layer thickness of the initial top metal electrode layer 135, 435A through 435G, as about three hundred and thirty Angstroms (330 A). In the foregoing examples, the one eighth of the wavelength (e.g., one eighth of the acoustic wavelength) at the main resonant frequency was used for determining the layer thickness of the initial top metal electrode layer 135, 435A-435G, but it should be understood that this layer thickness may be varied to be thicker or thinner in various other alternative example embodiments. Respective layer thicknesses, T11 through T18, shown in FIG. 1A for members of the pairs of top metal electrode layers may be about an odd multiple (e.g., 1×, 3×, etc.) of a quarter of a wavelength (e.g., one quarter of an acoustic wavelength) of the main resonant frequency of the example resonator. Similarly, respective layer thicknesses for members of the pairs of top metal electrode layers shown in FIGS. 4A through 4G may likewise be about one quarter of a wavelength (e.g., one quarter of an acoustic wavelength) at the main resonant frequency of the example resonator multiplied by an odd multiplier (e.g., 1×, 3×, etc.), and these respective layer thicknesses may likewise be determined for members of the pairs of top metal electrode layers for the high and low acoustic impedance metals employed. However, the foregoing may be varied. For example, members of the pairs of top metal electrode layers of the top acoustic reflector may have respective layer thickness that correspond to a range from an odd multiple (e.g., 1×, 3×, etc.) of about one eighth to an odd multiple (e.g., 1×, 3×, etc.) of about one half wavelength at the resonant frequency.

The bottom acoustic reflector 113, 413A through 413G, may have a thickness dimension T23 extending along the stack of bottom electrode layers. For the example of the five Gigahertz (5 GHz) resonator, the thickness dimension T23 of the bottom acoustic reflector may be about twenty four thousand Angstroms (24,000 A). For the example of the 24 GHz resonator, the thickness dimension T23 of the bottom acoustic reflector may be about five thousand Angstroms (5,000 A). The top acoustic reflector 115, 415A through 415G, may have a thickness dimension T25 extending along the stack of top electrode layers. For the example of the five Gigahertz (5 GHz) resonator, the thickness dimension T25 of the top acoustic reflector may be about twenty four thousand Angstroms (24,000 A). For the example of the 24 GHz resonator, the thickness dimension T25 of the top acoustic reflector may be about five thousand Angstroms (5,000 A). The piezoelectric layer stack 104, 404A through 404G, may have a thickness dimension T27 extending along the piezoelectric layer stack 104, 404A through 404G. For the example of the five Gigahertz (5 GHz) resonator, the thickness dimension T27 of the piezoelectric layer stack may be about thirty eight thousand Angstroms (38,000 A). For the example of the 24 GHz resonator, the thickness dimension T27 of the piezoelectric layer stack may be about eight thousand Angstroms (8,000 A).

In the example resonators 100, 400A through 400G, of FIG. 1A and FIGS. 4A through 4G, a notional heavy dashed line is used in depicting an etched edge region 153, 453A through 453G, associated with the example resonators 100, 400A through 400G. Similarly, a laterally opposing etched edge region 154, 454A through 454G is arranged laterally opposing or opposite from the notional heavy dashed line depicting the etched edge region 153, 453A through 453G. The etched edge region may, but need not, assist with acoustic isolation of the resonators. The etched edge region may, but need not, help with avoiding acoustic losses for the resonators. The etched edge region 153, 453A through 453G, (and the laterally opposing etched edge region 154, 454A through 454G) may extend along the thickness dimension T27 of the piezoelectric layer stack 104, 404A through 404G. The etched edge region 153, 453A through 453G, may extend through (e.g., entirely through or partially through) the piezoelectric layer stack 104, 404A through 404G. Similarly, the laterally opposing etched edge region 154, 454A through 454G may extend through (e.g., entirely through or partially through) the piezoelectric layer stack 104, 404A through 404G. The etched edge region 153, 453A through 453G, (and the laterally opposing etched edge region 154, 454A through 454G) may extend through (e.g., entirely through or partially through) the bottom piezoelectric layer 105, 405A through 405G. The etched edge region 153, 453A through 453G, (and the laterally opposing etched edge region 154, 454A through 454G) may extend through (e.g., entirely through or partially through) the first middle piezoelectric layer 107, 407A through 407G. The etched edge region 153, 453A through 453G, (and the laterally opposing etched edge region 154, 454A through 454G) may extend through (e.g., entirely through or partially through) the second middle piezoelectric layer 109, 409A through 409G. The etched edge region 153, 453A through 453G, (and the laterally opposing etched edge region 154, 454A through 454G) may extend through (e.g., entirely through or partially through) the top piezoelectric layer 111, 411A through 411G.

The etched edge region 153, 453A through 453G, (and the laterally opposing etched edge region 154, 454A through 454G) may extend along the thickness dimension T23 of the bottom acoustic reflector 113, 413A through 413G. The etched edge region 153, 453A through 453G, (and the laterally opposing etched edge region 154, 454A through 454G) may extend through (e.g., entirely through or partially through) the bottom acoustic reflector 113, 413A through 413G. The etched edge region 153, 453A through 453G, (and the laterally opposing etched edge region 154, 454A through 454G) may extend through (e.g., entirely through or partially through) the initial bottom metal electrode layer 117, 417A through 417G. The etched edge region 153, 453A through 453G, (and the laterally opposing etched edge region 154, 454A through 454G) may extend through (e.g., entirely through or partially through) the first pair of bottom metal electrode layers, 119, 419A through 419G, 121, 421A through 421G. The etched edge region 153, 453A through 453G (and the laterally opposing etched edge region 154, 454A through 454G) may extend through (e.g., entirely through or partially through) the second pair of bottom metal electrode layers, 123, 423A through 423G, 125, 425A through 425G. The etched edge region 153, 453A through 453G (and the laterally opposing etched edge region 154, 454A through 454G) may extend through (e.g., entirely through or partially through) the third pair of bottom metal electrode layers, 127, 427D, 129, 429D. The etched edge region 153, 453A through 453G (and the laterally opposing etched edge region 154, 454A through 454G) may extend through (e.g., entirely through or partially through) the fourth pair of bottom metal electrode layers, 131, 431D, 133, 433D.

The etched edge region 153, 453A through 453G (and the laterally opposing etched edge region 154, 454A through 454G) may extend along the thickness dimension T25 of the top acoustic reflector 115, 415A through 415G. The etched edge region 153, 453A through 453G (and the laterally opposing etched edge region 154, 454A through 454G) may extend through (e.g., entirely through or partially through) the top acoustic reflector 115, 415A through 415G. The etched edge region 153, 453A through 453G (and the laterally opposing etched edge region 154, 454A through 454G) may extend through (e.g., entirely through or partially through) the initial top metal electrode layer 135, 435A through 435G. The etched edge region 153, 453A through 453G (and the laterally opposing etched edge region 154, 454A through 454G) may extend through (e.g., entirely through or partially through) the first pair of top metal electrode layers, 137, 437A through 437G, 139, 439A through 49G. The etched edge region 153, 453A through 453C (and the laterally opposing etched edge region 154, 454A through 454C) may extend through (e.g., entirely through or partially through) the second pair of top metal electrode layers, 141, 441A through 441C, 143, 443A through 443C. The etched edge region 153, 453A through 453C (and the laterally opposing etched edge region 154, 454A through 454C) may extend through (e.g., entirely through or partially through) the third pair of top metal electrode layers, 145, 445A through 445C, 147, 447A through 447C. The etched edge region 153, 453A through 453C (and the laterally opposing etched edge region 154, 454A through 454C) may extend through (e.g., entirely through or partially through) the fourth pair of top metal electrode layers, 149, 449A through 449C, 151, 451A through 451C.

As mentioned previously, mesa structure 104, 404A through 404G (e.g., first mesa structure 104, 404A through 404G) may comprise the respective stack 104, 404A through 404G, of the example four layers of piezoelectric material. The mesa structure 104, 404A through 404G (e.g., first mesa structure 104, 404A through 404G) may extend laterally between (e.g., may be formed between) etched edge region 153, 453A through 453G and laterally opposing etched edge region 154, 454A through 454G. As mentioned previously, another mesa structure 113, 413A through 413G, (e.g., second mesa structure 113, 413A through 413G), may comprise the bottom acoustic reflector 113, 413A through 413G. The another mesa structure 113, 413A through 413G, (e.g., second mesa structure 113, 413A through 413G) may extend laterally between (e.g., may be formed between) etched edge region 153, 453A through 453G and laterally opposing etched edge region 154, 454A through 454G. As mentioned previously, yet another mesa structure 115, 415A through 415G, (e.g., third mesa structure 115, 415A through 415G), may comprise the top acoustic reflector 115, 415A through 415G or a portion of the top acoustic reflector 115, 415A through 415G. The yet another mesa structure 115, 415A through 415G, (e.g., third mesa structure 115, 415A through 415G) may extend laterally between (e.g., may be formed between) etched edge region 153, 453A through 453G and laterally opposing etched edge region 154, 454A through 454G. In some example resonators 100, 400A, 400B, 400D through 400F, the second mesa structure corresponding to the bottom acoustic reflector 113, 413A, 413B, 413D through 413F may be laterally wider than the first mesa structure corresponding to the stack 104, 404A, 404B, 404D through 404F, of the example four layers of piezoelectric material. In some example resonators 100, 400A through 400C, the first mesa structure corresponding to the stack 104, 404A through 404C, of the example four layers of piezoelectric material may be laterally wider than the third mesa structure corresponding to the top acoustic reflector 115, 415A through 415C. In some example resonators 400D through 400G, the first mesa structure corresponding to the stack 404D through 404G, of the example four layers of piezoelectric material may be laterally wider than a portion of the third mesa structure corresponding to the top acoustic reflector 415D through 415G.

An optional mass load layer 155, 455A through 455G, may be added to the example resonators 100, 400A through 400G. For example, filters may include series connected resonator designs and shunt connected resonator designs that may include mass load layers. For example, for ladder filter designs, the shunt resonator may include a sufficient mass load layer so that the parallel resonant frequency (Fp) of the shunt resonator approximately matches the series resonant frequency (Fs) of the series resonator design. Thus the series resonator design (without the mass load layer) may be used for the shunt resonator design, but with the addition of the mass load layer 155, 455A through 455G, for the shunt resonator design. By including the mass load layer, the design of the shunt resonator may be approximately down-shifted, or reduced, in frequency relative to the series resonator by a relative amount approximately corresponding to the electromechanical coupling coefficient (Kt2) of the shunt resonator. For the example resonators 100, 400A through 400G, the optional mass load layer 155, 455A through 455G, may be arranged in the top acoustic reflector 115, 415A through 415G, above the first pair of top metal electrode layers. A metal may be used for the mass load. A dense metal such as Tungsten may be used for the mass load 155, 455A through 455G. An example thickness dimension of the optional mass load layer 155, 455A through 455G, may be about five hundred Angstroms (500 A).

However, it should be understood that the thickness dimension of the optional mass load layer 155, 455A through 455G, may be varied depending on how much mass loading is desired for a particular design and depending on which metal is used for the mass load layer. Since there may be less acoustic energy in the top acoustic reflector 115, 415A through 415G, at locations further away from the piezoelectric stack 104, 404A through 404G, there may be less acoustic energy interaction with the optional mass load layer, depending on the location of the mass load layer in the arrangement of the top acoustic reflector. Accordingly, in alternative arrangements where the mass load layer is further away from the piezoelectric stack 104, 404A through 404G, such alternative designs may use more mass loading (e.g., thicker mass load layer) to achieve the same effect as what is provided in more proximate mass load placement designs. Also, in other alternative arrangements the mass load layer may be arranged relatively closer to the piezoelectric stack 104, 404A through 404G. Such alternative designs may use less mass loading (e.g., thinner mass load layer). This may achieve the same or similar mass loading effect as what is provided in previously discussed mass load placement designs, in which the mass load is arranged less proximate to the piezoelectric stack 104, 404A through 404G. Similarly, since Titanium (Ti) or Aluminum (Al) is less dense than Tungsten (W) or Molybdenum (Mo), in alternative designs where Titanium or Aluminum is used for the mass load layer, a relatively thicker mass load layer of Titanium (Ti) or Aluminum (Al) is needed to produce the same mass load effect as a mass load layer of Tungsten (W) or Molybdenum (Mo) of a given mass load layer thickness. Moreover, in alternative arrangements both shunt and series resonators may be additionally mass-loaded with considerably thinner mass loading layers (e.g., having thickness of about one tenth of the thickness of a main mass loading layer) in order to achieve specific filter design goals, as may be appreciated by one skilled in the art.

The example resonators 100, 400A through 400G, of FIG. 1A and FIGS. 4A through 4G may include a plurality of lateral features 157, 457A through 457G (e.g., patterned layer 157, 457A through 457G, e.g., step mass features 157, 457A through 457G), sandwiched between two top metal electrode layers (e.g., between the second member 139, 439A through 439G, of the first pair of top metal electrode layers and the first member 141, 441A through 441G, of the second pair of top metal electrode layers) of the top acoustic reflector 115, 415A through 415G. As shown in the figures, the plurality of lateral features 157, 457A through 457G, of patterned layer 157, 457A through 457G may comprise step features 157, 457A through 457G (e.g., step mass features 157, 457A through 457G). As shown in the figures, the plurality of lateral features 157, 457A through 457G, may be arranged proximate to lateral extremities (e.g., proximate to a lateral perimeter) of the top acoustic reflector 115, 415A through 415G. At least one of the lateral features 157, 457A through 457G, may be arranged proximate to where the etched edge region 153, 453A through 453G, extends through the top acoustic reflector 115, 415A through 415G.

After the lateral features 157, 457A through 457G, are formed, they may function as a step feature template, so that subsequent top metal electrode layers formed on top of the lateral features 157, 457A through 457G, may retain step patterns imposed by step features of the lateral features 157, 457A through 457G. For example, the second pair of top metal electrode layers 141, 441A through 441G, 143, 443A through 443G, the third pair of top metal electrode layers 145, 445A through 445C, 147, 447A through 447C, and the fourth pair of top metal electrodes 149, 449A through 449C, 151, 451A through 451C, may retain step patterns imposed by step features of the lateral features 157, 457A through 457G. The plurality of lateral features 157, 457A through 457G, may add a layer of mass loading. The plurality of lateral features 157, 457A through 457G, may be made of a patterned metal layer (e.g., a patterned layer of Tungsten (W), Molybdenum (Mo), Titanium (Ti), or Aluminum (Al)). In alternative examples, the plurality of lateral features 157, 457A through 457G, may be made of a patterned dielectric layer (e.g., a patterned layer of Silicon Nitride (SiN), Silicon Dioxide (SiO2) or Silicon Carbide (SiC)). The plurality of lateral features 157, 457A through 457G, may, but need not, limit parasitic lateral acoustic modes (e.g., facilitate suppression of spurious modes) of the example resonators 100, 400A through 400G. Thickness of the patterned layer of the lateral features 157, 457A through 457G, (e.g., thickness of the patterned layers 157, 457A through 457G) may be adjusted. For example, for the 5 GHz resonator, thickness may be adjusted within a range from about two hundred Angstroms (200 A) to about two thousand five hundred Angstroms (2500 A). Lateral step width of the lateral features 157, 457A through 457G (e.g., width of the step mass features 157, 457A through 457G) may be adjusted down, for example, from about two microns (2 um). The foregoing may be adjusted to balance a design goal of limiting parasitic lateral acoustic modes (e.g., facilitating suppression of spurious modes) of the example resonators 100, 400A through 400G as well as increasing average quality factor above the series resonance frequency against other design considerations e.g., maintaining desired average quality factor below the series resonance frequency.

In the example bulk acoustic wave resonator 100 shown in FIG. 1A, the patterned layer 157 may comprise Tungsten (W) (e.g., the step mass feature 157 of the patterned layer may comprise Tungsten (W)). A suitable thickness of the patterned layer 157 (e.g., thickness of the step mass feature 157) and lateral width of features of the patterned layer 157 may vary based on various design parameters e.g., material selected for the patterned layer 157, e.g., the desired resonant frequency of the given resonant design, e.g., effectiveness in facilitating spurious mode suppression. For an example 24 GHz design of the example acoustic wave resonator 100 shown in FIG. 1A in which the patterned layer comprises Tungsten (W), a suitable thickness of the patterned layer 157 (e.g., thickness of the step mass feature 157) may be 200 Angstroms and lateral width of features of the patterned layer 157 (e.g., lateral width of the step mass feature 157) may be 0.8 microns, may facilitate suppression of the average strength of the spurious modes in the passband by approximately fifty percent (50%), as estimated by simulation relative to similar designs without the benefit of patterned layer 157.

The example resonators 100, 400A through 400G, of FIG. 1A and FIGS. 4A through 4G may include one or more (e.g., one or a plurality of) interposer layers sandwiched between piezoelectric layers of the stack 104, 404A through 404G. For example, a first interposer layer 159, 459A through 459G may be sandwiched between the bottom piezoelectric layer 105, 405A through 405G, and the first middle piezoelectric layer 107, 407A through 407G. For example, a second interposer layer 161, 461A through 461G, may be sandwiched between the first middle piezoelectric layer 107, 407A through 407G, and the second middle piezoelectric layer 109, 409A through 409G. For example, a third interposer layer 163, 463A through 463G, may be sandwiched between the second middle piezoelectric layer 109, 409A through 409G, and the top piezoelectric layer 111, 411A through 411G.

One or more (e.g., one or a plurality of) interposer layers may be metal interposer layers. The metal interposer layers may be relatively high acoustic impedance metal interposer layers (e.g., using relatively high acoustic impedance metals such as Tungsten (W) or Molybdenum (Mo)). Such metal interposer layers may (but need not) flatten stress distribution across adjacent piezoelectric layers, and may (but need not) raise effective electromechanical coupling coefficient (Kt2) of adjacent piezoelectric layers.

Alternatively or additionally, one or more (e.g., one or a plurality of) interposer layers may be dielectric interposer layers. The dielectric of the dielectric interposer layers may be a dielectric that has a positive acoustic velocity temperature coefficient, so acoustic velocity increases with increasing temperature of the dielectric, e.g., silicon dioxide. The dielectric of the dielectric interposer layers may comprise, for example, zinc oxide, and alternatively or additionally may comprise titanium nitride, and alternatively or additionally may comprise, for example, silicon dioxide and alternatively or additionally may comprise, for example, hafnium dioxide. Dielectric interposer layers may, but need not, facilitate compensating for frequency response shifts with increasing temperature. Most materials (e.g., metals, e.g., dielectrics) generally have a negative acoustic velocity temperature coefficient, so acoustic velocity decreases with increasing temperature of such materials. Accordingly, increasing device temperature generally causes response of resonators and filters to shift downward in frequency. Including dielectric (e.g., silicon dioxide) that instead has a positive acoustic velocity temperature coefficient may facilitate countering or compensating (e.g., temperature compensating) this downward shift in frequency with increasing temperature. Alternatively or additionally, one or more (e.g., one or a plurality of) interposer layers may comprise metal and dielectric for respective interposer layers. Alternatively or additionally, one or more (e.g., one or a plurality of) interposer layers may comprise two different metal layers for respective interposer layers. Alternatively or additionally, one or more (e.g., one or a plurality of) interposer layers may comprise two different dielectric layers for respective interposer layers.

In addition to the foregoing application of metal interposer layers to raise effective electromechanical coupling coefficient (Kt2) of adjacent piezoelectric layers, and the application of dielectric interposer layers to facilitate compensating for frequency response shifts with increasing temperature, interposer layers may, but need not, increase quality factor (Q-factor) and/or suppress irregular spectral response patterns characterized by sharp reductions in Q-factor known as "rattles". Q-factor of a resonator is a figure of merit in which increased Q-factor indicates a lower rate of energy loss per cycle relative to the stored energy of the resonator. Increased Q-factor in resonators used in filters results in lower insertion loss and sharper roll-off in filters. The irregular spectral response patterns characterized by sharp reductions in Q-factor known as "rattles" may cause ripples in filter pass bands.

Metal and/or dielectric interposer layer of suitable thicknesses and acoustic material properties (e.g., velocity, density) may be placed at appropriate places in the stack 104, 404A through 404G, of piezoelectric layers, for example, proximate to the nulls of acoustic energy distribution in the stacks (e.g., between interfaces of piezoelectric layers of opposing axis orientation). Finite Element Modeling (FEM) simulations and varying parameters in fabrication prior to subsequent testing may help to optimize interposer layer designs for the stack. Thickness of interposer layers may, but need not, be adjusted to influence increased Q-factor and/or rattle suppression. It is theorized that if the interposer layer is too thin there is no substantial effect. Thus minimum thickness for the interposer layer may be about one monolayer, or about five Angstroms (5 A). Alternatively, if the interposer layer is too thick, rattle strength may increase rather than being suppressed. Accordingly, an upper limit of interposer thickness may be about two thousand five hundred Angstroms (2,500 A) for a five Gigahertz (5 GHz) resonator design, with limiting thickness scaling inversely with frequency for alternative resonator designs. An upper limit of interposer thickness may be about five-hundred Angstroms (500 A) for a twenty-four Gigahertz (24 GHz) resonator design. It is theorized that below a series resonant frequency of resonators, Fs, Q-factor may not be systematically and significantly affected by including a single interposer layer. However, it is theorized that there may, but need not, be significant increases in Q-factor, for example from about two-thousand (2000) to about three-thousand (3000), for inclusion of two or more interposer layers.

In the example resonators 100, 400A through 400C, of FIG. 1A and FIGS. 4A through 4C, a planarization layer 165, 465A through 465C may be included. A suitable material may be used for planarization layer 165, 465A through 465C, for example Silicon Dioxide (SiO2), Hafnium Dioxide (HfO2), polyimide, or BenzoCyclobutene (BCB). An isolation layer 167, 467A through 467C, may also be included and arranged over the planarization layer 165, 465A-465C. A suitable low dielectric constant (low-k), low acoustic impedance (low-Za) material may be used for the isolation layer 167, 467A through 467C, for example polyimide, or BenzoCyclobutene (BCB).

In the example resonators 100, 400A through 400G, of FIG. 1A and FIGS. 4A through 4G, a bottom electrical interconnect 169, 469A through 469G, may be included to interconnect electrically with (e.g., electrically contact with) the bottom acoustic reflector 113, 413A through 413G, stack of the plurality of bottom metal electrode layers. A top electrical interconnect 171, 471A through 471G, may be included to interconnect electrically with the top acoustic reflector 115, 415A through 415G, stack of the plurality of top metal electrode layers. A suitable material may be used for the bottom electrical interconnect 169, 469A through 469G, and the top electrical interconnect 171, 471A through 471G, for example, gold (Au). Top electrical interconnect 171, 471A through 471G may be substantially acoustically isolated from the stack 104, 404A through 404G of the example four layers of piezoelectric material by the top multilayer metal acoustic reflector electrode 115, 415A through 415G. Top electrical interconnect 171, 471A through 471G may have dimensions selected so that the top electrical interconnect 171, 471A through 471G approximates a fifty ohm electrical transmission line at the main resonant frequency of the bulk acoustic wave resonator 100, 400A through 400G. Top electrical interconnect 171, 471A through 471G may have a thickness that is substantially thicker than a thickness of a pair of top metal electrode layers of the top multilayer metal acoustic reflector electrode 115, 415A through 415G (e.g., thicker than thickness of the first pair of top metal electrode layers 137, 437A through 437G, 139, 439A through 439G). Top electrical interconnect 171, 471A through 471G may have a thickness within a range from about one hundred Angstroms (100 A) to about five micrometers (5 um). For example, top electrical interconnect 171, 471A through 471G may have a thickness of about two thousand Angstroms (2000 A).

Figure 1B:
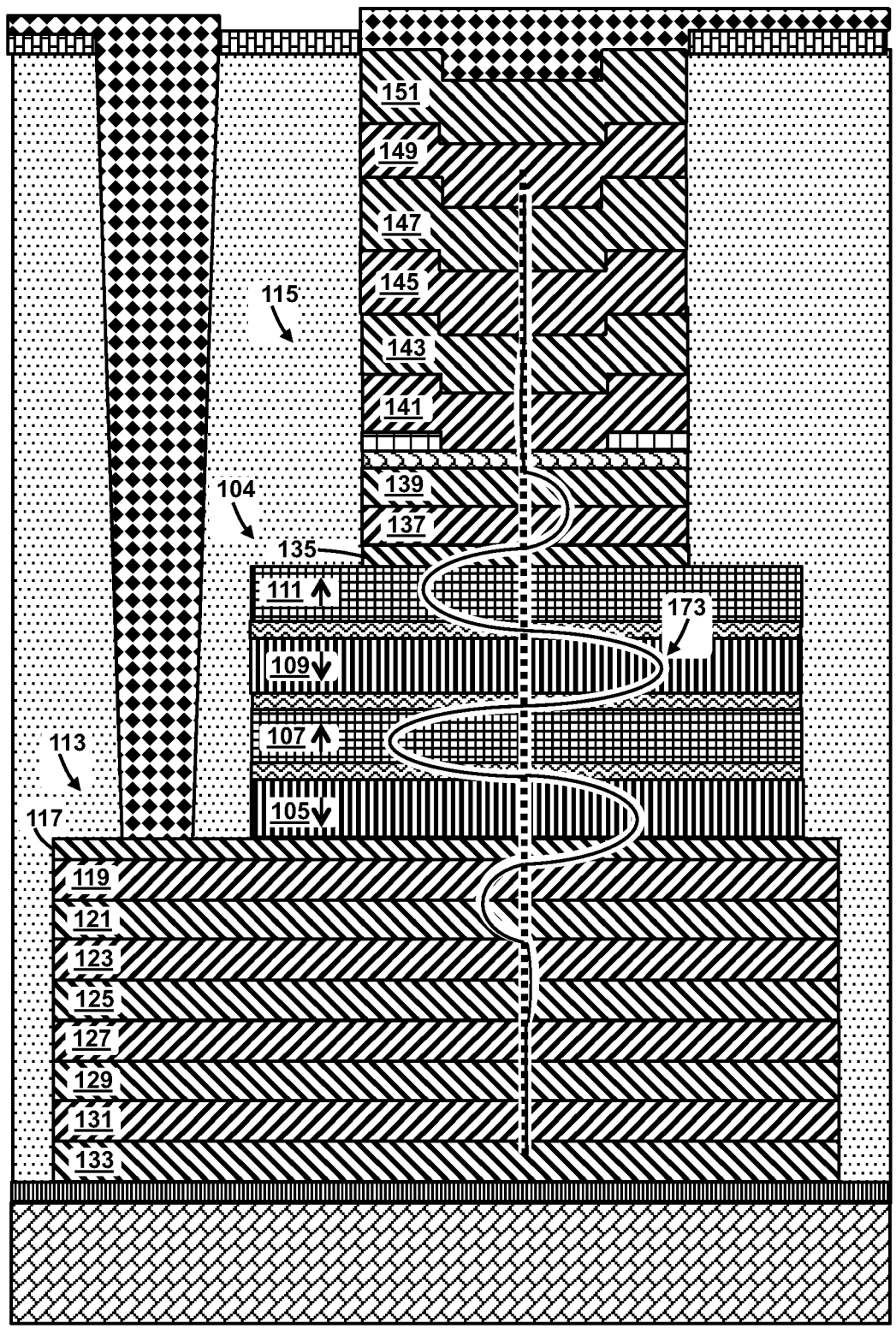
FIG. 1B is a simplified view of FIG. 1A that illustrates acoustic stress profile during electrical operation of the bulk acoustic wave resonator structure shown in FIG. 1A.

FIG. 1B is a simplified view of FIG. 1A that illustrates an example of acoustic stress distribution during electrical operation of the bulk acoustic wave resonator structure shown in FIG. 1A. A notional curved line schematically depicts vertical (Tzz) stress distribution 173 through stack 104 of the example four piezoelectric layers, 105, 107, 109, 111. The stress 173 is excited by the oscillating electric field applied via the top acoustic reflector 115 stack of the plurality of top metal electrode layers 135, 137, 139, 141, 143, 145, 147, 149, 151, and the bottom acoustic reflector 113 stack of the plurality of bottom metal electrode layers 117, 119, 121, 123, 125, 127, 129, 131, 133. The stress 173 has maximum values inside the stack 104 of piezoelectric layers, while exponentially tapering off within the top acoustic reflector 115 and the bottom acoustic reflector 113. Notably, acoustic energy confined in the resonator structure 100 is proportional to stress magnitude.

As discussed previously herein, the example four piezoelectric layers, 105, 107, 109, 111 in the stack 104 may have an alternating axis arrangement in the stack 104. For example the bottom piezoelectric layer 105 may have the normal axis orientation, which is depicted in FIG. 1B using the downward directed arrow. Next in the alternating axis arrangement of the stack 104, the first middle piezoelectric layer 107 may have the reverse axis orientation, which is depicted in FIG. 1B using the upward directed arrow. Next in the alternating axis arrangement of the stack 104, the second middle piezoelectric layer 109 may have the normal axis orientation, which is depicted in FIG. 1B using the downward directed arrow. Next in the alternating axis arrangement of the stack 104, the top piezoelectric layer 111 may have the reverse axis orientation, which is depicted in FIG. 1B using the upward directed arrow. For the alternating axis arrangement of the stack 104, stress 173 excited by the applied oscillating electric field causes normal axis piezoelectric layers (e.g., bottom and second middle piezoelectric layers 105, 109) to be in compression, while reverse axis piezoelectric layers (e.g., first middle and top piezoelectric layers 107, 111) to be in extension. Accordingly, FIG. 1B shows peaks of stress 173 on the right side of the heavy dashed line to depict compression in normal axis piezoelectric layers (e.g., bottom and second middle piezoelectric layers 105, 109), while peaks of stress 173 are shown on the left side of the heavy dashed line to depict extension in reverse axis piezoelectric layers (e.g., first middle and top piezoelectric layers 107, 111).

Figure 1C:
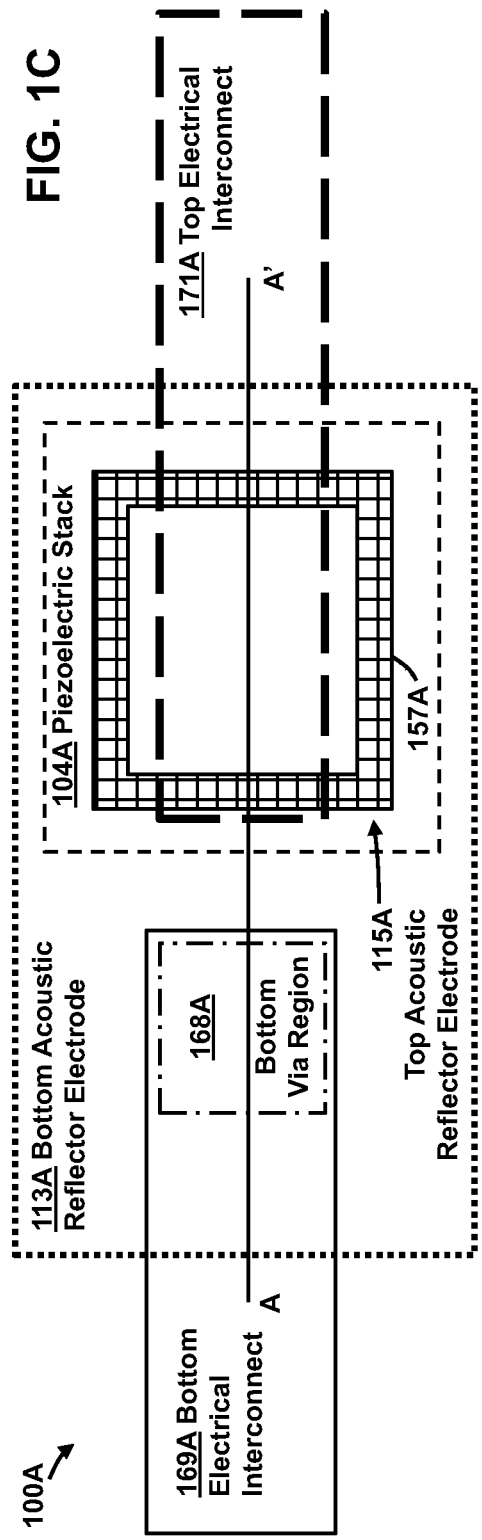
FIG. 1C shows a simplified top plan view of a bulk acoustic wave resonator structure corresponding to the cross sectional view of FIG. 1A, and also shows another simplified top plan view of an alternative bulk acoustic wave resonator structure.
Figure 1C:
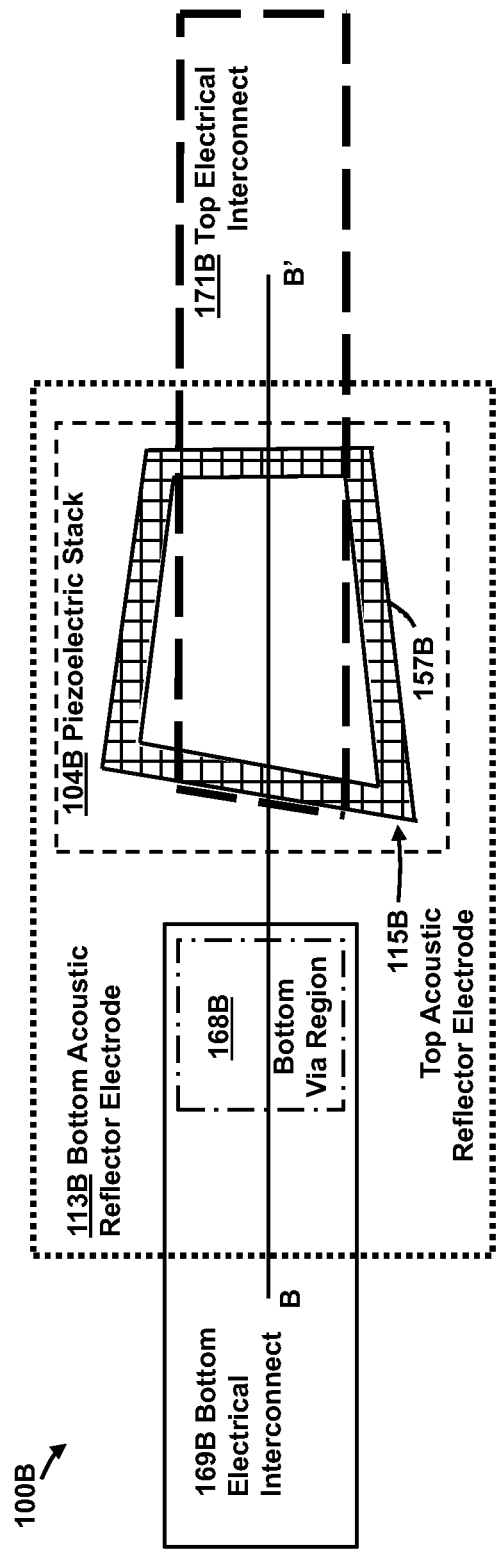

FIG. 1C shows a simplified top plan view of a bulk acoustic wave resonator structure 100A corresponding to the cross sectional view of FIG. 1A, and also shows another simplified top plan view of an alternative bulk acoustic wave resonator structure 100B. The bulk acoustic wave resonator structure 100A may include the stack 104A of four layers of piezoelectric material e.g., having the alternating piezoelectric axis arrangement of the four layers of piezoelectric material. The stack 104A of piezoelectric layers may be sandwiched between the bottom acoustic reflector electrode 113A and the top acoustic reflector electrode 115A. The bottom acoustic reflector electrode may comprise the stack of the plurality of bottom metal electrode layers of the bottom acoustic reflector electrode 113A, e.g., having the alternating arrangement of low acoustic impedance bottom metal electrode layers and high acoustic impedance bottom metal layers. Similarly, the top acoustic reflector electrode 115A may comprise the stack of the plurality of top metal electrode layers of the top acoustic reflector electrode 115A, e.g., having the alternating arrangement of low acoustic impedance top metal electrode layers and high acoustic impedance top metal electrode layers. The top acoustic reflector electrode 115A may include a patterned layer 157A. The patterned layer 157A may approximate a frame shape (e.g., rectangular frame shape) proximate to a perimeter (e.g., rectangular perimeter) of top acoustic reflector electrode 115A as shown in simplified top plan view in FIG. 1C. This patterned layer 157A, e.g., approximating the rectangular frame shape in the simplified top plan view in FIG. 1C, corresponds to the patterned layer 157 shown in simplified cross sectional view in FIG. 1A. Top electrical interconnect 171A extends over (e.g., electrically contacts) top acoustic reflector electrode 115A. Bottom electrical interconnect 169A extends over (e.g., electrically contacts) bottom acoustic reflector electrode 113A through bottom via region 168A.

FIG. 1C also shows another simplified top plan view of an alternative bulk acoustic wave resonator structure 100B. Similarly, the bulk acoustic wave resonator structure 100B may include the stack 104B of four layers of piezoelectric material e.g., having the alternating piezoelectric axis arrangement of the four layers of piezoelectric material. The stack 104B of piezoelectric layers may be sandwiched between the bottom acoustic reflector electrode 113B and the top acoustic reflector electrode 115B. The bottom acoustic reflector electrode may comprise the stack of the plurality of bottom metal electrode layers of the bottom acoustic reflector electrode 113B, e.g., having the alternating arrangement of low acoustic impedance bottom metal electrode layers and high acoustic impedance bottom metal layers. Similarly, the top acoustic reflector electrode 115B may comprise the stack of the plurality of top metal electrode layers of the top acoustic reflector electrode 115B, e.g., having the alternating arrangement of low acoustic impedance top metal electrode layers and high acoustic impedance top metal electrode layers. The top acoustic reflector electrode 115B may include a patterned layer 157B. The patterned layer 157B may approximate a frame shape (e.g., apodized frame shape) proximate to a perimeter (e.g., apodized perimeter) of top acoustic reflector electrode 115B as shown in simplified top plan view in FIG. 1C. The apodized frame shape may be a frame shape in which substantially opposing extremities are not parallel to one another. This patterned layer 157B, e.g., approximating the apodized frame shape in the simplified top plan view in FIG. 1C, is an alternative embodiment corresponding to the patterned layer 157 shown in simplified cross sectional view in FIG. 1A. Top electrical interconnect 171B extends over (e.g., electrically contacts) top acoustic reflector electrode 115B. Bottom electrical interconnect 169B extends over (e.g., electrically contacts) bottom acoustic reflector electrode 113B through bottom via region 168B.

In FIGS. 1D and 1E, Nitrogen (N) atoms are depicted with a hatching style, while Aluminum (Al) atoms are depicted without a hatching style. FIG. 1D is a perspective view of an illustrative model of a reverse axis crystal structure 175 of Aluminum Nitride, AlN, in piezoelectric material of layers in FIG. 1A, e.g., having reverse axis orientation of negative polarization. For example, first middle and top piezoelectric layers 107, 111 discussed previously herein with respect to FIGS. 1A and 1B are reverse axis piezoelectric layers. By convention, when the first layer of normal axis crystal structure 175 is a Nitrogen, N, layer and second layer in an upward direction (in the depicted orientation) is an Aluminum, Al, layer, the piezoelectric material including the reverse axis crystal structure 175 is said to have crystallographic c-axis negative polarization, or reverse axis orientation as indicated by the upward pointing arrow 177. For example, polycrystalline thin film Aluminum Nitride, AlN, may be grown in the crystallographic c-axis negative polarization, or reverse axis, orientation perpendicular relative to the substrate surface using reactive magnetron sputtering of an aluminum target in a nitrogen atmosphere, and by introducing oxygen into the gas atmosphere of the reaction chamber during fabrication at the position where the flip to the reverse axis is desired. An inert gas, for example, Argon may also be included in a sputtering gas atmosphere, along with the nitrogen and oxygen.

For example, a predetermined amount of oxygen containing gas may be added to the gas atmosphere over a short predetermined period of time or for the entire time the reverse axis layer is being deposited. The oxygen containing gas may be diatomic oxygen containing gas, such as oxygen ($O_2$). Proportionate amounts of the Nitrogen gas (N2) and the inert gas may flow, while the predetermined amount of oxygen containing gas flows into the gas atmosphere over the predetermined period of time. For example, N2 and Ar gas may flow into the reaction chamber in approximately a 3:1 ratio of N2 to Ar, as oxygen gas also flows into the reaction chamber. For example, the predetermined amount of oxygen containing gas added to the gas atmosphere may be in a range from about a thousandth of a percent (0.001%) to about ten percent (10%), of the entire gas flow. The entire gas flow may be a sum of the gas flows of argon, nitrogen and oxygen, and the predetermined period of time during which the predetermined amount of oxygen containing gas is added to the gas atmosphere may be in a range from about a quarter (0.25) second to a length of time needed to create an entire layer, for example. For example, based on mass-flows, the oxygen composition of the gas atmosphere may be about 2 percent when the oxygen is briefly injected. This results in an aluminum oxynitride (ALON) portion of the final monolithic piezoelectric layer, integrated in the Aluminum Nitride, AlN, material, having a thickness in a range of about 5 nm to about 20 nm, which is relatively oxygen rich and very thin. Alternatively, the entire reverse axis piezoelectric layer may be aluminum oxynitride.

FIG. 1E is a perspective view of an illustrative model of a normal axis crystal structure 179 of Aluminum Nitride, AlN, in piezoelectric material of layers in FIG. 1A, e.g., having normal axis orientation of positive polarization. For example, bottom and second middle piezoelectric layers 105, 109 discussed previously herein with respect to FIGS. 1A and 1B are normal axis piezoelectric layers. By convention, when the first layer of the reverse axis crystal structure 179 is an Al layer and second layer in an upward direction (in the depicted orientation) is an N layer, the piezoelectric material including the reverse axis crystal structure 179 is said to have a c-axis positive polarization, or normal axis orientation as indicated by the downward pointing arrow 181. For example, polycrystalline thin film AlN may be grown in the crystallographic c-axis positive polarization, or normal axis, orientation perpendicular relative to the substrate surface by using reactive magnetron sputtering of an Aluminum target in a nitrogen atmosphere.

FIG. 1FA is an illustrative diagram of trigonal Lithium Niobate or Lithium Tantalate 183FA having reverse axis orientation 185FA of negative polarization, as indicated in FIG. 1FA by the upward pointing arrow 185FA. Reverse axis Lithium Niobate or Lithium Tantalate may be used in some alternative example embodiments of the piezoelectric material layers of FIG. 1A. For example, first middle and top piezoelectric layers 107, 111 discussed previously herein with respect to FIGS. 1A and 1B are reverse axis piezoelectric layers (e.g., may be reverse axis Lithium Niobate or reverse axis Lithium Tantalate).

FIGS. 1FB through 1FE are a series of illustrative diagrams showing splitting a normal axis donor wafer to produce a trigonal Lithium Niobate or Lithium Tantalate layer having the normal axis orientation of positive polarization, and showing layer rotation to produce a trigonal Lithium Niobate or Lithium Tantalate layer having reverse axis orientation of negative polarization relative to the normal axis donor wafer. For example, as shown in FIG. 1FB, single crystal or near single crystal piezoelectric material (e.g. Czochralski method grown material) may be processed into a donor wafer 183FB having a normal axis orientation 185FB (e.g., single/near single crystal Lithium Niobate (LN) donor wafer 183FB having a normal axis orientation 185FB, e.g., X-cut, single/near single crystal Lithium Niobate (LN) donor wafer 183FB having a normal axis orientation 185FB, e.g., single/near single crystal Lithium Tantalate (LT) donor wafer 183FB having a normal axis orientation 185FB). For example, normal axis donor wafer 183FB having a bottom planar face 186FB may be subjected to implantation by bombardment of the bottom face 185FB of the normal axis donor wafer 183FB by means of ions (e.g., helium ions) when the normal axis donor wafer 183FB is at an implantation temperature. Subsequent heating of the normal axis donor wafer 183FB to a bubble forming and splitting temperature, which may be higher than the implantation temperature, may create in the volume of the wafer a layer of gaseous microbubbles 187FB defining in the volume of the normal axis donor wafer 183FB an upper region constituting the mass of the normal axis donor wafer and a lower region constituting the normal axis piezoelectric layer to be split from the normal axis donor wafer. The bottom planar face 186FB of the normal axis orientation donor wafer may be put into intimate contact with a stiffener comprising at least one rigid material layer, not shown (e.g., detachably bonding the bottom planar face 186FB of the normal axis orientation donor wafer 183FB to a stiffening carrier wafer, not shown). An assembly of the normal axis donor wafer 183FB and the stiffener, not shown (e.g., the carrier wafer, not shown) may be heat treated (e.g., heated) at the bubble forming and splitting temperature, above the implantation temperature at which the ion bombardment was carried out. This heating may be sufficient to create by a crystalline rearrangement effect in the normal axis donor wafer 183FB and a pressure effect in the microbubbles 187FB shown in FIG. 1FB. This may cause a separation (e.g., splitting) between the mass of the normal axis donor wafer 183FB and the piezoelectric layer to provide, as shown in FIG. 1FC, the separated piezoelectric layer 189FC having the normal axis orientation (e.g., piezoelectric layer 189FC still coupled with the stiffener, not shown, e.g., piezoelectric layer 189FC still detachably bonded to the carrier wafer, not shown).

The series of FIGS. 1FC through FIG. 1FE depict piezoelectric layer clockwise rotation by 180 degrees. This may invert the normal axis orientation 185FC of the piezoelectric layer 189FC shown in FIG. 1FC into the reverse axis orientation 189FE of the piezoelectric layer 189FE shown in FIG. 1FE. FIG. 1FD shows an intermediate rotation stage, where the piezoelectric layer 189FD has only been rotated by an initial 90 degrees relative to what is shown in FIG. 1FC, and has not yet be rotated the complete 180 degrees as discussed with respect to FIG. 1FE.

FIG. 1GA is an illustrative diagram of trigonal Lithium Niobate or Lithium Tantalate 183GA having normal axis orientation 185GA of positive polarization, as indicated in FIG. 1GA by the downward pointing arrow 185GA. Normal axis Lithium Niobate or Lithium Tantalate may be used in some in some alternative example embodiments of the piezoelectric material layers of FIG. 1A. For example, bottom and second middle piezoelectric layers 105, 109 discussed previously herein with respect to FIGS. 1A and 1B are normal axis piezoelectric layers (e.g., may be normal axis Lithium Niobate or normal axis Lithium Tantalate).

FIGS. 1GB through 1GE is a series of illustrative diagrams showing splitting a reverse axis donor wafer to produce a trigonal Lithium Niobate or Lithium Tantalate layer having the reverse axis orientation of negative polarization, and showing layer rotation to produce a trigonal Lithium Niobate or Lithium Tantalate layer having normal axis orientation of positive polarization relative to the reverse axis donor wafer 183GB. For example, as shown in FIG. 1GB, single crystal or near single crystal piezoelectric material (e.g. Czochralski method grown material) may be processed into a donor wafer 183GB having a reverse axis orientation 185GB (e.g., single/near single crystal Lithium Niobate (LN) donor wafer 183GB having a reverse axis orientation 185GB, e.g., X-cut, single/near single crystal Lithium Niobate (LN) donor wafer 183GB having a reverse axis orientation 185GB, e.g., single/near single crystal Lithium Tantalate (LT) donor wafer 183GB having a reverse axis orientation 185GB). For example, reverse axis donor wafer 183GB having a bottom planar face 186GB may be subjected to implantation by bombardment of the bottom face 186GB of the reverse axis donor wafer 183GB by means of ions (e.g., helium ions) when the reverse axis donor wafer 183GB is at the implantation temperature. Subsequent heating of the reverse axis donor wafer 183GB to the bubble forming and splitting temperature, which may be higher than the implantation temperature, may create in the volume of the reverse axis donor wafer 183GB a layer of gaseous microbubbles 187GB defining in the volume of the reverse axis donor wafer 183GB an upper region constituting the mass of the reverse axis donor wafer and a lower region constituting the reverse axis piezoelectric layer to be split from the reverse axis donor wafer. The bottom planar face 186GB of the reverse axis orientation donor wafer may be put into intimate contact with another stiffener comprising at least one rigid material layer, not shown (e.g., detachably bonding the bottom planar face 186GB of the reverse axis orientation donor wafer 183FB to a stiffening carrier wafer, not shown). An assembly of the reverse axis donor wafer 183GB and the stiffener, not shown (e.g., the carrier wafer, not shown) may be heat treated (e.g., heated) at the bubble forming and splitting temperature, above the implantation temperature at which the ion bombardment was carried out. This heating may be sufficient to create by the crystalline rearrangement effect in the reverse axis donor wafer 183GB and the pressure effect in the microbubbles 187GB shown in FIG. 1GB. This may cause a separation (e.g., splitting) between the mass of the reverse axis donor wafer 183GB and the piezoelectric layer to provide, as shown in FIG. 1GC, the separated piezoelectric layer 189FC having the reverse axis orientation (e.g., piezoelectric layer 189GC still coupled with the stiffener, not shown, e.g., piezoelectric layer 189GC still detachably bonded to the carrier wafer, not shown).

For example, in the figures the main pieces, e.g., boules, e.g., piezoelectric donor wafers 183FB, 183 GB (e.g., Lithium Niobate, e.g., Lithium Tantalate) may be implanted with helium ions at an energy corresponding to a desired layer thickness. This implantation may later result in the splitting of the Lithium Niobate at the desired thickness upon further heating. For example, helium implanted Lithium Niobate can be split from the Lithium Niobate donor wafers 183FB, 183 GB (e.g., main piece, e.g. boule) by heating to approximately 228 degrees Centigrade. In similar Lithium Tantalate embodiments, helium implanted Lithium Tantalate can be split from the Lithium Tantalite donor wafers 183FB, 183 GB (e.g., main pieces, e.g. boules) by heating to a similar bubble forming and splitting temperature (e.g., about 228 degrees Centigrade).

As mentioned previously herein, the bottom faces 186FB, 186GB of the implanted piezoelectric donor wafers 183FB, 183GB (e.g., Lithium Niobate, e.g., Lithium Tantalate) may be releasably bonded to one or more carrier wafers (not shown), for example, using one or more releasable carrier bonding layers (not shown) prior to the heating to the bubble forming and splitting temperature (e.g., about 228 degrees Centigrade), and prior to the splitting. Splitting of the piezoelectric layer (e.g., Lithium Niobate layer, e.g., Lithium Tantalate layer) from the piezoelectric donor wafers 183FB, 183 GB may occur at about 228 C (e.g., at the bubble forming and splitting temperature). Consequently, carrier bonding material of the carrier bonding layer may be selected to have a releasable bonding temperature, e.g., a glass transition temperature, e.g., a glass-liquid transition temperature, e.g., a melting or softening temperature, that is above (e.g., higher than) the bubble forming and splitting temperature (e.g., above about 228 degrees Centigrade). This may facilitate avoiding of de-bonding of the carrier wafer before piezoelectric layers have been split from the piezoelectric donor wafers 183FB, 183 GB.

For example, candidate carrier bonding materials for the carrier bonding layer may be lead based, relatively high temperature solders. For example, relatively high temperature solder compositions such as Sn5Pb93.5Ag1.5 and Sn10Pb88Ag2 may have melting points, e.g., releasable bonding temperatures, e.g., glass transition temperatures of approximately 298 C and 284 C respectively. These melting points, e.g., releasable bonding temperatures, e.g., glass transition temperatures of the carrier bonding material of the carrier bonding layer may be above the bubble forming and splitting temperature (e.g., above 228 degrees Centigrade).

In contrast, some carrier bonding materials may be less suitable because they may be characterized by a releasable bonding temperature, e.g., a melting temperature, e.g., a glass transition temperature, that is below the bubble forming and splitting temperature (e.g., below about 228 Degrees Centigrade). This may result in undesired de-bonding of the carrier wafer before piezoelectric layers have been split from the piezoelectric donor wafers 183FB, 183 GB. In other words, some bonding materials having the releasable bonding temperature below 228 degrees centigrade may create a risk of de-bonding the carrier wafer from the piezoelectric donor wafer before the piezoelectric has been split from the donor wafer.

As discussed, the retaining of bonding between the piezoelectric layers and the carrier wafer (not shown) during heating and splitting of the piezoelectric layers from the piezoelectric donor wafers 183FB, 183 GB. Since the piezoelectric layers 189FC through 189FE, 189GC through 189GE, may be thin, e.g., having thicknesses as discussed previously herein, they may otherwise be fragile. The stiffener/carrier wafer bonding may facilitate protecting the piezoelectric layers, e.g., from breakage, during layer transfer operation. For example, the stiffener/carrier wafer bonding may facilitate protecting the piezoelectric layers during grinding and/or polishing. For example, the piezoelectric layers may be ground and polished to a mirror-like or semi-mirror like state, which may facilitate stack bonding of piezoelectric layers to one another. The stiffener/carrier wafer bonding may facilitate protecting the piezoelectric layers during handling operations. The stiffener/carrier wafer bonding may facilitate protecting the piezoelectric layers during stack assembly operations, e.g., during stack assembly, e.g., during piezoelectric layer stack arrangement, e.g., during stack bonding of piezoelectric layers to one another into the alternating axis stack of piezoelectric layers, e.g., stack bonding using a stack bonding layer. For example, one or more interposer layers comprising stack bonding layers of stack bonding material may be used for stack bonding of the piezoelectric layers to one another into the alternating axis stack of piezoelectric layers. The stack bonding material of the stack bonding layers may comprise an adhesive, for example, comprising Benzocyclobutene (BCB), e.g., BCB, e.g., divinylsiloxane-bis-benzocyclobutene (DVS-BCB), e.g., mesithylene thinned BCB. Adhesive, e.g., BCB, may be spun onto piezoelectric layers and cured at a cure temperature (e.g., about 180 Degrees Centigrade) for stack bonding of the piezoelectric layers to one another into the alternating axis stack of piezoelectric layers. The cure temperature (e.g., about 180 Degrees Centigrade for BCB) of the adhesive, e.g., adhesive layer, e.g., bonding material, e.g., bonding layer, may be selected to be lower than the bubble forming and splitting temperature of the ion implanted piezoelectric material (e.g., lower than the 228 Degrees Centigrade for ion implanted Lithium Niobate). The cure temperature (e.g., about 180 Degrees Centigrade for BCB) of the adhesive, e.g., adhesive layer, e.g., bonding material, e.g., bonding layer, may be selected to be lower than the releasable bonding temperature of the carrier bonding material of the carrier bonding layer (e.g., relatively lower than the approximately 298 Degrees Centigrade or 284 Degrees Centigrade for the various relatively high temperature lead based solders discussed previously herein). The stack bonding material (e.g., cured BCB) may have a relatively high retention temperature (e.g., a relatively high glass transition temperature, e.g., a relatively high glass-liquid transition temperature, e.g., a relatively high stack bonding failure temperature, e.g., 370 Degrees Centigrade for BCB). This relatively high retention temperature of the stack bonding material may be selected to be relatively higher than the releasable bonding temperature of the carrier bonding material of the carrier bonding layer (e.g., relatively higher than the approximately 298 Degrees Centigrade or 284 Degrees Centigrade for the various relatively high temperature lead based solders discussed previously herein). Accordingly, since the retention temperature of the stack bonding material is higher than the releasable bonding temperature of the carrier bonding material, heating to a temperature that is between these two (e.g., above the releasable bonding temperature but below the retention temperature of the stack bonding material) may effect release of the carrier wafer while still maintaining interlayer bonding of the piezoelectric layers to one another for the alternating piezoelectric axis stack.

Further, this relatively high retention temperature of the stack bonding material may be selected to be relatively higher than the bubble forming and splitting temperature of the ion implanted piezoelectric material (e.g., higher than the 228 Degrees Centigrade for ion implanted Lithium Niobate). Accordingly, since the retention temperature of the stack bonding material is higher than the bubble forming and splitting temperature of the ion implanted piezoelectric material, heating to a temperature that is between these two (e.g., above the bubble forming and splitting temperature but below the retention temperature of the stack bonding material) may effect piezoelectric layer splitting from donor wafers while still maintain interlayer bonding of the piezoelectric layers to one another for the alternating piezoelectric axis stack.

In various alternative embodiments, stacks of any number or layers of Lithium Niobate (or Lithium Tantalate) with alternating piezoelectric orientations may be assembled by incrementally bonding the donor wafers of appropriate orientation to the stack using the stack bonding material, and incrementally splitting the piezoelectric layer from the donor wafers, in order to build up the stack, while the stack is retained by the carrier wafer. In other words, there may be repetition of a cycle comprising: bonding the stack being built-up to a donor wafer having the desired piezoelectric axis orientation for the piezoelectric layer to be added to the stack; splitting the piezoelectric layer from the donor wafer; and polishing/grinding the piezoelectric layer bonded to the stack. This cycle may be repeated to incrementally build up, layer by layer, that alternating axis stack of piezoelectric layers. For example, when the stack has been assembled and the total number of alternating axis Lithium Niobate (or Lithium Tantalate) layers has been attained, the entire stack may be heated to a temperature of 280-300 degrees Centigrade, e.g., above the releasable bonding temperature but below the retention temperature of the stack bonding material, so as to soften the solder holding the stack to the carrier wafer, while maintaining interlayer bonding between piezoelectric layers of the stance. The carrier wafer may be removed leaving the stack of alternating axis piezoelectric layers with stack bonding material, e.g., BCB, between each layer.

In alternative embodiments, relatively thicker layers of piezoelectric may be split off from donor wafers, and these newly liberated layers may be incrementally stack bonded and incrementally ground to desired thickness. In such case, the carrier bonding material of the carrier bonding layer need not endure splitting from the donor wafer, e.g., the releasable bonding temperature may be lower than the bubble forming and splitting temperature. In such case, a polymer such as poly propylene carbonate (PPC) may be used for the releasable carrier bonding material of the releasable carrier bonding layer. For example, heating to 50 Degrees Centigrate may provide for the PPC forming a good bond between the piezoelectric layer and the carrier wafer. Once the piezoelectric layers have been incrementally stack bonded and incrementally ground to desired thickness, heating above 50 Degrees Centigrate may provide for the PPC to soften and the carrier wafer to be removed from the bonded stack. The PPC can be removed by ketones or related polar solvents or by polishing or by heating to around 200 C whereby the polymer decomposes.

Figure 2A:
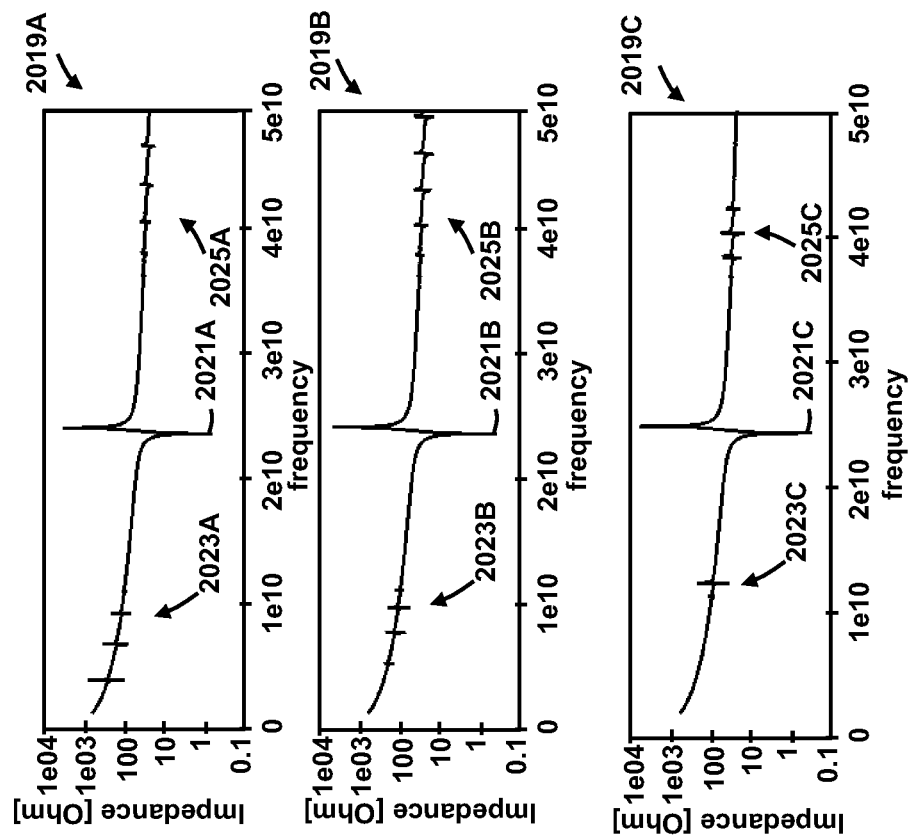
FIGS. 2A and 2B show a further simplified view of a bulk acoustic wave resonator similar to the bulk acoustic wave resonator structure shown in FIG. 1A along with its corresponding impedance versus frequency response during its electrical operation, as well as alternative bulk acoustic wave resonator structures with differing numbers of alternating axis piezoelectric layers, and their respective corresponding impedance versus frequency response during electrical operation, as predicted by simulation.
Figure 2A:
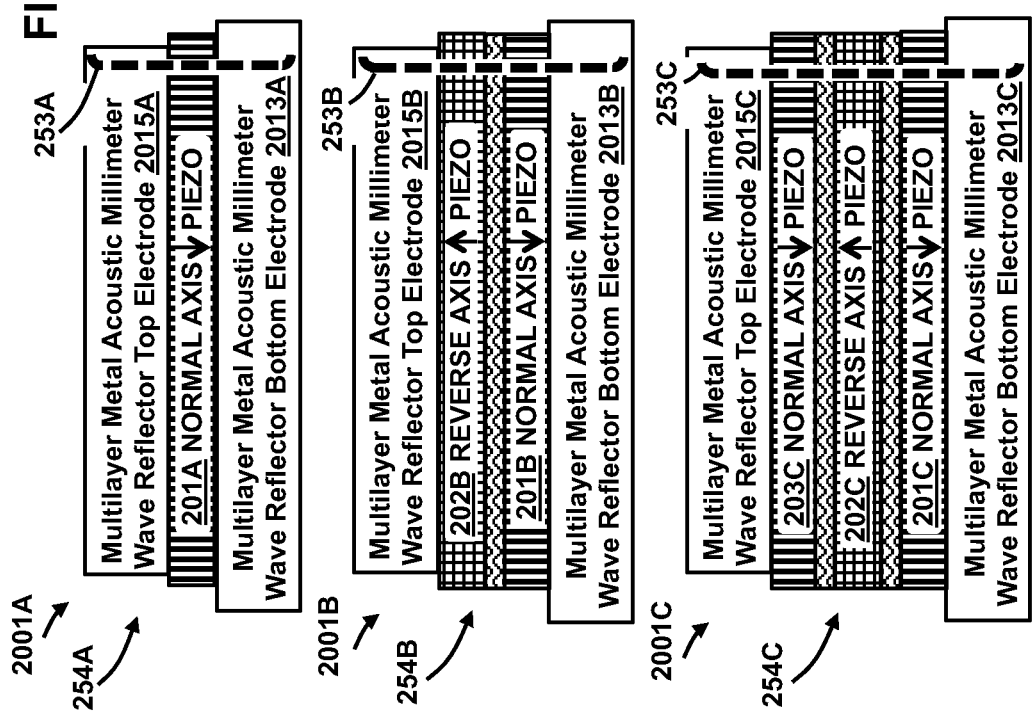
Figure 2B:
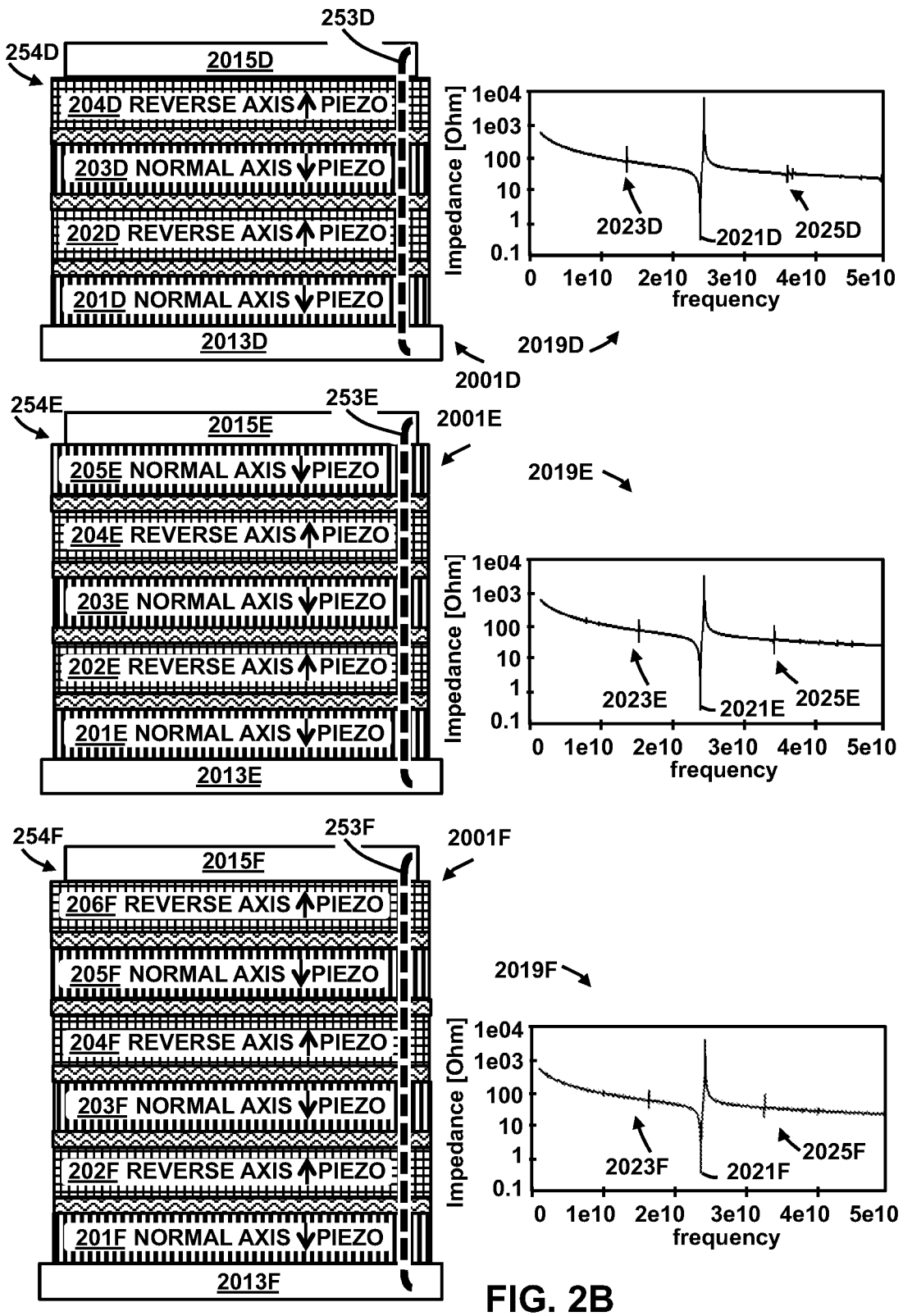

FIGS. 2A and 2B show a further simplified view of a bulk acoustic wave resonator similar to the bulk acoustic wave resonator structure shown in FIG. 1A along with its corresponding impedance versus frequency response during its electrical operation, as well as alternative bulk acoustic wave resonator structures with differing numbers of alternating axis piezoelectric layers, and their respective corresponding impedance versus frequency response during electrical operation. FIG. 2C shows additional alternative bulk acoustic wave resonator structures with additional numbers of alternating axis piezoelectric layers. Bulk acoustic wave resonators 2001A through 2001I may, but need not be, bulk acoustic millimeter wave resonators 2001A through 2001I, operable with a main resonance mode having a main resonant frequency that is a millimeter wave frequency (e.g., twenty-four Gigahertz, 24 GHz) in a millimeter wave frequency band. As defined herein, millimeter wave means a wave having a frequency within a range extending from eight Gigahertz (8 GHz) to three hundred Gigahertz (300 GHz), and millimeter wave band means a frequency band spanning this millimeter wave frequency range from eight Gigahertz (8 GHz) to three hundred Gigahertz (300 GHz). Bulk acoustic wave resonators 2001A through 2001I may, but need not be, bulk acoustic Super High Frequency (SHF) wave resonators 2001A through 2001I or bulk acoustic Extremely High Frequency (EHF) wave resonators 2001A through 2001I, as the terms Super High Frequency (SHF) and Extremely High Frequency (EHF) are defined by the International Telecommunications Union (ITU). For example, bulk acoustic wave resonators 2001A through 2001I may be bulk acoustic Super High Frequency (SHF) wave resonators 2001A through 2001I operable with a main resonance mode having a main resonant frequency that is a Super High Frequency (SHF) (e.g., twenty-four Gigahertz, 24 GHz) in a Super High Frequency (SHF) wave frequency band. Piezoelectric layer thicknesses may be selected to determine the main resonant frequency of bulk acoustic Super High Frequency (SHF) wave resonators 2001A through 2001I in the Super High Frequency (SHF) wave band (e.g., twenty-four Gigahertz, 24 GHz main resonant frequency). Similarly, layer thicknesses of Super High Frequency (SHF) reflector layers (e.g., layer thickness of multilayer metal acoustic SHF wave reflector bottom electrodes 2013A through 2013I, e.g., layer thickness of multilayer metal acoustic SHF wave reflector top electrodes 2015A through 2015I) may be selected to determine peak acoustic reflectivity of such SHF reflectors at a frequency, e.g., peak reflectivity resonant frequency, within the Super High Frequency (SHF) wave band (e.g., a twenty-four Gigahertz, 24

GHz peak reflectivity resonant frequency). Alternatively, bulk acoustic wave resonators 2001A through 2001I may be bulk acoustic Extremely High Frequency (EHF) wave resonators 2001A through 2001I operable with a main resonance mode having a main resonant frequency that is an Extremely High Frequency (EHF) wave band (e.g., thirty-nine Gigahertz, 39 GHz main resonant frequency) in an Extremely High Frequency (EHF) wave frequency band. Piezoelectric layer thicknesses may be selected to determine the main resonant frequency of bulk acoustic Extremely High Frequency (EHF) wave resonators 2001A through 2001I in the Extremely High Frequency (EHF) wave band (e.g., thirty-nine Gigahertz, 39 GHz main resonant frequency). Similarly, layer thicknesses of Extremely High Frequency (EHF) reflector layers (e.g., layer thickness of multilayer metal acoustic EHF wave reflector bottom electrodes 2013A through 2013I, e.g., layer thickness of multilayer metal acoustic EHF wave reflector top electrodes 2015A through 2015I) may be selected to determine peak acoustic reflectivity of such EHF reflectors at a frequency, e.g., peak reflectivity resonant frequency, within the Extremely High Frequency (EHF) wave band (e.g., a thirty-nine Gigahertz, 39 GHz peak reflectivity resonant frequency). The general structures of the multilayer metal acoustic reflector top electrode and the multilayer metal acoustic reflector bottom electrode have already been discussed previously herein with respect of FIGS. 1A and 1B. As already discussed, these structures are directed to respective pairs of metal electrode layers, in which a first member of the pair has a relatively low acoustic impedance (relative to acoustic impedance of an other member of the pair), in which the other member of the pair has a relatively high acoustic impedance (relative to acoustic impedance of the first member of the pair), and in which the respective pairs of metal electrode layers have layer thicknesses corresponding to one quarter wavelength (e.g., one quarter acoustic wavelength) at a main resonant frequency of the resonator. Accordingly, it should be understood that the bulk acoustic millimeter wave resonators 2001A, 2001B, 2000C shown in FIG. 2A include respective multilayer metal acoustic millimeter wave reflector top electrodes 2015A, 2015B, 2015C and multilayer metal acoustic millimeter wave reflector bottom electrodes 2013A, 2013B, 2013C, in which the respective pairs of metal electrode layers have layer thicknesses corresponding to a quarter wavelength (e.g., one quarter of an acoustic wavelength) at a millimeter wave main resonant frequency of the respective bulk acoustic millimeter wave resonator 2001A, 2001B, 2001C.

Shown in FIG. 2A is a bulk acoustic millimeter wave resonator 2001A including a normal axis piezoelectric layer 201A sandwiched between multilayer metal acoustic millimeter wave reflector top electrode 2015A and multilayer metal acoustic millimeter wave reflector bottom electrode 2013A. Also shown in FIG. 2A is a bulk acoustic millimeter wave resonator 2001B including a normal axis piezoelectric layer 201B and a reverse axis piezoelectric layer 202B arranged in a two piezoelectric layer alternating stack arrangement sandwiched between multilayer metal acoustic millimeter wave reflector top electrode 2015B and multilayer metal acoustic millimeter wave reflector bottom electrode 2013B. A bulk acoustic millimeter wave resonator 2001C includes a normal axis piezoelectric layer 201C, a reverse axis piezoelectric layer 202C, and another normal axis piezoelectric layer 203C arranged in a three piezoelectric layer alternating stack arrangement sandwiched between multilayer metal acoustic millimeter wave reflector top electrode 2015C and multilayer metal acoustic millimeter wave reflector bottom electrode 2013C.

Included in FIG. 2B is bulk acoustic millimeter wave resonator 2001D in a further simplified view similar to the bulk acoustic wave resonator structure shown in FIGS. 1A and 1B and including a normal axis piezoelectric layer 201D, a reverse axis piezoelectric layer 202D, and another normal axis piezoelectric layer 203D, and another reverse axis piezoelectric layer 204D arranged in a four piezoelectric layer alternating stack arrangement sandwiched between multilayer metal acoustic millimeter wave reflector top electrode 2015D and multilayer metal acoustic millimeter wave reflector bottom electrode 2013D. A bulk acoustic millimeter wave resonator 2001E includes a normal axis piezoelectric layer 201E, a reverse axis piezoelectric layer 202E, another normal axis piezoelectric layer 203E, another reverse axis piezoelectric layer 204E, and yet another normal axis piezoelectric layer 205E arranged in a five piezoelectric layer alternating stack arrangement sandwiched between multilayer metal acoustic millimeter wave reflector top electrode 2015E and multilayer metal acoustic millimeter wave reflector bottom electrode 2013E. A bulk acoustic millimeter wave resonator 2001F includes a normal axis piezoelectric layer 201F, a reverse axis piezoelectric layer 202F, another normal axis piezoelectric layer 203F, another reverse axis piezoelectric layer 204F, yet another normal axis piezoelectric layer 205F, and yet another reverse axis piezoelectric layer 206F arranged in a six piezoelectric layer alternating stack arrangement sandwiched between multilayer metal acoustic millimeter wave reflector top electrode 2015F and multilayer metal acoustic millimeter wave reflector bottom electrode 2013F.

In FIG. 2A, shown directly to the right of the bulk acoustic millimeter wave resonator 2001A including the normal axis piezoelectric layer 201A, is a corresponding diagram 2019A depicting its impedance versus frequency response during its electrical operation, as predicted by simulation. The diagram 2019A depicts the main resonant peak 2021A of the main resonant mode of the bulk acoustic millimeter wave resonator 2001A at its main resonant frequency (e.g., its 24 GHz series resonant frequency). The diagram 2019A also depicts the satellite resonance peaks 2023A, 2025A of the satellite resonant modes of the bulk acoustic millimeter wave resonator 2001A at satellite frequencies above and below the main resonant frequency 2021A (e.g., above and below the 24 GHz series resonant frequency). Relatively speaking, the main resonant mode corresponding to the main resonance peak 2021A is the strongest resonant mode because it is stronger than all other resonant modes of the resonator 2001A, (e.g., stronger than the satellite modes corresponding to relatively lesser satellite resonance peaks 2023A, 2025A).

Similarly, in FIGS. 2A and 2B, shown directly to the right of the bulk acoustic millimeter wave resonators 2001B through 2001F are respective corresponding diagrams 2019B through 2019F depicting corresponding impedance versus frequency response during electrical operation, as predicted by simulation. The diagrams 2019B through 2019F depict respective main resonant peaks 2021B through 2021F of respective corresponding main resonant modes of bulk acoustic millimeter wave resonators 2001B through 2001F at respective corresponding main resonant frequencies (e.g., respective 24 GHz series resonant frequencies). The diagrams 2019B through 2019F also depict respective satellite resonance peaks 2023B through 2023F, 2025B through 2025F of respective corresponding satellite resonant modes of the bulk acoustic millimeter wave resonators 2001B through 2001F at respective corresponding satellite frequencies above and below the respective corresponding main resonant frequencies 2021B through 2021F (e.g., above and below the corresponding respective 24 GHz series resonant frequencies). Relatively speaking, for the corresponding respective main resonant modes, its corresponding respective main resonance peak 2021B through 2021F is the strongest for its bulk acoustic millimeter wave resonators 2001B through 2001F (e.g., stronger than the corresponding respective satellite modes and corresponding respective lesser satellite resonance peaks 2023B, 2025B).

For the bulk acoustic millimeter wave resonator 2001F having the alternating axis stack of six piezoelectric layers, simulation of the 24 GHz design predicts an average passband quality factor of approximately 1,700. Scaling this 24 Ghz, six piezoelectric layer design to a 37 Ghz, six piezoelectric layer design, may have an average passband quality factor of approximately 1,300 as predicted by simulation. Scaling this 24 Ghz, six piezoelectric layer design to a 77 Ghz, six piezoelectric layer design, may have an average passband quality factor of approximately 730 as predicted by simulation.

As mentioned previously, FIG. 2C shows additional alternative bulk acoustic wave resonator structures with additional numbers of alternating axis piezoelectric layers. A bulk acoustic millimeter wave resonator 2001G includes four normal axis piezoelectric layers 201G, 203G, 205G, 207G, and four reverse axis piezoelectric layers 202G, 204G, 206G, 208G arranged in an eight piezoelectric layer alternating stack arrangement sandwiched between multilayer metal acoustic millimeter wave reflector top electrode 2015G and multilayer metal acoustic millimeter wave reflector bottom electrode 2013G. A bulk acoustic millimeter wave resonator 2001H includes five normal axis piezoelectric layers 201H, 203H, 205H, 207H, 209H and five reverse axis piezoelectric layers 202H, 204H, 206H, 208H, 210H arranged in a ten piezoelectric layer alternating stack arrangement sandwiched between multilayer metal acoustic millimeter wave reflector top electrode 2015H and multilayer metal acoustic millimeter wave reflector bottom electrode 2013H. A bulk acoustic millimeter wave resonator 2001I includes nine normal axis piezoelectric layers 201I, 203I, 205I, 207I, 209I, 211I, 213I, 215I, 217I and nine reverse axis piezoelectric layers 202I, 204I, 206I, 208I, 210I, 212I, 214I, 216I, 218I arranged in an eighteen piezoelectric layer alternating stack arrangement sandwiched between multilayer metal acoustic millimeter wave reflector top electrode 2015I and multilayer metal acoustic millimeter wave reflector bottom electrode 2013I.

For the bulk acoustic millimeter wave resonator 2001I having the alternating axis stack of eighteen piezoelectric layers, simulation of the 24 GHz design predicts an average passband quality factor of approximately 2,700. Scaling this 24 Ghz, eighteen piezoelectric layer design to a 37 Ghz, eighteen piezoelectric layer design, may have an average passband quality factor of approximately 2000 as predicted by simulation. Scaling this 24 Ghz, eighteen piezoelectric layer design to a 77 Ghz, eighteen piezoelectric layer design, may have an average passband quality factor of approximately 1,130 as predicted by simulation.

In the example resonators, 2001A through 2001I, of FIGS. 2A through 2C, a notional heavy dashed line is used in depicting respective etched edge region, 253A through 253I, associated with the example resonators, 2001A through 2001I. Similarly, in the example resonators, 2001A through 2001I, of FIGS. 2A through 2C, a laterally opposed etched edge region 254A through 254I may be arranged laterally opposite from etched edge region, 253A through 253I. The respective etched edge region may, but need not, assist with acoustic isolation of the resonators, 2001A through 2001I. The respective etched edge region may, but need not, help with avoiding acoustic losses for the resonators, 2001A through 2001I. The respective etched edge region, 253A through 253I, (and the laterally opposed etched edge region 254A through 254I) may extend along the thickness dimension of the respective piezoelectric layer stack. The respective etched edge region, 253A through 253I, (and the laterally opposed etched edge region 254A through 254I) may extend through (e.g., entirely through or partially through) the respective piezoelectric layer stack. The respective etched edge region, 253A through 253I may extend through (e.g., entirely through or partially through) the respective first piezoelectric layer, 201A through 201I. The respective etched edge region, 253B through 253I, (and the laterally opposed etched edge region 254B through 254I) may extend through (e.g., entirely through or partially through) the respective second piezoelectric layer, 202B through 202I. The respective etched edge region, 253C through 253I, (and the laterally opposed etched edge region 254C through 254I) may extend through (e.g., entirely through or partially through) the respective third piezoelectric layer, 203C through 203I. The respective etched edge region, 253D through 253I, (and the laterally opposed etched edge region 254D through 254I) may extend through (e.g., entirely through or partially through) the respective fourth piezoelectric layer, 204D through 204I. The respective etched edge region, 253E through 253I, (and the laterally opposed etched edge region 254E through 254I) may extend through (e.g., entirely through or partially through) the respective additional piezoelectric layers of the resonators, 2001E through 2001I. The respective etched edge region, 253A through 253I, (and the laterally opposed etched edge region 254A through 254I) may extend along the thickness dimension of the respective multilayer metal acoustic millimeter wave reflector bottom electrode, 2013A through 2013I, of the resonators, 2001A through 2001I. The respective etched edge region, 253A through 253I, (and the laterally opposed etched edge region 254A through 254I) may extend through (e.g., entirely through or partially through) the respective multilayer metal acoustic millimeter wave reflector bottom electrode, 2013A through 2013I. The respective etched edge region, 253A through 253I, (and the laterally opposed etched edge region 254A through 254I) may extend along the thickness dimension of the respective multilayer metal acoustic millimeter wave reflector top electrode, 2015A through 2015I of the resonators, 2001A through 2001I. The etched edge region, 253A through 253I, (and the laterally opposed etched edge region 254A through 254I) may extend through (e.g., entirely through or partially through) the respective multilayer metal acoustic millimeter wave reflector top electrode, 2015A through 2015I.

As shown in FIGS. 2A through 2C, first mesa structures corresponding to the respective stacks of piezoelectric material layers may extend laterally between (e.g., may be formed between) etched edge regions 253A through 253I and laterally opposing etched edge region 254A through 254I. Second mesa structures corresponding to multilayer metal acoustic millimeter wave reflector bottom electrode 2013A through 2013I may extend laterally between (e.g., may be formed between) etched edge regions 253A through 253I and laterally opposing etched edge region 254A through 254I. Third mesa structures corresponding to multilayer metal acoustic millimeter wave reflector top electrode 2015A through 2015I may extend laterally between (e.g., may be formed between) etched edge regions 253A through 253I and laterally opposing etched edge region 254A through 254I.

In accordance with the teachings herein, various bulk acoustic millimeter wave resonators may include: a seven piezoelectric layer alternating axis stack arrangement; a nine piezoelectric layer alternating axis stack arrangement; an eleven piezoelectric layer alternating axis stack arrangement; a twelve piezoelectric layer alternating axis stack arrangement; a thirteen piezoelectric layer alternating axis stack arrangement; a fourteen piezoelectric layer alternating axis stack arrangement; a fifteen piezoelectric layer alternating axis stack arrangement; a sixteen piezoelectric layer alternating axis stack arrangement; and a seventeen piezoelectric layer alternating axis stack arrangement; and that these stack arrangements may be sandwiched between respective multilayer metal acoustic millimeter wave reflector top electrodes and respective multilayer metal acoustic millimeter wave reflector bottom electrodes. Mass load layers and lateral features (e.g., step features) as discussed previously herein with respect to FIG. 1A are not explicitly shown in the simplified diagrams of the various resonators shown in FIGS. 2A, 2B and 2C. However, such mass load layers may be included, and such lateral features may be included, and may be arranged between, for example, top metal electrode layers of the respective top acoustic reflectors of the resonators shown in FIGS. 2A, 2B and 2C. Further, such mass load layers may be included, and such lateral features may be included, and may be arranged between, for example, top metal electrode layers of the respective top acoustic reflectors in the various resonators having the alternating axis stack arrangements of various numbers of piezoelectric layers, as described in this disclosure.

In a millimeter wave frequency example (e.g., in a Super High Frequency (SHF) example), thicknesses of piezoelectric layers (e.g., thicknesses of the normal axis piezoelectric layer 2005A through 2005I, e.g., thicknesses of the reverse axis piezoelectric layer 2007A through 2007I) may determine (e.g., may be selected to determine) the main resonant frequency of bulk acoustic millimeter wave resonator 2001A through 2001I in the millimeter wave band (e.g., approximately twenty-four Gigahertz, approximately 24 GHz main resonant frequency). Similarly, in the 24 GHz millimeter wave example, layer thicknesses of millimeter wave acoustic reflector electrode layers (e.g., member layer thicknesses of bottom acoustic millimeter wave reflector electrode 2013A through 2013I, e.g., member layer thickness of top acoustic millimeter wave reflector electrode 2015A through 2015I) may be selected to determine peak acoustic reflectivity of such acoustic millimeter wave reflector electrodes at a frequency, e.g., peak reflectivity resonant frequency, within the millimeter wave band (e.g., approximately twenty-four Gigahertz, approximately 24 GHz peak reflectivity resonant frequency). The millimeter wave band may include: 1) peak reflectivity resonant frequency (e.g., approximately twenty-four Gigahertz, approximately 24 GHz peak reflectivity resonant frequency) of the acoustic millimeter wave reflector electrode layers; and 2) the main resonant frequency of bulk acoustic millimeter wave resonator 2001A through 2001I (e.g., approximately twenty-four Gigahertz, approximately 24 GHz main resonant frequency).

In additional millimeter wave frequency examples (e.g., additional Extremely High Frequency (EHF) examples), thicknesses of piezoelectric layers (e.g., thicknesses of the normal axis piezoelectric layer 2005A through 2005I, e.g., thicknesses of the reverse axis piezoelectric layer 2007A through 2007I) may be selected to determine the main resonant frequency of bulk acoustic millimeter wave resonator 2001A through 2001I in the millimeter wave frequency band (e.g., 39 GHz main resonant frequency, e.g., 77 GHz main resonant frequency). Similarly, in additional millimeter wave frequency examples, layer thicknesses of acoustic millimeter wave reflector electrode layers (e.g., member layer thicknesses of bottom acoustic millimeter wave reflector electrode 2013A through 2013I, e.g., member layer thickness of top acoustic millimeter wave reflector electrode 2015A through 2015I) may be selected to determine peak acoustic reflectivity of such acoustic millimeter wave reflector electrodes at a frequency, e.g., peak reflectivity resonant frequency, within the millimeter wave band (e.g., 39 GHz peak reflectivity resonant frequency, e.g., 77 GHz peak reflectivity resonant frequency). The millimeter wave band may include: 1) peak reflectivity resonant frequency (e.g., 39 GHz peak reflectivity resonant frequency, e.g., 77 GHz peak reflectivity resonant frequency) of the acoustic millimeter wave reflector electrode layers; and 2) the main resonant frequency of bulk acoustic millimeter wave resonator 2001A through 2001I (e.g., 39 GHz main resonant frequency, e.g., 77 GHz main resonant frequency).

For example, relatively low acoustic impedance titanium (Ti) metal and relatively high acoustic impedance Molybdenum (Mo) metal may be alternated for member layers of the bottom acoustic reflector electrode 2013A through 2013I, and for member layers of top acoustic reflector electrode 2015A through 2015I. Accordingly, these member layers may be different metals from one another having respective acoustic impedances that are different from one another so as to provide a reflective acoustic impedance mismatch at the resonant frequency of the resonator. For example, a first member may have an acoustic impedance, and a second member may have a relatively higher acoustic impedance that is at least about twice (e.g., twice) as high as the acoustic impedance of the first member.

Thicknesses of member layers of the acoustic reflector electrodes may be related to resonator resonant frequency. Member layers of the acoustic reflector electrodes may be made thinner as resonators are made to extend to higher resonant frequencies, and as acoustic reflector electrodes are made to extend to higher peak reflectivity resonant frequencies. In accordance with teachings of this disclosure, to compensate for this member layer thinning, number of member layers of the acoustic reflector electrodes may be increased in designs extending to higher resonant frequencies, to facilitate thermal conductivity through acoustic reflector electrodes, and to facilitate electrical conductivity through acoustic reflectivity at higher resonant frequencies. Operation of the example bulk acoustic wave resonators 2001A through 2001I at a resonant millimeter wave frequency (e.g., at a resonant Super High Frequency (SHF), e.g., at a resonant Extremely High Frequency (EHF)) may generate heat to be removed from bulk acoustic wave resonators 2001A through 2001I through the acoustic reflector electrodes. The acoustic reflector electrodes (e.g., bottom acoustic millimeter wave reflector electrode 2013A through 2013I, e.g., top acoustic millimeter wave reflector electrode 2015A through 2015I) may have thermal resistance of three thousand degrees Kelvin per Watt or less at the given frequency (e.g., at the resonant frequency of the BAW resonator in the millimeter wave frequency band, e.g., at the peak reflectivity resonant frequency of the acoustic reflector electrode in the millimeter wave frequency band). For example, a sufficient number of member layers may be employed to provide for this thermal resistance at the given frequency (e.g., at the resonant frequency of the BAW resonator in the millimeter wave frequency band, e.g., at the peak reflectivity resonant frequency of the acoustic reflector electrode in the millimeter wave frequency band).

Further, quality factor (Q factor) is a figure of merit for bulk acoustic wave resonators that may be related, in part, to acoustic reflector electrode conductivity. In accordance with the teachings of this disclosure, without an offsetting compensation that increases number of member layers, member layer thinning with increasing frequency may otherwise diminish acoustic reflector electrode conductivity, and may otherwise diminish quality factor (Q factor) of bulk acoustic wave resonators. In accordance with the teachings of this disclosure, number of member layers of the acoustic reflector electrodes may be increased in designs extending to higher resonant frequencies, to facilitate electrical conductivity through acoustic reflector electrodes. The acoustic reflector electrodes (e.g., bottom acoustic millimeter wave reflector electrode 2013A through 2013I, e.g., top acoustic millimeter wave reflector electrode 2015A through 2015I) may have sheet resistance of less than one Ohm per square at the given frequency (e.g., at the resonant frequency of the BAW resonator in the millimeter wave frequency band, e.g., at the peak reflectivity resonant frequency of the acoustic reflector electrode in the millimeter wave frequency band). For example, a sufficient number of member layers may be employed to provide for this sheet resistance at the given frequency (e.g., at the resonant frequency of the BAW resonator in the millimeter wave frequency band, e.g., at the peak reflectivity resonant frequency of the acoustic reflector electrode in the millimeter wave band). This may, but need not, facilitate enhancing quality factor (Q factor) to a quality factor (Q factor) that may be above a desired one thousand (1000).

Further, it should be understood that interposer layers as discussed previously herein with respect to FIG. 1A are explicitly shown in the simplified diagrams of the various resonators shown in FIGS. 2A, 2B and 2C. Such interposers may be included and interposed between adjacent piezoelectric layers in the various resonators shown in FIGS. 2A, 2B and 2C, and further may be included and interposed between adjacent piezoelectric layers in the various resonators having the alternating axis stack arrangements of various numbers of piezoelectric layers, as described in this disclosure. In some other alternative bulk acoustic wave resonator structures, fewer interposer layers may be employed. For example, FIG. 2D shows another alternative bulk acoustic wave resonator structure 2001J, similar to bulk acoustic wave resonator structure 2001I shown in FIG. 2C, but with differences. For example, relatively fewer interposer layers may be included in the alternative bulk acoustic wave resonator structure 2001J shown in FIG. 2D. For example, FIG. 2D shows a first interposer layer 261J interposed between second layer of (reverse axis) piezoelectric material 202J and third layer of (normal axis) piezoelectric material 203J, but without an interposer layer interposed between first layer of (normal axis) piezoelectric material 201J and second layer of (reverse axis) piezoelectric material 202J. As shown in FIG. 2D in a first detailed view 220J, without an interposer layer interposed between first layer of piezoelectric material 201J and second layer of piezoelectric material 202J, the first and second piezoelectric layer 201J, 202J may be a monolithic layer 222J of piezoelectric material (e.g., Aluminum Nitride (AlN)) having first and second regions 224J, 226J. A central region of monolithic layer 222J of piezoelectric material (e.g., Aluminum Nitride (AlN)) between first and second regions 224J, 226J may be oxygen rich. The first region 224J of monolithic layer 222J (e.g., bottom region 224J of monolithic layer 222J) has a first piezoelectric axis orientation (e.g., normal axis orientation) as representatively illustrated in detailed view 220J using a downward pointing arrow at first region 224J, (e.g., bottom region 224J). This first piezoelectric axis orientation (e.g., normal axis orientation, e.g., downward pointing arrow) at first region 224J of monolithic layer 222J (e.g., bottom region 224J of monolithic layer 222J) corresponds to the first piezoelectric axis orientation (e.g., normal axis orientation, e.g., downward pointing arrow) of first piezoelectric layer 201J. The second region 226J of monolithic layer 222J (e.g., top region 226J of monolithic layer 222J) has a second piezoelectric axis orientation (e.g., reverse axis orientation) as representatively illustrated in detailed view 220J using an upward pointing arrow at second region 226J, (e.g., top region 226J). This second piezoelectric axis orientation (e.g., reverse axis orientation, e.g., upward pointing arrow) at second region 226J of monolithic layer 222J (e.g., top region 226J of monolithic layer 222J) may be formed to oppose the first piezoelectric axis orientation (e.g., normal axis orientation, e.g., downward pointing arrow) at first region 224J of monolithic layer 222J (e.g., bottom region 224J of monolithic layer 222J) by adding gas (e.g., oxygen) to flip the axis while sputtering the second region 226J of monolithic layer 222J (e.g., top region 226J of monolithic layer 222J) onto the first region 224J of monolithic layer 222J (e.g., bottom region 224J of monolithic layer 222J). The second piezoelectric axis orientation (e.g., reverse axis orientation, e.g., upward pointing arrow) at second region 226J of monolithic layer 222J (e.g., top region 226J of monolithic layer 222J) corresponds to the second piezoelectric axis orientation (e.g., reverse axis orientation, e.g., upward pointing arrow) of second piezoelectric layer 202J.

Similarly, as shown in FIG. 2D in a second detailed view 230J, without an interposer layer interposed between third layer of piezoelectric material 203J and fourth layer of piezoelectric material 204J, the third and fourth piezoelectric layer 203J, 204J may be an additional monolithic layer 232J of piezoelectric material (e.g., Aluminum Nitride (AlN)) having first and second regions 234J, 236J. A central region of additional monolithic layer 232J of piezoelectric material (e.g., Aluminum Nitride (AlN)) between first and second regions 234J, 236J may be oxygen rich. The first region 234J of additional monolithic layer 232J (e.g., bottom region 234J of additional monolithic layer 232J) has the first piezoelectric axis orientation (e.g., normal axis orientation) as representatively illustrated in second detailed view 230J using the downward pointing arrow at first region 234J, (e.g., bottom region 224J). This first piezoelectric axis orientation (e.g., normal axis orientation, e.g., downward pointing arrow) at first region 234J of additional monolithic layer 232J (e.g., bottom region 234J of additional monolithic layer 232J) corresponds to the first piezoelectric axis orientation (e.g., normal axis orientation, e.g., downward pointing arrow) of third piezoelectric layer 203J. The second region 236J of additional monolithic layer 232J (e.g., top region 236J of additional monolithic layer 232J) has the second piezoelectric axis orientation (e.g., reverse axis orientation) as representatively illustrated in second detailed view 230J using the upward pointing arrow at second region 236J, (e.g., top region 236J). This second piezoelectric axis orientation (e.g., reverse axis orientation, e.g., upward pointing arrow) at second region 236J of additional monolithic layer 232J (e.g., top region 236J of additional monolithic layer 232J) may be formed to oppose the first piezoelectric axis orientation (e.g., normal axis orientation, e.g., downward pointing arrow) at first region 234J of additional monolithic layer 232J (e.g., bottom region 234J of additional monolithic layer 232J) by adding gas (e.g., oxygen) to flip the axis while sputtering the second region 236J of additional monolithic layer 232J (e.g., top region 236J of additional monolithic layer 232J) onto the first region 234J of additional monolithic layer 232J (e.g., bottom region 234J of additional monolithic layer 232J). The second piezoelectric axis orientation (e.g., reverse axis orientation, e.g., upward pointing arrow) at second region 236J of additional monolithic layer 232J (e.g., top region 236J of additional monolithic layer 232J) corresponds to the second piezoelectric axis orientation (e.g., reverse axis orientation, e.g., upward pointing arrow) of fourth piezoelectric layer 204J.

Similar to what was just discussed, without an interposer layer interposed between fifth layer of piezoelectric material 205J and sixth layer of piezoelectric material 206J, the fifth and sixth piezoelectric layer 205J, 206J may be another additional monolithic layer of piezoelectric material (e.g., Aluminum Nitride (AlN)) having first and second regions. More generally, for example in FIG. 2D, where N is an odd positive integer, without an interposer layer interposed between Nth layer of piezoelectric material and (N+1)th layer of piezoelectric material, the Nth and (N+1)th piezoelectric layer may be an (N+1)/2th monolithic layer of piezoelectric material (e.g., Aluminum Nitride (AlN)) having first and second regions. Accordingly, without an interposer layer interposed between seventeenth layer of piezoelectric material 217J and eighteenth layer of piezoelectric material 218J, the seventeenth and eighteenth piezoelectric layer 217J, 218J may be ninth monolithic layer of piezoelectric material (e.g., Aluminum Nitride (AlN)) having first and second regions.

The first interposer layer 261J is shown in FIG. 2D as interposing between a first pair of opposing axis piezoelectric layers 201J, 202J, and a second pair of opposing axis piezoelectric layers 203J, 204J. More generally, for example, where M is a positive integer, an Mth interposer layer is shown in FIG. 2D as interposing between an Mth pair of opposing axis piezoelectric layers and an (M+1)th pair of opposing axis piezoelectric layers. Accordingly, an eighth interposer layer is shown in FIG. 2D as interposing between an eighth pair of opposing axis piezoelectric layers 215J, 216J, and a ninth pair of opposing axis piezoelectric layers 217J, 218J. FIG. 2D shows an eighteen piezoelectric layer alternating axis stack arrangement sandwiched between multilayer metal acoustic millimeter wave reflector top electrode 2015J and multilayer metal acoustic millimeter wave reflector bottom electrode 2013J. Etched edge region 253J (and laterally opposing etched edge region 254J) may extend through (e.g., entirely through, e.g., partially through) the eighteen piezoelectric layer alternating axis stack arrangement and its interposer layers, and may extend through (e.g., entirely through, e.g., partially through) multilayer metal acoustic millimeter wave reflector top electrode 2015J, and may extend through (e.g., entirely through, e.g., partially through) multilayer metal acoustic millimeter wave reflector bottom electrode 2013J. As shown in FIG. 2D, a first mesa structure corresponding to the stack of eighteen piezoelectric material layers may extend laterally between (e.g., may be formed between) etched edge region 253J and laterally opposing etched edge region 254J. A second mesa structure corresponding to multilayer metal acoustic millimeter wave reflector bottom electrode 2013J may extend laterally between (e.g., may be formed between) etched edge region 253J and laterally opposing etched edge region 254J. Third mesa structure corresponding to multilayer metal acoustic millimeter wave reflector top electrode 2015J may extend laterally between (e.g., may be formed between) etched edge region 253J and laterally opposing etched edge region 254J.

As mentioned previously herein, one or more (e.g., one or a plurality of) interposer layers may be metal interposer layers. Alternatively or additionally, one or more (e.g., one or a plurality of) interposer layers may be dielectric interposer layers. Interposer layers may be metal and/or dielectric interposer layers. Alternatively or additionally, one or more (e.g., one or a plurality of) interposer layers may be formed of different metal layers. Alternatively or additionally, one or more (e.g., one or a plurality of) interposer layers may be formed of different dielectric layers. Alternatively or additionally, one or more (e.g., one or a plurality of) interposer layers may comprise metal and dielectric for respective interposer layers. Alternatively or additionally, one or more (e.g., one or a plurality of) interposer layers may be formed of different metal layers. For example, high acoustic impedance metal layer such as Tungsten (W) or Molybdenum (Mo) may (but need not) raise effective electromechanical coupling coefficient (Kt2) while subsequently deposited metal layer with hexagonal symmetry such as Titanium (Ti) may (but need not) facilitate higher crystallographic quality of subsequently deposited piezoelectric layer. Alternatively or additionally, one or more (e.g., one or a plurality of) interposer layers may be formed of different dielectric layers. For example, high acoustic impedance dielectric layer such as Hafnium Dioxide (HfO2) may (but need not) raise effective electromechanical coupling coefficient (Kt2). For example, one or more dielectric interposer layers, for example zinc oxide (ZnO) may (but need not) facilitate deposition of the alternating axis stack piezoelectric layers, and/or may (but need not) facilitate patterning/etching of the alternating axis stack piezoelectric layers. For example, one or more dielectric interposer layers, for example titanium nitride (TiN) may (but need not) facilitate deposition of the alternating axis stack piezoelectric layers, and/or may (but need not) facilitate patterning/etching of the alternating axis stack piezoelectric layers. Subsequently deposited amorphous dielectric layer such as Silicon Dioxide (SiO2) may (but need not) facilitate compensating for temperature dependent frequency shifts. Alternatively or additionally, one or more (e.g., one or a plurality of) interposer layers may comprise metal and dielectric for respective interposer layers. For example, high acoustic impedance metal layer such as Tungsten (W) or Molybdenum (Mo) may (but need not) raise effective electromechanical coupling coefficient (Kt2) while subsequently deposited amorphous dielectric layer such as Silicon Dioxide (SiO2) may (but need not) facilitate compensating for temperature dependent frequency shifts. For example, in FIG. 2D one or more of the interposer layers (e.g., interposer layer 268J) may comprise metal and dielectric for respective interposer layers. For example, detailed view 240J of interposer 268J shows interposer 268J as comprising metal sublayer 268JB over dielectric sublayer 268JA. For interposer 268J, example thickness of metal sublayer 268JB may be approximately two hundred Angstroms (200 A). For interposer 268J, example thickness of dielectric sublayer 268JA may be approximately two hundred Angstroms (200 A). The second piezoelectric axis orientation (e.g., reverse axis orientation, e.g., upward pointing arrow) at region 244J (e.g., bottom region 244J) corresponds to the second piezoelectric axis orientation (e.g., reverse axis orientation, e.g., upward pointing arrow) of eighth piezoelectric layer 208J. The first piezoelectric axis orientation (e.g., normal axis orientation, e.g., downward pointing arrow) at region 246J (e.g., top region 246J) corresponds to the first piezoelectric axis orientation (e.g., normal orientation, e.g., downward pointing arrow) of ninth piezoelectric layer 209J.

Figure 2E:
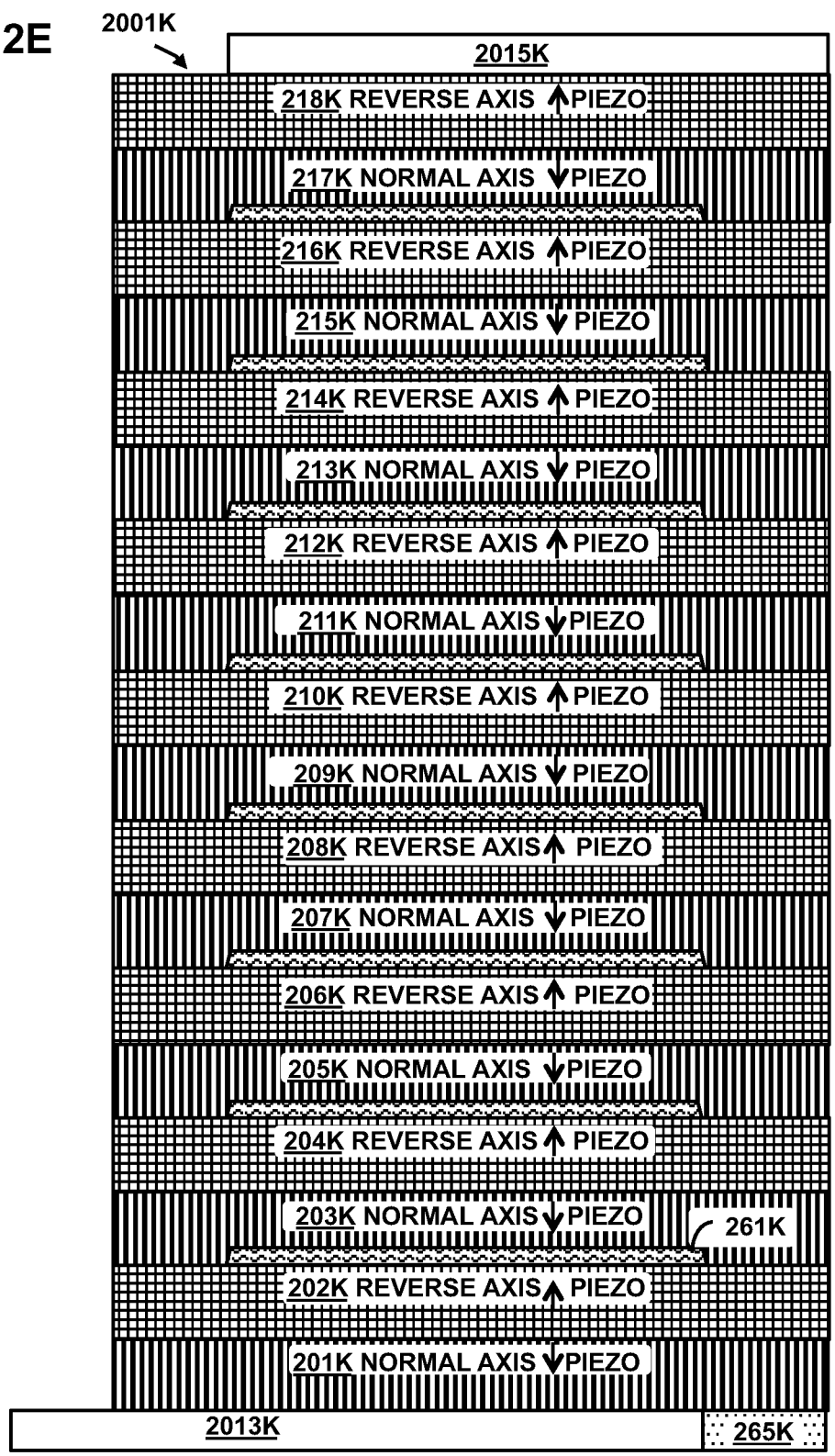

As discussed, interposer layers shown in FIG. 1A, and as explicitly shown in the simplified diagrams of the various resonators shown in FIGS. 2A, 2B, 2C and 2D may be included and interposed between adjacent piezoelectric layers in the various resonators. Such interposer layers may laterally extend within the mesa structure of the stack of piezoelectric layers a full lateral extent of the stack, e.g., between the etched edge region of the stack and the opposing etched edge region of the stack. However, in some other alternative bulk acoustic wave resonator structures, interposer layers may be patterned during fabrication of the interposer layers (e.g., patterned using masking and selective etching techniques during fabrication of the interposer layers). Such patterned interposer layers need not extend a full lateral extent of the stack (e.g., need not laterally extend to any etched edge regions of the stack.) For example, FIG. 2E shows another alternative bulk acoustic wave resonator structure 2001K, similar to bulk acoustic wave resonator structure 2001J shown in FIG. 2D, but with differences. For example, in the alternative bulk acoustic wave resonator structure 2001K shown in FIG. 2E, patterned interposer layers (e.g., first patterned interposer layer 261K) may be interposed between sequential pairs of opposing axis piezoelectric layers (e.g., first patterned interposer layer 261K may be interposed between a first pair of opposing axis piezoelectric layers 201K, 202K, and a second pair of opposing axis piezoelectric layers 203K, 204K).

FIG. 2E shows an eighteen piezoelectric layer alternating axis stack arrangement having an active region of the bulk acoustic wave resonator structure 2001K sandwiched between overlap of multilayer metal acoustic millimeter wave reflector top electrode 2015IK and multilayer metal acoustic millimeter wave reflector bottom electrode 2013K. In FIG. 2E, patterned interposer layers (e.g., first patterned interposer layer 261K) may be patterned to have extent limited to the active region of the bulk acoustic wave resonator structure 2001K sandwiched between overlap of multilayer metal acoustic millimeter wave reflector top electrode 2015K and multilayer metal acoustic millimeter wave reflector bottom electrode 2013K. A planarization layer 265K at a limited extent of multilayer metal acoustic millimeter wave reflector bottom electrode 2013K may facilitate fabrication of the eighteen piezoelectric layer alternating axis stack arrangement (e.g., stack of eighteen piezoelectric layers 201K through 218K).

Patterning of interposer layers may be done in various combinations. For example, some interposer layers need not be patterned (e.g., may be unpatterned) within lateral extent of the stack of piezoelectric layers (e.g., some interposer layers may extend to full lateral extent of the stack of piezoelectric layers). For example, first interposer layer 261J shown in FIG. 2D need not be patterned (e.g., may be unpatterned) within lateral extent of the stack of piezoelectric layers (e.g., first interposer layer 261J may extend to full lateral extent of the stack of piezoelectric layers). For example, in FIG. 2D interposer layers interposed between adjacent sequential pairs of normal axis and reverse axis piezoelectric layers need not be patterned (e.g., may be unpatterned) within lateral extent of the stack of piezoelectric layers (e.g., interposer layers interposed between sequential pairs of normal axis and reverse axis piezoelectric layers may extend to full lateral extent of the stack of piezoelectric layers). For example in FIG. 2D, first interposer layer 261J interposed between first sequential pair of normal axis and reverse axis piezoelectric layers 201J, 202J and adjacent second sequential pair of normal axis and reverse axis piezoelectric layers 203J, 204J need not be patterned within lateral extent of the stack of piezoelectric layers (e.g., first interposer layer 261J may extend to full lateral extent of the stack of piezoelectric layers). In contrast to these unpatterned interposer layers (e.g., in contrast to unpatterned interposer layer 261J) as shown in FIG. 2D, in FIG. 2E patterned interposer layers (e.g., first patterned interposer layer 261K) may be patterned, for example, to have extent limited to the active region of the bulk acoustic wave resonator structure 2001K shown in FIG. 2E.

Figure 2F:
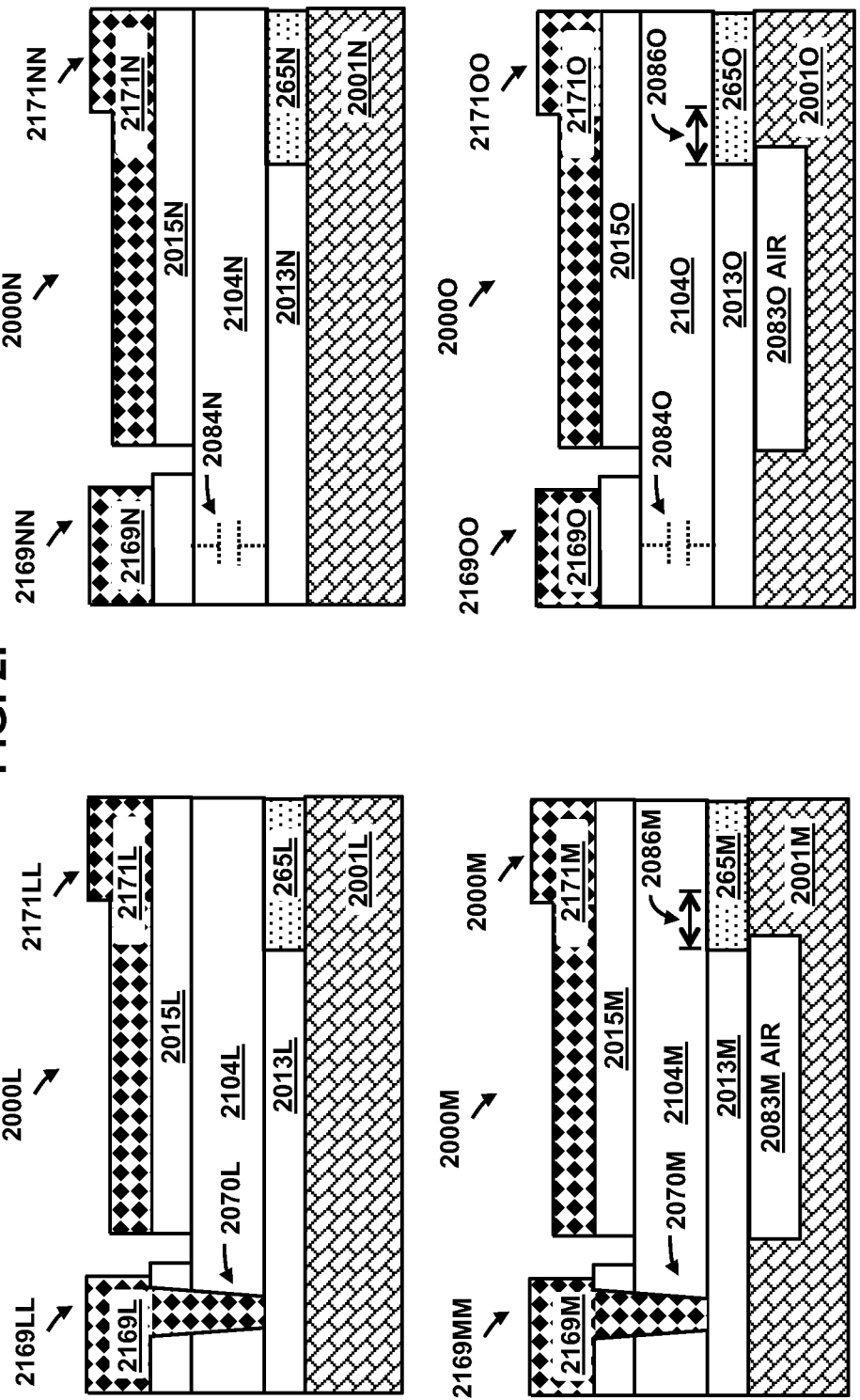

FIGS. 2F and 2G show additional Bulk Acoustic Wave (BAW) resonator examples 2000L through 2000S including passivation, planarization and even-level electrical interconnect areas in views that are simplified relative to the more detailed view of example Bulk Acoustic Wave (BAW) resonator 100 shown in FIG. 1A. FIGS. 1A, 2F and 2G show example BAW resonators 100 and 2000L through 2000S, which may comprise respective stacks 104, 2104L through 2104S of layers of piezoelectric material. Respective stacks 104, 2104L through 2104S of layers of piezoelectric material may comprise respective piezoelectric layers having respective piezoelectric axes arranged in substantially alternating directions. For example, the more detailed view of FIG. 1A explicitly shows the stack 104 may comprise four layers of piezoelectric material 105, 107, 109, 111 in the stack 104, in which the four layers of piezoelectric material 105, 107, 109, 111 may have the alternating piezoelectric axis arrangement shown in FIG. 1A. For example, the more detailed view of FIG. 1A explicitly shows: bottom piezoelectric layer 105 having the normal axis orientation and depicted in FIG. 1A using the downward directed arrow; the first middle piezoelectric layer 107 as next in the alternating axis arrangement of stack 104 and having the reverse axis orientation depicted in FIG. 1A using the upward directed arrow; the second middle piezoelectric layer 109 as next in the alternating axis arrangement of stack 104 and having the normal axis depicted in FIG. 1A using the downward directed arrow; and the top piezoelectric layer 111 as next in the alternating axis arrangement of stack 104 and having the reverse axis orientation depicted in the FIG. 1A using the upward directed arrow. Although individual piezoelectric layers of stacks are not explicitly shown in the simplified views of resonators 2000L through 2000S of FIGS. 2F and 2G, respective stacks 104, 2104L through 2104S may comprise layers of piezoelectric material, which may comprise respective piezoelectric layers having respective piezoelectric axes arranged in substantially alternating directions.

FIGS. 1A, 2F and 2G show example BAW resonators 100 and 2000L through 2000S, which may comprise respective stacks 104, 2104L through 2104S of layers of piezoelectric material sandwiched between respective bottom electrodes 113, 2013L through 2013S and respective top electrodes 115, 2015L through 2015S. These may be arranged over respective substrates 101, 2001L through 2001S. In example BAW resonators 100 and 2000L through 2000S shown in FIGS. 1A, 2F and 2G, respective bottom electrodes 113, 2013L through 2013S may comprise respective bottom multilayer metal acoustic reflector electrodes 113, 2013L through 2013S, e.g., may approximate respective bottom distributed Bragg acoustic reflectors 113, 2013L through 2013S. In example BAW resonators 100 and 2000L through 2000S shown in FIGS. 1A, 2F and 2G, respective top electrodes 115, 2015L through 2015S may comprise respective top multilayer metal acoustic reflector electrodes 115, 2015L through 2015S, e.g., may approximate respective top distributed Bragg acoustic reflectors 115, 2015L through 2015S.

There may be respective active regions of respective stacks 104, 2104L through 2104S of layers of piezoelectric material where respective bottom electrodes 113, 2013L through 2013S overlap respective top electrodes 115, 2015L through 2015S. There may be respective inactive regions of respective stacks 104, 2104L through 2104S of layers of piezoelectric material where respective bottom electrodes 113, 2013L through 2013S do not overlap respective top electrodes 115, 2015L through 2015S. Respective planarization layers 165, 265L through 265S may be at least partially overlapped by respective inactive regions of respective stacks 104, 2104L through 2104S of layers of piezoelectric material (e.g. partially overlapped by respective inactive regions of respective first piezoelectric layers of respective stacks 104, 2104L through 2104S of layers of piezoelectric material). In some examples, e.g., resonators 2000L through 2000P, 2000R shown in FIGS. 2F and 2G, respective planarization layers 265L through 265P, 265R may be entirely overlapped by respective inactive regions of respective stacks 2104L through 2104P, 2104R of layers of piezoelectric material (e.g. partially overlapped by respective inactive regions of respective first piezoelectric layers of respective stacks 2104L through 2104P, 2104R of layers of piezoelectric material). In example BAW resonators 100 and 2000L through 2000S shown in FIGS. 1A, 2F and 2G, respective planarization layers 165, 265L through 265S may abut respective bottom electrodes 113, 2013L through 2013S. At least respective portions of respective planarization layers 165, 265L through 265S may be substantially coplanar with at least respective portions of respective bottom electrodes 113, 2013L through 2013S. For example, in BAW resonators 100 and 2000L through 2000S shown in FIGS. 1A, 2F and 2G, at least respective bottom portions of respective planarization layers 165, 265L through 265S may be substantially coplanar with at least respective bottom portions of respective bottom electrodes 113, 2013L through 2013S. For example, in BAW resonators 2000L through 2000O, and 2000Q through 2000S shown in FIGS. 2F and 2G, at least respective top portions of respective planarization layers 265L through 265O and 265Q through 265S may be substantially coplanar with at least respective top portions of respective bottom electrodes 2013L through 2013O and 2013Q through 2013S.

In example BAW resonator 2000P shown in FIG. 2G, the bottom electrode 2013P may comprise bottom multilayer metal acoustic reflector electrode 2013P, including initial bottom electrode layer 2117P and remainder bottom electrode layers 2013PP, in which planarization layer 265P may abut remainder bottom electrode layers 2013PP. At least a portion (e.g., a bottom portion) of the planarization layer 265P may be substantially coplanar with at least a portion (e.g., a bottom portion) of the remainder bottom electrode layers 2013PP. At least a portion (e.g., a top portion) of the planarization layer 265P may be substantially coplanar with at least a portion (e.g., a bottom portion) of the initial bottom electrode layer 2117P. Initial bottom electrode layer 2117P may at least partially overlap planarization layer 265P.

In example BAW resonators 2000M, 2000N shown in FIG. 2F, respective cavity regions 2083M, 2083O may be interposed between respective substrates 2001M, 2001O and at least respective portions of respective bottom electrodes 2013M, 2013O. Respective cavity regions 2083M, 2083O may be interposed between respective substrates 2001M, 2001O and at least respective portions of respective planarization layers 265M, 265O. Respective bottom electrodes 2013M, 2013O may abut respective planarization layers 265M, 265O at respective edge interfaces 2086M, 2086O. Although respective edge interfaces 2086M, 2086O are depicted for example BAW resonators 2000M, 2000N as arranged over respective cavities 2093M, 2083O, in other examples, arrangement of respective edge interfaces 2086M, 2086O (e.g., location of respective edge interfaces 2086M, 2086O) may be varied as suggested by double headed arrows, for example, to facilitate meeting various design considerations. For example, while respective edge interfaces 2086M, 2086O arranged over respective cavities 2093M, 2083O may facilitate meeting a bottom electrode acoustic reflectivity design consideration, respective edge interfaces 2086M, 2086O differently arranged, e.g., located over respective substrates 2001M, 2001O, but spaced away from respective cavities 2093M, 2083O, may facilitate meeting heightened strength or ruggedness design considerations. Respective cavity regions 2083M, 2083O may extend into respective substrates 2001M, 2001O (e.g., cavity regions 2083M, 2083O may be etched into respective substrates 2001M, 2001O). Respective cavity regions 2083M, 2083O may comprise respective dielectric, e.g., may comprise air.

FIGS. 1A, 2F and 2G show example BAW resonators 100 and 2000L through 2000S, which may comprise respective top electrical interconnects 117 and 2171L through 2171S, which may be electrically coupled with respective top electrodes 115, 2015L through 2015S. Respective top electrical 117 and 2171L through 2171S interconnects may be formed, for example, from gold (Au). This may protect, or passivate, respective top electrodes 115, 2015L through 2015S from environmental factors, such as moisture. Respective planarization layers 165, 265L through 265S may be interposed between substrate 101, 2001L through 2001S and at least a respective portion of respective top electrical interconnects 117, 2171L through 2171S. Respective bottom electrical interconnects, 169, 2169L through 2169S may be electrically coupled with respective bottom electrodes 113, 2013L through 2013S. Top electrical interconnects 171, 2171L through 2171S may have respective top electrical interconnect areas 171AA, 2171LL through 2171SS. Similarly, bottom electrical interconnects 169, 2169L through 2169S may have respective bottom electrical interconnect areas 169AA, 2169LL through 2169SS. Respective top electrical interconnect areas 171AA, 2171LL through 2171SS may be arranged substantially even-level (e.g., substantially parallel, e.g., substantially coplanar) with respective bottom electrical interconnect areas 169AA, 2169LL through 2169SS, e.g., to facilitate respective packaging of BAW resonators 100 and 2000L through 2000S. In some example BAW resonators 2000Q through 2000S shown in FIG. 2G, respective top electrical interconnect 2171Q through 2171S may abut respective stacks 2104Q through 2104S of layers of piezoelectric material (e.g. may abut respective first piezoelectric layers of respective stacks 2104Q through 2104S of layers of piezoelectric material). In example BAW resonator 2000S shown in FIG. 2G, top electrical interconnect 2171S may abut substrate 2001S. Similarly, in example BAW resonator 2000S shown in FIG. 2G, bottom electrical interconnect 2169S may abut substrate 2001S. Bottom electrical interconnect 2169S may abut an extremity (e.g., a lateral extremity) of the bottom electrode 2013S.

In example BAW resonators 100, 2000L, 2000M, 2000P through 2000S shown in FIGS. 1A, 2F, 2G, electrical coupling between respective bottom electrical interconnects 169, 2169L, 2169M, 2169P through 2169S and respective bottom electrodes 113, 2013L, 2013M, 2013P through 2103S may comprise electrical connection (e.g., may comprise electrical contact). In example BAW resonators 2000N and 2000O shown in FIG. 2F, electrical coupling between respective bottom electrical interconnects 2169N, 2160O and respective bottom electrodes 2013N, 2013O may comprises a capacitive coupling 2084N, 2084O, as depicted in FIG. 2F using respective capacitor symbols as dashed lines extending through stacks 2104N, 2104O of piezoelectric material layers. In example BAW resonators 2000L, 2000M, 2000P shown in FIGS. 2F, 2G, respective bottom electrical interconnects 2169L, 2169M, 2169P may extends through respective vias 2170L, 2170M, 2170P (e.g., respective etched vias 2170L, 2170M, 2170P) in respective stacks 2104L, 2104M, 2104P of layers of piezoelectric material (e.g., in respective first piezoelectric layers of respective stacks 2104L, 2104M, 2104P of layers of piezoelectric material).

Figure 3A:
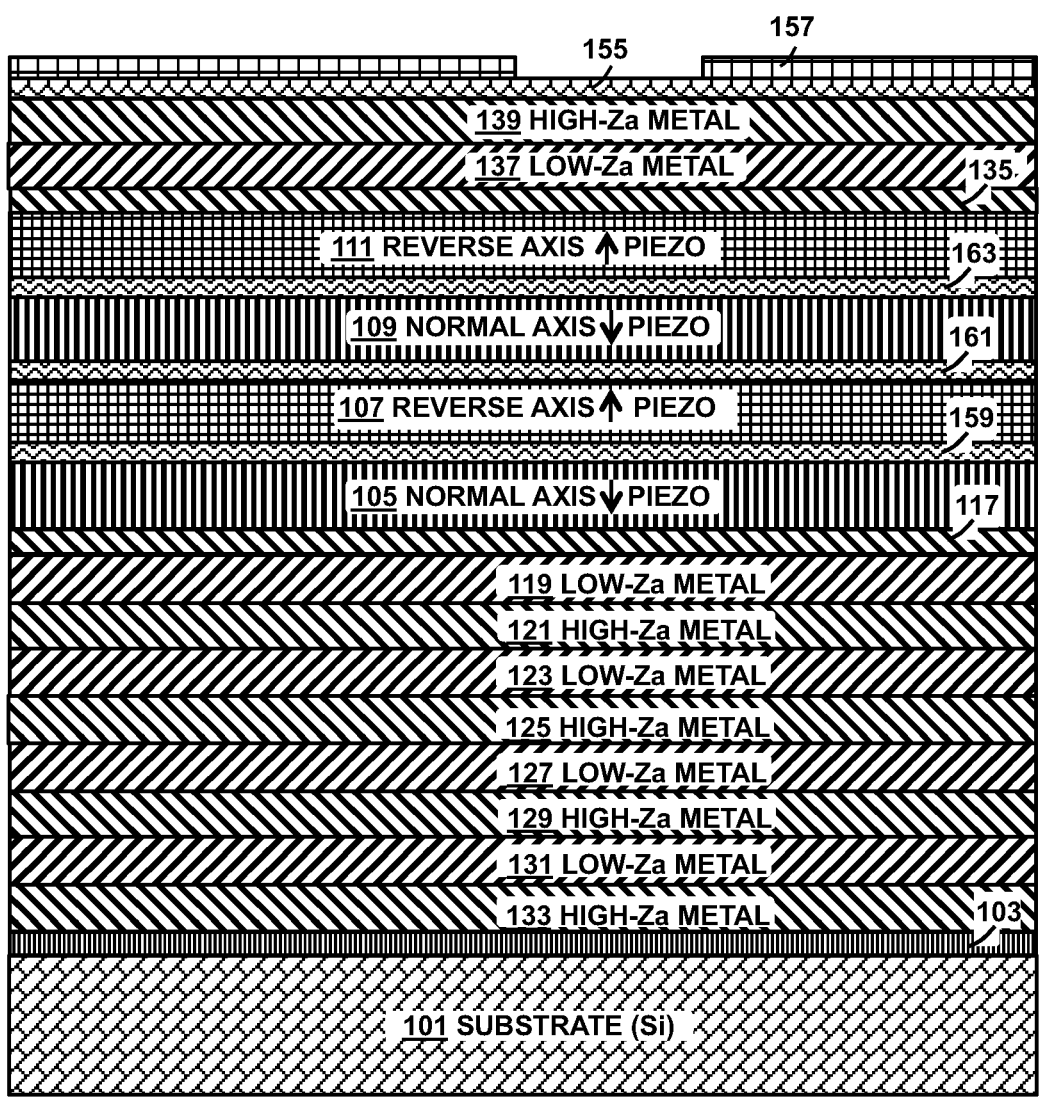
FIGS. 3A through 3E illustrate example integrated circuit structures used to form the example bulk acoustic wave resonator structure of FIG. 1A. Note that although AlN is used as an example piezoelectric layer material, the present disclosure is not intended to be so limited. For example, in some embodiments, the piezoelectric layer material may include other group III material-nitride (III-N) compounds (e.g., any combination of one or more of gallium, indium, and aluminum with nitrogen), and further, any of the foregoing may include doping, for example, of Scandium and/or Magnesium doping.

FIGS. 3A through 3E illustrate example integrated circuit structures used to form the example bulk acoustic wave resonator structure of FIG. 1A. As shown in FIG. 3A, magnetron sputtering may sequentially deposit layers on silicon substrate 101. Initially, a seed layer 103 of suitable material (e.g., aluminum nitride (AlN), e.g., silicon dioxide ($SiO_2$), e.g., aluminum oxide ($Al_2O_3$), e.g., silicon nitride ($Si_3N_4$), e.g., amorphous silicon (a-Si), e.g., silicon carbide (SiC)) may be deposited, for example, by sputtering from a respective target (e.g., from an aluminum, silicon, or silicon carbide target). The seed layer may have a layer thickness in a range from approximately one hundred Angstroms (100 A) to approximately one micron (1 um). In some examples, the seed layer 103 may also be at least partially formed of electrical conductivity enhancing material such as Aluminum (Al) or Gold (Au). Next, successive pairs of alternating layers of high acoustic impedance metal and low acoustic impedance metal may be deposited by alternating sputtering from targets of high acoustic impedance metal and low acoustic impedance metal. For example, sputtering targets of high acoustic impedance metal such as Molybdenum or Tungsten may be used for sputtering the high acoustic impedance metal layers, and sputtering targets of low acoustic impedance metal such as Aluminum or Titanium may be used for sputtering the low acoustic impedance metal layers. For example, the fourth pair of bottom metal electrode layers, 133, 131, may be deposited by sputtering the high acoustic impedance metal for a first bottom metal electrode layer 133 of the pair on the seed layer 103, and then sputtering the low acoustic impedance metal for a second bottom metal electrode layer 131 of the pair on the first layer 133 of the pair. Similarly, the third pair of bottom metal electrode layers, 129, 127, may then be deposited by sequentially sputtering from the high acoustic impedance metal target and the low acoustic impedance metal target. Similarly, the second pair of bottom metal electrodes 125, 123, may then be deposited by sequentially sputtering from the high acoustic impedance metal target and the low acoustic impedance metal target. Similarly, the first pair of bottom metal electrodes 121, 119, may then be deposited by sequentially sputtering from the high acoustic impedance metal target and the low acoustic impedance metal target. Respective layer thicknesses of bottom metal electrode layers of the first, second, third and fourth pairs 119, 121, 123, 125, 127, 129, 131, 133 may correspond to approximately a quarter wavelength (e.g., a quarter of an acoustic wavelength) of the resonant frequency at the resonator (e.g., respective layer thickness of about three thousand Angstroms (3,000 A) for the example 5 GHz resonator.) Initial bottom electrode layer 119 may then be deposited by sputtering from the high acoustic impedance metal target. Thickness of the initial bottom electrode layer may be, for example, about an eighth wavelength (e.g., an eighth of an acoustic wavelength) of the resonant frequency of the resonator (e.g., layer thickness of about one thousand five hundred Angstroms (1,500 A) for the example 5 GHz resonator.)

A stack of four layers of piezoelectric material, for example, four layers of Aluminum Nitride (AlN) having the wurtzite structure may be deposited by sputtering. For example, bottom piezoelectric layer 105, first middle piezoelectric layer 107, second middle piezoelectric layer 109, and top piezoelectric layer 111 may be deposited by sputtering. The four layers of piezoelectric material in the stack 104, may have the alternating axis arrangement in the respective stack 104. For example the bottom piezoelectric layer 105 may be sputter deposited to have the normal axis orientation, which is depicted in FIG. 3A using the downward directed arrow. The first middle piezoelectric layer 107 may be sputter deposited to have the reverse axis orientation, which is depicted in the FIG. 3A using the upward directed arrow. The second middle piezoelectric layer 109 may have the normal axis orientation, which is depicted in the FIG. 3A using the downward directed arrow. The top piezoelectric layer may have the reverse axis orientation, which is depicted in the FIG. 3A using the upward directed arrow. As mentioned previously herein, polycrystalline thin film AlN may be grown in the crystallographic c-axis negative polarization, or normal axis orientation perpendicular relative to the substrate surface using reactive magnetron sputtering of the Aluminum target in the nitrogen atmosphere. As was discussed in greater detail previously herein, changing sputtering conditions, for example by adding oxygen, may reverse the axis to a crystallographic c-axis positive polarization, or reverse axis, orientation perpendicular relative to the substrate surface.

Interposer layers may be sputtered between sputtering of piezoelectric layers, so as to be sandwiched between piezoelectric layers of the stack. For example, first interposer layer 159, may sputtered between sputtering of bottom piezoelectric layer 105, and the first middle piezoelectric layer 107, so as to be sandwiched between the bottom piezoelectric layer 105, and the first middle piezoelectric layer 107. For example, second interposer layer 161 may be sputtered between sputtering first middle piezoelectric layer 107 and the second middle piezoelectric layer 109 so as to be sandwiched between the first middle piezoelectric layer 107, and the second middle piezoelectric layer 109. For example, third interposer layer 163, may be sputtered between sputtering of second middle piezoelectric layer 109 and the top piezoelectric layer 111 so as to be sandwiched between the second middle piezoelectric layer 109 and the top piezoelectric layer 111.

As discussed previously, one or more of the interposer layers (e.g., interposer layers 159, 161, 163) may be metal interposer layers, e.g., high acoustic impedance metal interposer layers, e.g., Molybdenum metal interposer layers. These may be deposited by sputtering from a metal target. As discussed previously, one or more of the interposer layers (e.g., interposer layers 159, 161, 163) may comprise dielectric interposer layers, e.g., zinc oxide (ZnO) interposer layers, e.g., silicon dioxide interposer layers, e.g., hafnium dioxide interposer layers, e.g., titanium nitride interposer layers. The dielectric interposer layers may be deposited by reactive sputtering e.g, from a zinc target, e.g., from a Silicon target, e.g., from a hafnium target, in an oxygen atmosphere. The dielectric interposer layers may be deposited by reactive sputtering e.g, from a titanium target, in a nitrogen atmosphere. Alternatively or additionally, one or more of the interposer layers (e.g., interposer layers 159, 161, 163) may comprise metal and dielectric. Alternatively or additionally, one or more of the interposer layers (e.g., interposer layers 159, 161, 163) may be formed of, e.g. may comprise, different metals. Alternatively or additionally, one or more of the interposer layers (e.g., interposer layers 159, 161, 163) may be formed of, e.g. may comprise, different dielectrics. Sputtering thickness of interposer layers may be as discussed previously herein. Interposer layers may facilitate sputter deposition of piezoelectric layers. For example, initial sputter deposition of second interposer layer 166 on reverse axis first middle piezoelectric layer 107 may facilitate subsequent sputter deposition of normal axis second middle piezoelectric layer 109.

Initial top electrode layer 135 may be deposited on the top piezoelectric layer 111 by sputtering from the high acoustic impedance metal target. Thickness of the initial top electrode layer may be, for example, about an eighth wavelength (e.g., an eighth of an acoustic wavelength) of the resonant frequency of the resonator (e.g., layer thickness of about one thousand five hundred Angstroms (1,500 A) for the example 5 GHz resonator.) The first pair of top metal electrode layers, 137, 139, may then be deposited by sputtering the low acoustic impedance metal for a first top metal electrode layer 137 of the pair, and then sputtering the high acoustic impedance metal for a second top metal electrode layer 139 of the pair on the first layer 137 of the pair. Layer thicknesses of top metal electrode layers of the first pair 137, 139 may correspond to approximately a quarter wavelength (e.g., a quarter acoustic wavelength) of the resonant frequency of the resonator (e.g., respective layer thickness of about three thousand Angstroms (3,000 A) for the example 5 GHz resonator.) The optional mass load layer 155 may be sputtered from a high acoustic impedance metal target onto the second top metal electrode layer 139 of the pair. Thickness of the optional mass load layer may be as discussed previously herein. The mass load layer 155 may be an additional mass layer to increase electrode layer mass, so as to facilitate the preselected frequency compensation down in frequency (e.g., compensate to decrease resonant frequency). Alternatively, the mass load layer 155 may be a mass load reduction layer, e.g., ion milled mass load reduction layer 155, to decrease electrode layer mass, so as to facilitate the preselected frequency compensation up in frequency (e.g., compensate to increase resonant frequency). Accordingly, in such case, in FIG. 3A mass load reduction layer 155 may representatively illustrate, for example, an ion milled region of the second member 139 of the first pair of electrodes 137, 139 (e.g., ion milled region of high acoustic impedance metal electrode 139).

The plurality of lateral features 157 (e.g., patterned layer 157) may be formed by sputtering a layer of additional mass loading having a layer thickness as discussed previously herein. The plurality of lateral features 157 (e.g., patterned layer 157) may be made by patterning the layer of additional mass loading after it is deposited by sputtering. The patterning may done by photolithographic masking, layer etching, and mask removal. Initial sputtering may be sputtering of a metal layer of additional mass loading from a metal target (e.g., a target of Tungsten (W), Molybdenum (Mo), Titanium (Ti) or Aluminum (Al)). In alternative examples, the plurality of lateral features 157 may be made of a patterned dielectric layer (e.g., a patterned layer of Silicon Nitride (SiN), Silicon Dioxide (SiO2) or Silicon Carbide (SiC)). For example Silicon Nitride, and Silicon Dioxide may be deposited by reactive magnetron sputtering from a silicon target in an appropriate atmosphere, for example Nitrogen, Oxygen or Carbon Dioxide. Silicon Carbide may be sputtered from a Silicon Carbide target.

Figure 3B:
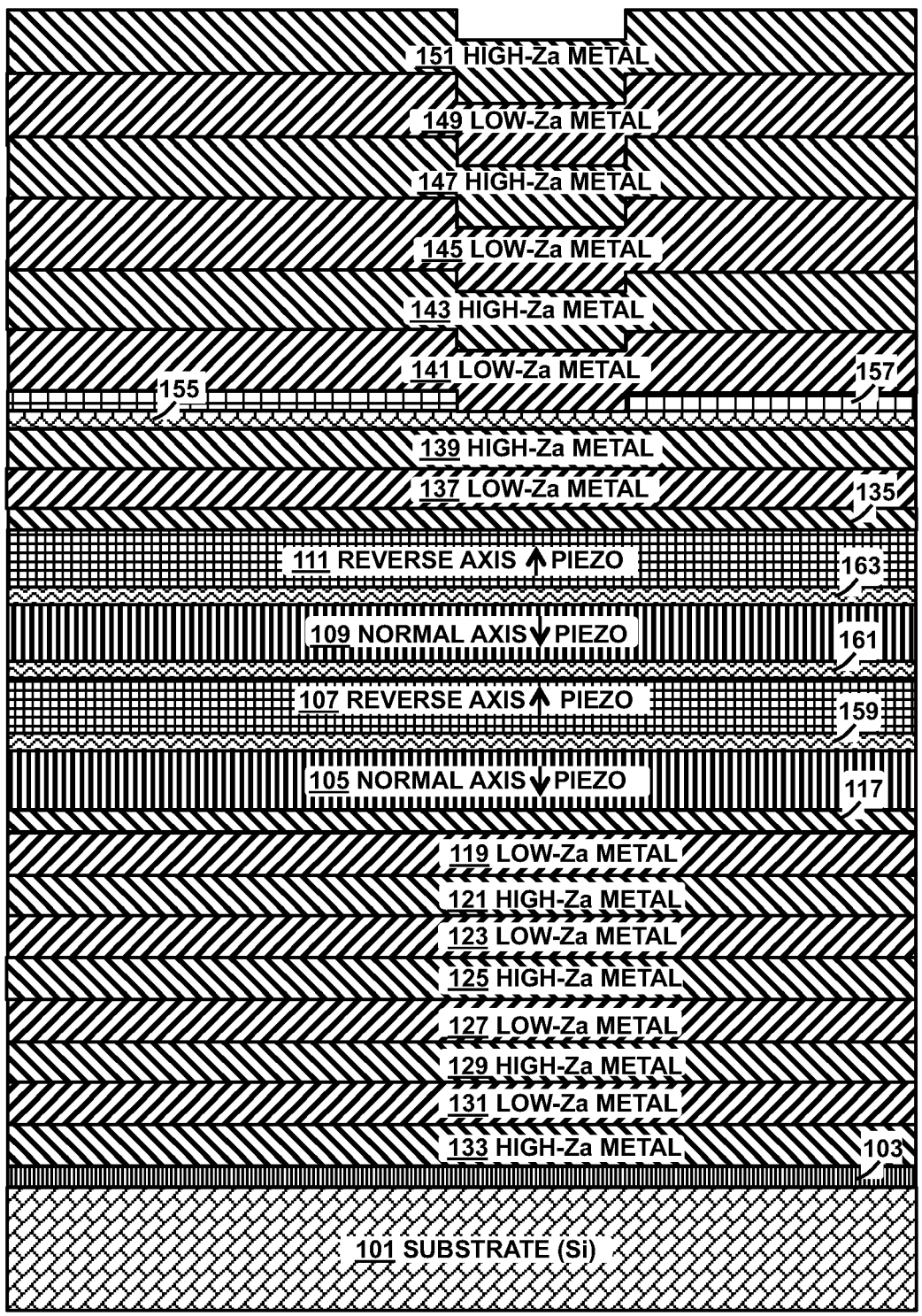

Once the plurality of lateral features 157 have been patterned (e.g., patterned layer 157) as shown in FIG. 3A, sputter deposition of successive additional pairs of alternating layers of high acoustic impedance metal and low acoustic impedance metal may continue as shown in FIG. 3B by alternating sputtering from targets of high acoustic impedance metal and low acoustic impedance metal. For example, sputtering targets of high acoustic impedance metal such as Molybdenum or Tungsten may be used for sputtering the high acoustic impedance metal layers, and sputtering targets of low acoustic impedance metal such as Aluminum or Titanium may be used for sputtering the low acoustic impedance metal layers. For example, the second pair of top metal electrode layers, 141, 143, may be deposited by sputtering the low acoustic impedance metal for a first bottom metal electrode layer 141 of the pair on the plurality of lateral features 157, and then sputtering the high acoustic impedance metal for a second top metal electrode layer 143 of the pair on the first layer 141 of the pair. Similarly, the third pair of top metal electrode layers, 145, 147, may then be deposited by sequentially sputtering from the low acoustic impedance metal target and the high acoustic impedance metal target. Similarly, the fourth pair of top metal electrodes 149, 151, may then be deposited by sequentially sputtering from the low acoustic impedance metal target and the high acoustic impedance metal target. Respective layer thicknesses of top metal electrode layers of the first, second, third and fourth pairs 137, 139, 141, 143, 145, 147, 149, 151 may correspond to approximately a quarter wavelength (e.g., a quarter acoustic wavelength) at the resonant frequency of the resonator (e.g., respective layer thickness of about three thousand Angstroms (3,000 A) for the example 5 GHz resonator.)

As mentioned previously, and as shown in FIG. 3B, after the lateral features 157 are formed, (e.g., patterned layer 157), they may function as a step feature template, so that subsequent top metal electrode layers formed on top of the lateral features 157 may retain step patterns imposed by step features of the lateral features 157. For example, the second pair of top metal electrode layers 141, 143, the third pair of top metal electrode layers 145, 147, and the fourth pair of top metal electrodes 149, 151, may retain step patterns imposed by step features of the lateral features 157.

Figure 3C:
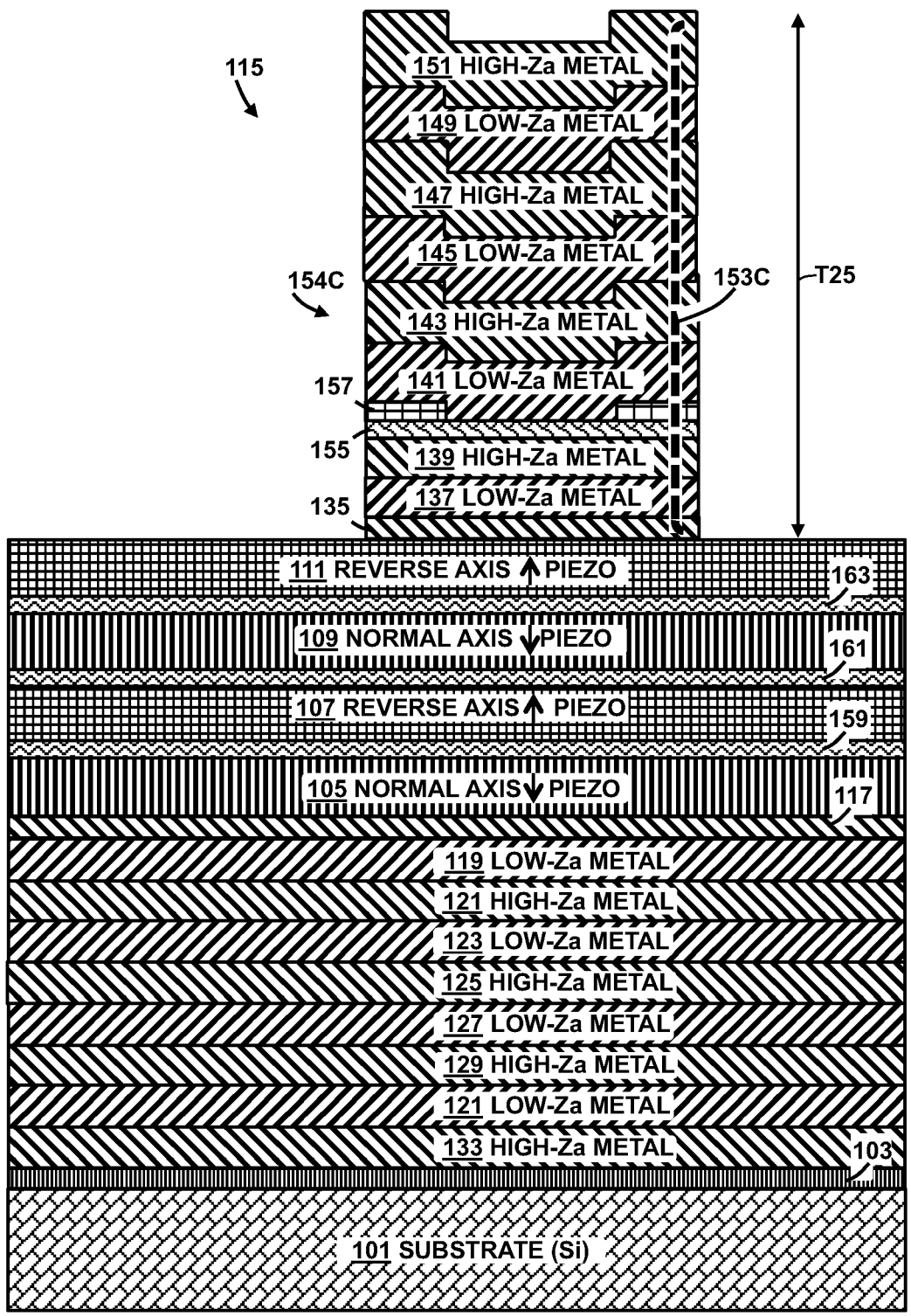

After depositing layers of the fourth pair of top metal electrodes 149, 151 as shown in FIG. 3B, suitable photolithographic masking and etching may be used to form a first portion of etched edge region 153C for the top acoustic reflector 115 as shown in FIG. 3C. A notional heavy dashed line is used in FIG. 3C depicting the first portion of etched edge region 153C associated with the top acoustic reflector 115. The first portion of etched edge region 153C may extend along the thickness dimension T25 of the top acoustic reflector 115. The first portion etched edge region 153C may extend through (e.g., entirely through or partially through) the top acoustic reflector 115. The first portion of the etched edge region 153C may extend through (e.g., entirely through or partially through) the initial top metal electrode layer 135. The first portion of the etched edge region 153C may extend through (e.g., entirely through or partially through) the first pair of top metal electrode layers 137, 139. The first portion of the etched edge region 153C may extend through (e.g., entirely through or partially through) the optional mass load layer 155. The first portion of the etched edge region 153C may extend through (e.g., entirely through or partially through) at least one of the lateral features 157 (e.g., through patterned layer 157). The first portion of etched edge region 153C may extend through (e.g., entirely through or partially through) the second pair of top metal electrode layers, 141,143. The first portion etched edge region 153C may extend through (e.g., entirely through or partially through) the third pair of top metal electrode layers, 145, 147. The first portion of etched edge region 153C may extend through (e.g., entirely through or partially through) the fourth pair of top metal electrode layers, 149, 151. Just as suitable photolithographic masking and etching may be used to form the first portion of etched edge region 153C at a lateral extremity the top acoustic reflector 115 as shown in FIG. 3C, such suitable photolithographic masking and etching may likewise be used to form another first portion of a laterally opposing etched edge region 154C at an opposing lateral extremity the top acoustic reflector 115, e.g., arranged laterally opposing or opposite from the first portion of etched edge region 153C, as shown in FIG. 3C. The another first portion of the laterally opposing etched edge region 154C may extend through (e.g., entirely through or partially through) the opposing lateral extremity of the top acoustic reflector 115, e.g., arranged laterally opposing or opposite from the first portion of etched edge region 153C, as shown in FIG. 3C. The mesa structure (e.g., third mesa structure) corresponding to the top acoustic reflector 115 may extend laterally between (e.g., may be formed between) etched edge region 153C and laterally opposing etched edge region 154C. Dry etching may be used, e.g., reactive ion etching may be used to etch the materials of the top acoustic reflector. Chlorine based reactive ion etch may be used to etch Aluminum, in cases where Aluminum may be used in the top acoustic reflector, e.g., may be used to etch Zinc Oxide (ZnO), in cases where Zinc Oxide (ZnO) may be used in dielectric interposers, e.g., may be used to etch Titanium Nitride (TiN), in cases where Titanium Nitride (TiN) may be used in dielectric interposers, e.g., may be used to etch Hafnium Dioxide (HfO2), in cases where Hafnium Dioxide (HfO2) may be used in dielectric interposers. Fluorine based reactive ion etch may be used to etch Tungsten (W), Molybdenum (Mo), Titanium (Ti), Silicon Nitride (SiN), Silicon Dioxide (SiO2) and/or Silicon Carbide (SiC) in cases where these materials may be used in the top acoustic reflector.

Figure 3D:
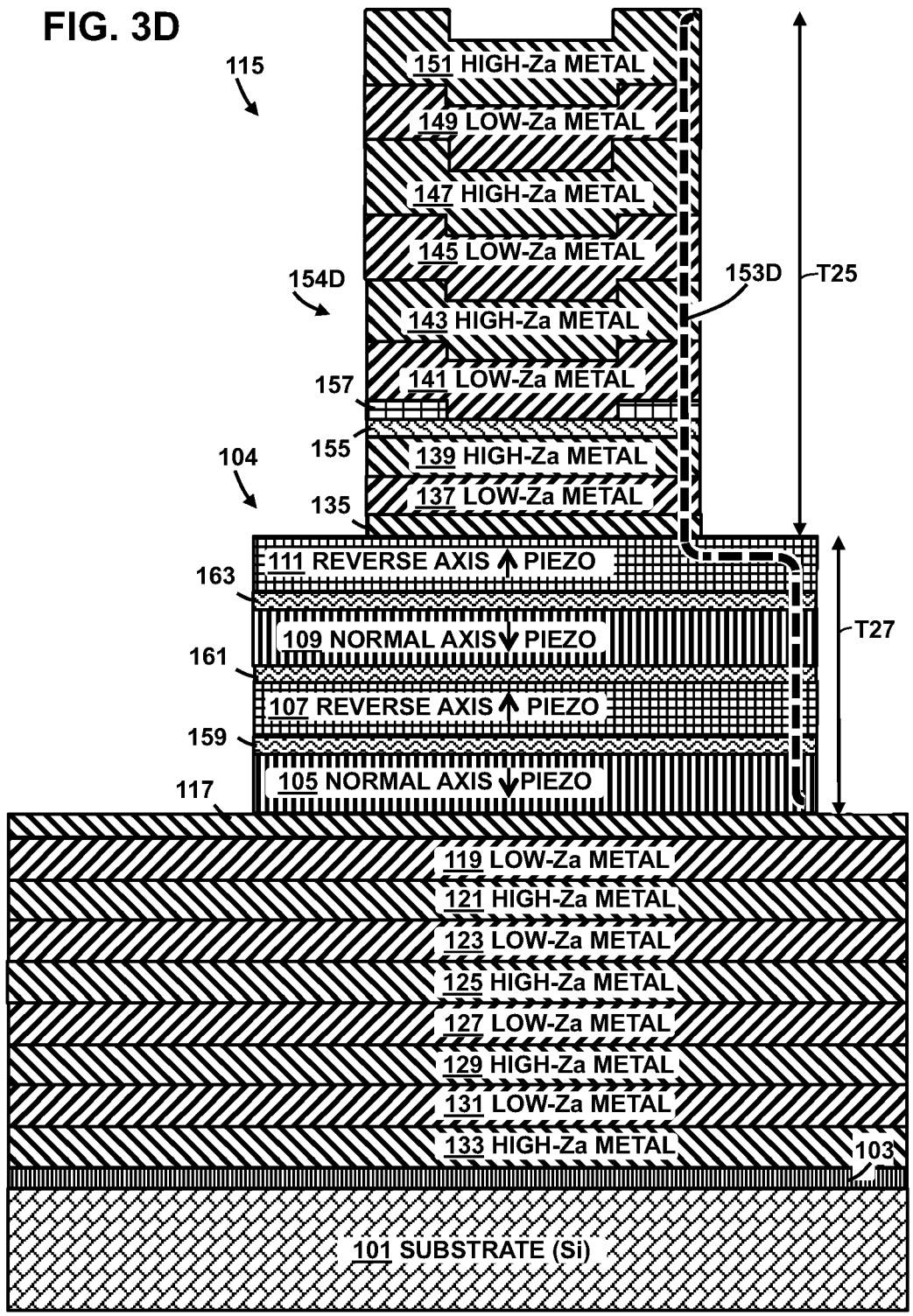

After etching to form the first portion of etched edge region 153C for top acoustic reflector 115 as shown in FIG. 3C, additional suitable photolithographic masking and etching may be used to form elongated portion of etched edge region 153D for top acoustic reflector 115 and for the stack 104 of four piezoelectric layers 105, 107, 109, 111 as shown in FIG. 3D. A notional heavy dashed line is used in FIG. 3D depicting the elongated portion of etched edge region 153D associated with the stack 104 of four piezoelectric layers 105, 107, 109, 111 and with the top acoustic reflector 115. Accordingly, the elongated portion of etched edge region 153D shown in FIG. 3D may extend through (e.g., entirely through or partially through) the fourth pair of top metal electrode layers, 149, 151, the third pair of top metal electrode layers, 145, 147, the second pair of top metal electrode layers, 141,143, at least one of the lateral features 157, (e.g., patterned layer 157), the optional mass load layer 155, the first pair of top metal electrode layers 137, 139 and the initial top metal electrode layer 135 of the top acoustic reflector 115. The elongated portion of etched edge region 153D may extend through (e.g., entirely through or partially through) the stack 104 of four piezoelectric layers 105, 107, 109, 111. The elongated portion of etched edge region 153D may extend through (e.g., entirely through or partially through) the first piezoelectric layer, 105, e.g., having the normal axis orientation, first interposer layer 159, first middle piezoelectric layer, 107, e.g., having the reverse axis orientation, second interposer layer 161, second middle interposer layer, 109, e.g., having the normal axis orientation, third interposer layer 163, and top piezoelectric layer 111, e.g., having the reverse axis orientation. The elongated portion of etched edge region 153D may extend along the thickness dimension T25 of the top acoustic reflector 115. The elongated portion of etched edge region 153D may extend along the thickness dimension T27 of the stack 104 of four piezoelectric layers 105, 107, 109, 111. Just as suitable photolithographic masking and etching may be used to form the elongated portion of etched edge region 153D at the lateral extremity the top acoustic reflector 115 and at a lateral extremity of the stack 104 of four piezoelectric layers 105, 107, 109, 111 as shown in FIG. 3D, such suitable photolithographic masking and etching may likewise be used to form another elongated portion of the laterally opposing etched edge region 154D at the opposing lateral extremity the top acoustic reflector 115 and the stack 104 of four piezoelectric layers 105, 107, 109, 111, e.g., arranged laterally opposing or opposite from the elongated portion of etched edge region 153D, as shown in FIG. 3D. The another elongated portion of the laterally opposing etched edge region 154D may extend through (e.g., entirely through or partially through) the opposing lateral extremity of the top acoustic reflector 115 and the stack of four piezoelectric layers 105, 107, 109, 111, e.g., arranged laterally opposing or opposite from the elongated portion of etched edge region 153D, as shown in FIG. 3D. The mesa structure (e.g., third mesa structure) corresponding to the top acoustic reflector 115 may extend laterally between (e.g., may be formed between) etched edge region 153D and laterally opposing etched edge region 154D. The mesa structure (e.g., first mesa structure) corresponding to stack 104 of the example four piezoelectric layers may extend laterally between (e.g., may be formed between) etched edge region 153D and laterally opposing etched edge region 154D. Dry etching may be used, e.g., reactive ion etching may be used to etch the materials of the stack 104 of four piezoelectric layers 105, 107, 109, 111 and any interposer layers. For example, Chlorine based reactive ion etch may be used to etch Aluminum Nitride piezoelectric layers. For example, Fluorine based reactive ion etch may be used to etch Tungsten (W), Molybdenum (Mo), Titanium (Ti), Silicon Nitride (SiN), Silicon Dioxide (SiO2) and/or Silicon Carbide (SiC) in cases where these materials may be used in interposer layers. For example, Chlorine based reactive ion etch may be used to etch interposers comprising dielectric, e.g., interposer layers comprising Zinc Oxide (ZnO), e.g., interposer layers comprising Hafnium Dioxide (HfO2), e.g., interposer layers comprising Titanium Nitride (TiN).

Figure 3E:
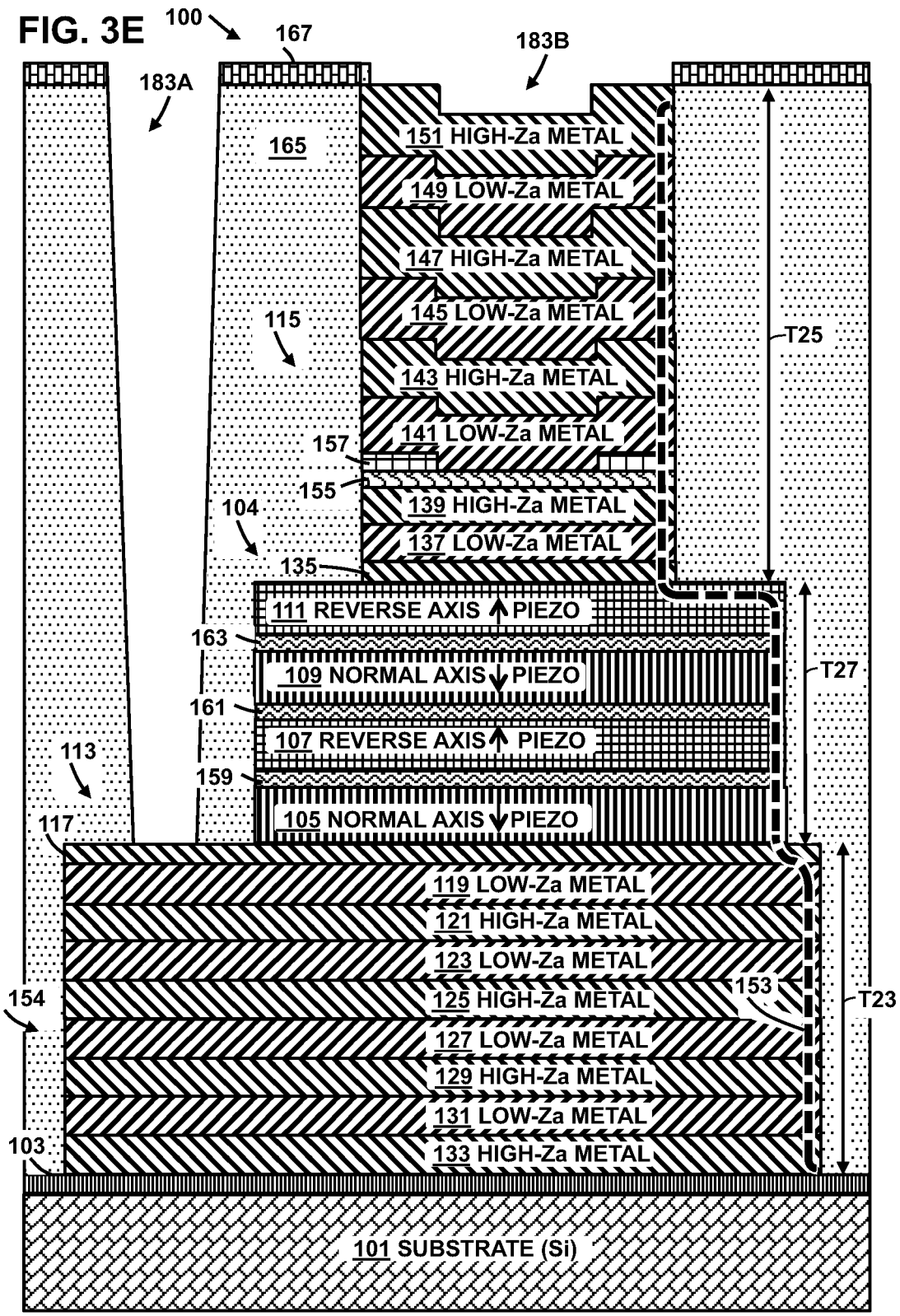

After etching to form the elongated portion of etched edge region 153D for top acoustic reflector 115 and the stack 104 of four piezoelectric layers 105, 107, 109, 111 as shown in FIG. 3D, further additional suitable photolithographic masking and etching may be used to form etched edge region 153D for top acoustic reflector 115 and for the stack 104 of four piezoelectric layers 105, 107, 109, 111 and for bottom acoustic reflector 113 as shown in FIG. 3E. The notional heavy dashed line is used in FIG. 3E depicting the etched edge region 153 associated with the stack 104 of four piezoelectric layers 105, 107, 109, 111 and with the top acoustic reflector 115 and with the bottom acoustic reflector 113. The etched edge region 153 may extend along the thickness dimension T25 of the top acoustic reflector 115. The etched edge region 153 may extend along the thickness dimension T27 of the stack 104 of four piezoelectric layers 105, 107, 109, 111. The etched edge region 153 may extend along the thickness dimension T23 of the bottom acoustic reflector 113. Just as suitable photolithographic masking and etching may be used to form the etched edge region 153 at the lateral extremity the top acoustic reflector 115 and at the lateral extremity of the stack 104 of four piezoelectric layers 105, 107, 109, 111 and at a lateral extremity of the bottom acoustic reflector 113 as shown in FIG. 3E, such suitable photolithographic masking and etching may likewise be used to form another laterally opposing etched edge region 154 at the opposing lateral extremity of the top acoustic reflector 115 and the stack 104 of four piezoelectric layers 105, 107, 109, 111, and the bottom acoustic reflector 113, e.g., arranged laterally opposing or opposite from the etched edge region 153, as shown in FIG. 3E. The laterally opposing etched edge region 154 may extend through (e.g., entirely through or partially through) the opposing lateral extremity of the top acoustic reflector 115 and the stack of four piezoelectric layers 105, 107, 109, 111, and the bottom acoustic reflector 113 e.g., arranged laterally opposing or opposite from the etched edge region 153, as shown in FIG. 3E.

After the foregoing etching to form the etched edge region 153 and the laterally opposing etched edge region 154 of the resonator 100 shown in FIG. 3E, a planarization layer 165 may be deposited. A suitable planarization material (e.g., Silicon Dioxide (SiO2), Hafnium Dioxide (HfO2), Polyimide, or BenzoCyclobutene (BCB)). These materials may be deposited by suitable methods, for example, chemical vapor deposition, standard or reactive magnetron sputtering (e.g., in cases of SiO2 or HfO2) or spin coating (e.g., in cases of Polyimide or BenzoCyclobutene (BCB)). An isolation layer 167 may also be deposited over the planarization layer 165. A suitable low dielectric constant (low-k), low acoustic impedance (low-Za) material may be used for the isolation layer 167, for example polyimide, or BenzoCyclobutene (BCB). These materials may be deposited by suitable methods, for example, chemical vapor deposition, standard or reactive magnetron sputtering or spin coating. After planarization layer 165 and the isolation layer 167 have been deposited, additional procedures of photolithographic masking, layer etching, and mask removal may be done to form a pair of etched acceptance locations 183A, 183B for electrical interconnections. Reactive ion etching or inductively coupled plasma etching with a gas mixture of argon, oxygen and a fluorine containing gas such as tetrafluoromethane (CF4) or Sulfur hexafluoride (SF6) may be used to etch through the isolation layer 167 and the planarization layer 165 to form the pair of etched acceptance locations 183A, 183B for electrical interconnections. Photolithographic masking, sputter deposition, and mask removal may then be used form electrical interconnects in the pair of etched acceptance locations 183A, 183B shown in FIG. 3E, so as to provide for the bottom electrical interconnect 169 and top electrical interconnect 171 that are shown explicitly in FIG. 1A. A suitable material, for example Gold (Au) may be used for the bottom electrical interconnect 169 and top electrical interconnect 171.

FIGS. 4A through 4G show alternative example bulk acoustic wave resonators 400A through 400G to the example bulk acoustic wave resonator 100A shown in FIG. 1A. For example, the bulk acoustic wave resonator 400A, 400E shown in FIG. 4A, 4E may have a cavity 483A, 483E, e.g., an air cavity 483A, 483E, e.g., extending into substrate 401A, 401E, e.g., extending into silicon substrate 401A, 401E, e.g., arranged below bottom acoustic reflector 413A, 413E. The cavity 483A, 483E may be formed using techniques known to those with ordinary skill in the art. For example, the cavity 483A, 483E may be formed by initial photolithographic masking and etching of the substrate 401A, 401E (e.g., silicon substrate 401A, 401E), and deposition of a sacrificial material (e.g., phosphosilicate glass (PSG)). The phosphosilicate glass (PSG) may comprise 8% phosphorous and 92% silicon dioxide. The resonator 400A, 400E may be formed over the sacrificial material (e.g., phosphosilicate glass (PSG)). The sacrificial material may then be selectively etched away beneath the resonator 400A, 400E, leaving cavity 483A, 483E beneath the resonator 400A, 400E. For example phosphosilicate glass (PSG) sacrificial material may be selectively etched away by hydrofluoric acid beneath the resonator 400A, 400E, leaving cavity 483A, 483E beneath the resonator 400A, 400E. The cavity 483A, 483E may, but need not, be arranged to provide acoustic isolation of the structures, e.g., bottom acoustic reflector 413A, 413E, e.g., stack 404A, 404E of piezoelectric layers, e.g., resonator 400A, 400E from the substrate 401A, 401E.

Figure 4A:
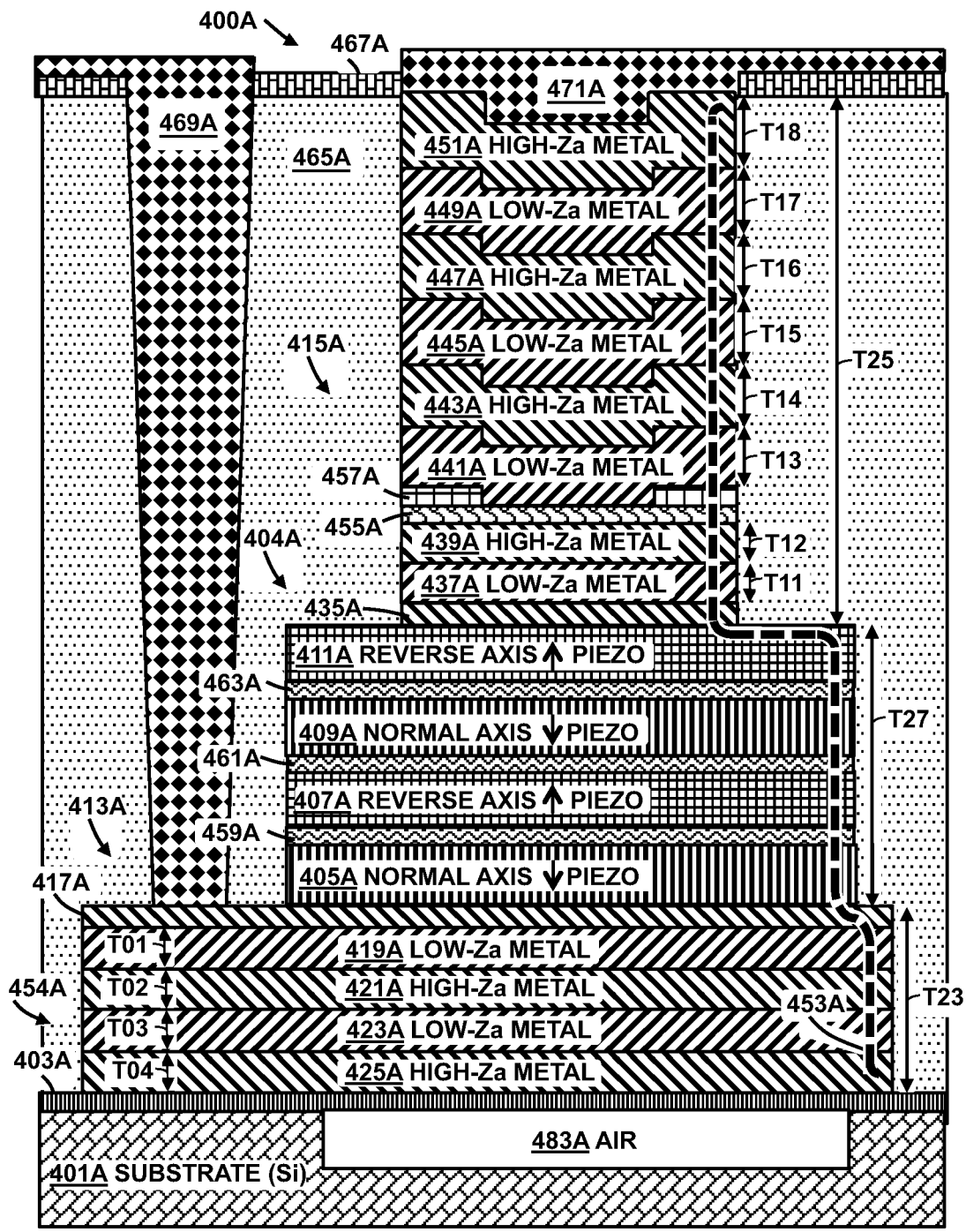
Figure 4B:
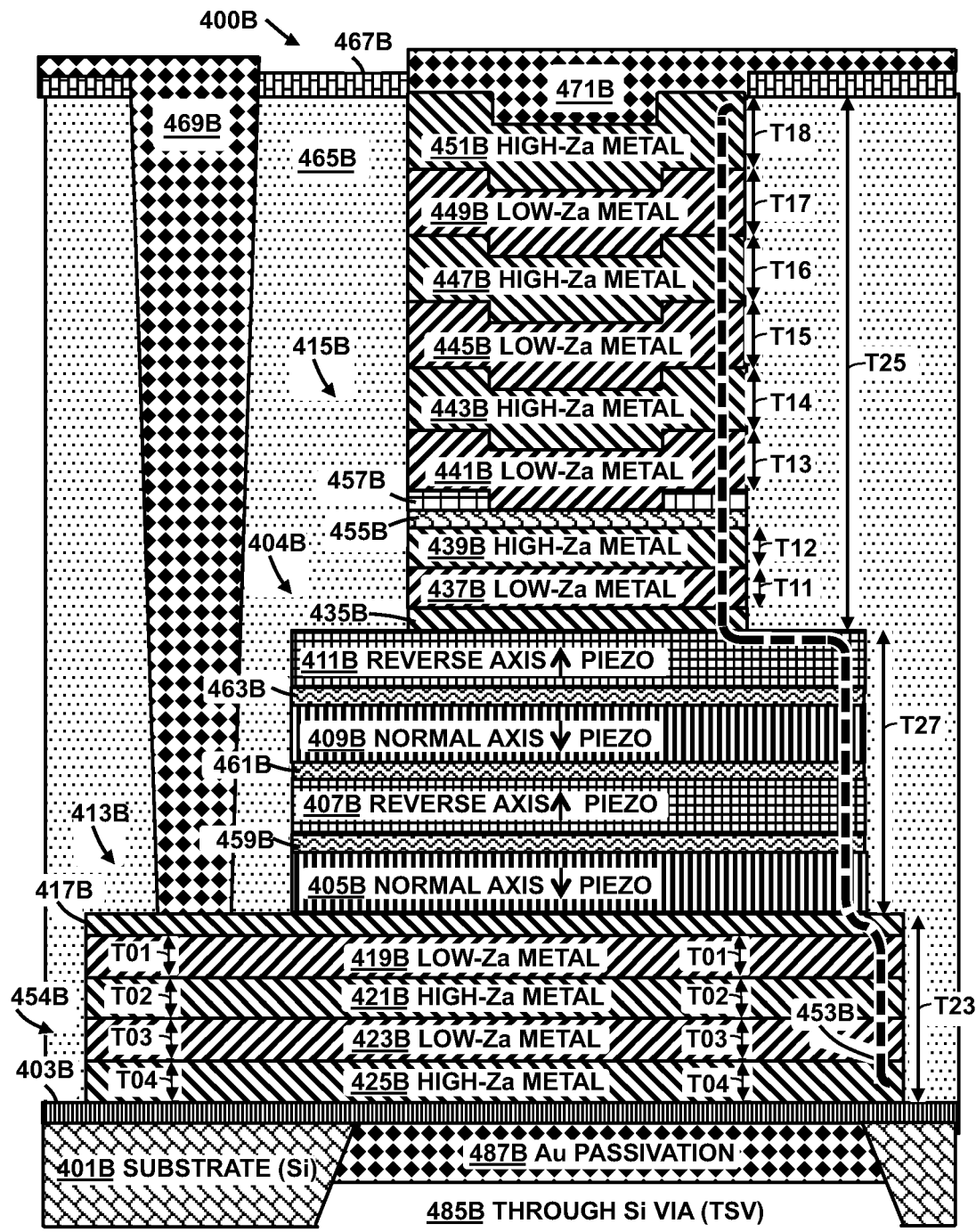
Figure 4C:
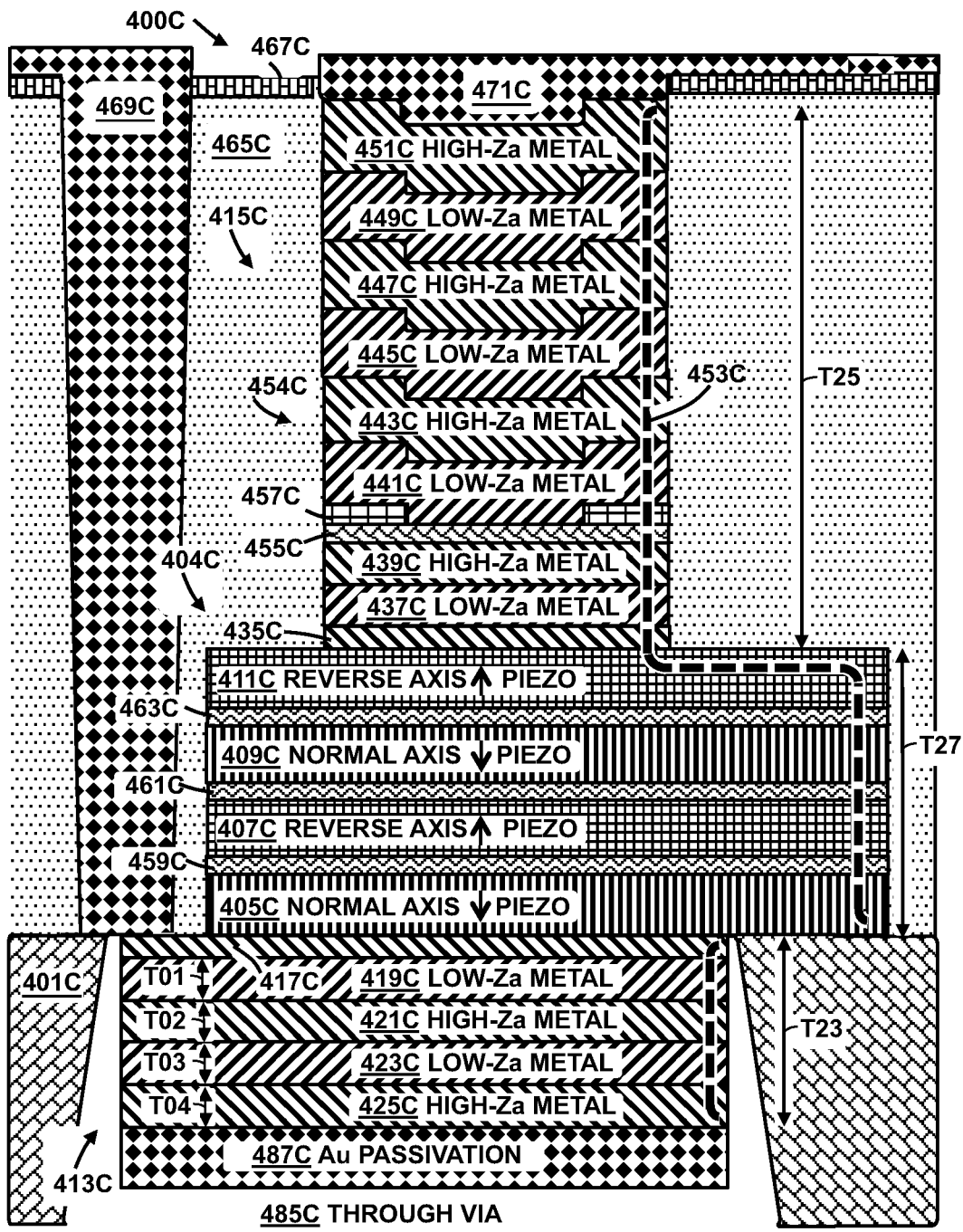

Similarly, in FIGS. 4B, 4C, 4F and 4G, a via 485B, 485C, 485F, 485G (e.g., through silicon via 485B, 485F, e.g., through silicon carbide via 485C, 485G) may, but need not, be arranged to provide acoustic isolation of the structures, e.g., bottom acoustic reflector 413B, 413C, 413F, 413G, e.g., stack 404B, 404C, 404F, 404G, of piezoelectric layers, e.g., resonator 400B, 400C, 400F, 400G from the substrate 401B, 401C, 401F, 401G. The via 485B, 485C, 485F, 485G (e.g., through silicon via 485B, 485F, e.g., through silicon carbide via 485C, 485G) may be formed using techniques (e.g., using photolithographic masking and etching techniques) known to those with ordinary skill in the art. For example, in FIGS. 4B and 4F, backside photolithographic masking and etching techniques may be used to form the through silicon via 485B, 485F, and an additional passivation layer 487B, 487F may be deposited, after the resonator 400B, 400F is formed. For example, in FIGS. 4C and 4G, backside photolithographic masking and etching techniques may be used to form the through silicon carbide via 485C, 485G, after the top acoustic reflector 415C, 415G and stack 404C, 404G of piezoelectric layers are formed. In FIGS. 4C and 4G, after the through silicon carbide via 485C, 485G, is formed, backside photolithographic masking and deposition techniques may be used to form bottom acoustic reflector 413C, 413G, and additional passivation layer 487C, 487G.

In FIGS. 4A, 4B, 4C, 4E, 4F, 4G, bottom acoustic reflector 413A, 413B, 413C, 413E, 413F, 413G, may include the acoustically reflective bottom electrode stack of the plurality of bottom metal electrode layers, in which thicknesses of the bottom metal electrode layers may be related to wavelength (e.g., acoustic wavelength) at the main resonant frequency of the example resonator 400A, 400B, 400C, 400E, 400F, 400G. As mentioned previously herein, the layer thickness of the initial bottom metal electrode layer 417A, 417B, 417C, 417E, 417F, 417G, may be about one eighth of a wavelength (e.g., one eighth acoustic wavelength) at the main resonant frequency of the example resonator 400A. Respective layer thicknesses, (e.g., T01 through T04, explicitly shown in FIGS. 4A, 4B, 4C) for members of the pairs of bottom metal electrode layers may be about one quarter of the wavelength (e.g., one quarter acoustic wavelength) at the main resonant frequency of the example resonators 400A, 400B, 400C, 400E, 400F, 400G. Relatively speaking, in various alternative designs of the example resonators 400A, 400B, 400C, 400E, 400F, 400G, for relatively lower main resonant frequencies (e.g., three and a half Gigahertz (3.5 GHz)) and having corresponding relatively longer wavelengths (e.g., longer acoustic wavelengths), may have relatively thicker bottom metal electrode layers in comparison to other alternative designs of the example resonators 400A, 400B, 400C, 400E, 400F, 400G, for relatively higher main resonant frequencies (e.g., five Gigahertz (5 GHz)). There may be corresponding longer etching times to form, e.g., etch through, the relatively thicker bottom metal electrode layers in designs of the example resonator 400A, 400B, 400C, 400E, 400F, 400G, for relatively lower main resonant frequencies (e.g., three and half Gigahertz (3.5 GHz)). Accordingly, in designs of the example resonators 400A, 400B, 400C, 400E, 400F, 400G, for relatively lower main resonant frequencies (e.g., three and a half Gigahertz (3.5 GHz)) having the relatively thicker bottom metal electrode layers, there may (but need not) be an advantage in etching time in having a relatively fewer number (e.g., five (5)) of bottom metal electrode layers, shown in 4A, 4B, 4C, 4E, 4F, 4G, in comparison to a relatively larger number (e.g., nine (9)) of bottom metal electrode layers, shown in FIG. 1A and in FIG. 4D. The relatively larger number (e.g., nine (9)) of bottom metal electrode layers, shown in FIG. 1A and in FIG. 4D may (but need not) provide for relatively greater acoustic isolation than the relatively fewer number (e.g., five (5)) of bottom metal electrode layers. However, in FIGS. 4A and 4E the cavity 483A, 483E, (e.g., air cavity 483A, 483E) may (but need not) be arranged to provide acoustic isolation enhancement relative to some designs without the cavity 483A, 483E. Similarly, in FIGS. 4B, 4C, 4F, 4G, the via 483B, 483C, 483F, 483G, (e.g., through silicon via 485B, 485F, e.g., through silicon carbide via 485C, 485G) may (but need not) be arranged to provide acoustic isolation enhancement relative to some designs without the via 483B, 483C, 483F, 483G.

In FIGS. 4A and 4E, the cavity 483A, 483E may (but need not) be arranged to compensate for relatively lesser acoustic isolation of the relatively fewer number (e.g., five (5)) of bottom metal electrode layers. In FIGS. 4A and 4E, the cavity 483A, 483E may (but need not) be arranged to provide acoustic isolation benefits, while retaining possible electrical conductivity improvements and etching time benefits of the relatively fewer number (e.g., five (5)) of bottom metal electrode layers, e.g., particularly in designs of the example resonator 400A, 400E, for relatively lower main resonant frequencies (e.g., five Gigahertz (5 GHz)). Similarly, in FIGS. 4B, 4C, 4F, 4G, the via 483B, 483C, 483F, 483G, may (but need not) be arranged to compensate for relatively lesser acoustic isolation of the relatively fewer number (e.g., five (5)) of bottom metal electrode layers. In FIGS. 4B, 4C, 4F, 4G, the via 483B, 483C, 483F, 483G, may (but need not) be arranged to provide acoustic isolation benefits, while retaining possible electrical conductivity improvement benefits and etching time benefits of the relatively fewer number (e.g., five (5)) of bottom metal electrode layers, e.g., particularly in designs of the example resonator 400B, 400C, 400F, 400G, for relatively lower main resonant frequencies (e.g., five Gigahertz (5 GHz), e.g., below six Gigahertz (6 GHz), e.g., below five Gigahertz (5 GHz)).

FIGS. 4D through 4G show alternative example bulk acoustic wave resonators 400D through 400G to the example bulk acoustic wave resonator 100A shown in FIG. 1A, in which the top acoustic reflector, 415D through 415G, may comprise a lateral connection portion, 489D through 489G, (e.g., bridge portion, 489D through 489G), of the top acoustic reflector, 415D through 415G. A gap, 491D through 491G, may be formed beneath the lateral connection portion, 489D through 489G, (e.g., bridge portion, 489D through 489G), of the top acoustic reflector 415D through 415G. The gap, 491D through 491G, may be arranged adjacent to the etched edge region, 453D through 453G, of the example resonators 400D through 400G.

For example, the gap, 491D through 491G, may be arranged adjacent to where the etched edge region, 453D through 453G, extends through (e.g., extends entirely through or extends partially through) the stack 404D through 404G, of piezoelectric layers, for example along the thickness dimension T27 of the stack 404D through 404G. For example, the gap, 491D through 491G, may be arranged adjacent to where the etched edge region, 453D through 453G, extends through (e.g., extends entirely through or extends partially through) the bottom piezoelectric layer 405D through 405G. For example, the gap, 491D through 491G, may be arranged adjacent to where the etched edge region, 453D through 453G, extends through (e.g., extends entirely through or extends partially through) the bottom piezoelectric layer 405D through 405G. For example, the gap, 491D through 491G, may be arranged adjacent to where the etched edge region, 453D through 453G, extends through (e.g., extends entirely through or extends partially through) the first middle piezoelectric layer 407D through 407G. For example, the gap, 491D through 491G, may be arranged adjacent to where the etched edge region, 453D through 453G, extends through (e.g., extends entirely through or extends partially through) the second middle piezoelectric layer 409D through 409G. For example, the gap, 491D through 491G, may be arranged adjacent to where the etched edge region, 453D through 453G, extends through (e.g., extends entirely through or extends partially through) the top piezoelectric layer 411D through 411G. For example, the gap, 491D through 491G, may be arranged adjacent to where the etched edge region, 453D through 453G, extends through (e.g., extends entirely through or extends partially through) one or more interposer layers (e.g., first interposer layer, 495D through 459G, second interposer layer, 461D through 461G, third interposer layer 411D through 411G).

For example, as shown in FIGS. 4D through 4G, the gap, 491D through 491G, may be arranged adjacent to where the etched edge region, 453D through 453G, extends through (e.g., extends partially through) the top acoustic reflector 415D through 415G, for example partially along the thickness dimension T25 of the top acoustic reflector 415D through 415G. For example, the gap, 491D through 491G, may be arranged adjacent to where the etched edge region, 453D through 453G, extends through (e.g., extends entirely through or extends partially through) the initial top electrode layer 435D through 435G. For example, the gap, 491D through 491G, may be arranged adjacent to where the etched edge region, 453D through 453G, extends through (e.g., extends entirely through or extends partially through) the first member, 437D through 437G, of the first pair of top electrode layers, 437D through 437G, 439D through 439G.

Figure 4D:
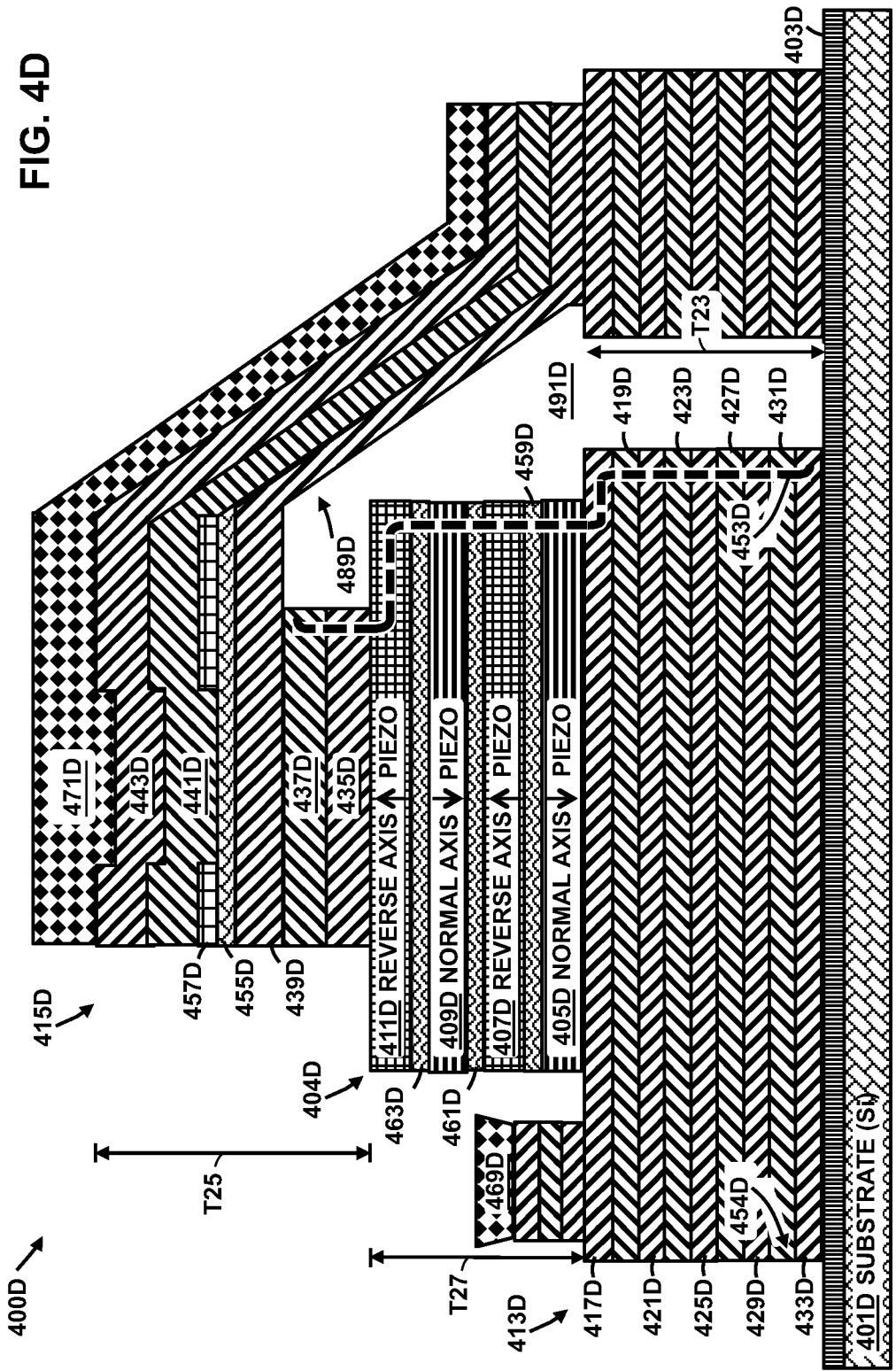
Figure 4F:
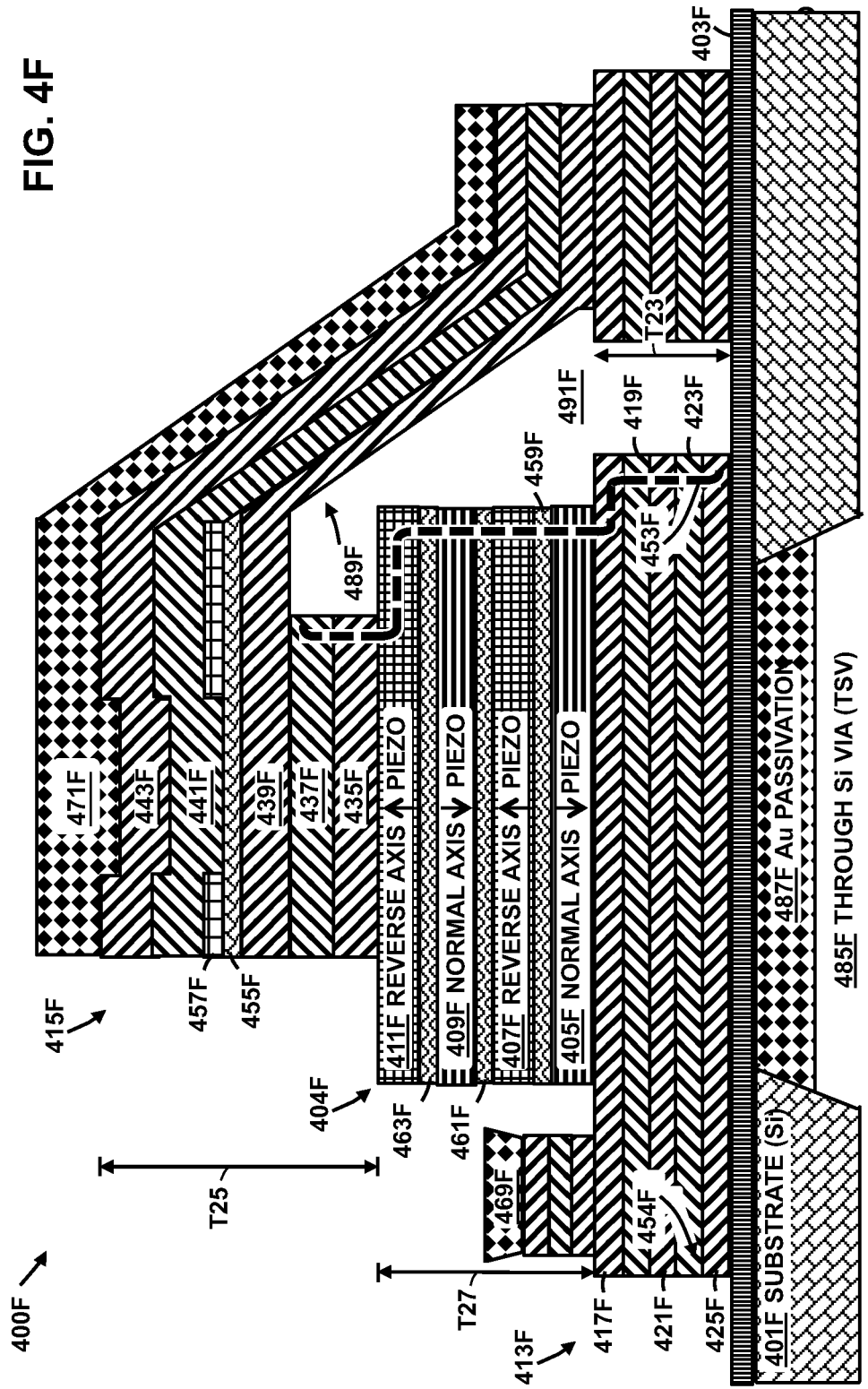

For example, as shown in FIGS. 4D through 4F, the gap, 491D through 491F, may be arranged adjacent to where the etched edge region, 453D through 453F, extends through (e.g., extends entirely through or extends partially through) the bottom acoustic reflector 413D through 413F, for example along the thickness dimension T23 of the bottom acoustic reflector 413D through 413F. For example, the gap, 491D through 491F, may be arranged adjacent to where the etched edge region, 453D through 453F, extends through (e.g., extends entirely through or extends partially through) the initial bottom electrode layer 417D through 417F. For example, the gap, 491D through 491F, may be arranged adjacent to where the etched edge region, 453D through 453F, extends through (e.g., extends entirely through or extends partially through) the first pair of bottom electrode layers, 419D through 419F, 421D through 421F. For example, the gap, 491D through 491F, may be arranged adjacent to where the etched edge region, 453D through 453F, extends through (e.g., extends entirely through or extends partially through) the second pair of bottom electrode layers, 423D through 423F, 425D through 425F. For example, as shown in FIGS. 4D through 4F, the etched edge region, 453D through 453F, may extend through (e.g., entirely through or partially through) the bottom acoustic reflector, 413D through 413F, and through (e.g., entirely through or partially through) one or more of the piezoelectric layers, 405D through 405F, 407D through 407F, 409D through 409F, 411D through 411F, to the lateral connection portion, 489D through 489G, (e.g., to the bridge portion, 489D through 489G), of the top acoustic reflector, 415D through 415F.

As shown in FIGS. 4D-4G, lateral connection portion, 489D through 489G, (e.g., bridge portion, 489D through 489G), of top acoustic reflector, 415D through 415G, may be a multilayer lateral connection portion, 415D through 415G, (e.g., a multilayer metal bridge portion, 415D through 415G, comprising differing metals, e.g., metals having differing acoustic impedances.) For example, lateral connection portion, 489D through 489G, (e.g., bridge portion, 489D through 489G), of top acoustic reflector, 415D through 415G, may comprise the second member, 439D through 439G, (e.g., comprising the relatively high acoustic impedance metal) of the first pair of top electrode layers, 437D through 437G, 439D through 439G. For example, lateral connection portion, 489D through 489G, (e.g., bridge portion, 489D through 489G), of top acoustic reflector, 415D through 415G, may comprise the second pair of top electrode layers, 441D through 441G, 443D through 443G.

Gap 491D-491G may be an air gap 491D-491G, or may be filled with a relatively low acoustic impedance material (e.g., BenzoCyclobutene (BCB)), which may be deposited using various techniques known to those with skill in the art. Gap 491D-491G may be formed by depositing a sacrificial material (e.g., phosphosilicate glass (PSG)) after the etched edge region, 453D through 453G, is formed. The lateral connection portion, 489D through 489G, (e.g., bridge portion, 489D through 489G), of top acoustic reflector, 415D through 415G, may then be deposited (e.g., sputtered) over the sacrificial material. The sacrificial material may then be selectively etched away beneath the lateral connection portion, 489D through 489G, (e.g., e.g., beneath the bridge portion, 489D through 489G), of top acoustic reflector, 415D through 415G, leaving gap 491D-491G beneath the lateral connection portion, 489D through 489G, (e.g., beneath the bridge portion, 489D through 489G). For example the phosphosilicate glass (PSG) sacrificial material may be selectively etched away by hydrofluoric acid beneath the lateral connection portion, 489D through 489G, (e.g., beneath the bridge portion, 489D through 489G), of top acoustic reflector, 415D through 415G, leaving gap 491D-491G beneath the lateral connection portion, 489D through 489G, (e.g., beneath the bridge portion, 489D through 489G).

In various example resonators, 100A, 400A, 400B, 400D, 400E, 400F, polycrystalline piezoelectric layers (e.g., polycrystalline Aluminum Nitride (AlN), e.g., polycrystalline Lithium Niobate (LN), e.g., polycrystalline Lithium Tantalate (LT)) may be deposited (e.g., by sputtering). In other example resonators 400C, 400G, alternative single crystal or near single crystal piezoelectric layers (e.g., single/near single crystal Aluminum Nitride (AlN)) may be deposited (e.g., by metal organic chemical vapor deposition (MOCVD)). Normal axis piezoelectric layers (e.g., normal axis Aluminum Nitride (AlN) piezoelectric layers) may be deposited by MOCVD using techniques known to those with skill in the art. As discussed previously herein, the interposer layers may be deposited by sputtering, but alternatively may be deposited by MOCVD. Reverse axis piezoelectric layers (e.g., reverse axis Aluminum Nitride (AlN) piezoelectric layers) may likewise be deposited via MOCVD.

For the respective example resonators 400C, 400G shown in FIGS. 4C and 4G, the alternating axis piezoelectric stack 404C, 404G comprised of piezoelectric layers 405C, 407C, 409C, 411C, 405G, 407G, 409G, 411G as well as interposer layers 459C, 461C, 463C, 459G, 461G, 463G extending along stack thickness dimension T27 fabricated using MOCVD on a silicon carbide substrate 401C, 401G. For example, aluminum nitride of piezoelectric layers 405C, 407C, 409C, 411C, 405G, 407G, 409G, 411G may grow nearly epitaxially on silicon carbide (e.g., 4H SiC) by virtue of the small lattice mismatch between the polar axis aluminum nitride wurtzite structure and specific crystal orientations of silicon carbide. Alternative small lattice mismatch substrates may be used (e.g., sapphire, e.g., aluminum oxide). By varying the ratio of the aluminum and nitrogen in the deposition precursors, an aluminum nitride film may be produced with the desired polarity (e.g., normal axis, e.g., reverse axis). For example, normal axis aluminum nitride may be synthesized using MOCVD when a nitrogen to aluminum ratio in precursor gases approximately 1000. For example, reverse axis aluminum nitride may be synthesized when the nitrogen to aluminum ratio is approximately 27000. In accordance with the foregoing, FIGS. 4C and 4G show MOCVD synthesized normal axis piezoelectric layer 405C, 405G, MOCVD synthesized reverse axis piezoelectric layer 407C, 407G, MOCVD synthesized normal axis piezoelectric layer 409C, 409G, and MOCVD synthesized reverse axis piezoelectric layer 411C, 411G. For example, normal axis piezoelectric layer 405C, 405G may be synthesized by MOCVD in a deposition environment where the nitrogen to aluminum gas ratio is relatively low, e.g., 1000 or less. Next an oxyaluminum nitride layer, 459 C at lower temperature, may be deposited by MOCVD that may reverse axis (e.g., reverse axis polarity) of the growing aluminum nitride under MOCVD growth conditions, and has also been shown to be able to be deposited by itself under MOCVD growth conditions. Increasing the nitrogen to aluminum ratio into the several thousands during the MOCVD synthesis may enable the reverse axis piezoelectric layer 407C, 407G to be synthesized. Interposer layer 461C, 461G may comprise one or more oxide layers such as, but not limited to, aluminum oxide and/or silicon dioxide and/or hafnium dioxide. This oxide layer may be deposited in in a low temperature physical vapor deposition process such as sputtering or in a higher temperature chemical vapor deposition process. Interposer layer 461C, 461G may comprise one or more nitride layers such as, but not limited to, titanium nitride. Normal axis piezoelectric layer 409C, 409G may be grown by MOCVD on top of interposer layer 461C, 461G using growth conditions similar to the normal axis layer

405C, 405G, as discussed previously, namely MOCVD in a deposition environment where the nitrogen to aluminum gas ratio is relatively low, e.g., 1000 or less. Next an aluminum oxynitride, interposer layer 463C, 463G may be deposited in a low temperature MOCVD process followed by a reverse axis piezoelectric layer 411C, 411G, synthesized in a high temperature MOCVD process and an atmosphere of nitrogen to aluminum ratio in the several thousand range. Upon conclusion of these depositions, the piezoelectric stack 404C, 404G shown in FIGS. 4C and 4G may be realized.

Alternatively, in other examples for resonators 400C, 400G, alternative single crystal or near single crystal piezoelectric material may be grown in various ways (e.g., by the well known Czochralski process). Further, various well known layer transfer techniques may be used to process single crystal or near single crystal piezoelectric layers. For example, layer transfer techniques may comprise grinding and/or polishing to produce single crystal or near single crystal piezoelectric layers. Alternatively or additionally, Czochralski grown single crystal or near single crystal piezoelectric material may be processed into donor wafers (e.g., single/near single crystal Lithium Niobate (LN) donor wafers, e.g., X-cut, single/near single crystal Lithium Niobate (LN) donor wafers, e.g., single/near single crystal Lithium Tantalate (LT) donor wafers). In such other examples for resonators 400C, 400G, such alternative single crystal or near single crystal piezoelectric material donor wafers may be split into desired normal axis piezoelectric layers and reverse axis piezoelectric layers using, for example, using ion implantation and micro-bubble techniques (e.g., split into single/near single crystal Lithium Niobate (LN) layers e.g., split into X-cut, single/near single crystal Lithium Niobate (LN), e.g., single/near single crystal Lithium Tantalate (LT)). For example, similar to what was already discussed previously herein with respect to FIGS. 1FA through 1FE, and FIGS. 1GA through 1GE, donor wafers (e.g., single/near single crystal Lithium Niobate (LN) donor wafers, e.g., X-cut, single/near single crystal Lithium Niobate (LN) donor wafers, e.g., single/near single crystal Lithium Tantalate (LT) donor wafers) having a bottom planar face may be subjected to the following three stages: a first stage of implantation by bombardment of the bottom face of the donor wafer by means of ions creating in the volume of the wafer a layer of gaseous microbubbles defining in the volume of the donor wafer an upper region constituting the mass of the donor wafer and a lower region constituting the piezoelectric layer to be split from the donor wafer; a second stage of intimately contacting the bottom planar face of the donor wafer with a stiffener comprising at least one rigid material layer (e.g., detachably bonding the planar face of the donor wafer to a carrier wafer); and a third stage of heat treating an assembly of the donor wafer and the stiffener (e.g., the carrier wafer) at a temperature above that at which the ion bombardment was carried out, and sufficient to create by a crystalline rearrangement effect in the donor wafer and a pressure effect in the microbubbles, a separation (e.g., splitting) between the mass of the donor wafer and the piezoelectric layer (e.g., piezoelectric layer still coupled with the stiffener, e.g., piezoelectric layer still detachably bonded to the carrier wafer). Illustrative examples of splitting using ion implantation and micro-bubble techniques are described in U.S. Pat. No. 5,374,564 issued Dec. 20, 1994 to Michel Bruel, which is hereby incorporated by reference.

The splitting process of this disclosure may select a relatively coarse thickness of the piezoelectric layer. Optionally, a relatively refined thickness of the piezoelectric layer may then be selected by thinning the thickness of the piezoelectric layer, for example, using an optional grinding and/or polishing step (e.g., mechanical grinding and/or polishing, e.g., chemical grinding and/or polishing, e.g. chemical-mechanical grinding and/or polishing).

Accordingly, for respective alternative example resonators 400C, 400G shown in FIGS. 4C and 4G, the alternating axis piezoelectric stack 404C, 404G may be comprised of single/near single crystal piezoelectric layers 405C, 407C, 409C, 411C, 405G, 407G, 409G, 411G (e.g., single/near single crystal Lithium Niobate (LN) layers, e.g., X-cut, single/near single crystal Lithium Niobate (LN) layers, e.g., single/near single crystal Lithium Tantalate (LT) layers). Further, the alternating axis piezoelectric stack 404C, 404G may be assembled using piezoelectric layer transfer techniques described in this disclosure, and using piezoelectric layer bonding techniques, for example using interposer layers 459C, 461C, 463C, 459G, 461G, 453G to bond the alternating axis piezoelectric stack 404C, 404G, e.g., to bond an alternating arrangement of normal axis piezoelectric layers and reverse axis piezoelectric layers (e.g., to bond single/near single crystal Lithium Niobate (LN) layers, e.g., to bond X-cut, single/near single crystal Lithium Niobate (LN), e.g., to bond single/near single crystal Lithium Tantalate (LT) layers). Lithium Niobate (LN) layers or Lithium Tantalate (LT) layers may be polished for prior to depositing interposer layers 459C, 461C, 463C, 459G, 461G, 453G for bonding. Further, Lithium Niobate (LN) layers or Lithium Tantalate (LT) layers may be polished for bonding, prior to their arrangement in contact with interposer layers 459C, 461C, 463C, 459G, 461G, 453G while temperature is elevated sufficiently high for bonding. The alternating axis piezoelectric stack 404C, 404G as well as interposer layers 459C, 461C, 463C, 459G, 461G, 453G may extend along stack thickness dimension T27. The alternating axis piezoelectric stack 404C, 404G (e.g., Lithium Niobate (LN) layers, e.g., Lithium Tantalate (LT) layers) may be bonded to the substrate 401C, 401G, for example, using a bonding layer (not shown) interposed there between, in which this bonding layer may, for example, may be similar to the interposer layer as discussed in detail previously herein. For example, Benzocyclobutene (BCB) may be used as the bonding material of the bonding layer (not shown) between the substrate 401C, 401G and the alternating axis piezoelectric stack 404C, 404G (e.g., Lithium Niobate (LN) layers, e.g., Lithium Tantalate (LT) layers).

Figure 5:
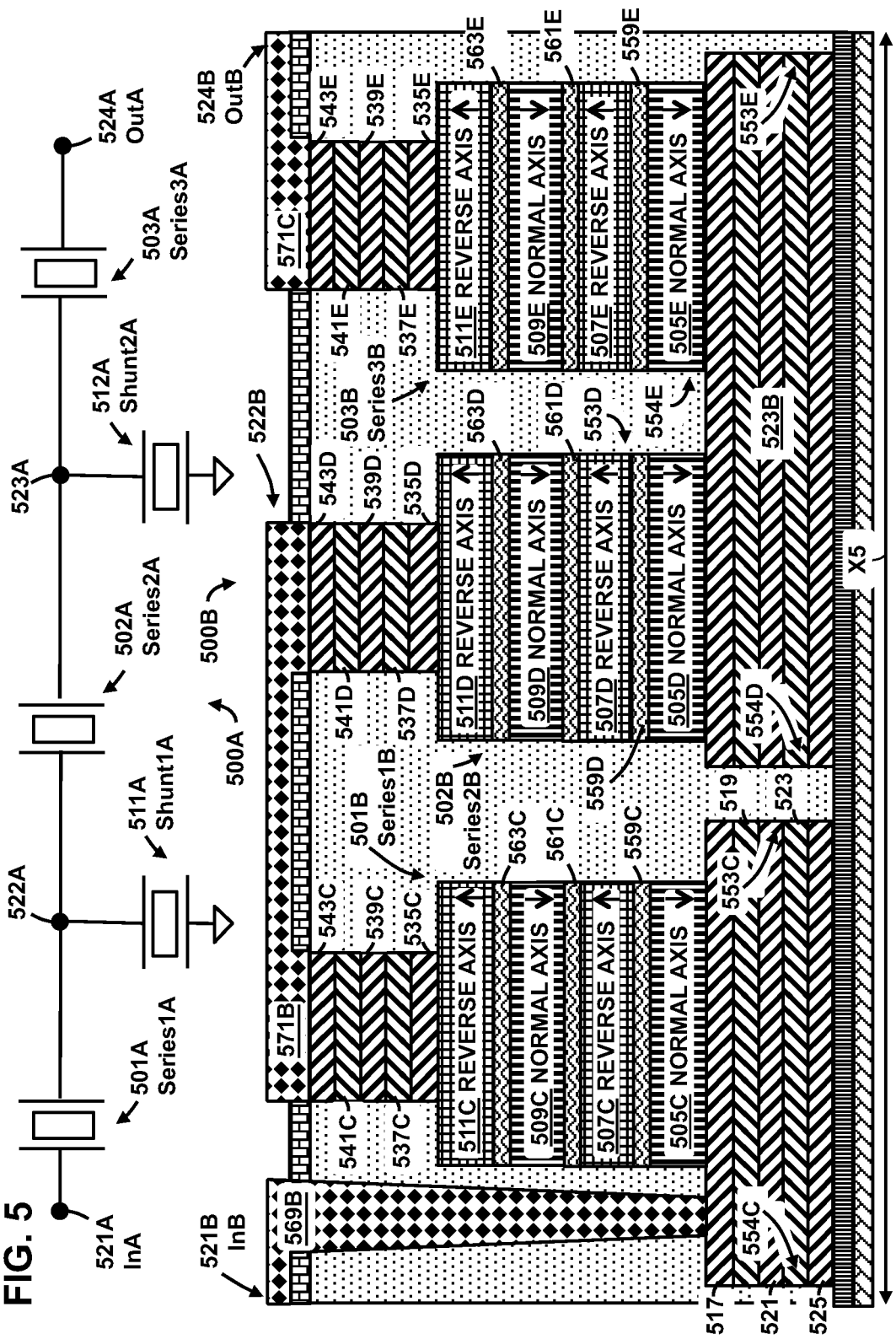
FIG. 5 shows a schematic of an example ladder filter using three series resonators of the bulk acoustic wave resonator structure of FIG. 1A, and two mass loaded shunt resonators of the bulk acoustic wave resonator structure of FIG. 1A, along with a simplified view of the three series resonators.

FIG. 5 shows a schematic of an example ladder filter 500A (e.g., SHF or EHF wave ladder filter 500A), which may use three series resonators of the bulk acoustic wave resonator structure of FIG. 1A (e.g., three bulk acoustic SHF or EHF wave resonators), and two mass loaded shunt resonators of the bulk acoustic wave resonator structure of FIG. 1A (e.g., two mass loaded bulk acoustic SHF or EHF wave resonators), along with a simplified view of the three series resonators. The example ladder filter 500A may be a band pass filter. Alternatively or additionally, the example ladder filter 500A may be a band stop filter, e.g., having a stop band, e.g., a notch filter, e.g., having a notch band. An alternative example of ladder band-stop filter 500A (e.g., SHF or EHF wave ladder band-stop filter 500A, e.g., SHF or EHF wave ladder notch filter 500A) may use three mass-loaded series resonators of the bulk acoustic wave resonator structure of FIG. 1A (e.g., three bulk acoustic SHF or EHF wave resonators), and two shunt resonators of the bulk acoustic wave resonator structure of FIG. 1A (e.g., two bulk acoustic SHF or EHF wave resonators). The example ladder filter 500A (e.g., SHF or EHF wave ladder filter 500A) is an electrical filter, comprising a plurality of bulk acoustic wave (BAW) resonators, e.g., on a substrate, in which the plurality of BAW resonators may comprise a respective first layer (e.g., bottom layer) of piezoelectric material having a respective piezoelectrically excitable resonance mode. The plurality of BAW resonators of the filter 500A may comprise a respective top acoustic reflector (e.g., top acoustic reflector electrode) including a respective initial top metal electrode layer and a respective first pair of top metal electrode layers electrically and acoustically coupled with the respective first layer (e.g., bottom layer) of piezoelectric material to excite the respective piezoelectrically excitable resonance mode at a respective resonant frequency. For example, the respective top acoustic reflector (e.g., top acoustic reflector electrode) may include the respective initial top metal electrode layer and the respective first pair of top metal electrode layers, and the foregoing may have a respective peak acoustic reflectivity, e.g., in the Super High Frequency (SHF) band, e.g., in the Extremely High Frequency (EHF) band, that includes the respective resonant frequency of the respective BAW resonator. The plurality of BAW resonators of the filter 500A may comprise a respective bottom acoustic reflector (e.g., bottom acoustic reflector electrode) including a respective initial bottom metal electrode layer and a respective first pair of bottom metal electrode layers electrically and acoustically coupled with the respective first layer (e.g., bottom layer) of piezoelectric material to excite the respective piezoelectrically excitable resonance mode at the respective resonant frequency. For example, the respective bottom acoustic reflector (e.g., bottom acoustic reflector electrode) may include the respective initial bottom metal electrode layer and the respective first pair of bottom metal electrode layers, and the foregoing may have a respective peak acoustic reflectivity, e.g., in the Super High Frequency (SHF) band, e.g., in the Extremely High Frequency (EHF) band, that includes the respective resonant frequency of the respective BAW resonator. The respective first layer (e.g., bottom layer) of piezoelectric material may be sandwiched between the respective top acoustic reflector and the respective bottom acoustic reflector. Further, the plurality of BAW resonators may comprise at least one respective additional layer of piezoelectric material, e.g., first middle piezoelectric layer. The at least one additional layer of piezoelectric material may have the piezoelectrically excitable main resonance mode with the respective first layer (e.g., bottom layer) of piezoelectric material. The respective first layer (e.g., bottom layer) of piezoelectric material may have a respective first piezoelectric axis orientation (e.g., normal axis orientation) and the at least one respective additional layer of piezoelectric material may have a respective piezoelectric axis orientation (e.g., reverse axis orientation) that opposes the first piezoelectric axis orientation of the respective first layer of piezoelectric material. Further discussion of features that may be included in the plurality of BAW resonators of the filter 500A is present previously herein with respect to previous discussion of FIG. 1A As shown in the schematic appearing at an upper section of FIG. 5, the example ladder filter 500A may include an input port comprising a first node 521A (InA), and may include a first series resonator 501A (Series1A) (e.g., first bulk acoustic SHF or EHF wave resonator 501A) coupled between the first node 521A (InA) associated with the input port and a second node 522A. The example ladder filter 500A may also include a second series resonator 502A (Series2A) (e.g., second bulk acoustic SHF or EHF wave resonator 502A) coupled between the second node 522A and a third node 523A. The example ladder filter 500A may also include a third series resonator 503A (Series3A) (e.g., third bulk acoustic SHF or EHF wave resonator 503A) coupled between the third node 523A and a fourth node 524A (OutA), which may be associated with an output port of the ladder filter 500A. The example ladder filter 500A may also include a first mass loaded shunt resonator 511A (Shunt1A) (e.g., first mass loaded bulk acoustic SHF or EHF wave resonator 511A) coupled between the second node 522A and ground. The example ladder filter 500A may also include a second mass loaded shunt resonator 512A (Shunt2A) (e.g., second mass loaded bulk acoustic SHF or EHF wave resonator 512A) coupled between the third node 523 and ground.

Appearing at a lower section of FIG. 5 is the simplified view of the three series resonators 501B (Series1B), 502B (Series2B), 503B (Series3B) in a serial electrically interconnected arrangement 500B, for example, corresponding to series resonators 501A, 502A, 503A, of the example ladder filter 500A. The three series resonators 501B (Series1B), 502B (Series2B), 503B (Series3B), may be constructed as shown in the arrangement 500B and electrically interconnected in a way compatible with integrated circuit fabrication of the ladder filter. Although the first mass loaded shunt resonator 511A (Shunt1A) and the second mass loaded shunt resonator 512A are not explicitly shown in the arrangement 500B appearing at a lower section of FIG. 5, it should be understood that the first mass loaded shunt resonator 511A (Shunt1A) and the second mass loaded shunt resonator 512A are constructed similarly to what is shown for the series resonators in the lower section of FIG. 5, but that the first and second mass loaded shunt resonators 511A, 512A may include mass layers, in addition to layers corresponding to those shown for the series resonators in the lower section of FIG. 5 (e.g., the first and second mass loaded shunt resonators 511A, 512A may include respective mass layers, in addition to respective top acoustic reflectors of respective top metal electrode layers, may include respective alternating axis stacks of piezoelectric material layers, and may include respective bottom acoustic reflectors of bottom metal electrode layers.) For example, all of the resonators of the ladder filter may be co-fabricated using integrated circuit processes (e.g., Complementary Metal Oxide Semiconductor (CMOS) compatible fabrication processes) on the same substrate (e.g., same silicon substrate). The example ladder filter 500A and serial electrically interconnected arrangement 500B of series resonators 501A, 502A, 503A, may respectively be relatively small in size, and may respectively have a lateral dimension (X5) of less than approximately three millimeters.

For example, the serial electrically interconnected arrangement 500B of three series resonators 501B (Series1B), 502B (Series2B), 503B (Series3B), may include an input port comprising a first node 521B (InB) and may include a first series resonator 501B (Series1B) (e.g., first bulk acoustic SHF or EHF wave resonator 501B) coupled between the first node 521B (InB) associated with the input port and a second node 522B. The first node 521B (InB) may include bottom electrical interconnect 569B electrically contacting a first bottom acoustic reflector of first series resonator 501B (Series1B) (e.g., first bottom acoustic reflector electrode of first series resonator 501B (Series1B). Accordingly, in addition to including bottom electrical interconnect 569, the first node 521B (InB) may also include the first bottom acoustic reflector of first series resonator 501B (Series1B) (e.g., first bottom acoustic reflector electrode of first series resonator 501B (Series1B)). The first bottom acoustic reflector of first series resonator 501B (Series1B) may include a stack of the plurality of bottom metal electrode layers 517 through 525. The serial electrically interconnected arrangement 500B of three series resonators 501B (Series1B), 502B (Series2B), 503B (Series3B), may include the second series resonator 502B (Series2B) (e.g., second bulk acoustic SHF or EHF wave resonator 502B) coupled between the second node 522B and a third node 523B. The third node 523B may include a second bottom acoustic reflector of second series resonator 502B (Series2B) (e.g., second bottom acoustic reflector electrode of second series resonator 502B (Series2B)). The second bottom acoustic reflector of second series resonator 502B (Series2B) (e.g., second bottom acoustic reflector electrode of second series resonator 502B (Series2B)) may include an additional stack of an additional plurality of bottom metal electrode layers. The serial electrically interconnected arrangement 500B of three series resonators 501B (Series1B), 502B (Series2B), 503B (Series3B), may also include the third series resonator 503B (Series3B) (e.g., third bulk acoustic SHF or EHF wave resonator 503B) coupled between the third node 523B and a fourth node 524B (OutB). The third node 523B, e.g., including the additional plurality of bottom metal electrode layers, may electrically interconnect the second series resonator 502B (Series2B) and the third series resonator 503B (Series3B). The second bottom acoustic reflector (e.g., second bottom acoustic reflector electrode) of second series resonator 502B (Series2B) of the third node 523B, e.g., including the additional plurality of bottom metal electrode layers, may be a mutual bottom acoustic reflector (e.g., mutual bottom acoustic reflector electrode), and may likewise serve as bottom acoustic reflector (e.g., bottom acoustic reflector electrode) of third series resonator 503B (Series3B). The fourth node 524B (OutB) may be associated with an output port of the serial electrically interconnected arrangement 500B of three series resonators 501B (Series1B), 502B (Series2B), 503B (Series3B). The fourth node 524B (OutB) may include electrical interconnect 571C.

The stack of the plurality of bottom metal electrode layers 517 through 525 are associated with the first bottom acoustic reflector (e.g., first bottom acoustic reflector electrode) of first series resonator 501B (Series1B). As shown for example in FIG. 5, an example via (e.g., second via, e.g., etched acceptance location) extends from a top portion of a planarization layer (shown with stripping) and through the planarization layer to the stack of the plurality of bottom metal electrode layers 517 through 525 (e.g., first bottom electrode stack), and a bottom electrical interconnect 569B is disposed in the second via and is electrically coupled with the first bottom electrode stack. The additional stack of the additional plurality of bottom metal electrode layers (e.g., of the third node 523B) may be associated with the mutual bottom acoustic reflector (e.g., mutual bottom acoustic reflector electrode) of both the second series resonant 502B (Series2B) and the third series resonator 503B (Series3B). Although stacks of respective five bottom metal electrode layers are shown in simplified view in FIG. 5, in should be understood that the stacks may include respective larger numbers of bottom metal electrode layers, e.g., respective nine top metal electrode layers. Further, the first series resonator (Series1B), and the second series resonant 502B (Series2B) and the third series resonator 503B (Series3B) may all have the same, or approximately the same, or different (e.g., achieved by means of additional mass loading layers) resonant frequency (e.g., the same, or approximately the same, or different main resonant frequency). For example, small additional massloads (e.g, a tenth of the main shunt mass-load) of series and shunt resonators may help to reduce pass-band ripples in insertion loss, as may be appreciated by one with skill in the art. The bottom metal electrode layers 517 through 525 and the additional plurality of bottom metal electrode layers (e.g., of the mutual bottom acoustic reflector, e.g., of the third node 523B) may have respective thicknesses that are related to wavelength (e.g., acoustic wavelength) for the resonant frequency (e.g., main resonant frequency) of the series resonators (e.g., first series resonator 501B (Series1B), e.g., second series resonator 502B, e.g., third series resonator (503B)). Various embodiments for series resonators (e.g., first series resonator 501B (Series1B), e.g., second series resonator 502B, e.g., third series resonator (503B)) having various relatively higher resonant frequency (e.g., higher main resonant frequency) may have relatively thinner bottom metal electrode thicknesses, e.g., scaled thinner with relatively higher resonant frequency (e.g., higher main resonant frequency). Similarly, various embodiments of the series resonators (e.g., first series resonator 501B (Series1B), e.g., second series resonator 502B, e.g., third series resonator (503B)) having various relatively lower resonant frequency (e.g., lower main resonant frequency) may have relatively thicker bottom metal electrode layer thicknesses, e.g., scaled thicker with relatively lower resonant frequency (e.g., lower main resonant frequency). The bottom metal electrode layers 517 through 525 and the additional plurality of bottom metal electrode layers (e.g., of the mutual bottom acoustic reflector, e.g., of the third node 523B) may include members of pairs of bottom metal electrodes having respective thicknesses of one quarter wavelength (e.g., one quarter acoustic wavelength) at the resonant frequency (e.g., main resonant frequency) of the series resonators (e.g., first series resonator 501B (Series1B), e.g., second series resonator 502B, e.g., third series resonator (503B)). The stack of bottom metal electrode layers 517 through 525 and the stack of additional plurality of bottom metal electrode layers (e.g., of the mutual bottom acoustic reflector, e.g., of the third node 523B) may include respective alternating stacks of different metals, e.g., different metals having different acoustic impedances (e.g., alternating relatively high acoustic impedance metals with relatively low acoustic impedance metals). The foregoing may provide acoustic impedance mismatches for facilitating acoustic reflectivity (e.g., SHF or EHF acoustic wave reflectivity) of the first bottom acoustic reflector (e.g., first bottom acoustic reflector electrode) of the first series resonator 501B (Series1B) and the mutual bottom acoustic reflector (e.g., of the third node 523B) of the second series resonator 502B (Series2B) and the third series resonator 503B (Series3B).

A first top acoustic reflector (e.g., first top acoustic reflector electrode) may comprise a first stack of a first plurality of top metal electrode layers 535C through 543C of the first series resonator 501B (Series1B). A second top acoustic reflector (e.g., second top acoustic reflector electrode) comprises a second stack of a second plurality of top metal electrode layers 535D through 543D of the second series resonator 502B (Series2B). As shown for example in FIG. 5, a top electrical interconnect 571B may be electrically coupled between the first stack of the first plurality of top metal electrode layers 535C through 543C and the second stack of the second plurality of top metal electrode layers 535D through 543D. A third top acoustic reflector (e.g., third top acoustic reflector electrode) may comprise a third stack of a third plurality of top metal electrode layers 535E through 543E of the third series resonator 503B (Series3B). Although stacks of respective five top metal electrode layers are shown in simplified view in FIG. 5, in should be understood that the stacks may include respective larger numbers of top metal electrode layers, e.g., respective nine bottom metal electrode layers. Further, the first plurality of top metal electrode layers 535C through 543C, the second plurality of top metal electrode layers 535D through 543D, and the third plurality of top metal electrode layers 535E through 543E may have respective thicknesses that are related to wavelength (e.g., acoustic wavelength) for the resonant frequency (e.g., main resonant frequency) of the series resonators (e.g., first series resonator 501B (Series1B), e.g., second series resonator 502B, e.g., third series resonator (503B)). Various embodiments for series resonators (e.g., first series resonator 501B (Series1B), e.g., second series resonator 502B, e.g., third series resonator (503B)) having various relatively higher resonant frequency (e.g., higher main resonant frequency) may have relatively thinner top metal electrode thicknesses, e.g., scaled thinner with relatively higher resonant frequency (e.g., higher main resonant frequency). Similarly, various embodiments of the series resonators (e.g., first series resonator 501B (Series1B), e.g., second series resonator 502B, e.g., third series resonator (503B)) having various relatively lower resonant frequency (e.g., lower main resonant frequency) may have relatively thicker top metal electrode layer thicknesses, e.g., scaled thicker with relatively lower resonant frequency (e.g., lower main resonant frequency). The first plurality of top metal electrode layers 535C through 543C, the second plurality of top metal electrode layers 535D through 543D, and the third plurality of top metal electrode layers 535E through 543E may include members of pairs of bottom metal electrodes having respective thicknesses of one quarter wavelength (e.g., one quarter acoustic wavelength) of the resonant frequency (e.g., main resonant frequency) of the series resonators (e.g., first series resonator 501B (Series1B), e.g., second series resonator 502B, e.g., third series resonator (503B)). The first stack of the first plurality of top metal electrode layers 535C through 543C, the second stack of the second plurality of top metal electrode layers 535D through 543D, and the third stack of the third plurality of top metal electrode layers 535E through 543E may include respective alternating stacks of different metals, e.g., different metals having different acoustic impedances (e.g., alternating relatively high acoustic impedance metals with relatively low acoustic impedance metals). The foregoing may provide acoustic impedance mismatches for facilitating acoustic reflectivity (e.g., acoustic SHF or EHF wave reflectivity) of the top acoustic reflectors (e.g., the first top acoustic reflector of the first series resonator 501B (Series1B), e.g., the second top acoustic reflector of the second series resonator 502B (Series2B), e.g., the third top acoustic reflector of the third series resonator 503B (Series3B)). Although not explicitly shown in the FIG. 5 simplified views of metal electrode layers of the series resonators, respective pluralities of lateral features (e.g., respective pluralities of step features) may be sandwiched between metal electrode layers (e.g., between respective pairs of top metal electrode layers, e.g., between respective first pairs of top metal electrode layers 537C, 539C, 537D, 539D, 537E, 539E, and respective second pairs of top metal electrode layers 541C, 543C, 541D, 543D, 541E, 543E. The respective pluralities of lateral features may, but need not, limit parasitic lateral acoustic modes (e.g., facilitate suppression of spurious modes) of the bulk acoustic wave resonators of FIG. 5 (e.g., of the series resonators, the mass loaded series resonators, and the mass loaded shunt resonators).

The first series resonator 501B (Series1B) may comprise a first alternating axis stack, e.g., an example first stack of four layers of alternating axis piezoelectric material, 505C through 511C. The second series resonator 502B (Series2B) may comprise a second alternating axis stack, e.g., an example second stack of four layers of alternating axis piezoelectric material, 505D through 511D. As shown using stippling in FIG. 5, the planarization layer of the filter 500B (e.g., millimeter wave filter) can be arranged, e.g., under the top electrical interconnect 571B, in which at least a portion of the planarization layer is interposed between the first piezoelectric stack (e.g., piezoelectric layers 505C through 511C) and the second piezoelectric stack (e.g., piezoelectric layers 505D through 511D). The top electrical interconnect 571B can extend over the portion of the planarization layer that is interposed between the first piezoelectric stack and the second piezoelectric stack. FIG. 5 shows a via (e.g., first via, e.g., etched location) can be interposed between the first piezoelectric stack (e.g., piezoelectric layers 505C through 511C) and the second piezoelectric stack (e.g., piezoelectric layers 505D through 511D), and the portion of the planarization layer that is interposed between the first piezoelectric stack and the second piezoelectric stack can be disposed in the via (e.g., first via, e.g., etch location.) The third series resonator 503B (Series3B) may comprise a third alternating axis stack, e.g., an example third stack of four layers of alternating axis piezoelectric material, 505E through 511E. The first, second and third alternating axis piezoelectric stacks may comprise layers of Aluminum Nitride (AlN) having alternating C-axis wurtzite structures. For example, piezoelectric layers 505C, 505D, 505E, 509C, 509D, 509E have normal axis orientation. For example, piezoelectric layers 507C, 507D, 507E, 511C, 511D, 511E have reverse axis orientation. Members of the first stack of four layers of alternating axis piezoelectric material, 505C through 511C, and members of the second stack of four layers of alternating axis piezoelectric material, 505D through 511D, and members of the third stack of four layers of alternating axis piezoelectric material, 505E through 511E, may have respective thicknesses that are related to wavelength (e.g., acoustic wavelength) for the resonant frequency (e.g., main resonant frequency) of the series resonators (e.g., first series resonator 501B (Series1B), e.g., second series resonator 502B, e.g., third series resonator (503B)). Various embodiments for series resonators (e.g., first series resonator 501B (Series1B), e.g., second series resonator 502B, e.g., third series resonator (503B)) having various relatively higher resonant frequency (e.g., higher main resonant frequency) may have relatively thinner piezoelectric layer thicknesses, e.g., scaled thinner with relatively higher resonant frequency (e.g., higher main resonant frequency). Similarly, various embodiments of the series resonators (e.g., first series resonator 501B (Series1B), e.g., second series resonator 502B, e.g., third series resonator (503B)) having various relatively lower resonant frequency (e.g., lower main resonant frequency) may have relatively thicker piezoelectric layer thicknesses, e.g., scaled thicker with relatively lower resonant frequency (e.g., lower main resonant frequency). The example first stack of four layers of alternating axis piezoelectric material, 505C through 511C, the example second stack of four layers of alternating axis piezoelectric material, 505D through 511D and the example third stack of four layers of alternating axis piezoelectric material, 505D through 511D may include stack members of piezoelectric layers having respective thicknesses of approximately one half wavelength (e.g., one half acoustic wavelength) at the resonant frequency (e.g., main resonant frequency) of the series resonators (e.g., first series resonator 501B (Series1B), e.g., second series resonator 502B, e.g., third series resonator (503B)).

The example first stack of four layers of alternating axis piezoelectric material, 505C through 511C, may include a first three members of interposer layers 559C, 561C, 563C respectively sandwiched between the corresponding four layers of alternating axis piezoelectric material, 505C through 511C. The example second stack of four layers of alternating axis piezoelectric material, 505D through 511D, may include a second three members of interposer layers 559D, 561D, 563D respectively sandwiched between the corresponding four layers of alternating axis piezoelectric material, 505D through 511D. The example third stack of four layers of alternating axis piezoelectric material, 505E through 511E, may include a third three members of interposer layers 559E, 561E, 563E respectively sandwiched between the corresponding four layers of alternating axis piezoelectric material, 505E through 511E. One or more (e.g., one or a plurality of) interposer layers may be metal interposer layers. The metal interposer layers may be relatively high acoustic impedance metal interposer layers (e.g., using relatively high acoustic impedance metals such as Tungsten (W) or Molybdenum (Mo)). Such metal interposer layers may (but need not) flatten stress distribution across adjacent piezoelectric layers, and may (but need not) raise effective electromechanical coupling coefficient (Kt2) of adjacent piezoelectric layers. Alternatively or additionally, one or more (e.g., one or a plurality of) interposer layers may be dielectric interposer layers. The dielectric of the dielectric interposer layers may be a dielectric that has a positive acoustic velocity temperature coefficient, so acoustic velocity increases with increasing temperature of the dielectric. The dielectric of the dielectric interposer layers may be, for example, silicon dioxide. Dielectric interposer layers may, but need not, facilitate compensating for frequency response shifts with increasing temperature. Alternatively or additionally, one or more (e.g., one or a plurality of) interposer layers may comprise metal and dielectric for respective interposer layers. The first series resonator 501B (Series1B), the second series resonator 502B (Series2B) and the third series resonator 503B (Series3B) may have respective etched edge regions 553C, 553D, 553E, and respective laterally opposing etched edge regions 554C, 554D, 554E. Reference is made to resonator mesa structures as have already been discussed in detail previously herein. Accordingly, they are not discussed again in detail at this point. Briefly, respective first, second and third mesa structures of the respective first series resonator 501B (Series1B), the respective second series resonator 502B (Series2B) and the respective third series resonator 503B (Series3B) may extend between respective etched edge regions 553C, 553D, 553E, and respective laterally opposing etched edge regions 554C, 554D, 554E of the respective first series resonator 501B (Series1B), the respective second series resonator 502B (Series2B) and the respective third series resonator 503B (Series3B). The second bottom acoustic reflector of second series resonator 502B (Series2B) of the third node 523B, e.g., including the additional plurality of bottom metal electrode layers may be a second mesa structure. For example, this may be a mutual second mesa structure bottom acoustic reflector 523B, and may likewise serve as bottom acoustic reflector of third series resonator 503B (Series3B). Accordingly, this mutual second mesa structure bottom acoustic reflector 523B may extend between etched edge region 553E of the third series resonator 503B (Series3B) and the laterally opposing etched edge region 554D of the third series resonator 503B (Series3B).

Figure 6:
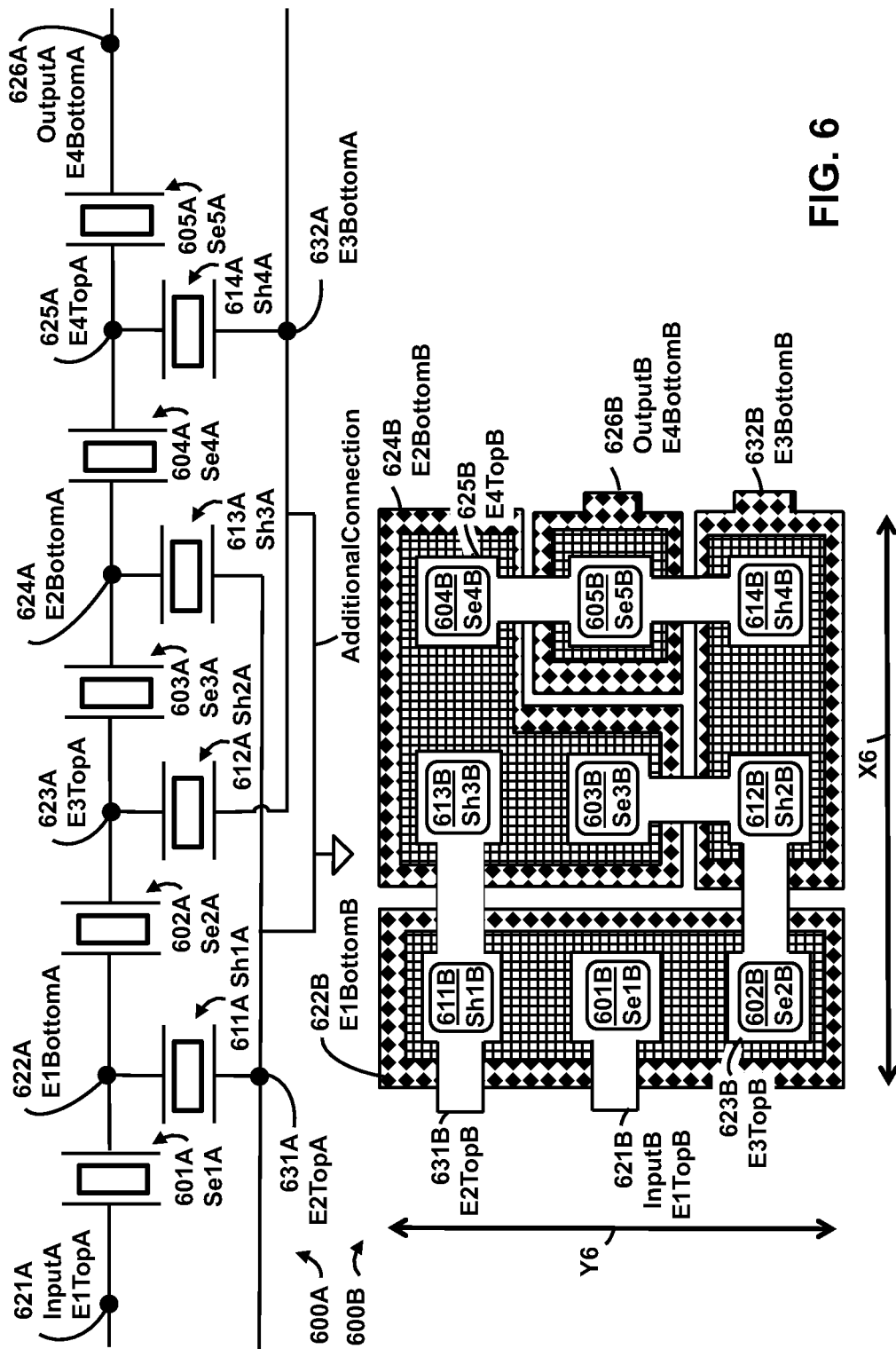
FIG. 6 shows a schematic of an example ladder filter using five series resonators of the bulk acoustic wave resonator structure of FIG. 1A, and four mass loaded shunt resonators of the bulk acoustic wave resonator structure of FIG. 1A, along with a simplified top view of the nine resonators interconnected in the example ladder filter, and lateral dimensions of the example ladder filter.

FIG. 6 shows a schematic of an example ladder filter 600A (e.g., SHF or EHF wave ladder filter 600A) using five series resonators of the bulk acoustic wave resonator structure of FIG. 1A (e.g., five bulk acoustic SHF or EHF wave resonators), and four mass loaded shunt resonators of the bulk acoustic wave resonator structure of FIG. 1A (e.g., four mass loaded bulk acoustic SHF or EHF wave resonators), along with a simplified top view of the nine resonators interconnected in the example ladder filter 600B, and lateral dimensions of the example ladder filter 600B. As shown in the schematic appearing at an upper section of FIG. 6, the example ladder filter 600A may include an input port comprising a first node 621A (InputA E1TopA), and may include a first series resonator 601A (Ser1 A) (e.g., first bulk acoustic SHF or EHF wave resonator 601A) coupled between the first node 621A (InputA E1TopA) associated with the input port and a second node 622A (E1BottomA). The example ladder filter 600A may also include a second series resonator 602A (Ser2 A) (e.g., second bulk acoustic SHF or EHF wave resonator 602A) coupled between the second node 622A (E1BottomA) and a third node 623A (E3TopA). The example ladder filter 600A may also include a third series resonator 603A (Ser3 A) (e.g., third bulk acoustic SHF or EHF wave resonator 603A) coupled between the third node 623A (E3TopA) and a fourth node 624A (E2BottomA). The example ladder filter 600A may also include a fourth series resonator 604A (Ser4 A) (e.g., fourth bulk acoustic SHF or EHF wave resonator 604A) coupled between the fourth node 624A (E2BottomA) and a fifth node 625A (E4TopA). The example ladder filter 600A may also include a fifth series resonator 605A (Ser5 A) (e.g., fifth bulk acoustic SHF or EHF wave resonator 605A) coupled between the fifth node 625A (E4TopA) and a sixth node 626A (OutputA E4BottomA), which may be associated with an output port of the ladder filter 600A. The example ladder filter 600A may also include a first mass loaded shunt resonator 611A (Sh1 A) (e.g., first mass loaded bulk acoustic SHF or EHF wave resonator 611A) coupled between the second node 622A (E1BottomA) and a first grounding node 631A (E2TopA). The example ladder filter 600A may also include a second mass loaded shunt resonator 612A (Sh2 A) (e.g., second mass loaded bulk acoustic SHF or EHF wave resonator 612A) coupled between the third node 623A (E3TopA) and a second grounding node 632A (E3BottomA). The example ladder filter 600A may also include a third mass loaded shunt resonator 613A (Sh3 A) (e.g., third mass loaded bulk acoustic SHF or EHF wave resonator 613A) coupled between the fourth node 624A (E2BottomA) and the first grounding node 631A (E2TopA). The example ladder filter 600A may also include a fourth mass loaded shunt resonator 614A (Sh4 A) (e.g., fourth mass loaded bulk acoustic SHF or EHF wave resonator 614A) coupled between the fifth node 625A (E4TopA) and the second grounding node 632A (E3BottomA). The first grounding node 631A (E2TopA) and the second grounding node 632A (E3BottomA) may be interconnected to each other, and may be connected to ground, through an additional grounding connection (AdditionalConnection).

Appearing at a lower section of FIG. 6 is the simplified top view of the nine resonators interconnected in the example ladder filter 600B, and lateral dimensions of the example ladder filter 600B. The example ladder filter 600B may include an input port comprising a first node 621B (InputA E1TopB), and may include a first series resonator 601B (Ser1B) (e.g., first bulk acoustic SHF or EHF wave resonator 601B) coupled between (e.g., sandwiched between) the first node 621B (InputA E1TopB) associated with the input port and a second node 622B (E1BottomB). The example ladder filter 600B may also include a second series resonator 602B (Ser2B) (e.g., second bulk acoustic wave resonator 602B) coupled between (e.g., sandwiched between) the second node 622B (E1BottomB) and a third node 623B (E3TopB). The example ladder filter 600B may also include a third series resonator 603B (Ser3B) (e.g., third bulk acoustic SHF or EHF wave resonator 603B) coupled between (e.g., sandwiched between) the third node 623B (E3TopB) and a fourth node 624B (E2BottomB). The example ladder filter 600B may also include a fourth series resonator 604B (Ser4B) (e.g., fourth bulk acoustic SHF or EHF wave resonator 604B) coupled between (e.g., sandwiched between) the fourth node 624B (E2BottomB) and a fifth node 625B (E4TopB). The example ladder filter 600B may also include a fifth series resonator 605B (Ser5B) (e.g., fifth bulk acoustic SHF or EHF wave resonator 605B) coupled between (e.g., sandwiched between) the fifth node 625B (E4TopB) and a sixth node 626B (OutputB E4BottomB), which may be associated with an output port of the ladder filter 600B. The example ladder filter 600B may also include a first mass loaded shunt resonator 611B (Sh1B) (e.g., first mass loaded bulk acoustic SHF or EHF wave resonator 611B) coupled between (e.g., sandwiched between) the second node 622B (E1BottomB) and a first grounding node 631B (E2TopB). The example ladder filter 600B may also include a second mass loaded shunt resonator 612B (Sh2B) (e.g., second mass loaded bulk acoustic SHF or EHF wave resonator 612B) coupled between (e.g., sandwiched between) the third node 623B (E3TopB) and a second grounding node 632B (E3BottomB). The example ladder filter 600B may also include a third mass loaded shunt resonator 613B (Sh3B) (e.g., third mass loaded bulk acoustic SHF or EHF wave resonator 613B) coupled between (e.g., sandwiched between) the fourth node 624B (E2BottomB) and the first grounding node 631B (E2TopB). The example ladder filter 600B may also include a fourth mass loaded shunt resonator 614B (Sh4B) (e.g., fourth mass loaded bulk acoustic SHF or EHF wave resonator 614B) coupled between (e.g., sandwiched between) the fifth node 625B (E4TopB) and the second grounding node 632B (E3BottomB). The first grounding node 631B (E2TopB) and the second grounding node 632B (E3BottomB) may be interconnected to each other, and may be connected to ground, through an additional grounding connection, not shown in the lower section of FIG. 6. The example ladder filter 600B may respectively be relatively small in size, and may respectively have lateral dimensions (X6 by Y6) of less than approximately three millimeters by three millimeters.

Figure 7:
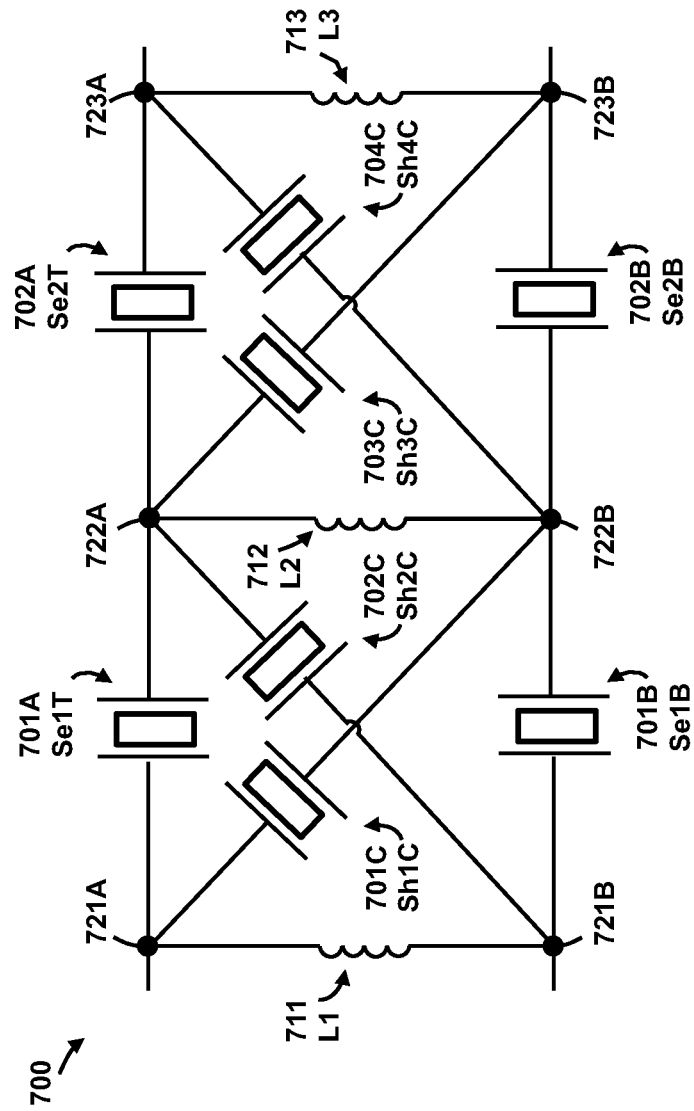
FIG. 7 shows a schematic of example inductors modifying an example lattice filter using a first pair of series resonators of the bulk acoustic wave resonator structure of FIG. 1A, a second pair of series resonators of the bulk acoustic wave resonator structure of FIG. 1A and two pairs of cross coupled mass loaded shunt resonators of the bulk acoustic wave resonator structure of FIG. 1A.

FIG. 7 shows an schematic of example inductors modifying an example lattice filter 700 using a first pair of series resonators 701A (Se1T), 702A (Se2T), (e.g., two bulk acoustic SHF or EHF wave resonators) of the bulk acoustic wave resonator structure of FIG. 1A, a second pair of series resonators 701B (Se2B), 702B (Se2B), (e.g., two additional bulk acoustic SHF or EHF wave resonators) of the bulk acoustic wave resonator structure of FIG. 1A and two pairs of cross coupled mass loaded shunt resonators 701C (Sh1C), 702C (Sh2C), 703C (Sh3C), 704C (Sh4C), (e.g., four mass loaded bulk acoustic SHF or EHF wave resonators) of the bulk acoustic wave resonator structure of FIG. 1A. As shown in the schematic of FIG. 7, the example inductor modified lattice filter 700 may include a first top series resonator 701A (Se1T) (e.g., first top bulk acoustic wave SHF or EHF resonator 701A) coupled between a first top node 721A and a second top node 722A. The example inductor modified lattice filter 700 may also include a second top series resonator 702A (Se2T) (e.g., second top bulk acoustic SHF or EHF wave resonator 702A) coupled between the second top node 722A and a third top node 723A.

The example inductor modified lattice filter 700 may include a first bottom series resonator 701B (Se1B) (e.g., first bottom bulk acoustic SHF or EHF wave resonator 701B) coupled between a first bottom node 721B and a second bottom node 722B. The example inductor modified lattice filter 700 may also include a second bottom series resonator 702B (Se2B) (e.g., second bottom bulk acoustic SHF or EHF wave resonator 702B) coupled between the second bottom node 722B and a third bottom node 723B. The example inductor modified lattice filter 700 may include a first cross-coupled mass loaded shunt resonator 701C (Sh1C) (e.g., first mass loaded bulk acoustic SHF or EHF wave resonator 701C) coupled between the first top node 721A and the second bottom node 722B. The example inductor modified lattice filter 700 may also include a second cross-coupled mass loaded shunt resonator 702C (Sh2C) (e.g., second mass loaded bulk acoustic SHF or EHF wave resonator 702C) coupled between the second top node 722A and the first bottom node 721B. The example inductor modified lattice filter 700 may include a third cross-coupled mass loaded shunt resonator 703C (Sh3C) (e.g., third mass loaded bulk acoustic SHF or EHF wave resonator 703C) coupled between the second top node 722A and the third bottom node 723B. The example inductor modified lattice filter 700 may also include a fourth cross-coupled mass loaded shunt resonator 704C (Sh4C) (e.g., fourth mass loaded bulk acoustic SHF or EHF wave resonator 704C) coupled between the third top node 723A and the second bottom node 722B. The example inductor modified lattice filter 700 may include a first inductor 711 (L1) coupled between the first top node 721A and the first bottom node 721B. The example inductor modified lattice filter 700 may include a second inductor 712 (L2) coupled between the second top node 722A and the second bottom node 722B. The example inductor modified lattice filter 700 may include a third inductor 713 (L3) coupled between the third top node 723A and the third bottom node 723B.

Figure 8:
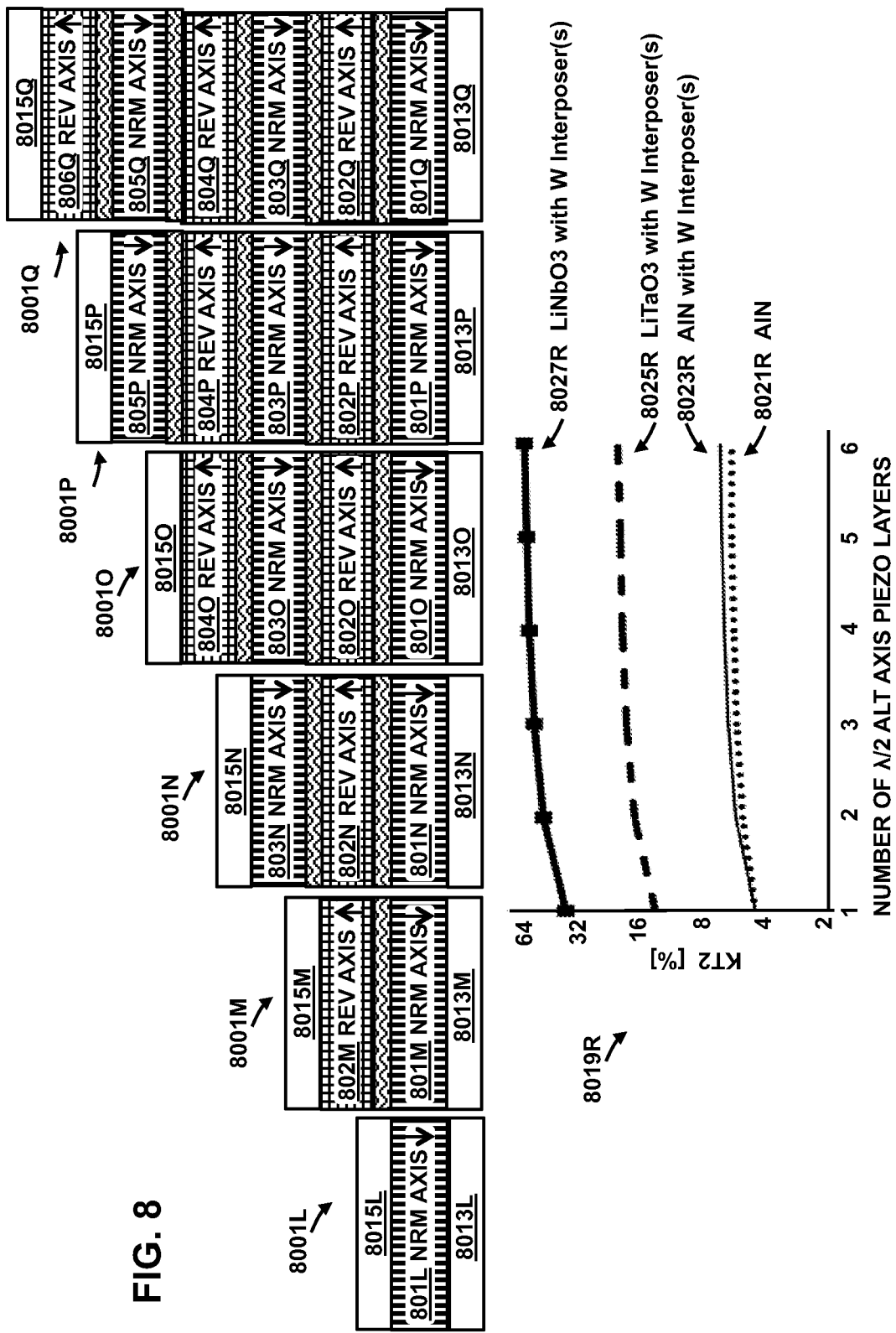
FIG. 8 shows six different simplified example resonators and a diagram showing electromechanical coupling coefficient predicted by simulation for various different configurations for six different resonators.

FIG. 8 shows six different simplified example resonators and a diagram showing electromechanical coupling coefficient predicted by simulation for various different configurations for the six different resonators 8001L through 8001Q. The six different resonators 8001L through 8001Q have respective one to six half wavelength piezoelectric layers in an alternating axis stack arrangement sandwiched between respective multilayer metal acoustic SHF or EHF wave reflector bottom electrodes 8013L through 8013Q and respective multilayer metal acoustic SHF or EHF wave reflector top electrode 8015L through 8015Q. First example resonator 8001L includes a single normal axis piezoelectric layer 801L. Second example resonator 8001M includes an alternating axis stack arrangement of a first normal axis piezoelectric layer 8001M and a second reverse axis piezoelectric layer 802M. Third example resonator 8001N includes an alternating axis stack arrangement of a first normal axis piezoelectric layer 801N, a second reverse axis piezoelectric layer 802N, and a third normal axis piezoelectric layer 803N. Fourth example resonator 8001O includes an alternating axis stack arrangement of a first normal axis piezoelectric layer 801O, a second reverse axis piezoelectric layer 802O, a third normal axis piezoelectric layer 803O and a fourth reverse axis piezoelectric layer 804O. Fifth example resonator 8001P includes an alternating axis stack arrangement of a first normal axis piezoelectric layer 801P, a second reverse axis piezoelectric layer 802P, a third normal axis piezoelectric layer 803P, a fourth reverse axis piezoelectric layer 804P, and a fifth normal axis piezoelectric layer 805P. Sixth example resonator 8001Q includes an alternating axis stack arrangement of a first normal axis piezoelectric layer 801Q, a second reverse axis piezoelectric layer 802Q, a third normal axis piezoelectric layer 803Q, a fourth reverse axis piezoelectric layer 804Q, a fifth normal axis piezoelectric layer 805Q, and a sixth reverse axis piezoelectric layer 806Q. The six example resonators shown in FIG. 8 may include interposer layers, as discussed in detail previously herein. For the sake of comparison, diagram 8019R shows electromechanical coupling coefficient (KT2%) predicted by simulation for the six example resonators 8001L through 8001Q, for different configurations of the piezoelectric layers of the example resonators 8001L through 8001Q. As shown in the diagram 8019R, a first trace 8021R depicts Aluminum Nitride (AlN) based resonators without interposers (e.g., without Tungsten (W) interposers), a second trace 8023R depicts Aluminum Nitride (AlN) based resonators with interposers (e.g., with Tungsten (W) interposers), a third trace 8025R depicts X-cut Lithium Tantalate (LiTaO3) based resonators with interposers (e.g., with Tungsten (W) interposers), a fourth trace 8027R depicts X-cut Lithium Niobate (LiNbO3) with interposers (e.g., with Tungsten (W) interposers), employed in the piezoelectric layers of the example resonators 8001L through 8001Q.

For example, as shown in trace 8021R of the diagram 8019R, for the single piezoelectric layer 801L of Aluminum Nitride (AlN) in example single piezoelectric layer resonator 8001L, the electromechanical coupling coefficient (KT2%) predicted by simulation may be about 4%. In comparison to the single piezoelectric layer 801L configured with Aluminum Nitride (AlN) in example single piezoelectric layer resonator 8001L, the single piezoelectric layer 801L configured with X-cut Lithium Tantalate (LiTaO3) in example single piezoelectric layer resonator 8001L shows relatively higher electromechanical coupling coefficient (KT2%), since X-cut Lithium Tantalate (LiTaO3) has a relatively higher electromechanical coupling coefficient (KT2%) than that of Aluminum Nitride (AlN). Accordingly, for the single piezoelectric layer 801L of X-cut Lithium Tantalate (LiTaO3) in example single piezoelectric layer resonator 8001L, the electromechanical coupling coefficient (KT2%) predicted by simulation may be about 13%, as shown in trace 8025R of diagram 8019R.

In comparison to the example single piezoelectric layer 801L configured with Aluminum Nitride (AlN) and the example single piezoelectric layer 801L configured with X-cut Lithium Tantalate (LiTaO3) in the examples of the single piezoelectric layer resonator 8001L just discussed, the single piezoelectric layer 801L configured with X-cut Lithium Niobate (LiNbO3) in example single piezoelectric layer resonator 8001L shows relatively higher electromechanical coupling coefficient (KT2%), since X-cut Lithium Niobate (LiNbO3) has a relatively higher electromechanical coupling coefficient (KT2%) than that of Aluminum Nitride (AlN) and X-cut Lithium Tantalate (LiTaO3). Accordingly, for the single piezoelectric layer 801L of X-cut Lithium Niobate (LiNBO3) in example single piezoelectric layer resonator 8001L, the electromechanical coupling coefficient (KT2%) predicted by simulation may be about 34%, as shown in trace 8027R of diagram 8019R. Accordingly, choice of piezoelectric material having relatively higher electromechanical coupling coefficient (KT2%) may facilitate increasing electromechanical coupling coefficient (KT2%) of resonators using such choice of piezoelectric material.

In addition to increasing electromechanical coupling coefficient (KT2%) of resonators by employing higher electromechanical coupling coefficient (KT2%) piezoelectric materials as just discussed, increasing number of alternating piezoelectric axis layers of the example resonators may facilitate increasing electromechanical coupling coefficient (KT2%) of resonators, even without employing interposers. For example, in trace 8021R of the diagram 8019R, the single piezoelectric layer 801L of Aluminum Nitride (AlN) in example single piezoelectric layer resonator 8001L (naturally, by definition of the single piezoelectric layer, without any interposer), the electromechanical coupling coefficient (KT2%) predicted by simulation may be about 4.5%. In contrast, in trace 8021R of the diagram 8019R, for the six alternating axis piezoelectric layers 801Q through 806Q of Aluminum Nitride (AlN) similar to resonator 8001Q, but without any of the interposers of resonator 8001Q, the electromechanical coupling coefficient (KT2%) predicted by simulation may be about 5.9%. Accordingly, increasing number of alternating piezoelectric axis layers of the example resonators may facilitate increasing electromechanical coupling coefficient (KT2%) of resonators, with or without employing interposers. For example, in diagram 8019R, traces 8023R, 8025R and 8027 directed to resonators with interposers (e.g., with Tungsten (W) interposers) respectively corresponding to employment of Aluminum Nitride (AlN), X-cut Lithium Tantalate (LiTaO3), and X-cut Lithium Niobate (LiNbO3), show that increasing number of alternating piezoelectric axis layers of the example resonators may facilitate increasing electromechanical coupling coefficient (KT2%) of resonators with interposers.

Furthermore, adding interposers to resonators may facilitate increasing electromechanical coupling coefficient (KT2%). For example, as shown in trace 8021R of the diagram 8019R, for the six piezoelectric layers 801Q through 806Q of Aluminum Nitride (AlN) in an example six piezoelectric layer resonator similar to resonator 8001Q, but without interposers (e.g., without Tungsten (W) interposers), the electromechanical coupling coefficient (KT2%) predicted by simulation may be about 5.9%. In contrast, as shown in trace 8023R of the diagram 8019R, for the six piezoelectric layers 801Q through 806Q of Aluminum Nitride (AlN) in an example six piezoelectric layer resonator 8001Q, with interposers (e.g., with Tungsten (W) interposers), the electromechanical coupling coefficient (KT2%) predicted by simulation may be about 6.6%. Accordingly, adding five interposers may facilitate increasing the electromechanical coupling coefficient (KT2%) of the six layer alternating axis Aluminum Nitride resonator 8001Q from 5.9% to 6.6%. Similarly, adding four interposers may facilitate increasing the electromechanical coupling coefficient (KT2%) of the five layer alternating axis Aluminum Nitride resonator 8001P from 5.8% to 6.5%. Similarly, adding three interposers may facilitate increasing the electromechanical coupling coefficient (KT2%) of the four layer alternating axis Aluminum Nitride resonator 8001O from 5.7% to 6.3%. Similarly, adding two interposers may facilitate increasing the electromechanical coupling coefficient (KT2%) of the three layer alternating axis Aluminum Nitride resonator 8001N from 5.5% to 6.1%. Similarly, adding one interposer may facilitate increasing the electromechanical coupling coefficient (KT2%) of the two layer alternating axis Aluminum Nitride resonator 8001M from 5.2% to 5.6%. In diagram 8019R, the foregoing contrasting electromechanical coupling coefficients (KT2%) just discussed are all shown by comparing trace 8021R for Aluminum Nitride (AlN) resonators for varying number of alternating axis layers without interposers to trace 8023R for Aluminum Nitride (AlN) resonators for varying number of alternating axis layers with interposers.

For example, as shown in trace 8027R of the diagram 8019R, for the six piezoelectric layers 801Q through 806Q of Lithium Niobate (LiNbO3) in example six piezoelectric layer resonator 8001Q with interposers (e.g., with Tungsten (W) interposers), the electromechanical coupling coefficient (KT2%) predicted by simulation may be about 53%. Further, it is theorized that electromechanical coupling coefficient (KT2%) may be enhanced for the six piezoelectric layer alternating axis stack resonator 8001Q with interposers (e.g., with Tungsten (W) interposers), at least in part because considerably more acoustic energy may be confined in the alternating axis stack of the six piezoelectric layers 801Q through 806Q rather than in multilayer metal acoustic SHF or EHF wave reflector bottom electrode 8013Q and in multilayer metal acoustic SHF or EHF wave reflector top electrode 8015Q. Relative to the alternating axis stack of the six piezoelectric layer resonator 8001Q, it is theorized that electromechanical coupling coefficient (KT2%) may be diminished for the single piezoelectric layer resonator 8001L, at least in part because relatively less acoustic energy may be confined in the single piezoelectric layer 801L, and relatively more acoustic energy in multilayer metal acoustic SHF or EHF wave reflector bottom electrode 8013L and in multilayer metal acoustic SHF or EHF wave reflector top electrode 8015L. Accordingly, in light of the foregoing, it is theorized that not only may enhancement of electromechanical coupling coefficient (KT2%) be facilitated with choice of piezoelectric material, but further enhancement of electromechanical coupling coefficient (KT2%) may be facilitated by employing interposers along with increasing number of piezoelectric layers in the alternating axis stack arrangement, e.g., from the single piezoelectric layer 801L in resonator 8001L to the six piezoelectric layers 801Q through 806Q in resonator 8001Q with interposers. Enhancement (e.g., relative increase) of electromechanical coupling coefficient (KT2%) may be facilitated by employing interposers having acoustic impedance greater than 1 megarayls. Enhancement (e.g., relative increase) of electromechanical coupling coefficient (KT2%) may be facilitated by employing interposers having acoustic impedance greater than acoustic impedance of the piezoelectric material of the resonator. Enhancement (e.g., relative increase) of electromechanical coupling coefficient (KT2%) may be facilitated by employing interposers having interposer layer thicknesses that are less than about one tenth of an acoustic wavelength corresponding to the resonant frequency (e.g., main resonant frequency) of the resonator.

FIGS. 9A and 9B are simplified diagrams of frequency spectrum illustrating application frequencies and application frequency bands of the example bulk acoustic wave resonators (e.g., bulk acoustic SHF wave resonators, e.g., bulk acoustic EHF wave resonators) shown in FIG. 1A and FIGS. 4A through 4G, and the example filters (e.g., band pass ladder filters, e.g., band stop ladder filters, e.g., notch ladder filters) shown in FIGS. 5 through 7. A widely used standard to designate frequency bands in the microwave range by letters is established by the United States Institute of Electrical and Electronic Engineers (IEEE). In accordance with standards published by the IEEE, as defined herein, and as shown in FIG. 9A S Band (2 GHz-4 GHz) and C Band (4 GHz-8 GHz) application bands. In particular, FIG. 9A shows a first frequency spectrum portion 9000A in a range from three Gigahertz (3 GHz) to eight Gigahertz (8 GHz), including application bands of S Band (2 GHz-4 GHz) and C Band (4 GHz-8 GHz). As described subsequently herein, the 3rd Generation Partnership Project standards organization (e.g., 3GPP) has standardized various 5G frequency bands. For example, included is a first application band 9010 (e.g., 3GPP 5G n77 band) (3.3 GHz-4.2 GHz) configured for fifth generation broadband cellular network (5G) applications. As described subsequently herein, the first application band 9010 (e.g., 5G n77 band) includes a 5G sub-band 9011 (3.3 GHz-3.8 GHz). The 3GPP 5G sub-band 9011 includes Long Term Evolution broadband cellular network (LTE) application sub-bands 9012 (3.4 GHz-3.6 GHz), 9013 (3.6 GHz-3.8 GHz), and 9014 (3.55 GHz-3.7 GHz). A second application band 9020 (4.4 GHz-5.0 GHz) includes a sub-band 9021 for China specific applications. Discussed next are Unlicensed National Information Infrastructure (UNII) bands. A third application band 9030 includes a UNII-1 band 9031 (5.15 GHz-5.25 GHz) and a UNII-2A band 9032 (5.25 GHz 5.33 GHz). An LTE band 9033 (LTE Band 252) overlaps the same frequency range as the UNII-1 band 6031. A fourth application band 9040 includes a UNII-2C band 9041 (5.490 GHz-5.735 GHz), a UNII-3 band 9042 (5.735 GHz-5.85 GHz), a UNII-4 band 9043 (5.85 GHz-5.925 GHz), a UNII-5 band 9044 (5.925 GHz-6.425 GHz), a UNII-6 band 9045 (6.425 GHz-6.525 GHz), a UNII-7 band 9046 (6.525 Ghz-6.875 Ghz), and a UNII-8 band 9047 (6.875 GHz-7125 Ghz). An LTE band 9048 overlaps the same frequency range (5.490 GHz-5.735 GHz) as the UNII-3 band 9042. A sub-band 9049A shares the same frequency range as the UNII-4 band 9043. An LTE band 9049B shares a subsection of the same frequency range (5.855 GHz-5.925 GHz).

FIG. 9B shows a second frequency spectrum portion 9000B in a range from eight Gigahertz (8 GHz) to one-hundred and ten Gigahertz (110 GHz), including application bands of X Band (8 Ghz-12 Ghz), Ku Band (12 Ghz-18 Ghz), K Band (18 Ghz-27 Ghz), Ka Band (27 Ghz-40 Ghz), V Band (40 Ghz-75 Ghz), and W Band (75 Ghz-110 Ghz). A fifth application band 9050 includes 3GPP 5G bands configured for fifth generation broadband cellular network (5G) applications, e.g., 3GPP 5G n258 band 9051 (24.25 GHz-27.5 GHz), e.g., 3GPP 5G n261 band 9052 (27.5 GHz-28.35 GHz), e.g., 3GPP 5G n257 band 9053 (26.5 GHz-29.5). FIG. 9B shows an EESS (Earth Exploration Satellite Service) band 9051A (23.6 GHz-24 GHz) adjacent to the 3GPP 5G n258 band 9051 (24.25 GHz-27.5 GHz). As will be discussed in greater detail subsequently herein, an example EESS notch filter of the present disclosure may facilitate protecting the EESS (Earth Exploration Satellite Service) band 9051A (23.6 GHz-24 GHz) from energy leakage from the adjacent 3GPP 5G n258 band 9051 (24.25 GHz-27.5 GHz). For example, this may facilitate satisfying (e.g., facilitate compliance with) a specification of a standards setting organization, e.g., International Telecommunications Union (ITU) specifications, e.g., ITU-R SM.329 Category A/B levels of −20 dbW/200 MHz, e.g., 3rd Generation Partnership Project (3GPP) 5G specifications, e.g., 3GPP 5G, unwanted (out-of-band & spurious) emission levels, worst case of −20 dBW/200 MHz. Alternatively or additionally, this may facilitate satisfying (e.g., facilitate compliance with) a regulatory requirement, e.g., a government regulatory requirement, e.g., a Federal Communications Commission (FCC) decision or requirement, e.g., a European Commission decision or requirement of −42 dbW/200 MHz for 200 MHz for Base Stations (BS) and −38 dbW/200 MHz for User Equipment (UE), e.g., European Commission Decision (EU) 2019/784 of 14 May 2019 on harmonization of the 24,25-27.5 GHz frequency band for terrestrial systems capable of providing wireless broadband electronic communications services in the Union, published May 16, 2019, which is hereby incorporated by reference in its entirety, e.g., a European Organization for the Exploitation of Meteorological Satellites (EUMETSAT) decision, requirement, recommendation or study, e.g., a ESA/EU-METSAT/EUMETNET study result of −54.2 dBW/200 MHz for Base Stations (BS) and 50.4 dBW/200 MHz for User Equipment (UE), e.g., the United Nations agency of the World Meteorological Organization (WMO) decision, requirement, recommendation or study, e.g., the WMO decision of −55 dBW/200 MHz for Base Stations (BS) and −51 dBW/200 MHz for User Equipment (UE). These specifications and/or decisions and/or requirements may be directed to suppression of energy leakage from an adjacent band, e.g., energy leakage from an adjacent 3GPP 5G band, e.g., suppression of transmit energy leakage from the adjacent 3GPP 5G n258 band 9051 (24.250 GHz-27.500 GHz), e.g. limiting of spurious out of n258 band emissions. A sixth application band 9060 includes the 3GPP 5G n260 band 9060 (37 GHz-40 GHz). A seventh application band 9070 includes United States WiGig Band for IEEE 802.11ad and IEEE 802.11ay 9071 (57 GHz-71 Ghz), European Union and Japan WiGig Band for IEEE 802.11ad and IEEE 802.11ay 9072 (57 GHz-66 Ghz), South Korea WiGig Band for IEEE 802.11ad and IEEE 802.11ay 9073 (57 GHz-64 Ghz), and China WiGig Band for IEEE 802.11ad and IEEE 802.11ay 9074 (59 GHz-64 GHz). An eighth application band 9080 includes an automobile radar band 9080 (76 GHz-81 GHz).

Accordingly, it should be understood from the foregoing that the acoustic wave devices (e.g., resonators, e.g., filters) of this disclosure may be implemented in the respective application frequency bands just discussed. For example, the layer thicknesses of the acoustic reflector electrodes and piezoelectric layers in alternating axis arrangement for the example acoustic wave devices (e.g., the 5 GHz bulk acoustic wave resonators, e.g., the 24 GHz bulk acoustic wave resonators, e.g., the example 39 GHz bulk acoustic wave resonators, e.g., contour mode resonators) of this disclosure may be scaled up and down as needed to be implemented in the respective application frequency bands just discussed. This is likewise applicable to the example filters (e.g., bulk acoustic wave resonator based filters, e.g., laterally coupled resonator filters, e.g., contour mode resonator based filters) of this disclosure to be implemented in the respective application frequency bands just discussed. The following examples pertain to further embodiments for acoustic wave devices, including but not limited to, e.g., bulk acoustic wave resonators, e.g., contour mode resonators, e.g., bulk acoustic wave resonator based filters, e.g., laterally coupled resonator filters, e.g., contour mode resonator based filters, and from which numerous permutations and configurations will be apparent. Example 1 is an apparatus comprising a first electrical filter including an acoustic wave device, the first electrical having a first filter band in a Super High Frequency (SHF) band or an Extremely High Frequency (EHF) band to facilitate compliance with a regulatory requirement or a standards setting organization specification. Example 2, the subject matter of Example 1 optionally includes in which a main resonant frequency of the acoustic wave device is in a 3rd Generation Partnership Project (3GPP) band. Example 3, the subject matter of Example 1 optionally includes in which a main resonant frequency of the acoustic wave device is in an Unlicensed National Information Infrastructure (UNII) band. Example 4, the subject matter of Example 1 optionally includes in which a main resonant frequency of the acoustic wave device is in a 3GPP n77 band 9010 as shown for example in FIG. 9A. Example 5, the subject matter of Example 1 optionally includes in which a main resonant frequency of the acoustic wave device is in a 3GPP n79 band 9020 as shown for example in FIG. 9A. Example 6, the subject matter of Example 1 optionally includes in which a main resonant frequency of the acoustic wave device is in a 3GPP n258 band 9051 as shown for example in FIG. 9B. Example 7, the subject matter of Example 1 optionally includes in which a main resonant frequency of the acoustic wave device is in a 3GPP n261 band 9052 as shown for example in FIG. 9B. Example 8, the subject matter of Example 1 optionally includes in which a main resonant frequency of the acoustic wave device is in a 3GPP n260 band as shown for example in FIG. 9B. Example 9, the subject matter of Example 1 optionally includes in which a main resonant frequency of the acoustic wave device is in an Institute of Electrical and Electronic Engineers (IEEE) C band as shown for example in FIG. 9A. Example 10, the subject matter of Example 1 optionally includes in which a main resonant frequency of the acoustic wave device is in an Institute of Electrical and Electronic Engineers (IEEE) X band as shown for example in FIG. 9B. Example 11, the subject matter of Example 1 optionally includes in which a main resonant frequency of the acoustic wave device is in an Institute of Electrical and Electronic Engineers (IEEE) Ku band as shown for example in FIG. 9B. Example 12, the subject matter of Example 1 optionally includes in which a main resonant frequency of the acoustic wave device is in an Institute of Electrical and Electronic Engineers (IEEE) K band, as shown for example in FIG. 9B. Example 13, the subject matter of Example 1 optionally includes in which a main resonant frequency of the acoustic wave device is in an Institute of Electrical and Electronic Engineers (IEEE) Ka band as shown in FIG. 9B. Example 14, the subject matter of Example 1 optionally includes in which a main resonant frequency of the acoustic wave device is in an Institute of Electrical and Electronic Engineers (IEEE) V band as shown for example in FIG. 9B. Example 15, the subject matter of Example 1 optionally includes in which a main resonant frequency of the acoustic wave device is in an Institute of Electrical and Electronic Engineers (IEEE) W band as shown for example in FIG. 9B. Example 16, the subject matter of Example 1 optionally includes in which a main resonant frequency of the acoustic wave device is in UNII-1 band 9031, as shown for example in FIG. 9A. Example 17, the subject matter of Example 1 optionally includes in which the main resonant frequency of the acoustic wave device is in UNII-2A band 9032, as shown for example in FIG. 9A. Example 18, the subject matter of Example 1 optionally includes in which a main resonant frequency of the acoustic wave device is in UNII-2C band 9041, as shown in FIG. 9A. Example 19, the subject matter of Example 1 optionally includes in which a main resonant frequency of the acoustic wave device is in UNII-3 band 9042, as shown for example in FIG. 9A. Example 20, the subject matter of Example 1 optionally includes in which a main resonant frequency of the acoustic wave device is in UNII-4 band 9043, as shown for example in FIG. 9A. Example 21, the subject matter of Example 1 optionally includes in which a main resonant frequency of the acoustic wave device is in UNII-5 band 9044, as shown for example in FIG. 9A. Example 22, the subject matter of Example 1 optionally includes in which a main resonant frequency of the acoustic wave device is in UNII-6 band 9045, as shown for example in FIG. 9A. Example 23, the subject matter of Example 1 optionally includes in which a main resonant frequency of the acoustic wave device is in UNII-7 band 9046, as shown for example in FIG. 9A. Example 24, the subject matter of Example 1 optionally includes in which a main resonant frequency of the acoustic wave device is in UNII-8 band 9047, as shown for example in FIG. 9A. Example 25, the subject matter of Example 1 optionally includes in which the main resonant frequency of the acoustic wave device is in an Earth Exploration Satellite Service (EESS) band 9051, as shown for example in FIG. 9B. Example 26, the subject matter of Example 1 optionally includes in which the first electrical filter comprises a notch filter having a notch band overlapping at least a portion of an Earth Exploration Satellite Service (EESS) band to facilitate compliance with a regulatory requirement or the standards setting organization specification for the Earth Exploration Satellite Service (EESS) band. Example 27, the subject matter of Example 1 optionally includes in which the first electrical filter comprises a band pass filter having a pass band overlapping at least a portion of an n258 band to facilitate compliance with a regulatory requirement or a standards setting organization specification for an Earth Exploration Satellite Service (EESS) band. Example 28, the subject matter of Example 1 optionally includes in which the first electrical filter comprises a band pass filter having a pass band overlapping at least a portion of an n258 band to facilitate compliance with a regulatory requirement or a standards setting organization specification for an Earth Exploration Satellite Service (EESS) band. Example 29, the subject matter of any one or more of Examples 1 through 28 optionally include in which the first electrical filter comprises a first plurality of resonators. Example 30, the subject matter of any one or more of Examples 1 through 28 optionally include in which the acoustic wave device comprises a first plurality of acoustic resonators. Example 31, the subject matter of any one or more of Examples 1 through 30 optionally include in which at least one member of the first plurality of acoustic resonators comprises first and second layers of piezoelectric material acoustically coupled with one another, in which the first layer of piezoelectric material has a first piezoelectric axis orientation, and the second layer of piezoelectric material has a second piezoelectric axis orientation that substantially opposes the first piezoelectric axis orientation of the first layer of piezoelectric material. Example 32, the subject matter of any one or more of Examples 1 through 31 optionally include in which at least one member of the first plurality of acoustic resonators comprises first and second layers of piezoelectric material and an interposer layer interposed between the first and second layers of piezoelectric material. Example 33, the subject matter of Example 32 optionally includes in which the interposer is to facilitate an enhancement of an electromechanical coupling coefficient. Example 34, the subject matter of any one or more of Examples 1 through 33 optionally include in which at least one member of the first plurality of acoustic resonators comprises first and second layers of piezoelectric material having respective thicknesses to have a main resonant frequency that is in the super high frequency band or the extremely high frequency band. Example 35, the subject matter of any one or more of Examples 1 through 34 optionally include in which at least one member of the first plurality of acoustic resonators comprises first and second layers of piezoelectric material and a top acoustic reflector including a first pair of top metal electrode layers electrically and acoustically coupled with the first and second layer of piezoelectric material. Example 36, the subject matter of any one or more of Examples 1 through 35 optionally include in which the first electrical filter comprises a first plurality of piezoelectric resonators. Example 37, the subject matter of any one or more of Examples 1 through 36 optionally include in which the first electrical filter is to facilitate attenuation proximate to a band edge of a 3GPP 5G n258 band. Example 38, the subject matter of any one or more of Examples 1 through 37 optionally include in which the electrical filter is to facilitate attenuation within the Earth Exploration Satellite Service (EESS) band. Example 39, the subject matter of any one or more of Examples 1 through 38 optionally include in which the first electrical filter comprises a Laterally Coupled Resonator Filter (LCRF). Example 40, the subject matter of any one or more of Examples 1 through 39 optionally include a bulk acoustic wave resonator. Example 41, the subject matter of any one or more of Examples 1 through 40 optionally include in which at least a portion of the first filter band is within a K band. Example 42, the subject matter of any one or more of Examples 1 through 41 optionally include in which a plurality of resonators have respective resonant frequencies within a K band. Example 43, the subject matter of any one or more of Examples 1 through 42 optionally include in which at least a portion of the first filter band is within a 3GPP 5G n258 band. Example 44, the subject matter of any one or more of Examples 1 through 43 optionally include in which a plurality resonators have respective resonant frequencies within a 3GPP 5G n258 band. Example 45, the subject matter of any one or more of Examples 1 through 44 optionally include in which at least a portion of the first filter band of the first filter is within the Earth Exploration Satellite Service (EESS) band. Example 46, the subject matter of any one or more of Examples 1 through 45 optionally include in which the plurality resonators have respective resonant frequencies within the Earth Exploration Satellite Service (EESS) band. Example 47, the subject matter of any one or more of Examples 1 through 46 optionally include in which a notch filter has more attenuation than about −33 decibels in at least a portion of its notch band. Example 48, the subject matter of any one or more of Examples 1 through 47 optionally include in which a notch band is characterized by a band edge on each side of the notch band having a transition region from about −3 decibels past about −33 decibels such that the transition region is less than about 100 MegaHertz. Example 49, the subject matter of any one or more of Examples 1 through 48 optionally include in which a notch filter has more attenuation than about −27 decibels in at least a portion of the notch band. Example 50, the subject matter of any one or more of Examples 1 through 49 optionally include in which a notch band is characterized by a band edge on each side of the notch band having a transition region from −3 decibels past about −27 decibels such that the transition region is less than about 200 MegaHertz. Example 51, the subject matter of any one or more of Examples 1 through 50 optionally include in which a notch filter has more attenuation than about −12 decibels in at least a portion of the notch band. Example 52, the subject matter of any one or more of Examples 1 through 51 optionally include in which the notch band is characterized by a band edge on each side of the notch band having a transition region from −3 decibels past about −12 decibels such that the transition region is no greater than about 110 MegaHertz. For example, a millimeter wave filter band can be characterized by a roll off having a steepness of about minus eight hundredths of a decibel per MegaHertz or steeper. Example 53, the subject matter of any one or more of Examples 1 through 52 optionally include in which a notch band is characterized by a band edge on each side of the notch band having −3 decibel width of less than about 600 MegaHertz. Example 54, the subject matter of any one or more of Examples 1 through 53 optionally include in which a notch band is characterized by a band edge on each side of the notch band having −3 decibel width of less than about 610 MegaHertz. Example 55, the subject matter of any one or more of Examples 1 through 54 optionally include in which a notch band is characterized by a band edge on each side of the notch band having −3 decibel width of less than about 650 MegaHertz. Example 56, the subject matter of any one or more of Examples 1 through 55 optionally include in which a notch band is characterized by a band edge on each side of the notch band having −3 decibel width of less than about five percent of a center frequency of the notch band. Example 57, the subject matter of any one or more of Examples 1 through 56 optionally include in which a notch band is characterized by a band edge on each side of the notch band having −3 decibel width of greater than about half of a percent of a center frequency of the notch band. Example 58, the subject matter of any one or more of Examples 1 through 57 optionally include in which a band pass filter has a pass band characterized by a band edge on each side of the pass band having −3 decibel width of less than about 5 percent of a center frequency of the pass band. Example 59, the subject matter of any one or more of Examples 1 through 58 optionally include in which a band pass filter has a pass band characterized by a band edge on each side of the pass band having −3 decibel width of greater than about 4 percent of a center frequency of the pass band. Example 60, the subject matter of any one or more of Examples 1 through 59 optionally include in which a band pass filter has a pass band characterized by a band edge on each side of its pass band having −3 decibel width of greater than about 3 percent of a center frequency of the pass band. Example 61, the subject matter of any one or more of Examples 1 through 60 optionally include in which the first filter comprises a notch filter having a notch band overlapping at least a portion of an Earth Exploration Satellite Service (EESS) band, and having an n258 pass region adjacent to the Earth Exploration Satellite Service (EESS) band, in which the first filter has less insertion loss than about −1 decibel in at least a portion of the n258 pass region. Example 62, the subject matter of any one or more of Examples 1 through 61 optionally include in which the first filter comprises a notch filter having a notch band overlapping at least a portion of an Earth Exploration Satellite Service (EESS) band, and having an n258 pass region adjacent to the Earth Exploration Satellite Service (EESS) band, in which the first filter has less insertion loss than about −0.5 decibel in at least a portion of the n258 pass region. Example 63, the subject matter of any one or more of Examples 1 through 62 optionally include in which the first filter comprises a notch filter having a notch band overlapping at least a portion of an Earth Exploration Satellite Service (EESS) band, and having an n258 pass region adjacent to the Earth Exploration Satellite Service (EESS) band, in which the first filter has less insertion loss than about −1 decibel in at least a portion of the n258 pass region. Example 64, the subject matter of any one or more of Examples 1 through 63 optionally include in which the first electrical filter comprises a notch filter having a notch band, and in which the apparatus comprises a second electrical filter comprising a band pass filter having a pass band adjacent to the notch band of the first electrical filter. Example 65, the subject matter of any one or more of Examples 1 through 63 optionally include in which the first electrical filter comprises a first band pass filter having a first pass band, and in which the apparatus comprises a second electrical filter comprising a second band pass filter having a second pass band. Example 66, the subject matter of any one or more of Examples 1 through 63 optionally include in which the first electrical filter comprises a first band pass filter having a first pass band, and in which the apparatus comprises second and third electrical filters respectively comprising second and third band pass filters having respective second and third pass bands. Example 67, the subject matter of Example 66 optionally includes in which the first, second and third pass bands at least partially overlap a 3GPP 5G n258 band. Example 68, the subject matter of any one or more of Examples 1 through 63 optionally include in which the apparatus comprises a second filter, and in which the first and second filters comprise band pass filters. Example 69, the subject matter of any one or more of Examples 1 through 63 optionally include in which the apparatus comprises a second filter, and in which the first and second filters comprise first and second millimeter wave filters to facilitate suppression of millimeter wave energy leakage among adjacent bandwidths of millimeter wave spectrum. Example 70, the subject matter of any one or more of Examples 1 through 63 optionally include in which the apparatus comprises a second filter, and in which the first and second filters comprise first and second millimeter wave filters to facilitate suppression of millimeter wave energy leakage among adjacent bandwidths of millimeter wave spectrum licensed to the differing entities associated with the differing mobile network operators. Example 71, the subject matter of any one or more of Examples 1 through 70 optionally include in which the apparatus comprises: a second filter; and a switchplexer including a switch to select coupling with the first filter, and with the second filter. Example 72, the subject matter of Example 71 optionally includes in which the switch to select coupling with the first filter, and with the second filter is to facilitate selecting wireless communication from among a plurality of different mobile network operators. Example 73 is a bulk acoustic wave (BAW) resonator comprising: a substrate, a first piezoelectric layer, a top electrical interconnect, and a planarization layer interposed between the substrate and at least a portion of the top electrical interconnect. Example 74, the subject matter of Example 73 optionally includes a bottom electrode, and a bottom electrical interconnect electrically coupled with the bottom electrode. Example 75, the subject matter of Example 74 optionally includes a top electrode, in which the top electrical interconnect is electrically coupled with the top electrode, the top electrical interconnect having a top electrical interconnect area that is arranged substantially even with a bottom electrical interconnect area of the bottom electrical interconnect. Example 76, the subject matter of Example 74 optionally includes a top electrode, in which the top electrical interconnect is electrically coupled with the top electrode, the top electrical interconnect having a top electrical interconnect area that is arranged substantially parallel with a bottom electrical interconnect area of the bottom electrical interconnect. Example 77, the subject matter of Example 74 optionally includes a top electrode, in which the top electrical interconnect is electrically coupled with the top electrode and abuts the first piezoelectric layer. Example 78, the subject matter of Example 74 optionally includes a top electrode, in which the top electrical interconnect is electrically coupled with the top electrode and abuts the planarization layer. Example 79, the subject matter of Example 74 optionally includes a top electrode, in which the top electrical interconnect is electrically coupled with the top electrode and abuts the substrate. Example 80, the subject matter of Example 74 optionally includes in which the electrical coupling between the bottom electrical interconnect and the bottom electrode comprises a capacitive coupling. Example 81, the subject matter of Example 74 optionally includes in which the electrical coupling between the bottom electrical interconnect and the bottom electrode comprises an electrical connection. Example 82, the subject matter of Example 74 optionally includes in which the electrical coupling between the bottom electrical interconnect and the bottom electrode comprises electrical contact. Example 83, the subject matter of Example 74 optionally includes in which the bottom electrical interconnect extends through a via in the first piezoelectric layer. Example 84, the subject matter of Example 74 optionally includes in which the bottom electrical interconnect extends through an etched via in the first piezoelectric layer. Example 85, the subject matter of any one or more of Examples 73 through 84 optionally include a cavity region interposed between the substrate and at least a portion of the bottom electrode. Example 86, the subject matter of Example 85 optionally includes in which the cavity region extends into the substrate. Example 87, the subject matter of Example 85 optionally includes in which the cavity region comprises a dielectric. Example 88, the subject matter of Example 85 optionally includes in which the cavity region comprises air. Example 89, the subject matter of Example 85 optionally includes in which the cavity region is interposed between the substrate and at least a portion of the planarization layer. Example 90, the subject matter of any one or more of Examples 74 through 89 optionally include in which the planarization layer abuts the bottom electrode. Example 91, the subject matter of any one or more of Examples 74 through 90 optionally include in which at least a portion of the planarization layer is substantially coplanar with at least a portion of the bottom electrode. Example 92, the subject matter of any one or more of Examples 74 through 90 optionally include a top multilayer metal acoustic reflector electrode. Example 93, the subject matter of Example 92 optionally includes in which the top multilayer metal acoustic reflector electrode approximates a top distributed Bragg acoustic reflector. Example 94, the subject matter of any one or more of Examples 74 through 93 optionally include in which the bottom electrode comprises a bottom multilayer metal acoustic reflector electrode.

Example 95, the subject matter of Example 94 optionally includes in which the bottom multilayer metal acoustic reflector electrode approximates a bottom distributed Bragg acoustic reflector. Example 96, the subject matter of any one or more of Examples 74 through 95 optionally include in which the bottom electrode comprises a bottom multilayer metal acoustic reflector electrode including an initial bottom electrode layer that at least partially overlaps the planarization layer. Example 97, the subject matter of any one or more of Examples 74 through 96 optionally include in which the bottom electrode comprises a bottom multilayer metal acoustic reflector electrode including an initial bottom electrode layer and remainder bottom electrode layers, in which the planarization layer abuts the remainder bottom electrode layers. Example 98, the subject matter of any one or more of Examples 74 through 97 optionally include in which the bottom electrode comprises a bottom multilayer metal acoustic reflector electrode including an initial bottom electrode layer and remainder bottom electrode layers, in which at least a portion of the planarization layer is substantially coplanar with at least a portion of the remainder bottom electrode layers. Example 99, the subject matter of any one or more of Examples 74 through 98 optionally include in which the bottom electrode comprises a bottom multilayer metal acoustic reflector electrode including an initial bottom electrode layer, in which at least a portion of the planarization layer is substantially coplanar with at least a portion of the initial bottom electrode layer. Example 100, the subject matter of any one or more of Examples 74 through 99 optionally include in which the bottom electrical interconnect abuts the substrate. Example 101, the subject matter of any one or more of Examples 74 through 100 optionally include in which the bottom electrical interconnect abuts an extremity of the bottom electrode. Example 102, the subject matter of any one or more of Examples 74 through 101 optionally include in which the planarization layer is at least partially overlapped by an inactive region of the first piezoelectric layer. Example 103, the subject matter of any one or more of Examples 74 through 102 optionally include in which the planarization layer is entirely overlapped by an inactive region of the first piezoelectric layer. Example 104, the subject matter of any one or more of Examples 74 through 103 optionally include in which the first piezoelectric layer is a stack of piezoelectric layers having respective piezoelectric axes arranged in substantially alternating directions.

FIGS. 9C through 9F are first, second, third and fourth diagrams 9100, 9200, 9300, 9400 illustrating respective simulated filter characteristics 9101, 9201, 9301, 9401 of insertion loss versus frequency for example filters.

Figure 9C:
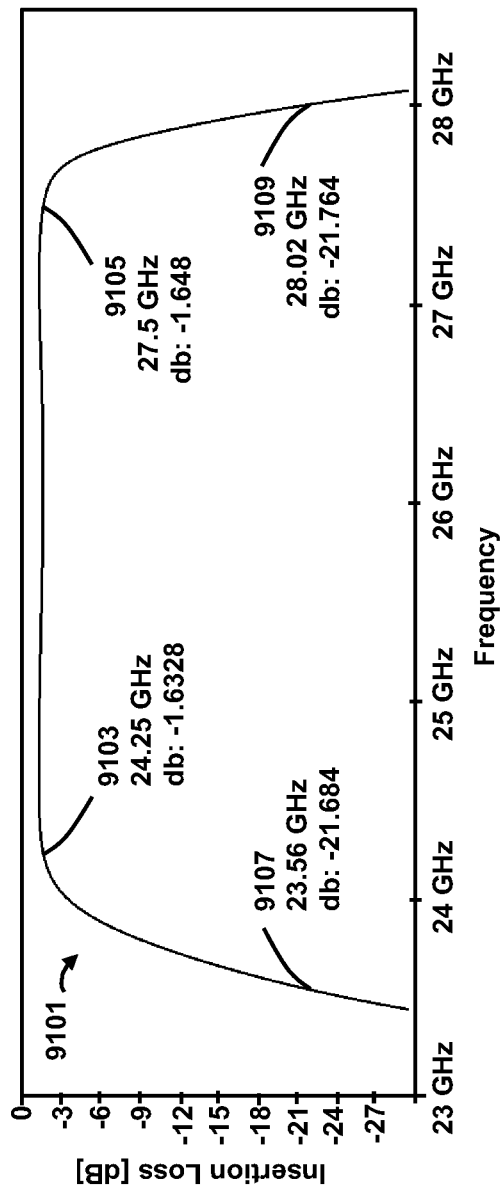
FIG. 9C is a diagram illustrating a simulated band pass filter characteristic of insertion loss versus frequency for an example band pass filter employing acoustic resonators of this disclosure.

For example, FIG. 9C is a first diagram 9100 illustrating a first simulated bandpass characteristic 9101 of insertion loss versus frequency for a first example millimeter wave filter configured as in FIG. 7 (e.g., inductors modifying an example lattice filter using a first pair of series resonators of the bulk acoustic wave resonator structure of FIG. 1A, a second pair of series resonators of the bulk acoustic wave resonator structure of FIG. 1A and two pairs of cross coupled mass loaded shunt resonators of the bulk acoustic wave resonator structure of FIG. 1A). For example, the first example millimeter wave filter having the simulated bandpass characteristic 9101 may be a 3GPP 5G n258 band filter (e.g., filter corresponding to the FIG. 9B 3GPP 5G n258 band 9051 (24.25 GHz-27.5 GHz)). For example, the first example millimeter wave filter having the simulated bandpass characteristic 9101 may have a fractional bandwidth of about twelve percent (12%), and may include resonators having electromechanical coupling coefficient (Kt2) of about six and a half percent (6.5%). For example, the simulated bandpass characteristic 9101 of FIG. 9C shows a first 3GPP 5G n258 band edge feature 9103 having an insertion loss of −1.6328 decibels (dB) at an initial 24.25 GHz extremity of the 3GPP 5G n258 band. For example, the simulated bandpass characteristic 9101 of FIG. 9C shows an opposing 3GPP 5G n258 band edge feature 9105 having an insertion loss of −1.648 decibels (dB) at an opposing 27.5 GHz extremity of the 3GPP 5G n258 band. The first example millimeter wave filter having the simulated bandpass characteristic 9101 may have a pass band that is configured for 3GPP 5G n258 applications. For example, the simulated bandpass characteristic 9101 of FIG. 9C shows a first 3GPP 5G n258 band roll off feature 9107 having an insertion loss of −21.684 decibels (dB) at an initial 23.56 GHz roll off extremity of the 3GPP 5G n258 band. At the initial 23.56 GHz roll off extremity of the 3GPP 5G n258 band, the first 3GPP 5G n258 band roll off feature 9107 may provide about twenty dB of roll off at about 690 MHz from the first 3GPP 5G n258 band edge feature 9103 at the initial 24.25 GHz extremity of the 3GPP 5G n258 band. For example, the simulated bandpass characteristic 9101 FIG. 9C shows an opposing 3GPP 5G n258 band roll off feature 9109 having an insertion loss of −21.764 decibels (dB) at an opposing 28.02 GHz roll off extremity of the 3GPP 5G n258 band. At the opposing 28.02 GHz roll off extremity of the 3GPP 5G n258 band, the opposing 3GPP 5G n258 band roll off feature 9109 may provide about twenty dB of roll off at about 580 MHz from the opposing 3GPP 5G n258 band edge feature 9105 at the opposing 27.5 GHz extremity of the 3GPP 5G n258 band.

Figure 9D:
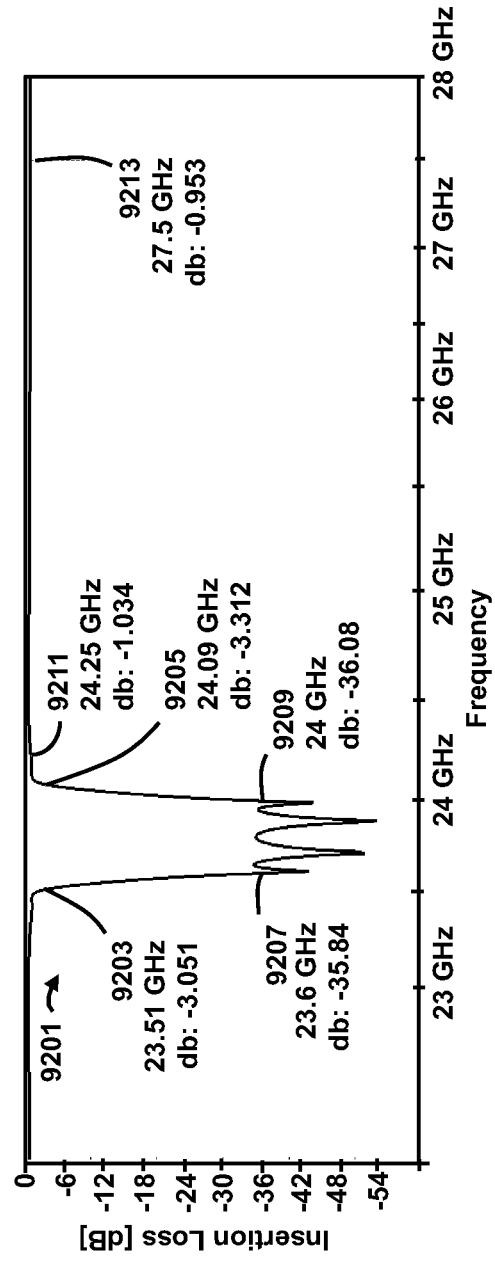
FIG. 9D is a diagram illustrating a simulated notch filter characteristic of insertion loss versus frequency for an example notch filter employing acoustic resonators of this disclosure.
Figure 9E:
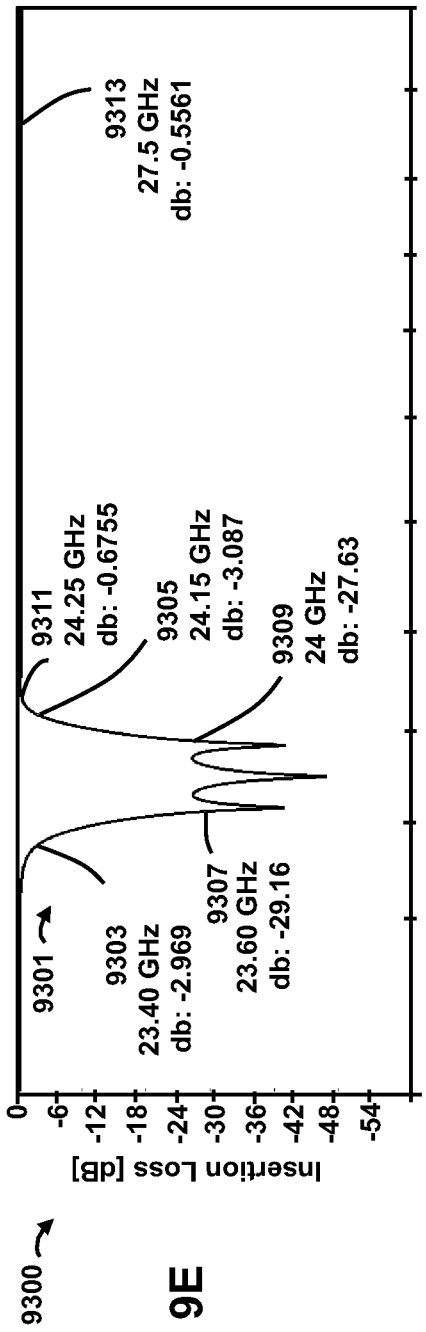
FIGS. 9E and 9F are diagrams illustrating respective simulated notch filter characteristic of insertion loss versus frequency for alternative examples of notch filters employing acoustic resonators of this disclosure.
Figure 9F:
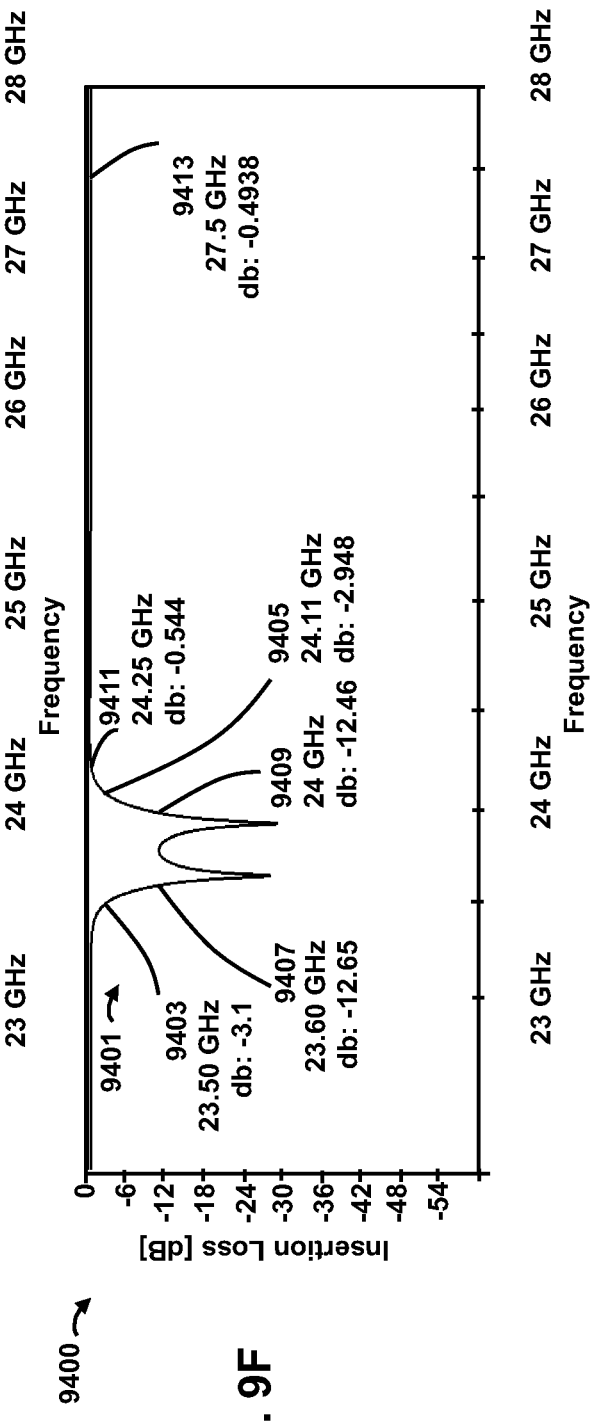
Figure 9G:
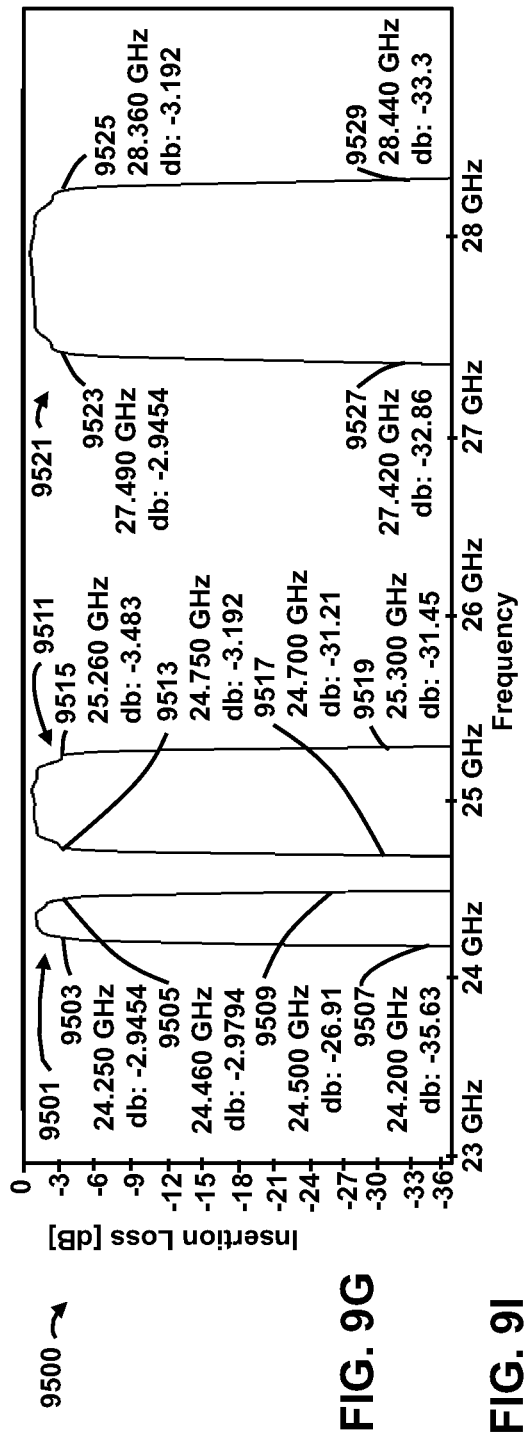
FIGS. 9G and 9H are diagrams illustrating simulated band pass filter characteristics of insertion loss versus frequency for respective additional example band pass filters employing acoustic resonators of this disclosure.

For example, FIGS. 9D through 9G show diagrams 9200 through 9500 illustrating simulated filter characteristics 9201 through 9501, 9511, 9521 of insertion loss versus frequency for example filters having respective filter bands (e.g., notch filters associated with respective notch bands as shown in FIGS. 9D through 9F, e.g., band pass filters associated with respective pass bands as shown in FIG. 9G) to facilitate compliance with a regulatory requirement or a standards setting organization specification for an Earth Exploration Satellite Service (EESS) band. One or more disclosed notch filters of this disclosure may be coupled with, e.g., may be serially coupled with, e.g., may be used together with, one or more band pass filters of this disclosure. For example, a first electrical filter may comprise a notch filter having a notch band, and a second electrical filter may comprise a band pass filter having a pass band adjacent to the notch band of the first electrical filter.

For example, FIGS. 9D through 9F show diagrams 9200 through 9400 illustrating simulated notch filter characteristics 9201 through 9401 of insertion loss versus frequency for example notch filters. For example, the notch filters associated with the simulated notch filter characteristic 9201 through 9401 shown in FIGS. 9D through 9F (e.g., EESS band notch filter characteristic 9201 through 9401) may facilitate suppression of energy leakage from an adjacent band, e.g., energy leakage from an adjacent 3GPP 5G band, e.g., transmit energy leakage from the adjacent 3GPP 5G n258 9051 shown in FIG. 9B. For example, the notch filters associated with the simulated notch filter characteristics 9201 through 9401 (e.g., EESS band notch filter characteristic 9201 through 9401) may facilitate satisfying (e.g., facilitate compliance with) a specification of a standards setting organization, e.g., International Telecommunications Union (ITU) specifications, e.g., ITU-R SM.329 Category A/B levels of −20 dbW/200 MHz, e.g., 3rd Generation Partnership Project (3GPP) 5G specifications, e.g., 3GPP 5G, unwanted (out-of-band & spurious) emission levels, worst case of −20 dBW/200 MHz. Alternatively or additionally, this may facilitate satisfying (e.g., facilitate compliance with) a regulatory requirement, e.g., a government regulatory requirement, e.g., a Federal Communications Commission (FCC) decision or requirement, e.g., a European Commission decision or requirement, e.g., European Commission Decision (EU) 2019/784 of 14 May 2019 on harmonization of the 24,25-27.5 GHz frequency band for terrestrial systems capable of providing wireless broadband electronic communications services in the Union, published May 16, 2019, a European Organization for the Exploitation of Meteorological Satellites (EUMETSAT) decision, requirement, recommendation or study, e.g., a ESA/EU-METSAT/EUMETNET study result of −54.2 dBW/200 MHz for Base Stations (BS) and 50.4 dBW/200 MHz for User Equipment (UE), e.g., the United Nations agency of the World Meteorological Organization (WMO) decision, requirement, recommendation or study, e.g., the WMO decision of −55 dBW/200 MHz for Base Stations (BS) and −51 dBW/200 MHz for User Equipment (UE). Since EESS is directed to passive sensing of the earth from space satellites, for example, to facilitate tracking and combating climate change, such government regulations and the innovative EESS notch filter of this disclosure may be needed to protect this vital mission from being frustrated and/or contaminated by transmit energy leakage from the adjacent 3GPP 5G n258 band. The EESS notch filter of this disclosure may facilitate attenuation, for example, proximate to a band edge of the 3GPP 5G n258 band. For the simulated notch filter characteristic 9201 shown in FIG. 9D, the corresponding notch filter may be configured as two external shunt inductors modifying the example ladder filter of FIG. 6 and configured with selected resonator mass loadings for notch filter (e.g., an input port shunt inductor and an output port shunt inductor modifying the ladder configuration using two mass loaded series resonators similar to the bulk acoustic wave resonator structure of FIG. 1A, e.g., using Aluminum Nitride piezoelectric material, and four two shunt resonators similar to the bulk acoustic wave resonator structure of FIG. 1A, e.g., using Aluminum Nitride piezoelectric material). The shunt inductors may be, for example, 0.5 nanohenry inductors having a quality factor of twenty (Q of 20). For example, the example notch filter associated with the simulated notch filter characteristic 9201 may be an EESS band notch filter (e.g., notch filter corresponding to the FIG. 9B EESS (Earth Exploration Satellite Service) band 9051A (23.6 GHz-24 GHz)). For example, the example notch filter associated with the simulated notch filter characteristic 9201 may have a fractional notch bandwidth of about 2.4 of a percent (2.4%), and may include resonators having electromechanical coupling coefficient (Kt2) of about seven percent (7%), e.g., using Aluminum Nitride piezoelectric material. For example, the simulated notch filter characteristic 9201 of FIG. 9D shows a first EESS band notch edge feature 9203 having an insertion loss of −3.051 decibels (dB) (e.g., about −3 dB) at an initial 23.51 GHz extremity adjacent to the EESS band. For example, the simulated bandpass characteristic 9201 of FIG. 9D shows an opposing EESS band notch edge feature 9205 having an insertion loss of −3 decibels (dB) at an opposing 24.09 GHz extremity adjacent to where spurious out of band emission from the 3GPP 5G n258 band could otherwise disrupt the adjacent EESS band (if not for the innovative notch filter of this disclosure facilitating avoidance of disruption). The notch band may be characterized by a band edge on each side of the notch band having −3 decibel width of less than about 600 MegaHertz (e.g., −3 decibel width from first EESS band notch edge feature 9203 to opposing EESS band notch edge feature 9205 may be less than about 600 Mega-Hertz). The notch band may be characterized by a band edge on each side of the notch band having −3 decibel width of less than about 610 MegaHertz (e.g., −3 decibel width from first EESS band notch edge feature 9203 to opposing EESS band notch edge feature 9205 may be less than about 610 MegaHertz). The notch band may be characterized by a band edge on each side of the notch band having −3 decibel width of less than about 650 MegaHertz (e.g., −3 decibel width from first EESS band notch edge feature 9203 to opposing EESS band notch edge feature 9205 may be less than about 650 MegaHertz). The notch band may be characterized by a band edge on each side of the notch band having −3 decibel width of less than about five percent of a center frequency of the notch band (e.g., −3 decibel width from first EESS band notch edge feature 9203 to opposing EESS band notch edge feature 9205 may be less than about five percent of a center frequency of the notch band). The notch band may be characterized by a band edge on each side of the notch band having −3 decibel width of greater than about half of a percent of a center frequency of the notch band (e.g., −3 decibel width from first EESS band notch edge feature 9203 to opposing EESS band notch edge feature 9205 may be greater than about half of a percent of a center frequency of the notch band).

The example notch filter associated with the simulated notch filter characteristic 9201 may have a notch that is configured for EESS applications, e.g., facilitating protection of the EESS from spurious emissions from out of the 3GPP 5G n258 band. For example, the simulated notch filter characteristic 9201 of FIG. 9D shows a first EESS band roll off feature 9209 having an insertion loss of −36.08 decibels (dB) at a 24 GHz roll off extremity of the EESS band that is adjacent to the 3GPP 5G n258 band. At the 24 GHz roll off extremity of the EESS band, the first EESS band roll off feature 9209 may provide about −35 dB of roll off (e.g., −36.08 dB) at about 100 MHz (e.g., 90 MHz) from the adjacent EESS band edge feature 9205 at the 24.09 GHz extremity, which is adjacent to where spurious out of band emission from the 3GPP 5G n258 band could otherwise disrupt the adjacent EESS band. For example, the simulated bandpass characteristic 9201 of FIG. 9D shows an opposing EESS band roll off feature 9207 having an insertion loss of −35.84 decibels (dB) at an opposing 23.6 GHz roll off extremity of the EESS band. At the opposing 23.6 GHz roll off extremity of the EESS band, the opposing EESS band roll off feature 9207 may provide about −35 dB of roll off (e.g., −35.84 dB) at about 100 MHz (e.g. 90 MHz) from the adjacent EESS band channel edge feature 9203 at the 23.51 GHz extremity adjacent to the band. As shown in FIG. 9D, the notch band may be characterized by a band edge on each side of the notch band having a transition region from about −3 decibels past about −33 decibels such that the transition region is less than about 100 MegaHertz. The WMO decision of −55 dBW/200 MHz for Base Station (BS) and −51 dBW/200 MHz for User Equipment (UE) is so stringent that −35 db of attenuation or more may be desired from the notch filter of this disclosure to facilitate compliance with the −55 dBW/200 MHz requirement for Base Stations (BS), and −27 db of attenuation or more may be needed from the notch filter of this disclosure to facilitate compliance with the −51 dBW/200 MHz for User Equipment (UE). Similarly, a ESA/EUMETSAT/EUMETNET study result of −54.2 dBW/200 MHz for Base Stations (BS) and 50.4 dBW/200 MHz for User Equipment (UE) may be so stringent that −34.2 db of attenuation or more may be desired from the notch filter of this disclosure to facilitate compliance with the −54.2 dBW/200 MHz requirement for Base Stations (BS), and −26.4 db of attenuation or more may be needed from the notch filter of this disclosure to facilitate compliance with the −50.4 dBW/200 MHz for User Equipment (UE). In some embodiments, the notch filter has more attenuation than about −33 decibels in at least a portion of the notch band.

Out of EESS notch band insertion loss may be relatively small at about −1 dB or less. For example, within 250 MHz from the 24 GHz extremity of the EESS band, the simulated notch filter characteristic 9201 of FIG. 9D shows an insertion loss of about −1 dB (e.g., −1.034 dB) at the 24.250 GHz edge extremity 9211 of the 3GPP 5G n258 band. Such low out of EESS notch band insertion loss continues to be relatively small, at about −1 dB or less, throughout the 3GPP 5G n258 band, as shown by the simulated notch filter characteristic 9201 of FIG. 9D where it extends between the 24.250 GHz to 27.500 GHz extremities of the 3GPP 5G n258 band. For example, the simulated notch filter characteristic 9201 of FIG. 9D shows an insertion loss of about −1 dB (e.g., −0.953 dB) at the 27.5 GHz edge extremity 9213 of the 3GPP 5G n258 band. Accordingly, the notch filter of this disclosure may have a notch band overlapping at least a portion of an Earth Exploration Satellite Service (EESS) band, and having an n258 pass region adjacent to the Earth Exploration Satellite Service (EESS) band, in which the first filter may have less insertion loss than about −1 decibel in at least a portion of the n258 pass region (e.g., at 27.5 GHz edge extremity 9213). Further, such relatively low insertion loss within the 3GPP 5G n258 band for the innovative EESS notch filter of this disclosure may facilitate avoiding attenuation within the 3GPP 5G n258 band.

For example, an alternative example notch filter associated with the simulated notch filter characteristic 9301 shown in FIG. 9E may be an additional example EESS band notch filter (e.g., notch filter corresponding to the FIG. 9B EESS (Earth Exploration Satellite Service) band 9051A (23.6 GHz-24 GHz)). For example, the additional example notch filter associated with the simulated notch filter characteristic 9301 may have a fractional notch bandwidth of about 3.15 of a percent (3.15%), and may include resonators having electromechanical coupling coefficient (Kt2) of about seven percent (7%), e.g., using Aluminum Nitride piezoelectric material.

For the simulated notch filter characteristic 9301 shown in FIG. 9E, the corresponding notch filter may be configured as two external shunt inductors modifying a filter, similar to the example ladder filter of FIG. 6 and configured with selected resonator mass loadings for notch filter (e.g., an input port shunt inductor and an output port shunt inductor modifying the ladder configuration using two mass loaded series resonators similar to the bulk acoustic wave resonator structure of FIG. 1A, e.g., using Aluminum Nitride piezoelectric material, and one shunt resonator similar to the bulk acoustic wave resonator structure of FIG. 1A, e.g., using Aluminum Nitride piezoelectric material). The shunt inductors may be, for example, about 0.5 nanohenry inductors having a quality factor of twenty (Q of 20). For example, the simulated notch filter characteristic 9301 of FIG. 9E shows a first EESS band notch edge feature 9303 having an insertion loss of −2.969 decibels (dB) (e.g., about −3 dB) at an initial 23.40 GHz extremity adjacent to the EESS band. For example, the simulated band pass characteristic 9301 of FIG. 9E shows an opposing EESS band notch edge feature 9305 having an insertion loss of −3.087 decibels (dB) (e.g., about −3 dB) at an opposing 24.15 GHz extremity adjacent to where spurious out of band emission from the 3GPP 5G n258 band could otherwise disrupt the adjacent EESS band (if not for the innovative notch filter of this disclosure facilitating avoidance of disruption). The example notch filter associated with the simulated notch filter characteristic 9301 may have a notch that is configured for EESS applications, e.g., facilitating protection of the EESS from spurious emissions from out of the 3GPP 5G n258 band. For example, the simulated notch filter characteristic 9301 of FIG. 9E shows a first EESS band roll off feature 9309 having an insertion loss of −27.63 decibels (dB) at a 24 GHz roll off extremity of the EESS band that is adjacent to the 3GPP 5G n258 band. At the 24 GHz roll off extremity of the EESS band, the first EESS band roll off feature 9309 may provide about −25 dB of roll off (e.g., −27.63 dB) at about 150 MHz from the adjacent EESS band edge feature 9305 at the 24.15 GHz extremity, which is adjacent to where spurious out of band emission from the 3GPP 5G n258 band could otherwise disrupt the adjacent EESS band. For example, the simulated band pass characteristic 9301 of FIG. 9E shows an opposing EESS band roll off feature 9307 having an insertion loss of −29.16 decibels (dB) at an opposing 23.60 GHz roll off extremity of the EESS band. At the opposing 23.60 GHz roll off extremity of the EESS band, the opposing EESS band roll off feature 9307 may provide about −25 dB of roll off (e.g., −29.16 dB) at about 200 MHz from the adjacent EESS band channel edge feature 9303 at the 23.40 GHz extremity adjacent to the band. The notch band shown in FIG. 9E may be characterized by a band edge on each side of the notch band having a transition region from −3 decibels past about −27 decibels such that the transition region is less than about 200 MegaHertz. For example, a European Commission decision or requirement of −42 dbW/200 MHz for 200 MHz for Base Stations (BS) and −38 dbW/200 MHz for User Equipment (UE) may be sufficiently stringent that −22 db of attenuation or more may be desired from the notch filter of this disclosure to facilitate compliance with the −42 dBW/200 MHz requirement for Base Stations (BS), and −14 db of attenuation or more may be needed from the notch filters of this disclosure to facilitate compliance with the −38 dBW/200 MHz for User Equipment (UE). In some embodiments, the notch filter of this disclosure may have more attenuation than about −27 decibels in at least a portion of the notch band.

Out of EESS notch band insertion loss may be relatively small at about −0.5 dB or less. For example, within 250 MHz from the 24 GHz extremity of the EESS band, the simulated notch filter characteristic 9301 of FIG. 9E shows an insertion loss of about −0.5 dB (e.g., −0.6755 dB) at the 24.250 GHz edge extremity 9311 of the 3GPP 5G n258 band. Such low out of EESS notch band insertion loss continues to be relatively small, at about −0.5 dB or less, throughout the 3GPP 5G n258 band, as shown by the simulated notch filter characteristic 9301 of FIG. 9E where it extends between the 24.250 GHz to 27.500 GHz extremities of the 3GPP 5G n258 band. For example, the simulated notch filter characteristic 9301 of FIG. 9E shows an insertion loss of about −0.5 dB (e.g., −0.5561 dB) at the 27.5 GHz edge extremity 9313 of the 3GPP 5G n258 band. Accordingly, such relatively low insertion loss within the 3GPP 5G n258 band for the innovative EESS notch filter of this disclosure may facilitate avoiding attenuation within the 3GPP 5G n258 band.

For example, another alternative example notch filter associated with the simulated notch filter characteristic 9401 shown in FIG. 9F may be another additional example EESS band notch filter (e.g., notch filter corresponding to the FIG. 9B EESS (Earth Exploration Satellite Service) band 9051A (23.6 GHz-24 GHz)). For example, the additional example notch filter associated with the simulated notch filter characteristic 9401 may have a fractional notch bandwidth of about 2.6 of a percent (2.6%), and may include resonators having electromechanical coupling coefficient (Kt2) of about seven percent (7%), e.g., using Aluminum Nitride piezoelectric material.

For the simulated notch filter characteristic 9401 shown in FIG. 9F, the corresponding notch filter may be configured as two external shunt inductors modifying a filter, similar to the example ladder filter of FIG. 6 and configured with selected resonator mass loadings for notch filter (e.g., an input port shunt inductor and an output port shunt inductor modifying the ladder configuration using one mass loaded series resonators similar to the bulk acoustic wave resonator structure of FIG. 1A, e.g., using Aluminum Nitride piezoelectric material, and one shunt resonator similar to the bulk acoustic wave resonator structure of FIG. 1A, e.g., using Aluminum Nitride piezoelectric material). The shunt inductors may be, for example, 2 nanohenry inductors having a quality factor of twenty (Q of 20). For example, the simulated notch filter characteristic 9401 of FIG. 9F shows a first EESS band notch edge feature 9403 having an insertion loss of −3.1 decibels (dB) (e.g., about −3 dB) at an initial 23.50 GHz extremity adjacent to the EESS band. For example, the simulated band pass characteristic 9401 of FIG. 9F shows an opposing EESS band notch edge feature 9405 having an insertion loss of −2.948 decibels (dB) (e.g., about −3 dB) at an opposing 24.11 GHz extremity adjacent to where spurious out of band emission from the 3GPP 5G n258 band could otherwise disrupt the adjacent EESS band (if not for the innovative notch filter of this disclosure facilitating avoidance of disruption). The notch band may be characterized by a band edge on each side of the notch band having −3 decibel width of less than about 610 MegaHertz (e.g., −3 decibel width from first EESS band notch edge feature 9403 to opposing EESS band notch edge feature 9405 may be less than about 610 MegaHertz). The notch band may be characterized by a band edge on each side of the notch band having −3 decibel width of less than about 650 MegaHertz (e.g., −3 decibel width from first EESS band notch edge feature 9403 to opposing EESS band notch edge feature 9405 may be less than about 650 MegaHertz). The notch band may be characterized by a band edge on each side of the notch band having −3 decibel width of less than about five percent of a center frequency of the notch band (e.g., −3 decibel width from first EESS band notch edge feature 9403 to opposing EESS band notch edge feature 9405 may be less than about five percent of a center frequency of the notch band). The notch band may be characterized by a band edge on each side of the notch band having −3 decibel width of greater than about half of a percent of a center frequency of the notch band (e.g., −3 decibel width from first EESS band notch edge feature 9403 to opposing EESS band notch edge feature 9405 may be greater than about half of a percent of a center frequency of the notch band). The example notch filter associated with the simulated notch filter characteristic 9401 may have a notch that is configured for EESS applications, e.g., facilitating protection of the EESS from spurious emissions from out of the 3GPP 5G n258 band. For example, the simulated notch filter characteristic 9401 of FIG. 9F shows a first EESS band roll off feature 9409 having an insertion loss of −12.46 decibels (dB) at a 24 GHz roll off extremity of the EESS band that is adjacent to the 3GPP 5G n258 band. At the 24 GHz roll off extremity of the EESS band, the first EESS band roll off feature 9409 may provide about −10 dB of roll off (e.g., −12.46 dB) at about 110 MHz from the adjacent EESS band edge feature 9405 at the 24.11 GHz extremity, which is adjacent to where spurious out of band emission from the 3GPP 5G n258 band could otherwise disrupt the adjacent EESS band. For example, the simulated band pass characteristic 9401 of FIG. 9F shows an opposing EESS band roll off feature 9407 having an insertion loss of −12.65 decibels (dB) at an opposing 23.60 GHz roll off extremity of the EESS band. At the opposing 23.60 GHz roll off extremity of the EESS band, the opposing EESS band roll off feature 9407 may provide about −12.65 dB of roll off (e.g., −10 dB) at about 100 MHz from the adjacent EESS band channel edge feature 9403 at the 23.50 GHz extremity adjacent to the band. The notch band may be characterized by a band edge on each side of the notch band having a transition region from −3 decibels past about −12 decibels such that the transition region is no greater than about 110 MegaHertz. The notch filters of this disclosure may facilitate compliance with the specifications of standards setting organization, e.g., International Telecommunications Union (ITU) specifications, e.g., ITU-R SM.329 Category A/B levels of −20 dbW/200 MHz, e.g., 3rd Generation Partnership Project (3GPP) 5G specifications, e.g., 3GPP 5G, unwanted (out-of-band & spurious) emission levels, worst case of −20 dBW/200 MHz. In some embodiments, the notch filter of this disclosure may have more attenuation than about −12 decibels in at least a portion of the notch band Out of EESS notch band insertion loss may be relatively small at about −0.5 dB or less. For example, within 250 MHz from the 24 GHz extremity of the EESS band, the simulated notch filter characteristic 9401 of FIG. 9F shows an insertion loss of about −0.5 dB (e.g., −0.544 dB) at the 24.250 GHz edge extremity 9411 of the 3GPP 5G n258 band. Such low out of EESS notch band insertion loss continues to be relatively small, at about −0.5 dB or less, throughout the 3GPP 5G n258 band, as shown by the simulated notch filter characteristic 9401 of FIG. 9F where it extends between the 24.250 GHz to 27.500 GHz extremities of the 3GPP 5G n258 band. For example, the simulated notch filter characteristic 9401 of FIG. 9F shows an insertion loss of about −0.5 dB (e.g., −0.4938 dB) at the 27.5 GHz edge extremity 9413 of the 3GPP 5G n258 band. Accordingly, the notch filter of this disclosure may have a notch band overlapping at least a portion of an Earth Exploration Satellite Service (EESS) band, and having an n258 pass region adjacent to the Earth Exploration Satellite Service (EESS) band, in which the first filter may have less insertion loss than about −0.5 decibel in at least a portion of the n258 pass region (e.g., at 27.5 GHz edge extremity 9413). Further, such relatively low insertion loss within the 3GPP 5G n258 band for the innovative EESS notch filter of this disclosure may facilitate avoiding attenuation within the 3GPP 5G n258 band.

Figure 9H:
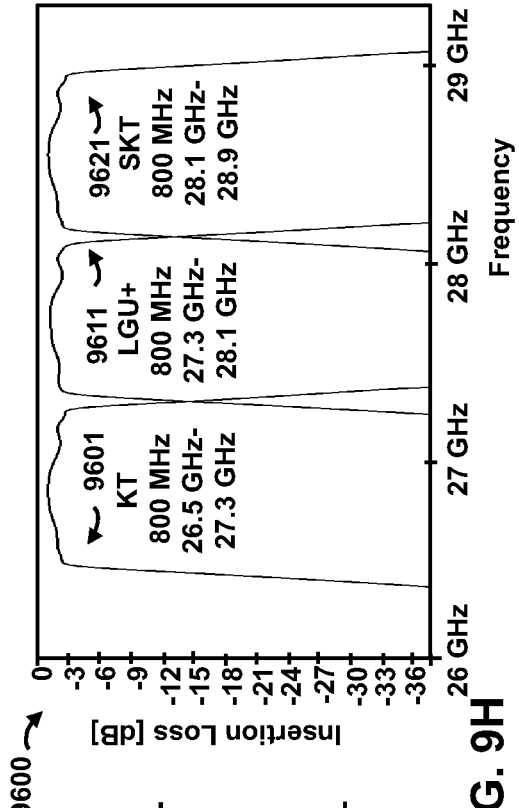

FIGS. 9G and 9H are diagrams illustrating simulated band pass filter characteristics of insertion loss versus frequency for respective additional example band pass filters employing acoustic resonators of this disclosure.

For example, FIG. 9G is a diagram 9500 illustrating simulated band pass characteristics 9501, 9511, 9521 of insertion loss versus frequency for three example millimeter wave band pass filters configured as two external shunt inductors modifying the example ladder filter similar to the one shown in FIG. 6 (e.g., an input port shunt inductor and an output port shunt inductor modifying the ladder configuration using four series resonators of the bulk acoustic wave resonator structure of FIG. 1A, and four mass loaded shunt resonators of the bulk acoustic wave resonator structure of FIG. 1A). The shunt inductors may be, for example, about 1 nanohenry inductors having a quality factor of twenty (Q of 20). For example, the three example millimeter wave filters respectively associated with the simulated band pass characteristics 9501, 9511, 9521 may be a 3GPP 5G n258 band channel filters (e.g., filters corresponding to channels in the FIG. 9B 3GPP 5G n258 band 9051 (24.25 GHz-27.5 GHz)). For example, a first example millimeter wave filter associated with the simulated band pass characteristic 9501 may be a two hundred Megahertz (200 MHz) channel filter of the 3GPP 5G n258, e.g., the filter may have a fractional bandwidth of about nine tenths of a percent (0.9%), and may include resonators having electromechanical coupling coefficient (Kt2) of about one and seven tenths percent (1.7%). For example, the simulated band pass characteristic 9501 of FIG. 9G shows a first 3GPP 5G n258 band channel edge feature 9503 having an insertion loss of −2.9454 decibels (dB) at an initial 24.25 GHz channel extremity of the 3GPP 5G n258 band. For example, the simulated band pass characteristic 9501 of FIG. 9G shows an opposing 3GPP 5G n258 band channel edge feature 9505 having an insertion loss of −2.9794 decibels (dB) at an opposing 24.460 GHz extremity of the 3GPP 5G n258 band channel. The first example millimeter wave filter associated with the simulated band pass characteristic 9501 may have a channel pass band that is configured for 3GPP 5G n258 applications. For example, the simulated band pass characteristic 9501 of FIG. 9G shows a first 3GPP 5G n258 band channel roll off feature 9507 having an insertion loss of −35.63 decibels (dB) at an initial 24.200 GHz roll off extremity of the 3GPP 5G n258 band channel. At the initial 24.200 GHz roll off extremity of the 3GPP 5G n258 band channel, the first 3GPP 5G n258 band channel roll off feature 9507 may provide about thirty five dB of roll off at about 50 MHz from the first 3GPP 5G n258 band channel edge feature 9503 at the initial 24.25 GHz extremity of the 3GPP 5G n258 band channel. For example, the simulated band pass characteristic 9501 of FIG. 9G shows an opposing 3GPP 5G n258 band channel roll off feature 9509 having an insertion loss of −26.91 decibels (dB) at an opposing 24.500 GHz channel roll off extremity of the 3GPP 5G n258 band channel. At the opposing 24.500 GHz channel roll off extremity of the 3GPP 5G n258 band channel, the opposing 3GPP 5G n258 band roll off channel feature 9509 may provide about twenty dB of roll off at about 50 MHz (e.g., 40 MHz) from the opposing 3GPP 5G n258 band channel edge feature 9505 at the opposing 24.460 GHz extremity of the 3GPP 5G n258 band channel.

For example, a second example millimeter wave filter associated with the simulated band pass characteristic 9511 may be a 500 hundred Megahertz (500 MHz) channel filter of the 3GPP 5G n258, e.g., the filter may have a fractional bandwidth of about two percent (2%), and may include resonators having electromechanical coupling coefficient (Kt2) of about three and three tenths percent (3.3%). For example, the simulated band pass characteristic 9511 of FIG. 9G shows a first 3GPP 5G n258 band channel edge feature 9513 having an insertion loss of −3.192 decibels (dB) at an initial 24.750 GHz channel extremity of the 3GPP 5G n258 band. For example, the simulated band pass characteristic 9511 of FIG. 9G shows an opposing 3GPP 5G n258 band channel edge feature 9515 having an insertion loss of −3.483 decibels (dB) at an opposing 25.260 GHz extremity of the 3GPP 5G n258 band channel. The second example millimeter wave filter associated with the simulated band pass characteristic 9511 may have a channel pass band that is configured for 3GPP 5G n258 applications. For example, the simulated band pass characteristic 9511 of FIG. 9G shows a first 3GPP 5G n258 band channel roll off feature 9517 having an insertion loss of −31.21 decibels (dB) at an initial 24.700 GHz roll off extremity of the 3GPP 5G n258 band channel. At the initial 24.700 GHz roll off extremity of the 3GPP 5G n258 band channel, the first 3GPP 5G n258 band channel roll off feature 9517 may provide about thirty five dB of roll off at about 50 MHz from the first 3GPP 5G n258 band channel edge feature 9513 at the initial 24.750 GHz extremity of the 3GPP 5G n258 band channel. For example, the simulated band pass characteristic 9511 of FIG. 9G shows an opposing 3GPP 5G n258 band channel roll off feature 9519 having an insertion loss of −31.45 decibels (dB) at an opposing 25.300 GHz channel roll off extremity of the 3GPP 5G n258 band channel. At the opposing 25.300 GHz channel roll off extremity of the 3GPP 5G n258 band channel, the opposing 3GPP 5G n258 band roll off channel feature 9519 may provide about thirty decibels (dB) of roll off at about 50 MHz (e.g., 40 MHz) from the opposing 3GPP 5G n258 band channel edge feature 9515 at the opposing 25.260 GHz extremity of the 3GPP 5G n258 band channel.

For example, a third example millimeter wave filter associated with the simulated band pass characteristic 9521 as shown in FIG. 9G may be a 900 hundred Megahertz (900

MHz) channel filter of the 3GPP 5G n258, e.g., the filter may have a fractional bandwidth of about three percent (3%), and may include resonators having electromechanical coupling coefficient (Kt2) of about five percent (5%). For example, the simulated band pass characteristic 9521 of FIG. 9G shows a first 3GPP 5G n258 band channel edge feature 9523 having an insertion loss of −2.9454 decibels (dB) at an initial 27.490 GHz channel extremity of the 3GPP 5G n258 band. For example, the simulated band pass characteristic 9521 of FIG. 9G shows an opposing 3GPP 5G n258 band channel edge feature 9525 having an insertion loss of −3.192 decibels (dB) at an opposing 28.360 GHz extremity of the 3GPP 5G n258 band channel. The third example millimeter wave filter associated with the simulated band pass characteristic 9521 may have a channel pass band that is configured for 3GPP 5G n258 applications. For example, the simulated band pass characteristic 9521 of FIG. 9G shows a first 3GPP 5G n258 band channel roll off feature 9527 having an insertion loss of −32.86 decibels (dB) at an initial 27.420 GHz roll off extremity of the 3GPP 5G n258 band channel. At the initial 27.420 GHz roll off extremity of the 3GPP 5G n258 band channel, the first 3GPP 5G n258 band channel roll off feature 9527 may provide about thirty dB of roll off (e.g., −32.86 dB) at about 50 MHz (e.g., 70 MHz) from the first 3GPP 5G n258 band channel edge feature 9523 at the initial 27.490 GHz extremity of the 3GPP 5G n258 band channel. For example, the simulated band pass characteristic 9521 FIG. 9G shows an opposing 3GPP 5G n258 band channel roll off feature 9529 having an insertion loss of −33.3 decibels (dB) at an opposing 28.440 GHz channel roll off extremity of the 3GPP 5G n258 band channel. At the opposing 28.440 GHz channel roll off extremity of the 3GPP 5G n258 band channel, the opposing 3GPP 5G n258 band roll off channel feature 9529 may provide about thirty dB of roll off at about 80 MHz from the opposing 3GPP 5G n258 band channel edge feature 9525 at the opposing 28.360 GHz extremity of the 3GPP 5G n258 band channel.

Embodiments of band pass filters of this disclosure, for example band pass filters corresponding to one or more simulated band pass characteristics 9501, 9511, 9521 of insertion loss versus frequency as shown in FIG. 9G, may have pass band characterized by a band edge on each side of the pass band having −3 decibel width of less than about 5 percent of a center frequency of the pass band. Embodiments of band pass filters of this disclosure, for example band pass filters corresponding to one or more simulated band pass characteristics 9501, 9511, 9521 of insertion loss versus frequency as shown in FIG. 9G, may have pass band characterized by a band edge on each side of the pass band having −3 decibel width of less than about 4 percent of a center frequency of the pass band. Embodiments of band pass filters of this disclosure, for example band pass filters corresponding to one or more simulated band pass characteristics 9501, 9511, 9521 of insertion loss versus frequency as shown in FIG. 9G, may have pass band characterized by a band edge on each side of the pass band having −3 decibel width of less than about 3 percent of a center frequency of the pass band.

For example, FIG. 9H is a diagram 9600 illustrating simulated band pass characteristics 9601, 9611, 9621 of insertion loss versus frequency for three additional example millimeter wave band pass filters (e.g., first, second and third example millimeter wave band pass filters). These example filters may be respectively configured as two external shunt inductors modifying the example ladder filter similar to the one shown in FIG. 6 (e.g., an input port shunt inductor and an output port shunt inductor modifying the ladder configuration using four series resonators of the bulk acoustic wave resonator structure of FIG. 1A, and four mass loaded shunt resonators of the bulk acoustic wave resonator structure of FIG. 1A). The shunt inductors may be, for example, about 1 nanohenry inductors having a quality factor of twenty (Q of 20). For example, two of the example band pass millimeter wave filters respectively associated with the simulated band pass characteristics 9601, 9611 of FIG. 9H may overlap at least portions of a 3GPP 5G n258 band (e.g., filters corresponding to channels overlapping at least portions of the FIG. 9B 3GPP 5G n258 band 9051 (24.25 GHz-27.5 GHz)). Further, a third example band pass millimeter wave filter associated with the simulated band pass characteristic 9612 of FIG. 9H may overlap at least a portion of the FIG. 9B 3GPP 5G n261 band 9052 (27.5 GHz-28.35 GHz). For example, the three example band pass millimeter wave filters respectively associated with the simulated band pass characteristics 9601, 9611, 9621 of FIG. 9H may overlap at least portions of the FIG. 9B 3GPP 5G n257 band 9053 (26.5 GHz-29.5 GHz).

For example, the three example millimeter wave filters respectively associated with the simulated band pass characteristic 9601, 9611, 9621 as shown in FIG. 9H may be respective eight hundred Megahertz (800 MHz) channel filters of the 3GPP 5G n257 band, e.g., the filter may have a fractional bandwidth of about three percent (3%), and may include resonators having electromechanical coupling coefficient (Kt2) of about five percent (5%).

The first example band pass millimeter filter may have a bandwidth that is licensed by a regulatory authority to a first entity associated with a first mobile network operator (e.g., first cellular carrier, e.g., first wireless carrier, e.g., first mobile phone operator). For example, the first example band pass millimeter wave filter may have a bandwidth of about eight hundred Megahertz (800 MHz) extending from about 26.5 GHz to about 27.3 GHz (e.g., may have the first simulated band pass characteristics 9601 as shown in FIG. 9H) that is licensed by a regulatory authority (e.g., by the South Korean regulatory authority, e.g., by the South Korean Ministry of Science and ICT) to the first entity associated with the first mobile network operator (e.g., KT Corporation, e.g., formerly Korea Telecom, e.g., South Korea's largest telephone company).

Similarly, the second example band pass millimeter filter may have a bandwidth that is licensed by the regulatory authority to a second entity associated with a second mobile network operator (e.g., second cellular carrier, e.g., second wireless carrier, e.g., second mobile phone operator). For example, the second example band pass millimeter wave filter may have a bandwidth of about eight hundred Megahertz (800 MHz) extending from about 27.3 GHz to about 28.1 GHz (e.g., may have the second simulated band pass characteristics 9611 as shown in FIG. 9H) that is licensed by the regulatory authority (e.g., by the South Korean regulatory authority, e.g., by the South Korean Ministry of Science and ICT) to the second entity associated with the second mobile network operator (e.g., LG Uplus Corporation, e.g., LGU+, e.g., formerly known as LG Telecom, e.g., the South Korean cellular carrier owned by LG Corporation, South Korea's fourth largest conglomerate and parent company of LG Electronics).

Similarly, the third example band pass millimeter filter may have a bandwidth that is licensed by the regulatory authority to a third entity associated with a third mobile network operator (e.g., third cellular carrier, e.g., third wireless carrier, e.g., third mobile phone operator). For example, the third example band pass millimeter wave filter may have a bandwidth of about eight hundred Megahertz (800 MHz) extending from about 28.1 GHz to about 28.9 GHz (e.g., may have the third simulated band pass characteristics 9621 as shown in FIG. 9H) that is licensed by the regulatory authority (e.g., by the South Korean regulatory authority, e.g., by the South Korean Ministry of Science and ICT) to the third entity associated with the third mobile network operator (e.g., SK Telecom Co., Ltd, a South Korean wireless telecommunications operator that it is part of the SK Group, one of South Koreas largest chaebols).

Accordingly, the first entity associated with the first mobile network operator may be different than the second entity associated with the second mobile network operator. The first entity associated with the first mobile network operator may be different than the third entity associated with the third mobile network operator. The second entity associated with the second mobile network operator may be different than the third entity associated with the third mobile network operator.

Figure 10:
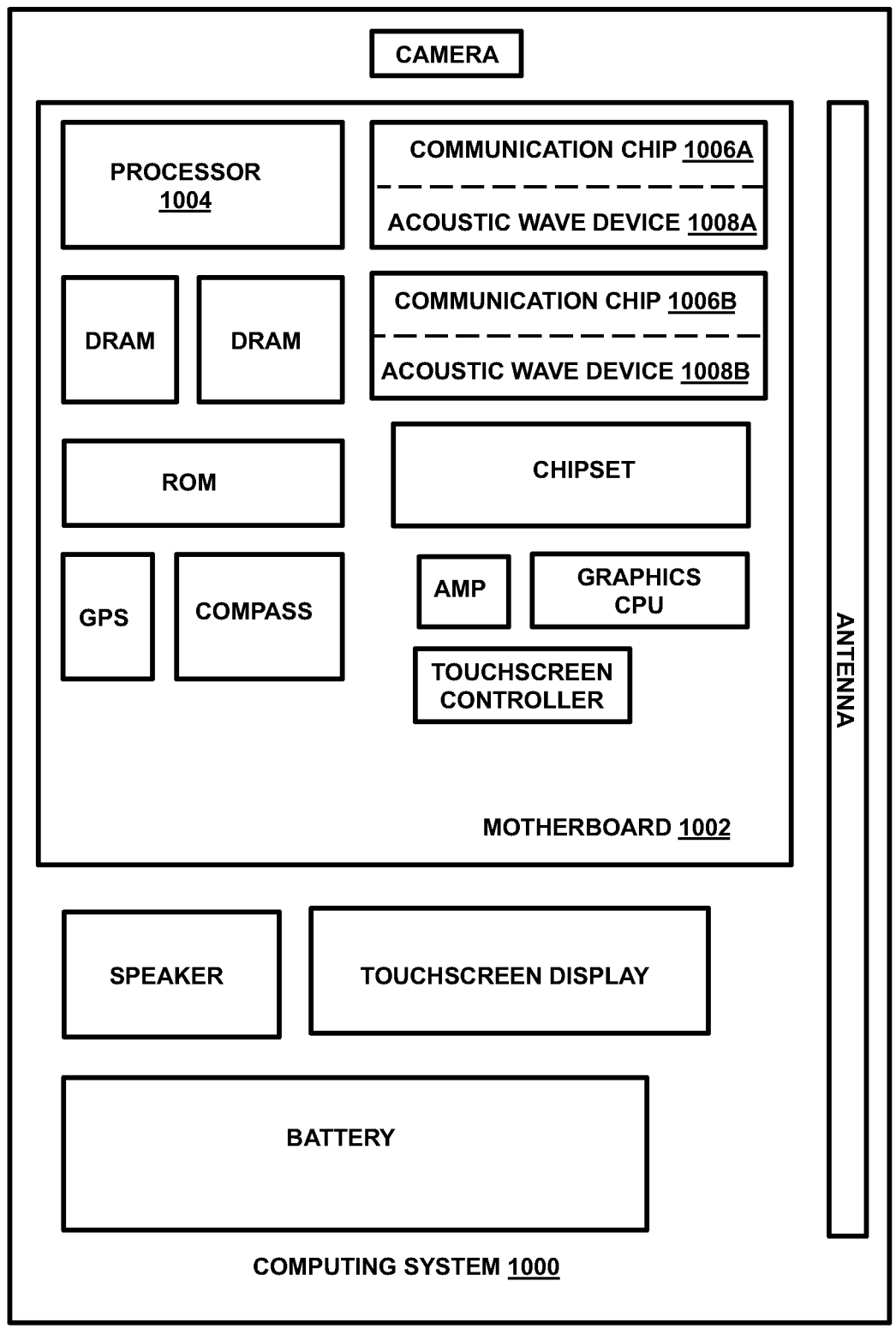
FIG. 10 illustrates a computing system implemented with integrated circuit structures or devices formed using the techniques disclosed herein, in accordance with an embodiment of the present disclosure.

The first, second and third example millimeter wave band pass filters respectively associated with simulated band pass characteristics 9601, 9611, 9621 as shown in FIG. 9H may comprise acoustic wave devices 1008A, 1008B of computing device computing device 1000 (e.g., mobile phone 1000) shown in FIG. 10. The first example millimeter wave band pass filter associated with the first simulated band pass characteristic 9601 shown in FIG. 9H may facilitate wireless communication (e.g., wireless operation, e.g., wireless compatibility) of the computing device 1000 (e.g., mobile phone 1000) shown in FIG. 10 with the first mobile network operator (e.g., KT Corporation, e.g., formerly Korea Telecom, e.g., South Korea's largest telephone company). For example, the first band pass millimeter wave filter may facilitate wireless communication (e.g., wireless operation, e.g., wireless compatibility) of the computing device 1000 (e.g., mobile phone 1000) shown in FIG. 10 with the first mobile network operator using the bandwidth of about eight hundred Megahertz (800 MHz) extending from about 26.5 GHz to about 27.3 GHz that is licensed by the regulatory authority (e.g., by the South Korean regulatory authority, e.g., by the South Korean Ministry of Science and ICT) to the first entity associated with the first mobile network operator (e.g., KT Corporation, e.g., KT).

The second example millimeter wave band pass filter associated with the second simulated band pass characteristic 9611 shown in FIG. 9H may facilitate wireless communication (e.g., wireless operation, e.g., wireless compatibility) of the computing device 1000 (e.g., mobile phone 1000) shown in FIG. 10 with the second mobile network operator (e.g., LG Uplus Corporation, e.g., LGU+, e.g., formerly known as LG Telecom, e.g., the South Korean cellular carrier owned by LG Corporation, South Korea's fourth largest conglomerate and parent company of LG Electronics). For example, the second band pass millimeter wave filter may facilitate wireless communication (e.g., wireless operation, e.g., wireless compatibility) of the computing device 1000 (e.g., mobile phone 1000) shown in FIG. 10 with the second mobile network operator using the bandwidth of about eight hundred Megahertz (800 MHz) extending from about 27.3 GHz to about 28.1 GHz that is licensed by the regulatory authority (e.g., by the South Korean regulatory authority, e.g., by the South Korean Ministry of Science and ICT) to the second entity associated with the second mobile network operator (e.g., LG Uplus Corporation, e.g., LGU+).

The third example millimeter wave band pass filter associated with the third simulated band pass characteristic 9621 shown in FIG. 9H may facilitate wireless communication (e.g., wireless operation, e.g., wireless compatibility) of the computing device 1000 (e.g., mobile phone 1000) shown in FIG. 10 with the third mobile network operator (e.g., SK Telecom Co., Ltd, a South Korean wireless telecommunications operator that it is part of the SK Group, one of South Koreas largest chaebols). For example, the third band pass millimeter wave filter may facilitate wireless communication (e.g., wireless operation, e.g., wireless compatibility) of the computing device 1000 (e.g., mobile phone 1000) shown in FIG. 10 with the third mobile network operator using the bandwidth of about eight hundred Megahertz (800 MHz) extending from about 28.1 GHz to about 28.9 GHz that is licensed by the regulatory authority (e.g., by the South Korean regulatory authority, e.g., by the South Korean Ministry of Science and ICT) to the third entity associated with the third mobile network operator (e.g., SK Telecom Co., Ltd, e.g., SKT).

The three example millimeter wave filters just discussed may have respective pass bands that may be adjacent to one another (e.g., may be contiguous with one another), corresponding to the three simulated band pass characteristics 9601, 9611, 9621 that may be adjacent to one another (e.g., may be contiguous with one another) as shown in FIG. 9H. For example, the three example millimeter wave filters may have respective pass bands of about eight hundred Megahertz (800 MHz) that may be adjacent to one another (e.g., may be contiguous with one another) within the 3GPP 5G n257 band. The three example millimeter wave filters may facilitate channelization within the 3GPP 5G n257 band. The respective pass bands of the three filters may facilitate attenuation, for example, proximate to respective pass band edges of the respective pass bands. The three example millimeter wave filters may facilitate suppression of energy leakage (e.g., facilitate suppression of millimeter wave energy leakage) among adjacent (e.g., contiguous) bandwidths of millimeter wave spectrum licensed to the differing entities associated with the differing mobile network operators (e.g., differing cellular carrier, e.g., differing wireless carriers, e.g., differing mobile phone operators). This may facilitate satisfying (e.g., facilitate compliance with) a government regulatory requirement, and/or a spectrum licensing requirement, which may be directed to suppression of energy leakage, e.g., suppression of transmit energy leakage, from a licensed bandwidth of millimeter wave spectrum into adjacent (e.g., contiguous) bandwidths of millimeter wave spectrum. In other words, the three example millimeter wave filters may facilitate limiting of spurious emissions out of the respective pass bands of the three filters into adjacent (e.g., contiguous) bandwidths of millimeter wave spectrum.

For example, the first millimeter wave filter may have a first pass band, e.g., of about eight hundred Megahertz (800 MHz) extending from about 26.5 GHz to about 27.3 GHz, corresponding to a first 800 MHz bandwidth of millimeter wave spectrum licensed to the first entity associated with the first mobile network operator (e.g., KT Corporation, e.g., KT). This first 800 MHz bandwidth of millimeter wave spectrum licensed to the first entity associated with the first mobile network operator (e.g., KT Corporation, e.g., KT) may be adjacent to (e.g., may be contiguous with) a second 800 MHz bandwidth of millimeter wave spectrum licensed to the second entity associated with the second mobile network operator (e.g., LG Uplus Corporation, e.g., LGU+). The second millimeter wave filter may have a second pass band, e.g., of about eight hundred Megahertz (800 MHz) extending from about 27.3 GHz to about 28.1 GHz, corresponding to the second 800 MHz bandwidth of millimeter wave spectrum licensed to the second entity associated with the second mobile network operator (e.g., LG Uplus Corporation, e.g., LGU+). This second 800 MHz bandwidth of millimeter wave spectrum licensed to the second entity associated with the second mobile network operator (e.g., LG Uplus Corporation, e.g., LGU+) may be adjacent to (e.g., may be contiguous with) a third 800 MHz bandwidth of millimeter wave spectrum licensed to the third entity associated with the third mobile network operator (e.g., SK Telecom Co., Ltd, e.g., SKT). The third millimeter wave filter may have a third pass band, e.g., of about eight hundred Megahertz (800 MHz) extending from about 28.1 GHz to about 28.9 GHz, corresponding to the third 800 MHz bandwidth of millimeter wave spectrum licensed to the third entity associated with the third mobile network operator (e.g., SK Telecom Co., Ltd, e.g., SKT).

The first millimeter wave filter having the first pass band, for example, corresponding to a first 800 MHz bandwidth of millimeter wave spectrum licensed to the first entity associated with the first mobile network operator (e.g., KT Corporation, e.g., KT) may facilitate suppression of energy leakage therefrom into an adjacent (e.g., contiguous) second 800 MHz bandwidth of millimeter wave spectrum, which may be licensed to the second entity associated with the second mobile network operator (e.g., LG Uplus Corporation, e.g., LGU+). Conversely, the second millimeter wave filter having the second pass band, for example, corresponding to the second 800 MHz bandwidth of millimeter wave spectrum licensed to the second entity associated with the second mobile network operator (e.g., LG Uplus Corporation, e.g., LGU+) may facilitate suppression of energy leakage therefrom into an adjacent (e.g., contiguous) first 800 MHz bandwidth of millimeter wave spectrum, which may be licensed to the first entity associated with the first mobile network operator (e.g., KT Corporation, e.g., KT).

Similarly, the second millimeter wave filter having the second pass band, for example, corresponding to the second 800 MHz bandwidth of millimeter wave spectrum licensed to the second entity associated with the second mobile network operator (e.g., LG Uplus Corporation, e.g., LGU+) may facilitate suppression of energy leakage therefrom into an adjacent (e.g., contiguous) third 800 MHz bandwidth of millimeter wave spectrum, which may be licensed to the third entity associated with the third mobile network operator (e.g., SK Telecom Co., Ltd, e.g., SKT). Conversely, the third millimeter wave filter having the third pass band, for example, corresponding to the third 800 MHz bandwidth of millimeter wave spectrum licensed to the third entity associated with the third mobile network operator (e.g., SK Telecom Co., Ltd, e.g., SKT) may facilitate suppression of energy leakage therefrom into an adjacent (e.g., contiguous) second 800 MHz bandwidth of millimeter wave spectrum, which may be licensed to the second entity associated with the second mobile network operator (e.g., LG Uplus Corporation, e.g., LGU+).

The plurality of millimeter wave band pass filters may facilitate respective wireless communication (e.g., wireless operation, e.g., wireless compatibility) of the computing device 1000 (e.g., mobile phone 1000) shown in FIG. 10 with the respective plurality of mobile network operators. The first and second example millimeter wave band pass filters respectively associated with first and second simulated band pass characteristics 9601, 9611 shown in FIG. 9H may facilitate respective wireless communication (e.g., wireless operation, e.g., wireless compatibility) of the computing device 1000 (e.g., mobile phone 1000) shown in FIG. 10 with the first mobile network operator (e.g., KT Corporation, e.g., KT) and with the second mobile network operator (e.g., LG Uplus Corporation, e.g., LGU+). Similarly, the first, second and third example millimeter wave band pass filters respectively associated with first, second and third simulated band pass characteristics 9601, 9611, 9621 shown in FIG. 9H may facilitate respective wireless communication (e.g., wireless operation, e.g., wireless compatibility) of the computing device 1000 (e.g., mobile phone 1000) shown in FIG. 10 with the first mobile network operator (e.g., KT Corporation, e.g., KT) and with the second mobile network operator (e.g., LG Uplus Corporation, e.g., LGU+), and with the third mobile network operator (e.g., SK Telecom Co., Ltd, e.g., SKT).

Figure 9I:
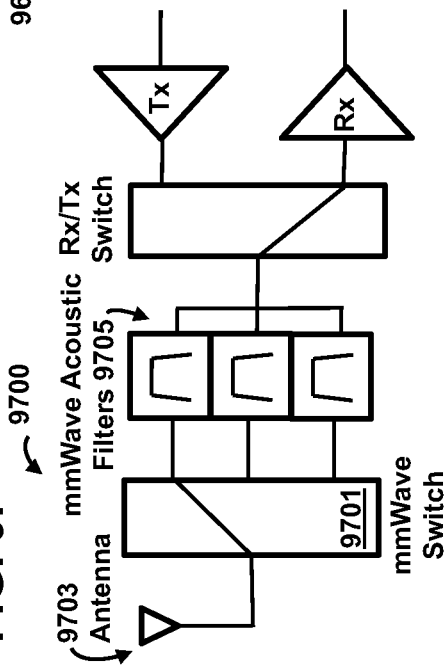
FIG. 9I is a simplified block diagram illustrating an example of a switchplexer comprising a switch to select coupling with alternative examples of a first band pass filter, and/or with the second band pass filter, and/or with the third band pass filter, respectively corresponding to the simulated band pass filter characteristics of FIGS. 9G and/or 9H.

Selecting from among the plurality of millimeter wave band pass filters just discussed may facilitate selecting wireless communication (e.g., wireless operation, e.g., wireless compatibility) of the computing device 1000 (e.g., mobile phone 1000) shown in FIG. 10 with a selected one of a plurality of mobile network operator (e.g., a plurality of mobile network operator that may be different from one another). For example, FIG. 9I is a simplified block diagram illustrating a switchplexer 9700. The switchplexer 9700 may comprise a switch (e.g., millimeter wave electrical switch 9701) to select coupling between an antenna 9703 a respective one of millimeter acoustic wave electrical filters 9705, e.g., alternative examples of a first band pass filter, and/or with the second band pass filter, and/or with the third band pass filter, respectively corresponding to the simulated band pass filter characteristics of FIGS. 9G and/or 9H. In a TDD (Time Division Duplex) example shown in FIG. 9I, a receive/transmit switch (Rx/Tx switch) may selectively coupled transmit and receive amplifiers (Tx and Rx amplifiers) to millimeter acoustic wave electrical filters 9705.

The switchplexer 9700 shown in FIG. 9I may select (e.g., may select electrical coupling) from among the plurality of millimeter wave band pass filters discussed previously herein and may facilitate selecting wireless communication (e.g., wireless operation, e.g., wireless compatibility) of the computing device 1000 (e.g., mobile phone 1000) shown in FIG. 10 with a selected mobile network operator (e.g., a selected one of a plurality of mobile network operators). For example, the switchplexer 9700 shown in FIG. 9I may select (e.g., may select electrical coupling) from among the first, second and third example millimeter wave band pass filters respectively associated with first, second and third simulated band pass characteristics 9601, 9611, 9621 shown in FIG. 9H. This may facilitate may facilitate selecting wireless communication (e.g., wireless operation, e.g., wireless compatibility) of the computing device 1000 (e.g., mobile phone 1000) shown in FIG. 10 with the first wireless mobile network operator (e.g., KT Corporation, e.g., KT) and with the second mobile network operator (e.g., LG Uplus Corporation, e.g., LGU+), and with the third mobile network operator (e.g., SK Telecom Co., Ltd, e.g., SKT).

Accordingly, at a first time, e.g., a time of manufacture, the computing device 1000 (e.g., mobile phone 1000) may comprise the plurality of millimeter wave band pass filters. This may facilitate respective wireless communication (e.g., wireless operation, e.g., wireless compatibility) of the computing device 1000 (e.g., mobile phone 1000) shown in FIG. 10 with the respective plurality of mobile network operators. At a second time, e.g., at a configuration time, after the first time, e.g., after the time of manufacture, the switchplexer 9700 shown in FIG. 9I may select (e.g., may select electrical coupling) from among the first, second and third example millimeter wave band pass filters respectively associated with first, second and third simulated band pass characteristics 9601, 9611, 9621 shown in FIG. 9H. This may facilitate configuration of the computing device 1000 (e.g., mobile phone 1000), e.g., by selecting wireless communication (e.g., wireless operation, e.g., wireless compatibility) of the computing device 1000 (e.g., mobile phone 1000) shown in FIG. 10 with the first wireless mobile network operator (e.g., KT Corporation, e.g., KT) and/or with the second mobile network operator (e.g., LG Uplus Corporation, e.g., LGU+), and/or with the third mobile network operator (e.g., SK Telecom Co., Ltd, e.g., SKT).

Further, the foregoing configuration may be changed (e.g., may be reconfigured) at a subsequent time. For example, at a third time, e.g., at a reconfiguration time, after the second time and after the first time, e.g., after the configuration time (and after the time of manufacture), the switchplexer 9700 shown in FIG. 9I may further select (e.g., may further select electrical coupling) from among the first, second and third example millimeter wave band pass filters respectively associated with first, second and third simulated band pass characteristics 9601, 9611, 9621 shown in FIG. 9H. This may facilitate reconfiguration of the computing device 1000 (e.g., mobile phone 1000), e.g., by further selecting wireless communication (e.g., wireless operation, e.g., wireless compatibility) of the computing device 1000 (e.g., mobile phone 1000) shown in FIG. 10 with the first mobile network operator (e.g., KT Corporation, e.g., KT) and/or with the second mobile network operator (e.g., LG Uplus Corporation, e.g., LGU+), and/or with the third mobile network operator (e.g., SK Telecom Co., Ltd, e.g., SKT).

FIG. 10 illustrates a computing system implemented with integrated circuit structures or devices formed using the techniques disclosed herein, in accordance with an embodiment of the present disclosure. As may be seen, the computing system 1000 houses a motherboard 1002. The motherboard 1002 may include a number of components, including, but not limited to, a processor 1004 and at least one communication chip 1006A, 1006B each of which may be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions may be integrated into one or more chips (e.g., for instance, note that the communication chips 1006A, 1006B may be part of or otherwise integrated into the processor 1004).

The communication chips 1006A, 1006B enable wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chips 1006A, 1006B may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006A, 1006B. For instance, a first communication chip 1006A may be dedicated to shorter range wireless communications such as Wi-Fi and Bluetooth and a second communication chip 1006B may be dedicated to longer range wireless communications such as GPS, EDGE, GPRS, CDMA, WiMAX, LTE, Ev-DO, 5G and others. In some embodiments, communication chips 1006A, 1006B may include, or be coupled with one or more acoustic wave devices 1008A, 1008B (e.g., resonators, e.g., filters 1008A, 1008B) as variously described herein (e.g., acoustic wave devices including a stack of alternating axis piezoelectric material). Acoustic wave devices 1008A, 1008B may be included in various ways e.g., one or more resonators, e.g., one or more filters. Further, such acoustic wave devices 1008A, 1008B e.g., resonators, e.g., filters may be configured to be Super High Frequency (SHF) acoustic wave devices 1008A, 1008B or Extremely High Frequency (EHF) acoustic wave devices 1008A, 1008B, e.g., resonators, and/or filters (e.g., operating at greater than 3, 4, 5, 6, 7, or 8 GHz, e.g., operating at greater than 23, 24, 25, 26, 27, 28, 29, or 30 GHz, e.g., operating at greater than 36, 37, 38, 39, or 40 GHz). Further still, such Super High Frequency (SHF) or Extremely High Frequency (EHF) acoustic wave devices 1008A, 1008B, e.g., resonators, and/or filters may be included in the RF front end of computing system 1000 and they may be used for 5G wireless standards or protocols, for example.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chips 1006A, 1006B also may include an integrated circuit die packaged within the communication chips 1006A, 1006B. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006A, 1006B is integrated into processor 1004, rather than having separate communication chips). Further note that processor 1004 may be a chip set having such wireless capability. In short, any number of processor 1004 and/or communication chips 1006A, 1006B may be used. Likewise, any one chip or chip set may have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent. The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An apparatus comprising:
a first millimeter wave filter having a millimeter wave filter band to facilitate compliance with at least one of a regulatory requirement and a standards setting organization specification, the first millimeter wave filter including at least a first acoustic millimeter wave resonator, the first acoustic millimeter wave resonator including at least:
a piezoelectric stack including at least a first piezoelectric layer having a first piezoelectric axis orientation, and a second piezoelectric layer having a second piezoelectric axis orientation, in which the second piezoelectric axis orientation substantially opposes the first piezoelectric axis orientation, in which the first piezoelectric layer and the second piezoelectric layer have respective thicknesses to facilitate the first acoustic millimeter wave resonator having a main resonant millimeter wave frequency in one of a Ku band, a K band, a Ka band, a V band and a W band; and
a top electrode stack acoustically reflective of the main resonant millimeter wave frequency, the top electrode stack including at least a first top metal electrode layer, a second top metal electrode layer, a third top metal electrode layer, and a fourth top metal electrode layer, in which the third top metal electrode layer and the fourth top metal electrode layer are electrically and acoustically coupled with the second piezoelectric layer to excite the main resonant millimeter wave frequency of the first acoustic millimeter wave resonator.

2. The apparatus as in claim 1 in which the first millimeter wave filter includes at least a millimeter wave notch filter, in which the main resonant millimeter wave frequency of the first acoustic millimeter wave resonator is in a millimeter wave notch band, in which the main resonant millimeter wave frequency and the millimeter wave notch band overlap at least a portion of an Earth Exploration Satellite Service (EESS) band, and in which the millimeter wave notch band is to facilitate compliance with at least one of a regulatory requirement for the Earth Exploration Satellite Service (EESS) band and a standards setting organization specification for the Earth Exploration Satellite Service (EESS) band.

3. The apparatus as in claim 1 in which the first millimeter wave filter includes at least a millimeter wave band pass filter, in which the main resonant millimeter wave frequency of the first acoustic millimeter wave resonator is in a millimeter wave pass band, in which the main resonant millimeter wave frequency and the millimeter wave pass band overlap at least a portion of an n258 band to facilitate compliance with at least one of a regulatory requirement for an Earth Exploration Satellite Service (EESS) band and a standards setting organization specification for the Earth Exploration Satellite Service (EESS) band.

4. The apparatus as in claim 1 in which the millimeter wave filter band is characterized by a band edge having a transition region from −3 decibels past about −12 decibels, in which the transition region is no greater than about MegaHertz.

5. The apparatus as in claim 1 in which the millimeter wave filter band is characterized by a roll off having a steepness of about minus eight hundredths of a decibel per MegaHertz or steeper.

6. The apparatus as in claim 1 in which first acoustic millimeter wave resonator includes at least one or more of a second pair of piezoelectric layers, a third pair of piezoelectric layers, a fourth pair of piezoelectric layers, a fifth pair of piezoelectric layers, a sixth pair of piezoelectric layers, a seventh pair of piezoelectric layers, an eighth pair of piezoelectric layers and a ninth pair of piezoelectric layers.

7. The apparatus as in claim 1 in which the first acoustic millimeter wave resonator is a bulk acoustic millimeter wave resonator having a quality factor of approximately 730 or greater.

8. The apparatus as in claim 1 in which the first acoustic millimeter wave resonator includes at least a bottom electrode stack acoustically reflective of the main resonant millimeter wave frequency, the bottom electrode stack including at least a first bottom metal electrode layer, a second bottom metal electrode layer, a third bottom metal electrode layer, and a fourth bottom metal electrode layer, in which the third bottom metal electrode layer and the fourth bottom metal electrode layer are electrically and acoustically coupled with the second piezoelectric layer to excite the main resonant millimeter wave frequency of the first acoustic millimeter wave resonator.

9. The apparatus as in claim 1 in which at least a portion of the millimeter wave filter band overlaps at least a portion of at least one of the Ku band, the K band, the Ka band, the V band and the W band.

10. The apparatus as in claim 1 in which the top electrode stack has a peak acoustic reflectivity in at least one of the Ku band, the K band, the Ka band, the V band and the W band.

11. The apparatus as in claim 1 in which at least a portion of the first millimeter wave filter band is in a 3rd Generation Partnership Project (3GPP) band in at least one of a 3GPP n257 band, a 3GPP 5G n258 band, a 3GPP n260 band and a 3GPP n261 band.

12. The apparatus as in claim 1 in which the first acoustic millimeter wave resonator has a main resonant millimeter wave frequency in a 3rd Generation Partnership Project (3GPP) band in at least one of a 3GPP n257 band, a 3GPP 5G n258 band, a 3GPP n260 band and a 3GPP n261 band.

13. The apparatus as in claim 1 in which the first millimeter wave filter includes at least a millimeter wave notch filter having a millimeter wave notch band, the millimeter wave notch band having −3 decibel width of less than about five percent of a center frequency of the millimeter wave notch band.

14. The apparatus as in claim 1 in which the first millimeter wave filter comprises a millimeter wave band pass filter having a millimeter wave pass band, the millimeter wave pass band having −3 decibel width of less than about 5 percent of a center frequency of the millimeter wave pass band.

15. The apparatus as in claim 1 in which the apparatus comprises a second millimeter wave filter, the second millimeter wave filter including at least a second acoustic millimeter wave resonator, the second acoustic millimeter wave resonator having a second main resonant millimeter wave frequency in one of the Ku band, the K band, the Ka band, the V band and the W band, and in which the first millimeter wave filter and the second millimeter wave filter are to facilitate suppression of millimeter wave energy leakage among adjacent bandwidths of millimeter wave spectrum.

16. The apparatus as in claim 1 in which the apparatus comprises:
a second millimeter wave filter including at least a second acoustic millimeter wave resonator; and
a switchplexer including a switch to select coupling with the first millimeter wave filter and with the second millimeter wave filter.

17. The apparatus as in claim 16 in which the switch to select coupling with the first millimeter wave filter, and with the second millimeter wave filter is to facilitate selecting wireless communication from among a plurality of different mobile network operators.

18. A millimeter wave filter comprising:
a first acoustic millimeter wave resonator including at least a first piezoelectric stack, the first piezoelectric stack including at least a first plurality of piezoelectric layers, in which an arrangement of members of the first piezoelectric stack has alternating parallel and antiparallel piezoelectric axis orientations;
a second acoustic millimeter wave resonator including at least a second piezoelectric stack, the second piezoelectric stack including at least a second plurality of piezoelectric layers; and
a planarization layer of the millimeter wave filter, in which at least a portion of the planarization layer is interposed between the first piezoelectric stack and the second piezoelectric stack, and in which:
the first acoustic millimeter wave resonator has a first main resonant millimeter wave frequency in one of a Ku band, a K band, a V band and a W band; and
the first acoustic millimeter wave resonator includes at least a first top electrode stack reflective of the first main resonant millimeter wave frequency, the first top electrode stack including at least a first quartet of top metal layers electrically and acoustically coupled with the first plurality of piezoelectric layers.

19. The millimeter wave filter as in claim 18 in which:
the second acoustic millimeter wave resonator has a second main resonant millimeter wave frequency, and includes at least a second top electrode stack reflective of the second main resonant millimeter wave frequency; and
the millimeter wave filter includes at least a top electrical interconnect electrically coupled between first top electrode stack and the second top electrode stack, the top electrical interconnect extending over the portion of the planarization layer that is interposed between the first piezoelectric stack and the second piezoelectric stack.

20. The millimeter wave filter as in claim 18 in which:
a first via is interposed between the first piezoelectric stack and the second piezoelectric stack; and
the portion of the planarization layer that is interposed between the first piezoelectric stack and the second piezoelectric stack is disposed in the first via.

21. The millimeter wave filter as in claim 18 in which:
the first acoustic millimeter wave resonator includes at least a first bottom electrode stack reflective of the first main resonant millimeter wave frequency;
the first bottom electrode stack includes at least a first quartet of bottom metal layers electrically and acoustically coupled with the first plurality of piezoelectric layers;
a second via extends from a top portion of the planarization layer and through the planarization layer to the first bottom electrode stack; and
a second electrical interconnect is disposed in the second via and is electrically coupled with the first bottom electrode stack.

22. An Earth Exploration Satellite Service (EESS) band electroacoustic notch filter comprising:
a first acoustic millimeter wave resonator including at least a first piezoelectric stack, the first piezoelectric stack including at least a first plurality of piezoelectric layers, in which an arrangement of members of the first piezoelectric stack has alternating parallel and antiparallel piezoelectric axis orientations; and
a second acoustic millimeter wave resonator coupled with the first acoustic millimeter wave resonator to provide the Earth Exploration Satellite Service (EESS) band electroacoustic notch filter, the second acoustic millimeter wave resonator including at least a second piezoelectric stack, the second piezoelectric stack including at least a second plurality of piezoelectric layers, and in which:
the first acoustic millimeter wave resonator has a main resonant millimeter wave frequency in the Earth Exploration Satellite Service (EESS) band; and
the first acoustic millimeter wave resonator includes at least a first top electrode stack reflective of the main resonant millimeter wave frequency in the Earth Exploration Satellite Service (EESS) band, the first top electrode stack including at least a first quartet of top metal layers electrically and acoustically coupled with the first plurality of piezoelectric layers.

23. The Earth Exploration Satellite Service (EESS) band electroacoustic notch filter as in claim 22 in which the Earth Exploration Satellite Service (EESS) band electroacoustic notch filter is operative to facilitate compliance with at least one of a regulatory requirement for the Earth Exploration Satellite Service (EESS) band and a standards setting organization specification for the Earth Exploration Satellite Service (EESS) band.

24. The Earth Exploration Satellite Service (EESS) band electroacoustic notch filter as in claim 22 in which:
a via is interposed between the first piezoelectric stack and the second piezoelectric stack; and
at least a portion of a planarization layer is disposed in the via.

25. The Earth Exploration Satellite Service (EESS) band electroacoustic notch filter as in claim 22 in which the first acoustic millimeter wave resonator is a first bulk acoustic millimeter wave resonator.

26. An apparatus comprising:
a substrate; and
an acoustic millimeter wave filter, the acoustic millimeter wave filter including at least a first acoustic millimeter wave resonator having a quality factor of approximately 730 or greater, the first acoustic millimeter wave resonator including at least;
a piezoelectric stack including at least a plurality of piezoelectric layers, in which an arrangement of members of the piezoelectric stack has alternating parallel and antiparallel piezoelectric axis orientations, in which the first acoustic millimeter wave resonator has a main acoustic resonance millimeter wave frequency in one of in one of a Ku band, a K band, a Ka band, a V band and a W band; and
a first metal acoustic millimeter wave reflector including at least a first quartet of metal electrode layers acoustically and electrically coupled over the plurality of piezoelectric layers.

27. The apparatus of claim 26 in which the first metal acoustic millimeter wave reflector has a peak acoustic reflectivity for the main acoustic resonance millimeter wave frequency.

28. The apparatus of claim 26 in which the first acoustic millimeter wave resonator includes at least a second metal acoustic millimeter wave reflector, in which the second metal acoustic millimeter wave reflector includes at least a second quartet of metal electrode layers coupled between the substrate and the plurality of piezoelectric layers.

29. The apparatus of claim 26 in which the first acoustic millimeter wave resonator is a contour mode resonator.

30. The apparatus of claim 26 in which the acoustic millimeter wave resonator is a bulk acoustic millimeter wave resonator.

* * * * *